(12) United States Patent
Choi

(10) Patent No.: US 8,832,391 B2
(45) Date of Patent: Sep. 9, 2014

(54) SEMICONDUCTOR DEVICE, CONTROLLER ASSOCIATED THEREWITH, SYSTEM INCLUDING THE SAME, AND METHODS OF OPERATION

(75) Inventor: Jung-Hwan Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 774 days.

(21) Appl. No.: 12/946,334

(22) Filed: Nov. 15, 2010

(65) Prior Publication Data

US 2011/0153939 A1     Jun. 23, 2011

Related U.S. Application Data

(60) Provisional application No. 61/302,254, filed on Feb. 8, 2010, provisional application No. 61/369,968, filed on Aug. 2, 2010.

(30) Foreign Application Priority Data

Dec. 22, 2009    (KR) .......................... 10-2009-0129137

(51) Int. Cl.
     *G06F 12/00*        (2006.01)
     *G11C 11/407*      (2006.01)
     *G11C 11/4096*     (2006.01)
     *G11C 11/401*      (2006.01)
     *G06F 13/16*        (2006.01)
     *G11C 7/12*         (2006.01)

(52) U.S. Cl.
     CPC ............... *G11C 7/12* (2013.01); *G11C 11/407* (2013.01); *G11C 11/4096* (2013.01); *G11C 11/401* (2013.01); *G06F 13/1668* (2013.01)
     USPC ........... 711/154; 711/105; 711/170; 711/202; 711/220; 711/E12.002

(58) Field of Classification Search
     CPC .......... G06F 12/00; G06F 12/02; G06F 12/14
     See application file for complete search history.

(56) References Cited

U.S. PATENT DOCUMENTS

5,583,500 A   *   12/1996   Allen et al. .................... 341/107
6,834,014 B2      12/2004   Yoo et al.

(Continued)

FOREIGN PATENT DOCUMENTS

CN           1722078 A      1/2006
CN         101387686 A      3/2009

OTHER PUBLICATIONS

Graphics Double Data Rate (GDDR4) SGRAM Specification, Release 1.0, Nov. 2005, JEDEC Standard No. 21-C, pp. 3.11.5.8-1-72.

(Continued)

*Primary Examiner* — Matthew Bradley
*Assistant Examiner* — Arvind Talukdar
(74) *Attorney, Agent, or Firm* — Harness, Dickey & Pierce

(57) ABSTRACT

In one embodiment, the semiconductor device includes a data control unit configured to selectively process data for writing to a memory. The data control unit is configured to enable a processing function from a group of processing functions based on a mode register command during a write operation, the group of processing functions including at least three processing functions. The enabled processing function may be performed based on a signal received over a single pin associated with the group of processing functions. In another embodiment, the semiconductor device includes a data control unit configured to process data read from a memory. The data control unit is configured to enable a processing function from a group of processing functions based on a mode register command during a read operation. Here, the group of processing functions including at least two processing functions.

18 Claims, 65 Drawing Sheets

(56) References Cited

U.S. PATENT DOCUMENTS

| | | |
|---|---|---|
| 7,102,958 B2 | 9/2006 | Lee et al. |
| 7,139,852 B2 * | 11/2006 | LaBerge ............ 710/100 |
| 7,277,356 B2 | 10/2007 | Lee et al. |
| 7,369,445 B2 | 5/2008 | Lee et al. |
| 7,457,189 B2 | 11/2008 | Lee et al. |
| 7,636,273 B2 | 12/2009 | Lee et al. |
| 7,804,720 B2 | 9/2010 | Lee et al. |
| 2008/0175071 A1 | 7/2008 | Lee et al. |
| 2010/0220536 A1 * | 9/2010 | Coteus et al. ............ 365/193 |

OTHER PUBLICATIONS

Office Action for corresponding Chinese Application No. 20101062111.X dated Aril 8, 2014.

\* cited by examiner

FIG. 60

| SEL | P1 |
|---|---|
| MRS_W0 | DBI |
| MRS_W1 | CRC |
| MRS_W2 | DM |
| MRS_W3 | X |

FIG. 61

| SEL | P1 |
|---|---|
| MRS_R0 | DBI |
| MRS_R1 | CRC |
| MRS_R2 | X |

FIG. 62

| SEL | P1 | |
|---|---|---|
| | WRITE | READ |
| MRS_0 | DBI | DBI |
| MRS_1 | DBI | CRC |
| MRS_2 | DBI | X |
| MRS_3 | CRC | DBI |
| MRS_4 | CRC | CRC |
| MRS_5 | CRC | X |
| MRS_6 | DM | DBI |
| MRS_7 | DM | CRC |
| MRS_8 | DM | X |
| MRS_9 | X | DBI |
| MRS_10 | X | CRC |
| MRS_11 | X | X |

FIG. 63

| SEL | P11 | P12 |
|---|---|---|
| MRS_W0 | DBI | CRC |
| MRS_W1 | DBI | DM |
| MRS_W2 | DBI | X |
| MRS_W0 | CRC | DM |
| MRS_W1 | CRC | X |
| MRS_W2 | X | DM |
| MRS_W2 | X | X |

FIG. 64

| SEL | P11 | P12 |
|---|---|---|
| MRS_R0 | DBI | CRC |
| MRS_R1 | DBI | X |
| MRS_R2 | X | CRC |
| MRS_R3 | X | X |

FIG. 65

| SEL | WRITE | | READ | |
|---|---|---|---|---|
| | P11 | P12 | P11 | P12 |
| MRS_0 | DBI | CRC | DBI | CRC |
| MRS_1 | DBI | CRC | DBI | X |
| MRS_2 | DBI | CRC | X | CRC |
| MRS_3 | DBI | CRC | X | X |
| MRS_4 | DBI | DM | DBI | CRC |
| MRS_5 | DBI | DM | DBI | X |
| MRS_6 | DBI | DM | X | CRC |
| MRS_7 | DBI | DM | X | X |
| MRS_8 | DBI | X | DBI | CRC |
| MRS_9 | DBI | X | DBI | X |
| MRS_10 | DBI | X | X | CRC |
| MRS_11 | DBI | X | X | X |
| MRS_12 | CRC | DM | DBI | CRC |
| MRS_13 | CRC | DM | DBI | X |
| MRS_14 | CRC | DM | X | CRC |
| MRS_15 | CRC | DM | X | X |
| MRS_16 | CRC | X | DBI | CRC |
| MRS_17 | CRC | X | DBI | X |
| MRS_18 | CRC | X | X | CRC |
| MRS_19 | CRC | X | X | X |
| MRS_20 | DM | X | DBI | CRC |
| MRS_21 | DM | X | DBI | X |
| MRS_22 | DM | X | X | CRC |
| MRS_23 | DM | X | X | X |
| MRS_24 | X | X | DBI | CRC |
| MRS_25 | X | X | DBI | X |
| MRS_26 | X | X | X | CRC |
| MRS_27 | X | X | X | X |

SEMICONDUCTOR DEVICE, CONTROLLER ASSOCIATED THEREWITH, SYSTEM INCLUDING THE SAME, AND METHODS OF OPERATION

CROSS-REFERENCE TO RELATED APPLICATIONS

This application claims the benefit of (1) Korean Patent Application No. 10-2009-0129137, filed on Dec. 22, 2009, in the Korean Intellectual Property Office, (2) U.S. Provisional Application No. 61/302,254 filed Feb. 8, 2010 in the U.S. Patent Office, and (3) U.S. Provisional Application No. 61/369,968 filed Aug. 2, 2010 in the U.S. Patent Office; the disclosures of all of which are incorporated herein in their entirety by reference.

BACKGROUND

The inventive concepts relates to semiconductor devices.

In order to increase the operating speed of a semiconductor device, not only the operating frequency of the semiconductor device has continuously been increased but also the number of data bits that are input thereto or output therefrom is increased. Accordingly, the total number of pads arranged in the semiconductor device has continuously been increased.

SUMMARY

Embodiment relates to one or more of a semiconductor device, controller associated therewith, system including the same, and methods of operation.

For example, in one embodiment of the semiconductor device, the semiconductor device includes a data control unit configured to selectively process data for writing to a memory. The data control unit is configured to enable a processing function from a group of processing functions based on a mode register command during a write operation, and the group of processing functions includes at least three processing functions. The group of processing functions may include a first function, a bus inversion function, and a data masking function. A pin may be associated with the group of functions, and the data control unit is configured to selectively perform the enabled processing function based on a signal received on the pin.

Another embodiment of the semiconductor device includes a data control unit configured to process data read from a memory. The data control unit is configured to enable a processing function from a group of processing functions based on a mode register command during a read operation, and the group of processing functions includes at least two processing functions. The group of processing functions may include a first function and a bus inversion function. A pin may be associated with the group of functions, and the data control unit is configured to selectively output a signal on the pin based on performance of the enabled processing function.

In yet another embodiment, the semiconductor device includes a data control unit configured to selectively process data for writing to a memory and configured to selectively process data read from the memory. The data control unit is configured to enable a processing function from a first group of processing functions based on a first mode register command during a write operation, and the data control unit is configured to enable a processing function from a second group of processing functions based on a second mode register command during a read operation. The first group of processing functions includes a first function, a data bus inversion function, and a data masking function. The second group of processing functions includes the first function and the data bus inversion function. A pin is associated with the first function, the data bus inversion function, and the data masking function.

In a further embodiment, the semiconductor device includes a dedicated pin configured to support a group of processing functions selectively performed by a data control unit with respect to a memory write operation. The group includes a first function, a data bus inversion function, and a data masking function.

In a still further embodiment, the semiconductor device includes a dedicated pin configured to support a group of processing functions selectively performed by a data control unit with respect to a memory read operation. Here, the group includes a first function and a data bus inversion function.

Another embodiment of the semiconductor device includes a dedicated pin configured to support a group of processing functions selectively performed by a data control unit with respect to a memory read operation and a memory write operation. The group includes a first function, a data bus inversion function, and a data masking function.

In an additional embodiment, the semiconductor device includes a pin associated with a group of data processing functions and a data processing unit configured to selectively enable a processing function from group of processing functions based on a signal received by the pin during a write operation to a memory. The data processing unit is configured to selectively perform the enabled processing function based on the signal received by the pin. The group of processing functions may include a first function and a bus inversion function.

In one embodiment, the semiconductor device includes a data control unit configured to process data for writing to a memory. The data control unit is configured to disable all processing functions from a group of processing functions during a write operation based on a mode register command. The group of processing functions includes a data bus inversion function and a data masking function.

In another embodiment, the semiconductor device includes a data control unit configured to process data for writing to a memory, and the data control unit is configured to enable a processing function from a group of processing functions based on a mode register command during a write operation. The group of processing functions includes an error checking function.

In an embodiment of the memory system, the memory system includes a memory device and a memory controller. The memory device includes a pin associated with a group of processing functions and a data control unit configured to selectively process data for writing to a memory. The data control unit is configured to enable a processing function from a group of processing functions based on a first mode register command during a write operation. The group of processing functions includes at least three processing functions, and the data control unit is configured to selectively perform an enabled processing function based on an operation signal received on the pin. The memory controller is configured to generate and output the operation signal to the pin. For example, the memory controller may include one or more data processing units configured to generate the operation signal.

In an embodiment of the memory controller, the memory controller includes a data control unit configured to selectively process data for writing to a memory. The data control unit is configured to enable a processing function from a group of processing functions based on a mode register command during a write operation. The group of processing functions including at least three processing functions, and the data control unit is configured to output an operation signal based on the enabled processing function. For example, the operation signal is output to a pin of a semiconductor device. The pin supports the group of processing functions at the semiconductor device.

In an embodiment of the method, the method includes enabling a processing function from a group of processing functions based on a mode register command during a write operation. The group of processing functions includes at least three processing functions. The method further includes receiving a signal on a pin associated with the group of processing functions, and selectively performing the enabled processing function based on the received signal.

BRIEF DESCRIPTION OF THE DRAWINGS

Exemplary embodiments of the inventive concepts will be more clearly understood from the following detailed description taken in conjunction with the accompanying drawings in which:

FIG. 60 is a table showing the relationship between selection information and a first pad according to an embodiment of the inventive concepts;

FIG. 61 is a table showing the relationship between selection information and a first pad P1 according to another embodiment of the inventive concepts;

FIG. 62 is a table showing the relationship between selection information and a first pad P1 according to another embodiment of the inventive concepts;

FIG. 63 is a table showing the relationship between selection information and a first pad P1 according to another embodiment of the inventive concepts;

FIG. 64 is a table showing the relationship between selection information and a first pad P1 according to another embodiment of the inventive concepts;

FIG. 65 is a table showing the relationship between selection information and a first pad. P1 according to another embodiment of the inventive concepts;

DETAILED DESCRIPTION OF THE EMBODIMENTS

Figure 1:
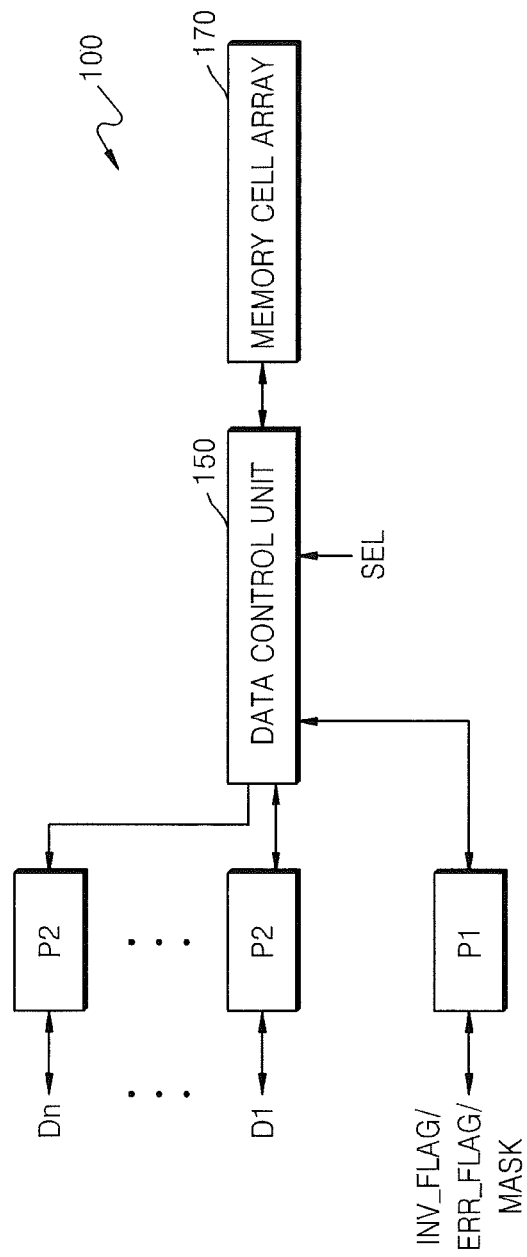
FIG. 1 is a block diagram of a semiconductor device according to an embodiment of the inventive concepts.

Example embodiments of the invention will be described below in more detail with reference to the accompanying drawings such that those skilled in the art could easily practice the scope of the inventive concepts. The inventive concepts may, however, be embodied, in different forms and should not be construed as limited to the example embodiments set forth herein. Rather, these example embodiments are provided so that this disclosure will be thorough and complete, and will fully convey the scope of the inventive concepts to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that the spatially relative terms are intended to encompass different orientations of the device in use or operation in addition to the orientation depicted in the figures. The figures are intended to depict example embodiments of the invention and should not be interpreted to limit the intended scope of the claims. The accompanying figures are not to be considered as drawn to scale unless explicitly noted.

The terminology used herein is for the purpose of describing particular example embodiments only and is not intended to be limiting of the example embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures (FIGS.). For example, two FIGS. shown in succession may in fact be executed substantially concurrently or may sometimes be executed in the reverse order, depending upon the functionality/acts involved.

When it is determined that a detailed description related to a related known function or configuration may make the purpose of the example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

FIG. 1 is a block diagram of a semiconductor device 100 according to an embodiment of the inventive concepts. Referring to FIG. 1, the semiconductor device 100 may include a first pad P1 and a data control unit 150.

The first pad P1 may be connected to a data control unit 150 and may output a data inversion flag INV_FLAG, an error check flag ERR_FLAG, or a masking signal MASK. The data inversion flag INV_FLAG may be a signal indicating whether the data control unit 150 is to invert input data. The error check flag ERR_FLAG may be a signal indicating whether the data control unit 150 is to perform error checking on the input data. The masking signal MASK may be a signal indicating whether the data control unit 150 is to mask the input data.

The data control unit 150 may control the input data according to at least one signal of selection information SEL and the signal output from the first pad P1. The selection information SEL may be defined according to a mode register set (MRS) command. The selection information SEL will be described in detail while various embodiments of the semiconductor device 100 of FIG. 1 according to the inventive concepts are described with reference to FIGS. 2 to 5. That is, the data control unit 150 may determine whether the input data is to be inverted according to at least one of the selection information SEL and the data inversion flag INV_FLAG, may determine whether the input data is to be error checked according to at least one of the selection information SEL and the error check flag ERR_FLAG, or may determine whether the input data is to be masked according to at least one of the selection information SEL and the masking signal MASK.

For example, if the semiconductor device 100 performs a write operation, then the data control unit 150 may determine whether the input data is to be inverted according to the selection information SEL and the data inversion flag INV_FLAG, may determine whether the input data is to be error checked according to the selection information SEL and the error check flag ERR_FLAG, or may determine whether the input data is to be masked according to the selection information SEL and the masking signal MASK. As will be further appreciated, selection information SEL may not enable any of the data processing functions during a write operation. Stated another way, the data processing functions are all disabled. If the semiconductor device 100 performs a read operation, according to the selection information SEL, the data control unit 150 may determine whether read data is to be inverted and whether the data inversion flag INV_FLAG is to be generated, or may determine whether the read data is to be error checked and whether the error check flag ERR_FLAG is to be generated. Hereinafter it is assumed that the data control unit 150 does not mask the read data during a read operation, but the inventive concepts is not limited thereto and the data control unit 150 may determine whether the read data is to be masked and whether the masking signal MASK is to be generated, during a read operation. As will be further appreciated, selection information SEL may not enable any of the data processing functions during a read operation. Stated another way, the data processing functions are all disabled.

In the current embodiment, the semiconductor device 100 may further include a plurality of second pads P2 and a memory cell array 170.

The plurality of second pads P2 may be connected to the data control unit 150 and may be used to transmit n-bit data D1, . . . , through to Dn (n denotes a natural number equal to or greater than '2'). That is, the plurality of second pads P2 may transmit the data D1, . . . , through to Dn received from the outside of the semiconductor device 100 to the data control unit 150 or may transmit the D1, . . . , through to Dn which are read from the memory cell array 170 and are controlled by the data control unit 150, to the outside of the semiconductor device 100.

Various embodiments of the structure and operation of the semiconductor device 100 of FIG. 1 according to the inventive concepts will now be described with reference to FIGS. 2 to 5.

Figure 2:
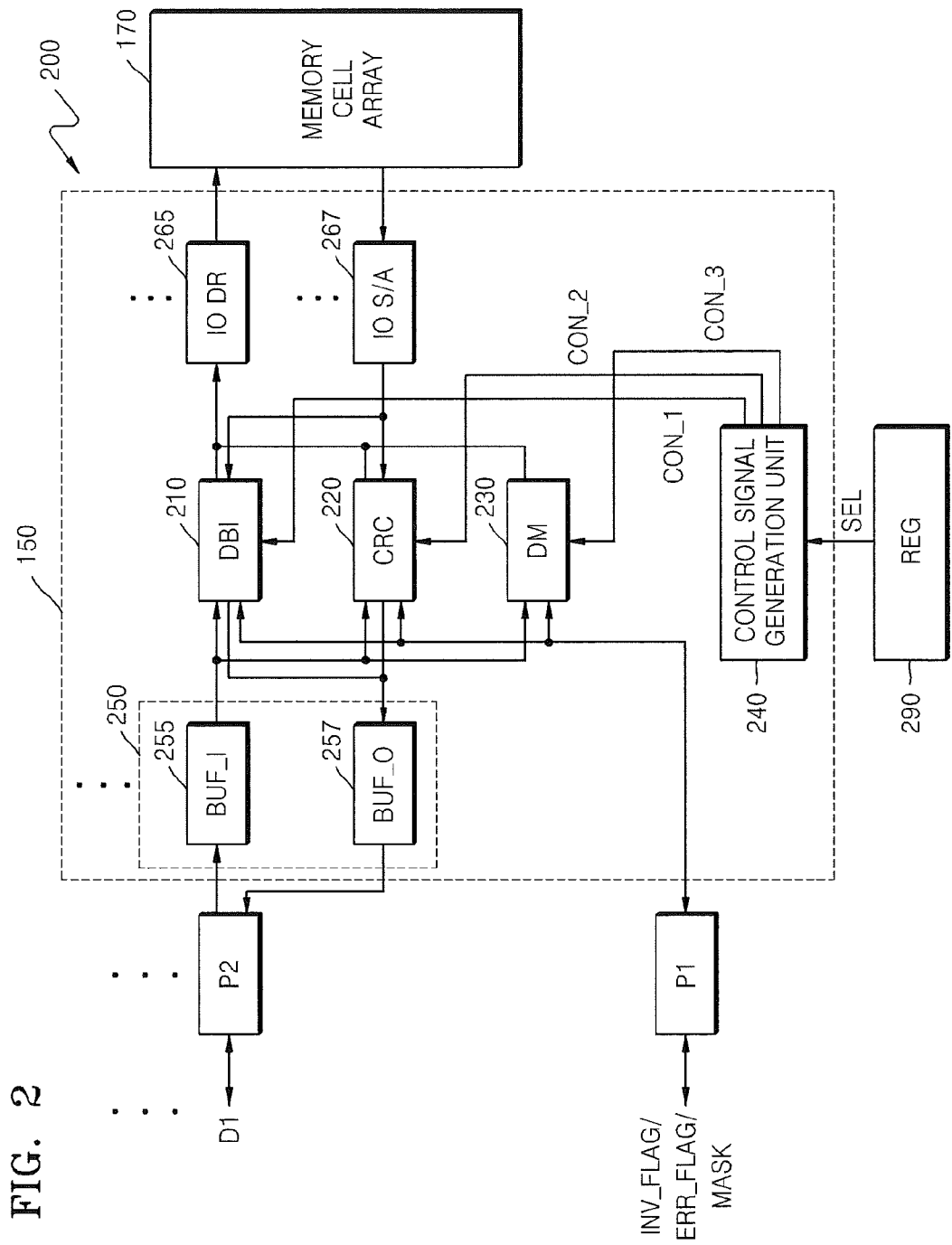
FIG. 2 is a block diagram of a semiconductor device that is another embodiment of the semiconductor device of FIG. 1, according the inventive concepts.

FIG. 2 is a block diagram of a semiconductor device 200 that is another embodiment of the semiconductor device 100 of FIG. 1, according the inventive concepts. In FIG. 2, a first pad P1, a plurality of second pads P2, and a memory cell array 170 have been described above with reference to FIG. 1.

Referring to FIGS. 1 and 2, a data control unit 150 may include a control signal generation unit 240, a plurality of buffer units 250, a plurality of driving units 265, a plurality of sense amplification units 267, a data bus inversion (DBI) unit 210, an error check unit 220, and a data masking (DM) unit 230.

The control signal generation unit 240 may generate a first control signal CON_1, a second control signal CON_2, or a third control signal CON_3 and then supply the generated signal to the DBI unit 210, the error check unit 220, or the DM unit 230, according to selection information SEL. Here, it is assumed that the first control signal CON_1 controls the DBI unit 210 to be enabled or disabled, the second control signal CON_2 controls the error check unit 220 to be enabled or disabled, and the third control signal CON_3 controls the DM unit 230 to be enabled or disabled.

The selection information SEL may be stored in a register 290. For example, the selection information SEL may be defined according to an MRS command stored in the register 290. That is, the control signal generation unit 240 may generate the first control signal CON_1, the second control signal CON_2, or the third control signal CON_3 according to the MRS command stored in the register 290.

Each of the plurality of buffer units 250 may be connected among the DBI unit 210, the error check unit 220, and the DM unit 230, and a corresponding second pad P2. Each of the plurality of buffer units 250 may include an input buffer 255 and an output buffer 257. Each of the plurality of buffer units 250 may buffer one of the data D1, . . . , Dn received via the corresponding second pad P2, and may transmit the buffering result to the DBI unit 210, the error check unit 220, and the DM unit 230.

The plurality of driving units 265 and the plurality of sense amplification units 267 may be connected between at least one selected from among the DBI unit 210, the error check unit 220, and the DM unit 230 and the memory cell array 170. Each of the plurality of driving units 265 may write data received from one of the DBI unit 210, the error check unit 220, and the DM unit 230 to a corresponding memory cell of the memory cell array 170. Each of the plurality of sense amplification units 267 may sense and amplifies data received from a corresponding memory cell of the memory cell array 170 and transmit the amplified data to the DBI unit 210 and the error check unit 220.

The DBI unit 210 is used when a data inversion scheme is employed. For example, a method of inverting and transmitting the n-bit data D1, . . . through to Dn of FIG. 1 when the number of bits that are logic 'high' is greater than the number of bits that are logic 'low' from among the n-bit data D1, . . . through to Dn, is referred to as the data inversion scheme. The DBI unit 210 may be constructed in various ways and the structure thereof will not be described here.

When the semiconductor device 200 performs a write operation, the DBI unit 210 may invert data received from the input buffer 255 of one of the plurality of buffer units 250, and output the inverting result to one of the plurality of driving units 265, according to the first control signal CON_1 and a data inversion flag INV_FLAG. When the semiconductor device 200 performs a read operation, then according to the first control signal CON_1, the DBI unit 210 may invert data, which is read from the memory cell array 170 and is sensed and amplified by one of the sense amplification units 267, supply the inverted data to the output buffer 257 of one of the plurality of buffer units 250, generate the data inversion flag INV_FLAG, and supply the data inversion flag INV_FLAG to the first pad P1. That is, the DBI unit 210 may be enabled or disabled according to the first control signal CON_1.

The error check unit 220 is used when an error check scheme is employed. The error check scheme allows determination as to whether an error occurs during data transmission. For example, according to the error check scheme, the n-bit data D1, . . . through to Dn may be transmitted together with a parity bit that is logic 'high' when the number of bits that are logic 'high' is an odd number from among the n-bit data and may be transmitted together with a parity bit that is logic 'low' when the number of the bits that are logic 'high' is an even number, so that whether an error occurs during data transmission may be determined. The error check unit 220 may be constructed in various ways and the structure thereof will not be described here.

When the semiconductor device 200 performs the write operation, the error check unit 220 may perform error checking on data received from the input buffer 255 of one of the plurality of buffer units 250, according to the second control signal CON_2 and the error check flag ERR_FLAG. If the semiconductor device 200 performs the read operation, according to the second control signal CON_2, the error check unit 220 may perform error checking on data, which is read from the memory cell array 170 and is sensed and amplified by one of the plurality of sense amplification units 267, provide the amplified data to the output buffer 257 of one of the plurality of buffer units 250, generate the error check flag ERR_FLAG and output the error check flag ERR_FLAG to the first pad P1. That is, the error check unit 220 may be enabled or disabled according to the second control signal CON_2.

The DM unit 230 is used when a data masking scheme is employed. According to the data masking scheme, if data that is in the same logic state as data stored in the memory cell array 170 is to be written to the memory cell array 170, then a masking operation is performed to not transmit the data. The DM unit 230 may be constructed in various ways and the structure thereof will not be described here.

When the semiconductor device 200 performs the write operation, the DM, unit 230 may not transmit data received from the input buffer 255 of one of the plurality of buffer units 250 to the memory cell array 170, according to the third control signal CON_3 and the masking signal MASK. As described above, it is assumed that the data control unit 150 does not mask read data while the semiconductor device 200 performs a read operation. Thus, the DM unit 230 does not operate while the semiconductor device 200 performs the read operation. That is, the DM unit 230 may be enabled or disabled according to the third control signal CON_3.

The operation of the semiconductor device 200 of FIG. 2 according to an embodiment of the inventive concepts will now be described in detail. For convenience of explanation, it is assumed that in a data inversion mode, the semiconductor device 200 may invert input data and write it to the memory cell array 170 or may invert and output data read from the memory cell array 170; in an error check mode, the semiconductor device 200 may perform error checking on data that is to be written or that is read; and in a data masking mode, the semiconductor device 200 may not transmit data that is to be written to the memory cell array 170 or may not transmit the read data to the plurality of second pads P2. For convenience of explanation, it is assumed that in the current embodiment, the 1-bit data D1 from among the n-bit data D1, . . . , through to Dn is to be written or is to be read but the other data may also be written or read similar to the way the 1-bit data D1 is written or read.

First, a case where the semiconductor device 200 performs the write operation in the data inversion mode will be described. In the data inversion mode, according to the selection information SEL, the control signal generation unit 240 generates the first control signal CON_1 but does not generate the second and third control signals CON_2 and CON_3. Thus, the DBI unit 210 is enabled according to the first control signal CON_1 and both the error check unit 220 and the DM unit 230 are disabled.

If the data D1 is supplied sequentially to one of the plurality of second pads P2 and the buffer unit 250 of one of the plurality of buffer units 250 and finally to the DBI unit 210 and the data inversion flag INV_FLAG is supplied to the DBI unit 210 via the first pad P1, then the DBI unit 210 inverts the data D1 and transmits the inverting result to one of the plurality of driving units 265. If the data inversion flag INV_FLAG is not supplied to the first pad P1, the DBI unit 210 does not invert the data D1 and transmits the data D1 directly to one of the plurality of driving units 265.

A case where the semiconductor device 200 performs the read operation in the data inversion mode will now be described. In the data inversion mode, according to the selection information SEL, the control signal generation unit 240 generates the first control signal CON_1 but does not generate the second and third control signals CON_2 and CON_3. Thus, the DBI unit 210 is enabled according to the first control signal CON_1 and both the error check unit 220 and the DM unit 230 are disabled.

The DBI unit 210 may determine whether the data, which is received from the memory cell array 170 and is sensed and amplified by one of the plurality of sense amplification units 267, is to be inverted according to the first control signal CON_1. That is, if the DBI unit 210 inverts the amplified data and supplies the inverting result to the output buffer 257 of one of the plurality of buffer units 250, then the DBI unit 210 generates the data inversion flag INV_FLAG indicating that the read data has been inverted and transmits the data inversion flag INV_FLAG to the first pad P1. If the DBI unit 210 does not invert the read data and outputs the read data directly to the sense amplification unit 260, then the DBI unit 210 does not generate the data inversion flag INV_FLAG.

A case where the semiconductor device 200 performs the write operation in the error check mode will be described. In the error check mode, according to the selection information SEL, the control signal generation unit 240 generates the second control signal CON_2 but does not generate the first and third control signals CON_1 and CON_3. Thus, the error check unit 220 is enabled according to the second control signal CON_2 and both the DBI unit 210 and the DM unit 230 are disabled.

If the data D1 is transmitted sequentially to one of the plurality of second pads P2 and the input buffer 255 of one of the plurality of buffer units 250 and finally to the error check unit 220 and the error check flag ERR_FLAG is input to the error check unit 220 via the first pad P1, then the error check unit 220 performs error checking on the data D1. If the error check flag ERR_FLAG is not input to the first pad P1, the error check unit 220 does not perform error checking on the data D1 and transmits the data D1 directly to one of the plurality of driving units 265. Then, the driving unit 265 writes the data D1 to the memory cell array 170.

A case where the semiconductor device 200 performs the read operation in the error check mode will be described. In the error check mode, according to the selection information SEL, the control signal generation unit 240 generates the second control signal CON_2 but does not generate the first and third control signals CON_1 and CON_3. Thus, the error check unit 220 is enabled according to the second control signal CON_2 and both the DBI unit 210 and the DM unit 230 are disabled.

The error check unit 220 may determine whether the data sensed and amplified by one of the plurality of sense amplification units 267 is to be error checked, according to the second control signal CON_2. That is, if the error check unit 220 performs error checking on the amplified data and provides the amplified data to the output buffer 257 of one of the plurality of buffer units 250, then the error check unit 220 generates the error check flag ERR_FLAG indicating that the read data has been error checked and transmits the error check flag ERR_FLAG to the first pad P1. If the error check unit 220 does not perform error checking and outputs the amplified data to the output buffer 257, then the error check unit 220 does not generate the error check flag ERR_FLAG.

A case where the semiconductor device 200 performs the write operation in the data masking mode will be described. In the data masking mode, according to the selection information SEL, the control signal generation unit 240 generates the third control signal CON_3 but does not generate the first and second control signals CON_1 and CON_2. Thus, the DM unit 230 is enabled according to the third control signal CON_3 and the DBI unit 210 and the error check unit 220 are disabled.

If the data D1 is input sequentially to the second pad P2 and the input buffer 255 of the buffer unit 250 and finally to the DM unit 230 and the masking signal MASK is input to the DM unit 230 via the first pad P1, then the DM unit 230 does not transmit the data D1 to the driving unit 265. If the masking signal MASK is not input to the first pad P1, the DM unit 230 transmits the data D1 to driving unit 265 and the driving unit 265 writes the data D1 to the memory cell array 170.

Figure 3:
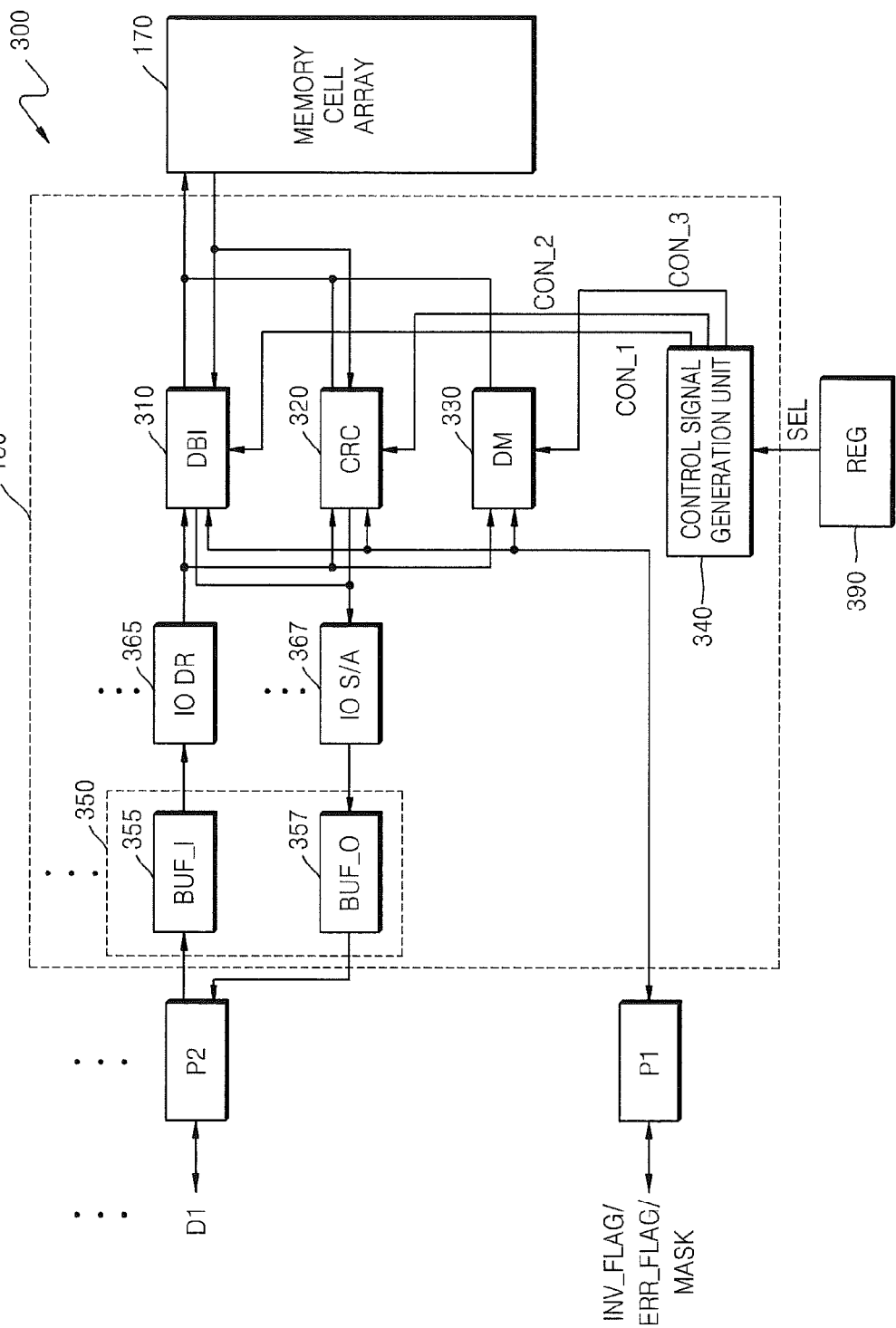
FIG. 3 is a block diagram of a semiconductor device that, is another embodiment of the semiconductor device of FIG. 1, according the inventive concepts.

FIG. 3 is a block diagram of a semiconductor device 300 that is another embodiment of the semiconductor device 100 of FIG. 1, according the inventive concepts. In FIG. 3, a first pad P1, a plurality of second pads P2, and a memory cell array 170 have been described above with reference to FIG. 1.

Referring to FIGS. 1 to 3, a data control unit 150 may include a control signal generation unit 340, a plurality of buffer units 350, a plurality of driving units 365, a plurality of sense amplification units 367, a DBI unit 310, an error check unit 320, and a DM unit 230. Similar to the control signal generation unit 240, the control signal generation unit 340 may generate a first control signal CON_1, a second control signal CON_2, or a third control signal CON_3 and then supply the generated signal to the DBI unit 310, the error check unit 320, or the DM unit 330, according to selection information SEL.

The selection information SEL may be stored in a register 390. For example, the selection information SEL may be defined according to an MRS command stored in the register 390. That is, the control signal generation unit 340 may generate the first control signal CON_1, the second control signal CON_2, or the third control signal CON_3 according to the MRS command stored in the register 390.

Each of the plurality of buffer units 350 may be connected between a corresponding second pad P2 and a corresponding driving unit 365. Each of the plurality of buffer units 350 may include an input buffer 355 and an output buffer 357. The input buffer 355 may buffer, for example, data D1 received via the corresponding second pad P2 and transmit the buffering result to the corresponding driving unit 365. The output buffer 357 may buffer data received from one of the plurality of sense amplification units 367 and transmit the buffering result to the corresponding second pad P2.

Each of the plurality of driving units 365 and the plurality of sense amplification units 367 may be connected between at least one from among the DBI unit 310, the error check unit 320, and the DM unit 330 and a corresponding buffer unit 350 from among the plurality of buffer units 350. Each of the plurality of driving units 365 may transmit data received from the input buffer 355 of the corresponding buffer unit 350 to the DBI unit 310, the error check unit 320, and the DM unit 330. Each of the plurality of sense amplification units 367 may sense and amplify data received from the DBI unit 310, the error check unit 320, and the DM unit 330, and transmit the output to the corresponding buffer 357 of the buffer unit 350. The DBI unit 310 may invert received data and output the inverting result according to the first control signal CON_1. In detail, if the semiconductor device 300 performs a write operation, then the DBI unit 310 may invert, for example, data D1 received from one of the plurality of driving units 365 and write the inverting result to a corresponding memory cell of the memory cell array 170, according to the first control signal CON_1 and a data inversion flag INV_FLAG. When the semiconductor device 300 performs a read operation, according to the first control signal CON_1, the DBI unit 310 may invert data received from the corresponding memory cell of the memory cell array 170, transmit the inverting result to one of the plurality of sense amplification units 367, generate the data inversion flag INV_FLAG, and transmit the data inversion flag INV_FLAG to the first pad P1. The structure and operation of the DBI unit 310 are similar to those of the DBI unit 210 of FIG. 2.

The error check unit 320 may perform error checking on received data and then output the data, according to the second control signal CON_2. In detail, if the semiconductor device 300 performs the write operation, then the error check unit 320 may perform error checking on data received from one of the plurality of driving units 365 and write the data to a corresponding memory cell of the memory cell array 170, according to the second control signal CON_2 and an error check flag ERR_FLAG. If the semiconductor device 300 performs the read operation, then according to the second control signal CON_2, the error check unit 320 may buffer and perform error checking on data received from the corresponding memory cell of the memory cell array 170, transmit the data to one of the plurality of second pads P2, generate the error check flag ERR_FLAG, and transmit the error check flag ERR_FLAG to the first pad P1. The structure and operation of the error check unit 320 are similar to those of the error check unit 220 of FIG. 2.

The DM unit 330 may mask received data according to the third control signal CON_3. In detail, if the semiconductor device 300 performs the write operation, then the DM unit 330 may mask the data received from one of the plurality of driving units 365, according to the third control signal CON_3 and a masking signal MASK. As described above with reference to FIGS. 1 and 2, it is assumed that in the current embodiment, the data control unit 150 does not mask read data while the semiconductor device 300 performs a read operation. Thus, the DM unit 330 does not operate while the semiconductor device 300 performs a read operation. The structure and operation of the DM unit 330 are similar to those of the DM unit 230 of FIG. 2.

The operation of the semiconductor device 300 of FIG. 3 according to an embodiment of the inventive concepts will now be described in detail. The operations of the DBI unit 310, the error check unit 320, and the DM unit 330 of FIG. 3 are similar to those of the DBI unit 210, the error check unit 220, and the DM unit 230 of FIG. 2, respectively, and thus will be described briefly.

First, if the semiconductor device 300 is in the data inversion mode, the control signal generation unit 340 generates only the first control signal CON_1 according to the selection information SEL, and thus, only the DBI unit 310 is enabled according to the first control signal CON_1, as described above with reference to FIG. 2. If the semiconductor device 300 performs the write operation, the DBI unit 310 inverts data received from one of the plurality of driving units 365 and writes the data to a corresponding memory cell of the memory cell array 170, according to the data inversion flag INV_FLAG. If the semiconductor device 300 performs the read operation, the DBI unit 310 may invert data received from the corresponding memory cell of the memory cell array 170, transmit the inverting result to one of the plurality of second pads P2, generate the data inversion flag INV_FLAG, and transmit the data inversion flag INV_FLAG to the first pad P1, according to the first control signal CON_1.

If the semiconductor device 300 is in the error check mode, the control signal generation unit 340 generates only the second control signal CON_2 according to the selection information SEL, and thus, only the error check unit 320 is enabled according to the second control signal CON_2, as described above with reference to FIG. 2. If the semiconductor device 300 performs the write operation, the error check unit 320 may perform error checking on data received from one of the plurality of driving units 365 and write the data to a corresponding memory cell of the memory cell array 170, according to the error check flag ERR_FLAG. If the semiconductor device 300 performs the read operation, the error check unit 320 may perform error checking on data received from the corresponding memory cell of the memory cell array 170, transmit the data to one of the plurality of sense amplification units 367, generate the error check flag ERR_FLAG, and transmit the error check flag ERR_FLAG to the first pad P1, according to the second control signal CON_2.

If the semiconductor device 300 is in the data masking mode, the control signal generation unit 340 generates only the third control signal CON_3 according to the selection information SEL, and thus, only the DM unit 330 is enabled according to the third control signal CON_3, as described above with reference to FIG. 2. If the semiconductor device 300 performs the write operation, the DM unit 330 may not write data received from one of the plurality of driving units 365 to the corresponding memory cell of the memory cell array 170, according to the masking signal MASK. As described above, it is assumed that the data control unit 150 does not mask read data while the semiconductor device 300 performs a read operation. Thus, the DM unit 330 does not operate while the semiconductor device 300 performs the read operation.

Figure 4:
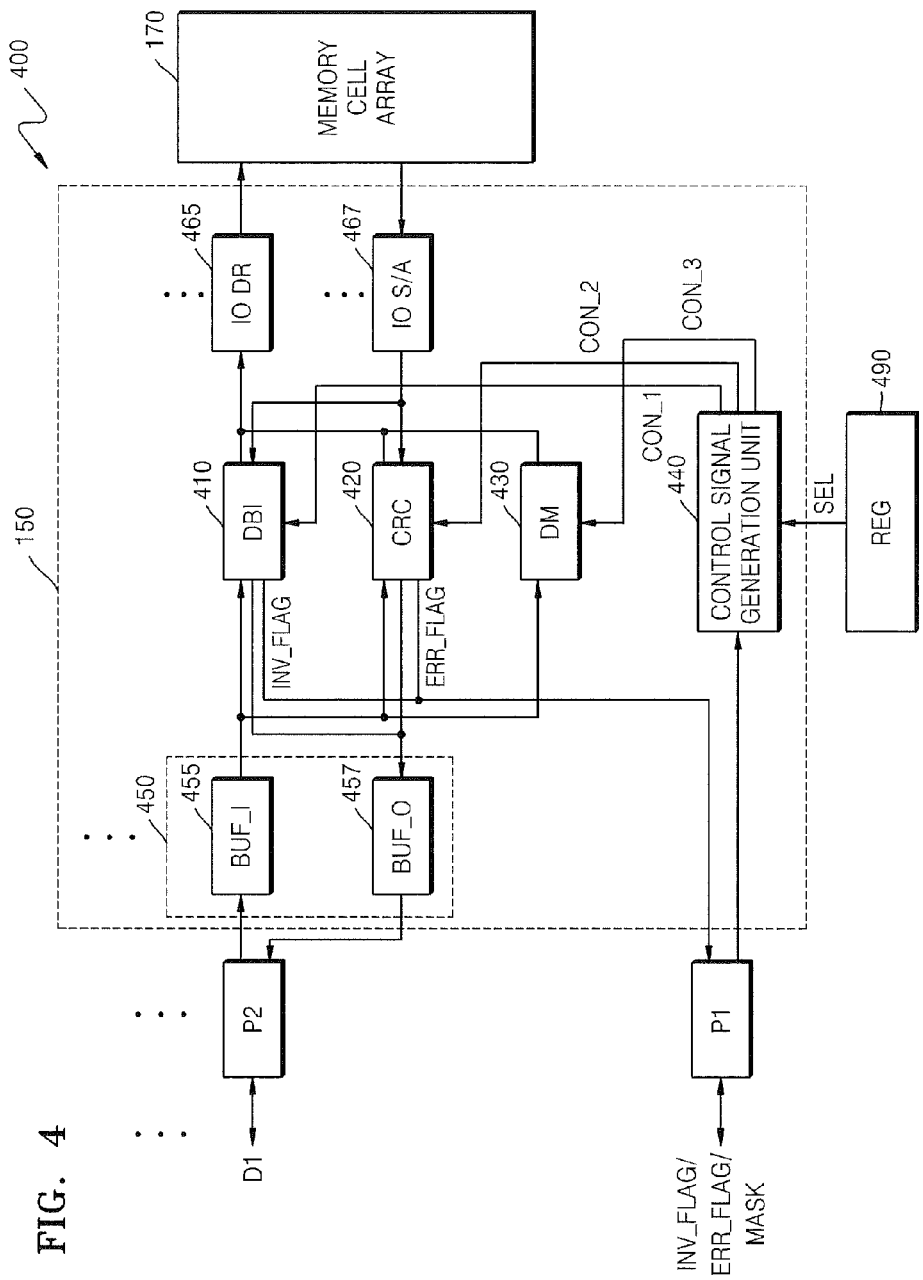
FIG. 4 is a block diagram of a semiconductor device that is another embodiment of the semiconductor device of FIG. 1, according the inventive concepts.

FIG. 4 is a block diagram of a semiconductor device 400 that is another embodiment of the semiconductor device 100 of FIG. 1, according the inventive concepts. In FIG. 4, a first pad P1, a plurality of second pads P2, and a memory cell array 170 have been described above with reference to FIG. 1.

Referring to FIGS. 1 to 4, a data control unit 150 may include a control signal generation unit 440, a plurality of buffer units 450, a plurality of driving units 465, a plurality of sense amplification units 467, a DBI unit 410, an error check unit 420, and a DM unit 430. If the semiconductor device 400 performs a write operation, the control signal generation unit 420 may generate a first control signal CON_1, a second control signal CON_2, or a third control signal CON_3 according to a selection information SEL and a signal output from the first pad P1. That is, if the semiconductor device 400 performs the write operation, the control signal generation unit 440 may generate the first control signal CON_1 according to the selection information SEL and a data inversion flag INV_FLAG, may generate the second control signal CON_2 according to the selection information SEL and an error check flag ERR_FLAG, and may generate the third control signal CON_3 according to the selection information SEL and a masking signal MASK. If the semiconductor device 400 performs a read operation, the control signal generation unit 440 may generate the first control signal CON_1, the second control signal CON_2, or the third control signal CON_3 according to the selection information SEL, similar to the control signal generation unit 240 of FIG. 2 and the control signal generation unit 340 of FIG. 3. As described above, it is assumed that in the current embodiment, the data control unit 150 does not mask read data while the semiconductor device 400 performs a read operation. The control signal generation unit 440 does not generate the third control signal CON_3 while the semiconductor device 400 performs a read operation.

The selection information SEL may be stored in a register 490. For example, the selection information SEL may be defined according to an MRS command stored in the register 490. That is, the control signal generation unit 440 may generate the first control signal CON_1, the second control signal CON_2, or the third control signal CON_3 according to the MRS command stored in the register 490.

A plurality of buffer units 450, a plurality of driving units 465, and a plurality of sense amplification units 467 are similar to the plurality of buffer units 250, the plurality of driving units 265, and the plurality of sense amplification units 267 of FIG. 2, respectively. If the semiconductor device 400 performs the read operation, the DBI unit 410, the error check unit 420, and the DM unit 430 of FIG. 4 operate similar to the way that the DBI unit 210, the error check unit 220, and the DM unit 230 of FIG. 2 operate, respectively. Accordingly, the operations of the DBI unit 410, the error check unit 420, and the DM unit 430 when the semiconductor device 400 performs the read operation, will not be described here.

The DBI unit 410 is used when the data inversion scheme described above with reference to FIG. 2 is employed. If the semiconductor device 400 performs the write operation, the DBI unit 410 may invert data received from an input buffer 455 of one of the plurality of buffer units 450 and output the inverting result to one of the plurality of driving units 465, according to the first control signal CON_1. That is, the DBI unit 410 may be enabled or disabled according to the first control signal CON_1.

The error check unit 420 is used when the error check scheme described above with reference to FIG. 2 is employed. If the semiconductor device 400 performs the write operation, the error check unit 420 may perform error checking on data received from the input buffer 455 of one of the plurality of buffer units 450 according to the second control signal CON_2. That is, the error check unit 420 may be enabled or disabled according to the second control signal CON_2.

The DM unit 430 is used when the data masking scheme described above with reference to FIG. 2 is employed. If the semiconductor device 400 performs the write operation, the DM unit 430 may not transmit data received from the input buffer 455 of one of the plurality of buffer units 450 to one of the plurality of driving units 465, according to the third control signal CON_3. That is, the DM unit 430 may be enabled or disabled according to the third control signal CON_3.

The operation of the semiconductor device 400 of FIG. 4 according to an embodiment of the inventive concepts will now be described in detail. The operation of the semiconductor device 400 of FIG. 4 according to the current embodiment will be described with respect to the data inversion mode, the error check mode, and the data masking mode that have been assumed above with reference to FIG. 2.

First, a case where the semiconductor device 400 performs the write operation in the data inversion mode will be described. In the data inversion mode, the control signal generation unit 420 may generate the first control signal CON_1 according to the selection information SEL and the signal output from the first pad P1. That is, if in the data inversion mode, the data inversion flag INV_FLAG is input to the control signal generation unit 420 via the first pad. P1, then the control signal generation unit 420 may generate the first control signal CON_1 for controlling the DBI unit 410 to invert and output data received from data received from one of the plurality of sense amplification units 460. If in the data inversion mode, the data inversion flag INV_FLAG is not input to the control signal generation unit 420 via the first pad P1, the control signal generation unit 420 may generate the first control signal CON_1 for controlling the DBI unit 410 to output the received data directly without inverting the received data. Since the control signal generation unit 420 does not generate the second control signal CON_2 and the third control signal CON_3, the error check unit 420 and the DM unit 430 are disabled.

If, for example, (1) 1-bit data D1 is input sequentially to a corresponding second pad and a corresponding buffer in the buffer unit 450 and then finally to the DBI unit 410 and (2) the data inversion flag INV_FLAG is input to the control signal generation unit 420 via the first pad P1, then the DBI unit 410 inverts the data D1 and transmits the inverting result to one of the plurality of driving units 465, according to the first control signal CON_1. If the data inversion flag INV_FLAG is not transmitted to the control signal generation unit 420 via the first pad P1, then the DBI unit 410 does not invert the data D1 and transmits the data D1 directly to the driving unit 465 according to the first control signal CON_1. Then, the driving unit 465 writes the data D1 to a corresponding memory cell of the memory cell array 170.

A case where the semiconductor device 400 performs the write operation in the error check mode will be described. In the error check mode, the control signal generation unit 420 may generate the second control signal CON_2 according to the selection information SEL and the signal output from the first pad P1. That is, if in the error check mode, the error check flag ERR_FLAG is input to the control signal generation unit 420 via the first pad P1, the control signal generation unit 420 may generate the second control signal CON_2 for controlling the error check unit 420 to perform error checking on the data received from one of the plurality of sense amplification units 467. If in the error check mode, the error check flag ERR_FLAG is not input to the control signal generation unit 420 via the first pad P1, then the control signal generation unit 420 may generate the second control signal CON_2 for controlling the error check unit 420 to output the received data directly without performing error checking thereon. Since the control signal generation unit 420 does not generate the first control signal CON_1 and the third control signal CON_3, the DBI unit 410 and the DM unit 430 are disabled.

If 1-bit data D1 is input sequentially to a corresponding second pad P2 and the input buffer 455 of a corresponding buffer unit 450, and finally to the error check unit 420 and the error check flag ERR_FLAG is input to the control signal generation unit 420 via the first pad P1, then the error check unit 420 performs error checking on the data D1 and transmit the data D1 to a corresponding driving unit 465, according to the second control signal CON_2. If the error check flag ERR_FLAG is not input to the control signal generation unit 420 via the first pad P1, then the error check unit 420 does not perform error checking on the data DATA and transmit the data D1 directly to the corresponding driving unit 465, according to the second control signal CON_2. The corresponding driving unit 465 writes the data D1 to a corresponding memory cell of the memory cell array 170. A case where the semiconductor device 400 performs the write operation in the data masking mode will be described. In the data masking mode, the control signal generation unit 420 may generate the third control signal CON_3 according to the selection information SEL and the signal output from the first pad P1. That is, if in the data masking mode, the masking signal MASK is input to the control signal generation unit 420 via the first pad P1, then control signal generation unit 420 may generate the third control signal CON_3 for controlling the DM unit 430 not to transmit data received from a corresponding sense amplification unit 467. If in the data masking mode, the masking signal MASK is not input to the control signal generation unit 420 via the first pad P1, then the control signal generation unit 420 may generate the third control signal CON_3 for controlling the DM unit 430 to transmit the data. Since the control signal generation unit 420 does not transmit the first control signal CON_1 and the second control signal CON_2, the DBI unit 410 and the error check unit 420 are disabled.

If 1-bit data D1 is input sequentially to a corresponding second pad P2 and the input buffer 455 of a corresponding buffer unit 450 and finally to the DM unit 430 and the masking signal MASK is input to the control signal generation unit 420 via the first pad P1, then the DM unit 430 does not transmit the data D1 according to the third control signal CON_3. If the masking signal MASK is not input to the control signal generation unit 420 via the first pad P1, the DM unit 430 transmits the data D1 to a corresponding driving unit 465 according to the third control signal CON_3. The corresponding driving unit 465 writes the data D1 to a corresponding memory cell of the memory cell array 170.

Figure 5:
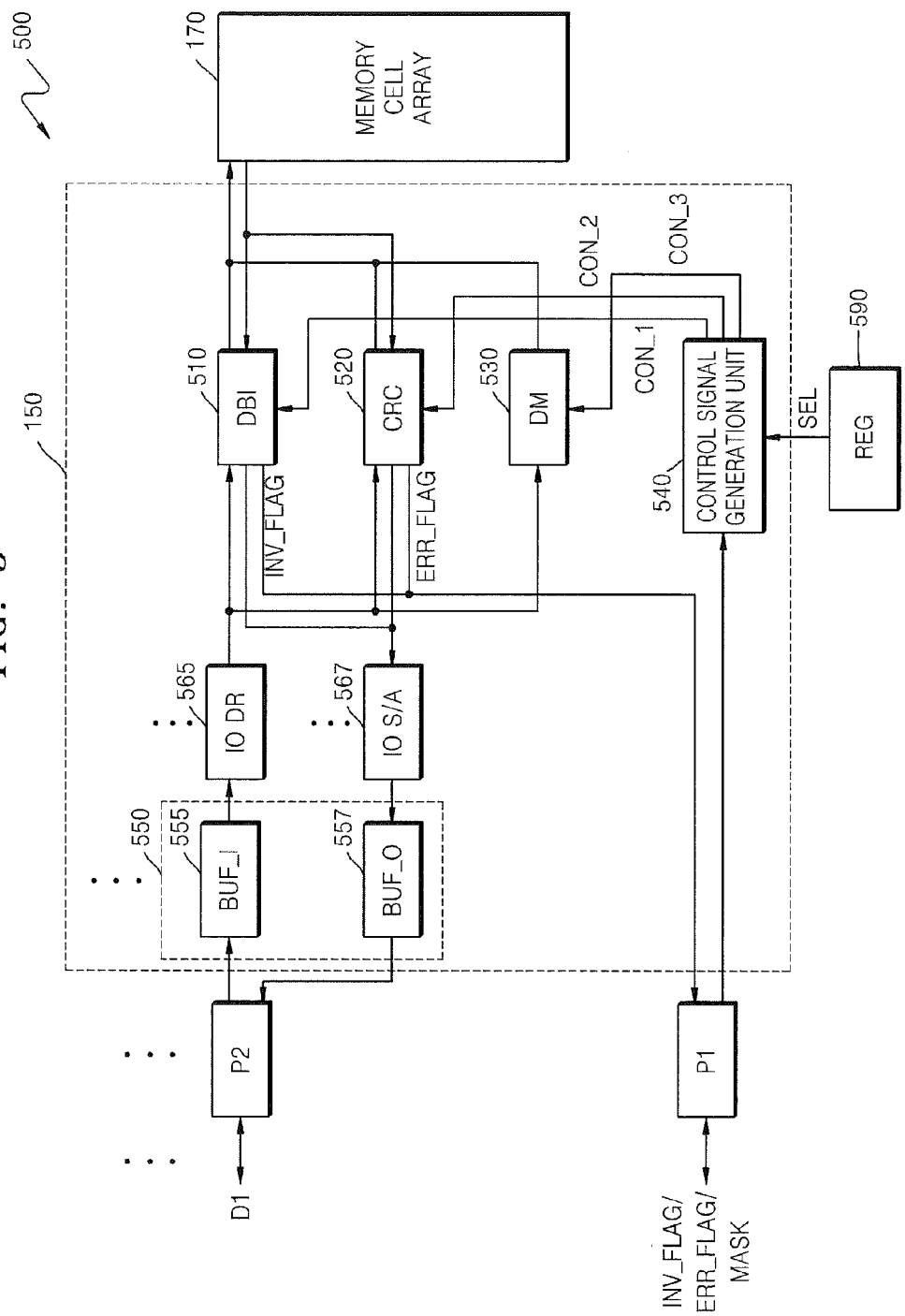
FIG. 5 is a block diagram of a semiconductor device that is another embodiment of the semiconductor device of FIG. 1, according the inventive concepts.

FIG. 5 is a block diagram of a semiconductor device 500 that is another embodiment of the semiconductor device 100 of FIG. 1, according the inventive concepts. In FIG. 5, a first pad P1, a plurality of second pads P2, and a memory cell array 170 have been described above with reference to FIG. 1.

Referring to FIGS. 1 to 5, a data control unit 150 may include a control signal generation unit 540, a plurality of buffer units 550, a plurality of driving units 565, a plurality of sense amplification units 567, a DBI unit 510, an error check unit 520, and a DM unit 530.

Similar to the control signal generation unit 440 of FIG. 4, the control signal generation unit 540 may generate a first control signal CON_1, a second control signal CON_2, or a third control signal CON_3 and then supply the generated signal to the DBI unit 510, the error check unit 520, or the DM unit 530, according to selection information SEL and a signal received from the first pad P1.

The selection information SEL may be stored in a register 590. For example, the selection information SEL may be defined according to an MRS command stored in the register 590. That is, the control signal generation unit 540 may generate the first control signal CON_1, the second control signal CON_2, or the third control signal CON_3 according to the MRS command stored in the register 590.

The plurality of buffer units 550, the plurality of driving units 565, and the plurality of sense amplification units 567 are similar to the plurality of buffer units 350, the plurality of driving units 365, and the plurality of sense amplification units 367 of FIG. 3, respectively. If the semiconductor device 500 performs a read operation as described above with reference to FIG. 4, the DBI unit 510, the error check unit 520, and the DM unit 530 of FIG. 5 operate similar to the way that the DBI unit 310, the error check unit 320, and the DM unit 330 operate, respectively. Thus, the operations of the DBI unit 510, the error check unit 520, and the DM unit 530 when the semiconductor device 500 performs the read operation will not be described here.

The DBI unit 510 may invert received data and output the inverting result according to a first control signal CON_1. More specifically, if the semiconductor device 500 performs a write operation, the DBI unit 510 may invert data received from one of the plurality of driving units 565 and writes the data to a corresponding memory cell of the memory cell array 170, according to the first control signal CON_1. The structure and operation of the DBI unit 510 are similar to those of the DBI unit 410 of FIG. 4.

The error check unit 520 may perform error checking on received data and output the data, according to the second control signal CON_2. In detail, if the semiconductor device 500 performs the write operation, the error check unit 520 may perform error checking on data received from one of the plurality of driving units 565, according to the second control signal CON_2. The structure and operation of the error check unit 520 are similar to those of the error check unit 420 of FIG. 4.

The DM unit 530 may mask received data according to the third control signal CON_3. More specifically, if the semiconductor device 500 performs the write operation, the DM unit 530 may or may not write data received from one of the plurality of driving units 565 to a corresponding memory cell of the memory cell array 1700, according to the third control signal CON_3. The structure and operation of the DM unit 530 are similar to those of the DM unit 430 of FIG. 4.

The operation of the semiconductor device 500 of FIG. 5 according to an embodiment of the inventive concepts will now be described in detail. The operations of the DBI unit 510, the error check unit 520, and the DM unit 530 are similar to those of the DBI unit 410, the error check unit 420, and the DM unit 430 of FIG. 4, respectively.

First, if the semiconductor device 500 is in the data inversion mode, the control signal generation unit 520 generates only the first control signal CON_1 according to a selection information SEL and a signal output from the first pad P1, and thus, only the DBI unit 510 is enabled according to the first control signal CON_1, as described above with reference to FIG. 5. If the semiconductor device 500 performs the write operation, the DBI unit 510 may invert data received via one of the plurality of second pads P2 and write the data to a corresponding memory cell of the memory cell array 1700, according to the first control signal CON_1.

If the semiconductor device 500 is in the error check mode, the control signal generation unit 520 generates only the second control signal CON_2 according to the selection information SEL and the signal output from the first pad P1 and only the error check unit 520 is thus enabled according to the second control signal CON_2, as described above with reference to FIG. 4. If the semiconductor device 500 performs the write operation, the error check unit 520 may perform error checking on data received via one of the plurality of second pads P2 and write the data to a corresponding memory cell of the memory cell array 1700, according to the second control signal CON_2.

Figure 6A:
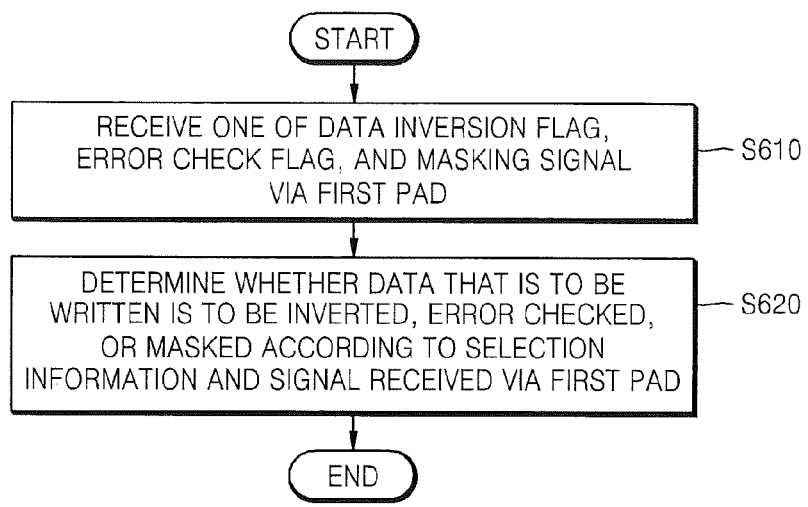
FIG. 6A is a flowchart illustrating a method of performing a write operation by using the semiconductor device of FIG. 1, according to an embodiment of the inventive concepts.

If the semiconductor device 500 is in the data masking mode, the control signal generation unit 520 generates only the third control signal CON_3 according to the selection information SEL and the signal output from the first pad P1 and only the DM unit 530 is thus enabled according to the third control signal CON_3; as described above with reference to FIG. 4. If the semiconductor device 500 performs the write operation, the DM unit 530 may not write data received via one of the plurality of second pads P2 to a corresponding memory cell of the memory cell array 1700, according to the third control signal CON_3, FIG. 6A is a flowchart illustrating a method of performing a write operation by using the semiconductor device 100 of FIG. 1, according to an embodiment of the inventive concepts. Referring to FIGS. 1 to 6A, if the semiconductor device 100 performs the write operation, a data inversion flag INV_FLAG, an error check flag ERR_FLAG, or a masking signal MASK may be received via the first pad P1 of the semiconductor device 100 (operation S610). The data control unit 150 may determine whether data that is to be written is to be inverted, error checked, or masked according to selection information SEL and a signal supplied to the first pad P1 (operation S620). The operation of the data control unit 150 when the semiconductor device 100 performs the write operation has been described above with reference to FIGS. 1 to 5.

Figure 6B:
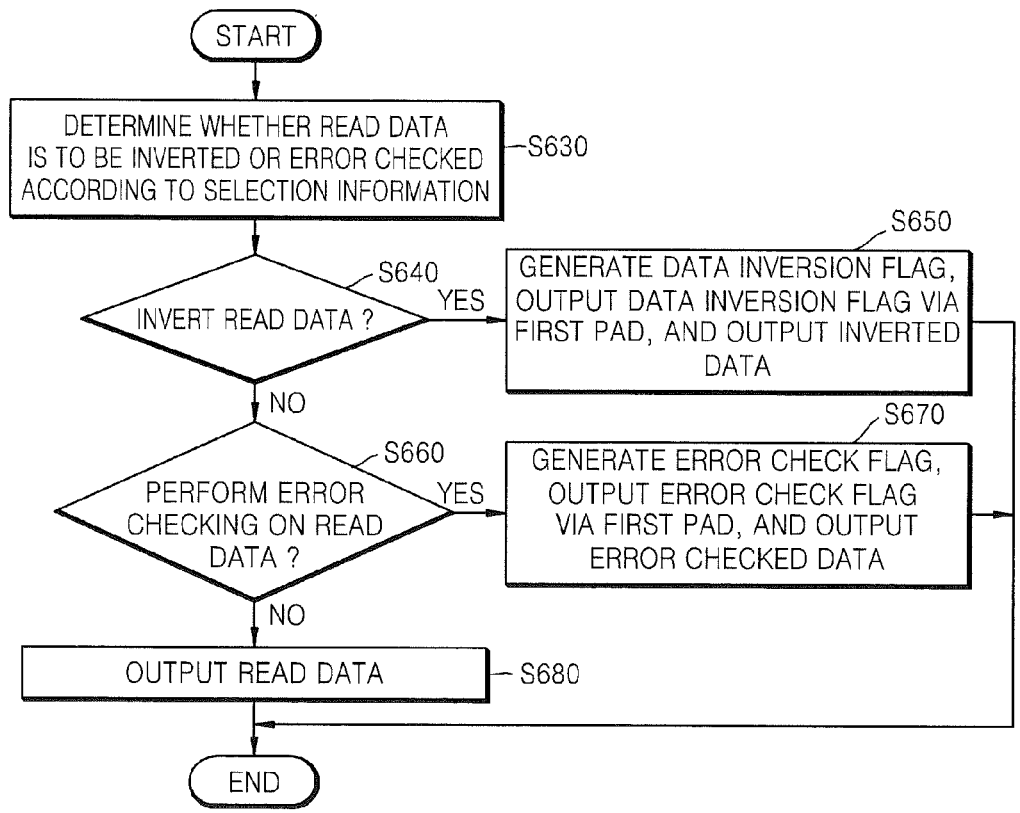
FIG. 6B is a flowchart illustrating a method of performing a read operation by using the semiconductor device of FIG. 1, according to an embodiment of the inventive concepts.

FIG. 6B is a flowchart illustrating a method of performing a read operation by using the semiconductor device 100 of FIG. 1, according to an embodiment of the inventive concepts. Referring to FIGS. 1 to 5 and 6B, while the semiconductor device 100 performs the read operation, the data control unit 150 may determine whether read data is to be inverted or error checked according to selection information SEL (operation S630). For example, the DBI unit DBI may determine that the read data is to be inverted when the number of bits of the read data that are logic 'high' is greater than half the number of the total bits of the read data, and may determine that the read data is not to be inverted when the number of the bits of the read data that are logic 'high' is less than the half the number of the total bits of the read data. If it is determined in operation S630 that the read data is not to be error checked and is to be inverted (operations S640 and S660), then the data control unit 150 generates a data inversion flag INV_FLAG, outputs the data inversion flag INV_FLAG via the first pad P1, inverts the read data, and outputs the inverting result to a corresponding second pad P2 (operation S650). If it is determined in operation S630 that the read data is not to be inverted and is to be error checked (operations S640 and S660), then the data control unit 150 generates an error check flag ERR_FLAG, outputs the error check flag ERR_FLAG via the first pad P1, performs error checking on the read data, and outputs the read data via a corresponding second pad P2 (operation S670). If it is determined in operation S630 that the read data is not to be error checked and is not to be inverted (operations S640 and S660), then the data control unit 150 does not generate the data inversion flag INV_FLAG and the error check flag ERR_FLAG, and outputs the read data via a corresponding second pad P2 (operation S680). The operation of the data control unit 150 when the semiconductor device 100 performs the read operation has been described above in detail with reference to FIGS. 1 to 5.

FIGS. 1 through 6B illustrate cases where one of the data inversion scheme, the error check scheme, and the data masking scheme is applied to the semiconductor devices 100 to 500, but the inventive concepts is not limited thereto and the other various schemes may also be applied by using one pad.

Figure 7:
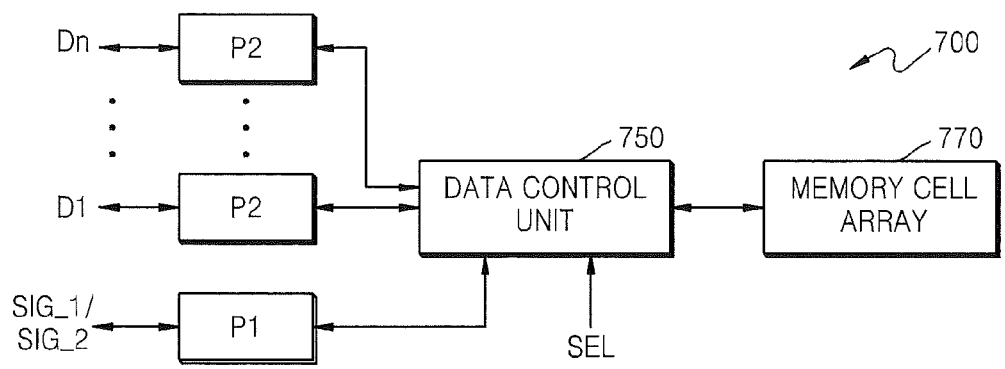
FIG. 7 is a block diagram of a semiconductor device according to another embodiment of the inventive concepts.

FIG. 7 is a block diagram of a semiconductor device 700 according to another embodiment of the inventive concepts.

Referring to FIG. 7, the semiconductor device 700 may include a first pad P1 and a data control unit 750. The first pad P1 may be connected to a data control unit 750 and may receive or output a first signal SIG_1 or a second signal SIG_2. The first signal SIG_1 may be a data inversion flag, an error check flag, or a masking signal. The second signal SIG_2 is different from the first signal SIG_1 and may be the data inversion flag, the error check flag, or the masking signal. The data inversion flag, the error check flag, and the masking signal are the same as the data inversion flag INV_FLAG, the error check flag ERR_FLAG, and the masking signal MASK of FIG. 1, respectively.

The data control unit 750 may control received data according to at least one of selection information SEL and a signal output from the first pad P1. The operation of the data control unit 750 will be described in detail later with reference to FIGS. 8 to 22B.

In the current embodiment of FIG. 7, the semiconductor device 700 may further include a plurality of second pads P2 and a memory cell array 770.

The second pads P2 may be connected to the data control unit 750 and may receive or output n-bit data D1, ..., Dn (n denotes a natural number equal to or greater than '2'). That is, the second pads P2 may transmit the data D1, ..., through to Dn received from the outside of the semiconductor device 700 to the data control unit 750 or may transmit the data D1, ..., through to Dn is read from the memory cell array 770 and is controlled by the data control unit 750 to the outside of the semiconductor device 700.

The structure and operation of the semiconductor device 700 according to embodiments of the inventive concepts will be described in detail with reference to FIGS. 8 to 22B. Embodiments of FIG. 8 to FIG. 12B relate to cases where the first signal SIG_1 is the data inversion flag INV_FLAG and the second signal SIG_2 is the error check flag ERR_FLAG. Embodiments of FIGS. 13 to 17B relate to cases where the first signal SIG_1 is the data inversion flag INV_FLAG and the second signal SIG_2 is the masking signal MASK. Embodiments of FIGS. 18 to 22B relate to cases where the first signal SIG_1 is the error check flag ERR_FLAG and the second signal SIG_2 is the masking signal MASK.

Figure 8:
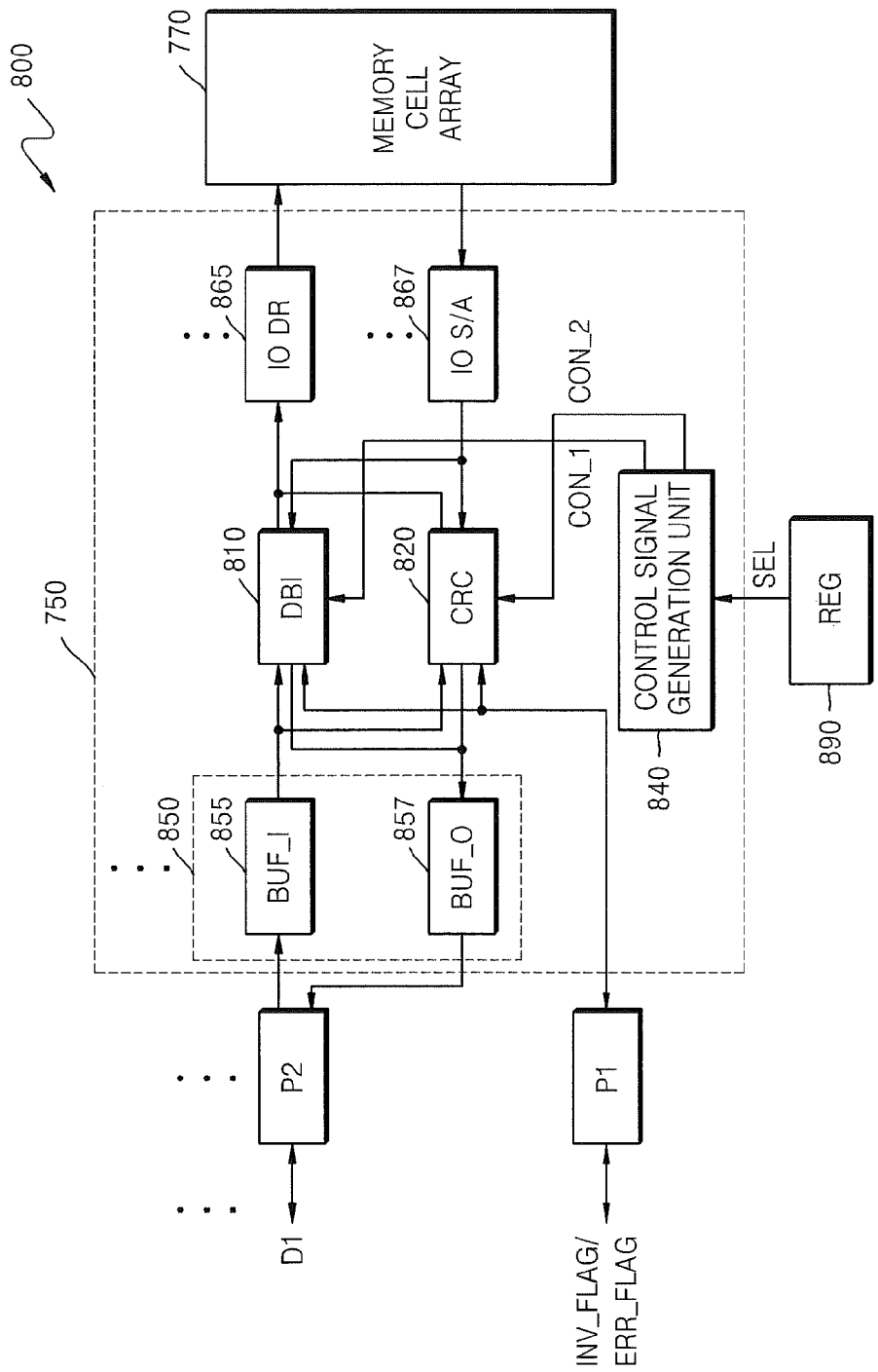
FIG. 8 is a block diagram of a semiconductor device that is another embodiment of the semiconductor device of FIG. 7 according to the inventive concepts.

FIG. 8 is a block diagram of a semiconductor device 800 that is another embodiment of the semiconductor device 700 of FIG. 7 according to the inventive concepts.

In FIG. 8, a first pad P1, a plurality of second pads P2, and a memory cell array 770 have been described above with reference to FIG. 7.

Referring to FIGS. 7 and 8, the data control unit 750 may include a control signal generation unit 840, a plurality of buffer units 850, a plurality of driving units 865, a plurality of sense amplification units 867, a DBI unit 810, and an error check unit 820.

The control signal generation unit 840 may generate a first control signal CON_1 or a second control signal CON_2 according to a selection information SEL and may output it to the DBI unit 810 and the error check unit 820. Hereinafter, it is assumed that a first control signal CON_1 controls the DBI unit 810 to be enabled or disabled and a second control signal CON_2 controls the error check unit 820 to be enabled or disabled.

The selection information SEL may be stored in a register 890. For example, the selection information SEL may be defined according to an MRS command stored in the register 890. That is, the control signal generation unit 840 may generate the first control signal CON_1, or the second control signal CON_2 according to the MRS command stored in the register 890.

Each of the plurality of buffer units 850 may be connected among the DBI unit 810, the error check unit 820, a corresponding second pad P2, and the sense amplification unit 867. Each of the plurality of buffer units 850 may include an input buffer 855 and an output buffer 857. The input buffer 855 may buffer the data D1 received via the corresponding second pad P2, and may transmit the buffering result to the DBI unit 810 and the error check unit 820. The output buffer 857 may buffer data output from the DBI unit 810 or the error check unit 820, and may transmit the buffering result to the corresponding second pad P2.

The plurality of driving units 865 and the plurality of sense amplification units 867 may be connected between at least one selected from among the DBI unit 810 and the error check unit 820, and the memory cell array 770. Each of the plurality of driving units 865 may write data received from one of the DBI unit 810 and the error check unit 820 to a corresponding memory cell of the memory cell array 770. Each of the plurality of sense amplification units 867 may sense and amplifies data received from a corresponding memory cell of the memory cell array 770 and transmit the amplified data to the DBI unit 810 and the error check unit 820.

The DBI unit 810 is used when the data inversion scheme is employed. For example, a method of inverting and transmitting the n-bit data D1, ..., through to Dn of FIG. 7 when the number of bits that are logic 'high' is greater than the number of bits that are logic 'low' from among the n-bit data D1, ..., through to Dn, is referred to as the data inversion scheme. The DBI unit 810 may be constructed in various ways and the structure thereof will not be described here.

If the semiconductor device 800 performs the write operation, the DBI unit 810 may invert the data received from the input buffer 855 and output the inverting result to the memory cell array 770 according to the first control signal CON_1 and a data inversion flag INV_FLAG. If the semiconductor device 800 performs the read operation, then according to the first control signal CON_1, the DBI unit 810 may invert data read from the memory cell array 770 and sense-amplified by the sense amplification unit 867 and transmit the inverting result to the output buffer 857 and may generate a data inversion flag INV_FLAG and transmit it to the first pad P1. That is, the DBI unit 810 may be enabled or disabled according to the first control signal CON_1.

The error check unit 820 is used when the error check scheme is established. The error check scheme allows determination as to whether an error occurs during data transmission. For example, according to the error check scheme, the n-bit data D1, ..., through to Dn may be transmitted together with a parity bit that is logic 'high' when the total number of bits that are logic 'high' is an odd number from among the n-bit data D1, ..., through to Dn and may be transmitted together with a parity bit that is logic 'low' when the total number of the bits that are logic 'high' is an even number, so that whether an error occurs during data transmission may be determined. The error check unit 820 may be constructed in various ways and the structure thereof will not be described here.

If the semiconductor device 800 performs the write operation, the error check unit 820 may perform error checking on the data received from the input buffer 855 according to the second control signal CON_2 and an error check flag ERR_FLAG. If the semiconductor device 800 performs the read operation, then according to the second control signal CON_2, the error check unit 820 may perform error checking on the data read from the memory cell array 770 and sense-amplified by the sense amplification unit 867, transmit the sense-amplified data to the output buffer 857, and generate the error check flag ERR_FLAG and transmit it to the first pad P1. That is, the error check unit 820 may be enabled or disabled according to the second control signal CON_2.

The operation of the semiconductor device 800 of FIG. 8 according to an embodiment of the inventive concepts will now be described in detail. For convenience of explanation, it is assumed that in the data inversion mode, the semiconductor device 800 may invert received data and write it to the memory cell array 770 or may invert and output the data received from the memory cell array 770 and in the error check mode, the semiconductor device 800 may perform error checking on data that is, to be written or that is read. For convenience of explanation, it is assumed that in the current embodiment, the 1-bit data D1 from among the n-bit data D1, ..., through to Dn is to be written or is to be read but the other data may also be written or read similar to the way the 1-bit data D1 is written or read. First, a case where the semiconductor device 800 performs the write operation in the data inversion mode will be described. In the data inversion mode, the control signal generation unit 840 generates only the first control signal CON_1 and does not generate the second control signal CON_2 according to the selection information SEL. Accordingly, the DBI unit 810 is enabled according to the first control signal CON_1 and the error check unit 820 is disabled.

If the data D1 is input sequentially to the second pad P2, the input buffer 855, and finally to the DBI unit 810 and the data inversion flag INV_FLAG is input to the DBI unit 810 via the first pad P1, then the DBI unit 810 inverts the data D1 and transmits the inverting result to the driving unit 865. If the data inversion flag INV_FLAG is not input to the first pad P1, then the DBI unit 810 does not invert the data D1 and transmits it directly to the driving unit 865. The driving unit 865 writes the data D1 to the memory cell array 770.

A case where the semiconductor device 800 performs the read operation in the data inversion mode will be described. In the data inversion mode, the control signal generation unit 840 generates only the first control signal CON_1 and does not generate the second control signal CON_2 according to the selection information SEL. Thus, the DBI unit 810 is enabled according to the first control signal CON_1 and the error check unit 820 is disabled.

The DBI unit 810 may determine whether the data read from the memory cell array 770 and sense-amplified by the sense amplification unit 867 is to be inverted, according to the first control signal CON_1. That is, when the DBI unit 810 inverts the read data and outputs the inverting result to the output buffer 857, the DBI unit 810 generates data inversion flag INV_FLAG indicating that the read data has been inverted and then transmits it to the first pad P1. If the DBI unit 810 does not invert the read data and transmit it directly to the sense amplification unit 860, then the DBI unit 810 does not generate the data inversion flag INV_FLAG.

A case where the semiconductor device 800 performs the write operation in the error check mode will be described. In the error check mode, the control signal generation unit 840 generates only the second control signal CON_2 and does not generate the first control signal CON_1 according to the selection information SEL. Thus, the error check unit 820 is enabled according to the second control signal CON_2 and the DBI unit 810 is disabled.

If the data D1 is input sequentially to the second pad P2 and the input buffer 855 and finally to the error check unit 820 and the error check flag ERR_FLAG is input to the error check unit 820 via the first pad P1, then the error check unit 820 performs error checking on the data D1 and transmits the checking result to the driving unit 865. If the error check flag ERR_FLAG is not input to the first pad P1, then the error check unit 820 does not perform error checking on the data D1 and transmit it directly to the driving unit 865. Afterward, the driving unit 865 writes the data D1 to the memory cell array 770.

A case where the semiconductor device 800 performs the read operation in the error check mode will be described. In the error check mode, the control signal generation unit 840 generates only the second control signal CON_2 and does not generate the first control signal CON_1 according to the selection information SEL. Thus, the error check unit 820 is enabled according to the second control signal CON_2 and the DBI unit 810 is disabled.

The error check unit 820 may determine whether the data read from the memory cell array 770 and sense-amplified by the sense amplification unit 867 is to be error checked, according to the second control signal CON_2. That is, if the error check unit 820 performs error checking on the sense-amplified data and outputs the data to the output buffer 857, then the error check unit 820 generates the error check flag ERR_FLAG indicating that the read data has been error checked and transmits the error check flag ERR_FLAG to the first pad P1. If the error check unit 820 does not perform error checking on the read data and transmits the read data directly to the output buffer 857, then the error check unit 820 does not generate the error check flag ERR_FLAG.

Figure 9:
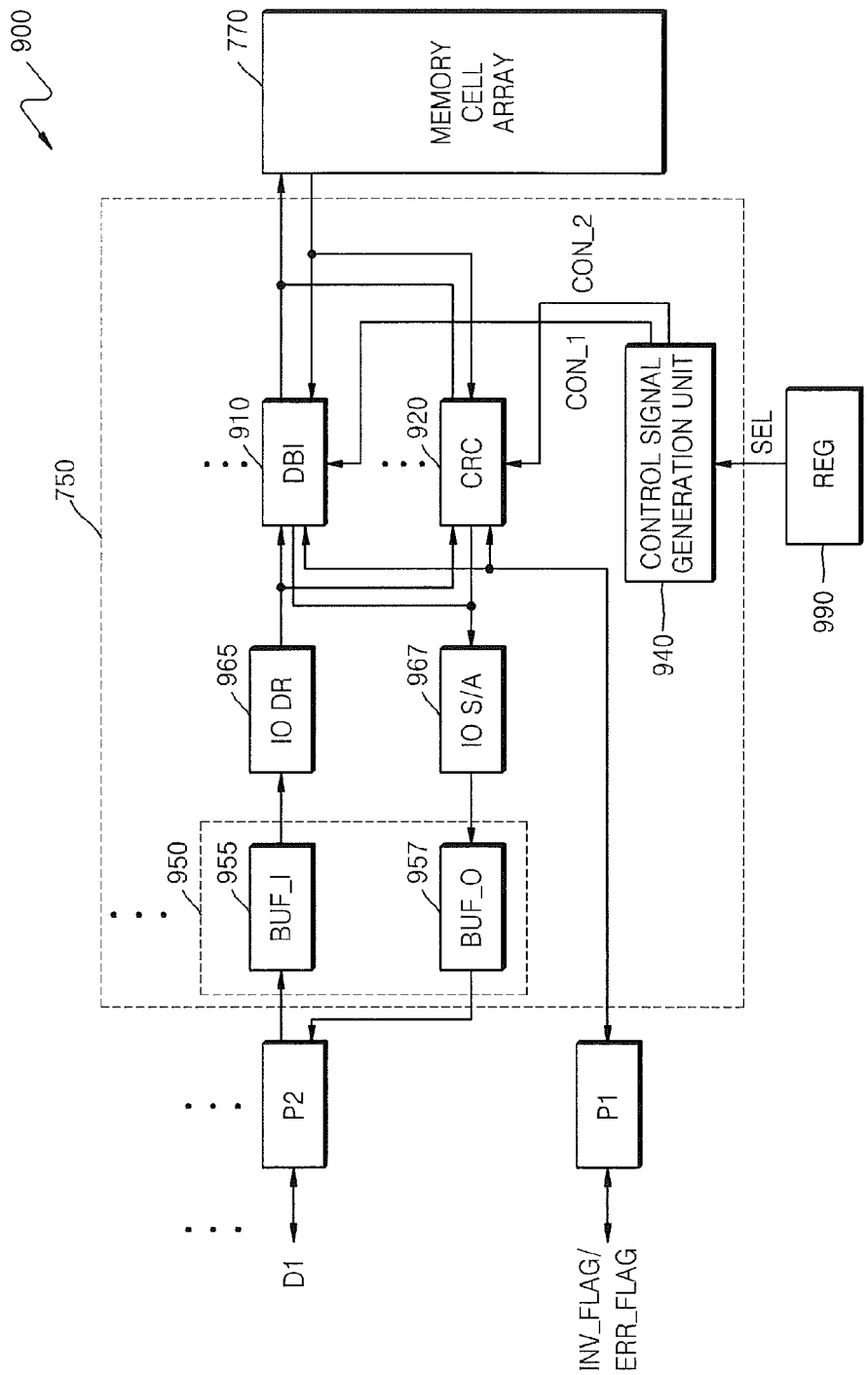
FIG. 9 is a block diagram of a semiconductor device that is another embodiment of the semiconductor device of FIG. 7 according to the inventive concepts.

FIG. 9 is a block diagram of a semiconductor device 900 that is another embodiment of the semiconductor device 700 of FIG. 7 according to the inventive concepts. In FIG. 9, a first pad P1, a plurality of second pads P2, and a memory cell array 770 have been described above with reference to FIG. 7.

Referring to FIGS. 7 to 9, the data control unit 750 may include a control signal generation unit 940, a plurality of buffer units 950, a plurality of driving units 965, a plurality of sense amplification units 967, a DBI unit 910, and an error check unit 920.

Similar to the control signal generation unit 840 of FIG. 8, the control signal generation unit 940 may generate a first control signal CON_1, or a second control, signal CON_2 and then supply the generated signal to the DBI unit 910, or the error check unit 920, according to selection information SEL.

The selection information SEL may be stored in a register 990. For example, the selection information SEL may be defined according to an MRS command stored in the register 990. That is, the control signal generation unit 940 may generate the first control signal CON_1, or the second control signal CON_2, according to the MRS command stored in the register 990.

Each of the plurality of buffer units 950 may be connected between a corresponding second pad P2 and a corresponding driving unit 965. Each of the plurality of buffer units 950 may include an input buffer 955 and an output buffer 957. The input buffer 955 may buffer data D1 received via the corresponding second pad P2 and transmit the buffering result to the corresponding driving unit 965. The output buffer 957 may buffer data received from one of the plurality of sense amplification units 967 and transmit the buffering result to the corresponding second pad P2.

Each of the plurality of driving units 965 and the plurality of sense amplification units 967 may be connected between at least one from among the DBI unit 910 and the error check unit 920, and a corresponding buffer unit 950 from among the plurality of buffer units 950. Each of the plurality of driving units 965 may transmit data received from the input buffer 955 to the DBI unit 910 and the error check unit 920. Each of the plurality of sense amplification units 967 may sense and amplify data received from one of the DBI unit 910 and the error check unit 920, and transmit the output buffer 957.

The DBI unit 910 may invert and output received data according to a first control signal CON_1. In detail, if the semiconductor device 900 performs the write operation, the DBI unit 910 may invert data received from the driving unit 965 and write the inverting result to a corresponding memory cell of the memory cell array 770 according to the first control signal CON_1 and a data inversion flag INV_FLAG. If the semiconductor device 900 performs the read operation, then according to the first control signal CON_1, the DBI unit 910 may invert data read by the corresponding memory cell of the memory cell array 770, transmit the inverting result to the sense amplification unit 967 according to the first control signal CON_1, generate the data inversion flag INV_FLAG, and transmit the data inversion flag INV_FLAG to the first pad P1. The structure and operation of the DBI unit 910 are similar to those of the DBI unit 810 of FIG. 8.

The error check unit 920 may perform error checking on received data and then output the performing result according to a second control signal CON_2. In detail, if the semiconductor device 900 performs the write operation, the error check unit 920 may perform error checking on data received from the driving unit 965 according to the second control signal CON_2 and an error check flag ERR_FLAG. If the semiconductor device 900 performs the read operation, then the error check unit 920 may perform error checking on data read by the corresponding memory cell of the memory cell array 770, transmit the performing result to the sense amplification unit 967, generate the error check flag ERR_FLAG, and transmit the error check flag ERR_FLAG to the first pad P1. The structure and operation of the error check unit 920 are similar to those of the error check unit 820 of FIG. 8.

The operation of the semiconductor device 900 of FIG. 9 according to an embodiment of the inventive concepts will be described in detail. The operations of the DBI unit 910 and the error check unit 920 are similar to those of the DBI unit 810 and the error check unit 820 of FIG. 8, respectively.

First, if the semiconductor device 900 is in the data inversion mode, the control signal generation unit 940 generates only the first control signal CON_1 according to the selection information SEL and only the DBI unit 910 is thus enabled according to the first control signal CON_1 as described above with reference to FIG. 8. If the semiconductor device 900 performs the write operation, the DBI unit 910 may invert the data received from the driving unit 965 and write the inverting result to a corresponding memory cell of the memory cell array 770 according to the data, inversion flag INV_FLAG. If the semiconductor device 900 performs the read operation, then according to the first control signal CON_1, the DBI unit 910 may invert the data read by the corresponding memory cell of the memory cell array 770, output the inverting result to the sense amplification unit 967, generate the data inversion flag INV_FLAG, and transmit the data inversion, flag INV_FLAG to the first pad P1.

If the semiconductor device 900 is in the error check mode, the control signal generation unit 940 generates only the second control signal CON_2 according to the selection information SEL and only the error check unit 920 is thus enabled according to the second control signal CON_2 as described above with reference to FIG. 8. If the semiconductor device 900 performs the write operation, the error check unit 920 may perform error checking on the data received from the driving unit 965 and write the performing result to a corresponding memory cell of the memory cell array 770 according to the error check flag ERR_FLAG. If the semiconductor device 900 performs the read operation, then according to the second control signal CON_2, the error check unit 920 may perform error checking on the data read by the corresponding memory cell of the memory cell array 770, output the performing result to the sense amplification unit 967, generate the error check flag ERR_FLAG, and transmit the error check flag ERR_FLAG to the first pad P1.

Figure 10:
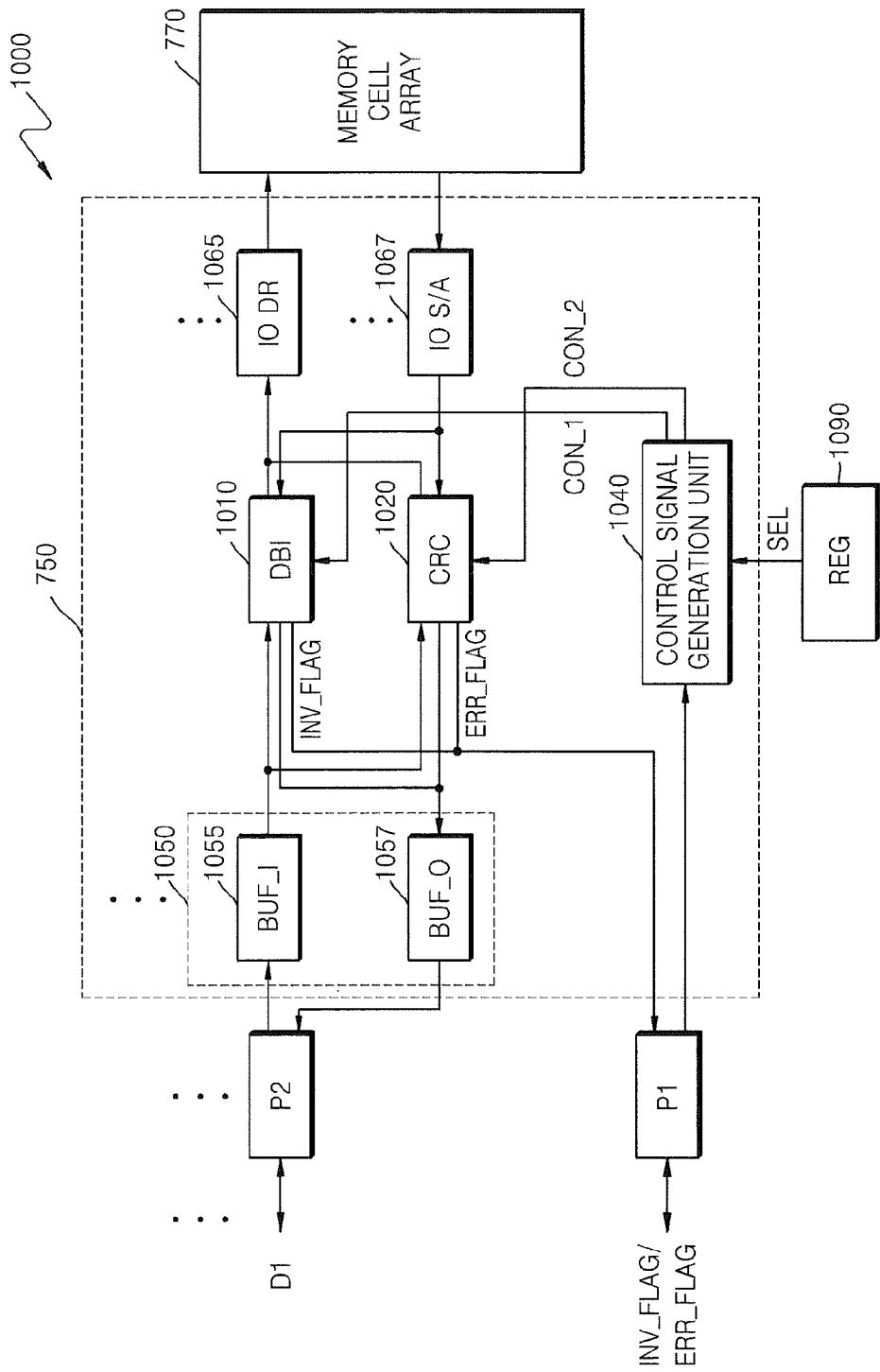
FIG. 10 is a block diagram of a semiconductor device that is another embodiment of the semiconductor device of FIG. 7 according to the inventive concepts.

FIG. 10 is a block diagram of a semiconductor device 1000 that is another embodiment of the semiconductor device 700 of FIG. 7 according to the inventive concepts.

In FIG. 10, a first pad P1, a plurality of second pads P2, and a memory cell array 770 have been described above with reference to FIG. 7.

Referring to FIGS. 7 and 10, the data control unit 750 may include a control signal generation unit 1040, a plurality of buffer units 1050, a plurality of driving units 1065, a plurality of sense amplification unit 1067, a DBI unit 1010, and an error check unit 1020.

If the semiconductor device 1000 performs the write operation, then the control signal generation unit 1020 may generate a first control signal CON_1 or a second control signal CON_2 according to a selection information SEL and a signal output from the first pad P1. That is, if the semiconductor device 1000 performs the write operation, the control signal generation unit 1040 may generate the first control signal CON_1 according to the selection information SEL and a data inversion flag INV_FLAG and generate the second control signal CON_2 according to the selection information SEL and an error check flag ERR_FLAG. If the semiconductor device 1000 performs the read operation, the control signal generation unit 1040 may generate the first control signal CON_1 or the second control signal CON_2 according to the selection information SEL, similar to the control signal generation units 840 and 940 of FIGS. 8 and 9.

The selection information SEL may be stored in a register 1090. For example, the selection information SEL may be defined according to an MRS command stored in the register 1090. That is, the control signal generation unit 1040 may generate the first control signal CON_1 or the second control signal CON_2 according to the MRS command stored in the register 1090.

The operations of the buffer unit 1350 and the sense amplification unit 1360 are similar to those of the buffer unit 1050 and the sense amplification unit 1060 of FIG. 10, respectively. The operations of the plurality of buffer units 1050, the plurality of driving units 1065, and the plurality of sense amplification unit 1067 are similar to those of the plurality of buffer units 850, the plurality of driving units 865, and the plurality of sense amplification unit 867 of FIG. 8, respectively, and thus the detailed description thereof is omitted here. If the semiconductor device 1000 performs the read operation, the DBI unit 1010 and the error check unit 1020 operate similar to the DBI unit 810 and the error check unit 820 of FIG. 8, respectively. Thus, the operation of the DBI unit 1010 and the error check unit 1020 when the semiconductor device 1000 performs the read operation will not be described here.

The DBI unit 1010 is used when the data inversion scheme described above with reference to FIG. 8 is established. If the semiconductor device 1000 performs the write Operation, the DBI unit 1010 may invert data received from an input buffer 1055 and output the inverting result to the memory cell array 770 according to the first control signal CON_1. That is, the DBI unit 1010 may be enabled or disabled according to the first control signal CON_1.

The error check unit 1020 is used when the error check scheme described above with reference to FIG. 8 is established. If the semiconductor device 1000 performs the write operation, the error check unit 1020 may perform error checking on data received from the input buffer 1055 according to the second control signal CON_2. That is, the error check unit 1020 may be enabled or disabled according to the second control signal CON_2.

The operation of the semiconductor device 1000 of FIG. 10 will now be described in detail. For convenience of explanation, the operation of the semiconductor device 1000 will be described with respect to the data inversion mode and the error check mode assumed above with reference to FIG. 8.

First, a case where the semiconductor device 1000 performs the write operation in the data inversion mode will be described. In the data inversion mode, the control signal generation unit 1040 may generate the first control signal CON_1 according to the selection information SEL and the signal output from the first pad P1. That is, if in the data inversion mode, the data inversion flag INV_FLAG is input to the control signal generation unit 1040 via the first pad P1, then the control signal generation unit 1040 may generate the first control signal CON_1 for controlling the DBI unit 1010 to invert and output the data received from the input buffer 1055. If in the data inversion mode, the data inversion flag INV_FLAG is not input to the control signal generation unit 1040 via the first pad P1, then the control signal generation unit 1040 may generate the first control signal CON_1 for controlling the DBI unit 1010 to output the data directly without inverting it. The control signal generation unit 1040 does not generate the second control signal CON_2 and the error check unit 1020 is thus disabled.

If 1-bit data D1 is input sequentially to the second pad P2, the input buffer 1055 and finally to the DBI unit 1010 and the data inversion flag INV_FLAG is input to the control signal generation unit 1040 via the first pad P1, then the DBI unit 1010 inverts the data received from the input buffer 1055 and transmits the inverting result to the driving unit 1065 according to the first control signal CON_1. If the data inversion flag INV_FLAG is not input to the control signal generation unit 1040 via the first pad P1, the DBI unit 1010 does not invert the received data and transmits the received data directly to the driving unit 1065 according to the first control signal CON_1. The driving unit 1065 writes the transmitted data to a corresponding memory cell of the memory cell array 970.

A case where the semiconductor device 1000 performs the write operation in the error check mode will be described.

In the error check mode, the control signal generation unit 1040 may generate the second control signal CON_2 according to the selection information SEL and the signal output from the first pad P1. That is, if in the error check mode, the error check flag ERR_FLAG is input to the control signal generation unit 1040 via the first pad P1, then the control signal generation unit 1040 may generate the second control signal CON_2 for controlling the error check unit 1020 to perform error checking on the data received from the input buffer 1055. If in the error check mode, the error check flag ERR_FLAG is not input to the control signal generation unit 1040 via the first pad P1, then the control signal generation unit 1040 may generate the second control signal CON_2 for controlling the error check unit 1020 not to perform error checking on the received data and to output the received data directly. The control signal generation unit 1040 does not generate the first control signal CON_1 and the DBI unit 1010 is thus disabled.

If the 1-bit data D1 is input sequentially to the second pad P2, the input buffer 1055, and finally to the error check unit 1020 and the error check flag ERR_FLAG is input to the control signal generation unit 1040 via the first pad P1, then the error check unit 1020 performs error checking on the received data according to the second control signal CON_2 and transmits the checking result to the driving unit 1065. If the error check flag ERR_FLAG is not input to the control signal generation unit 1040 via the first pad P1, the error check unit 1020 does not perform error checking on the received data and transmits the received data directly to the driving unit 1065 according to the second control signal CON_2. The driving unit 1065 writes the transmitted data to a corresponding memory cell of the memory cell array 770.

Figure 11:
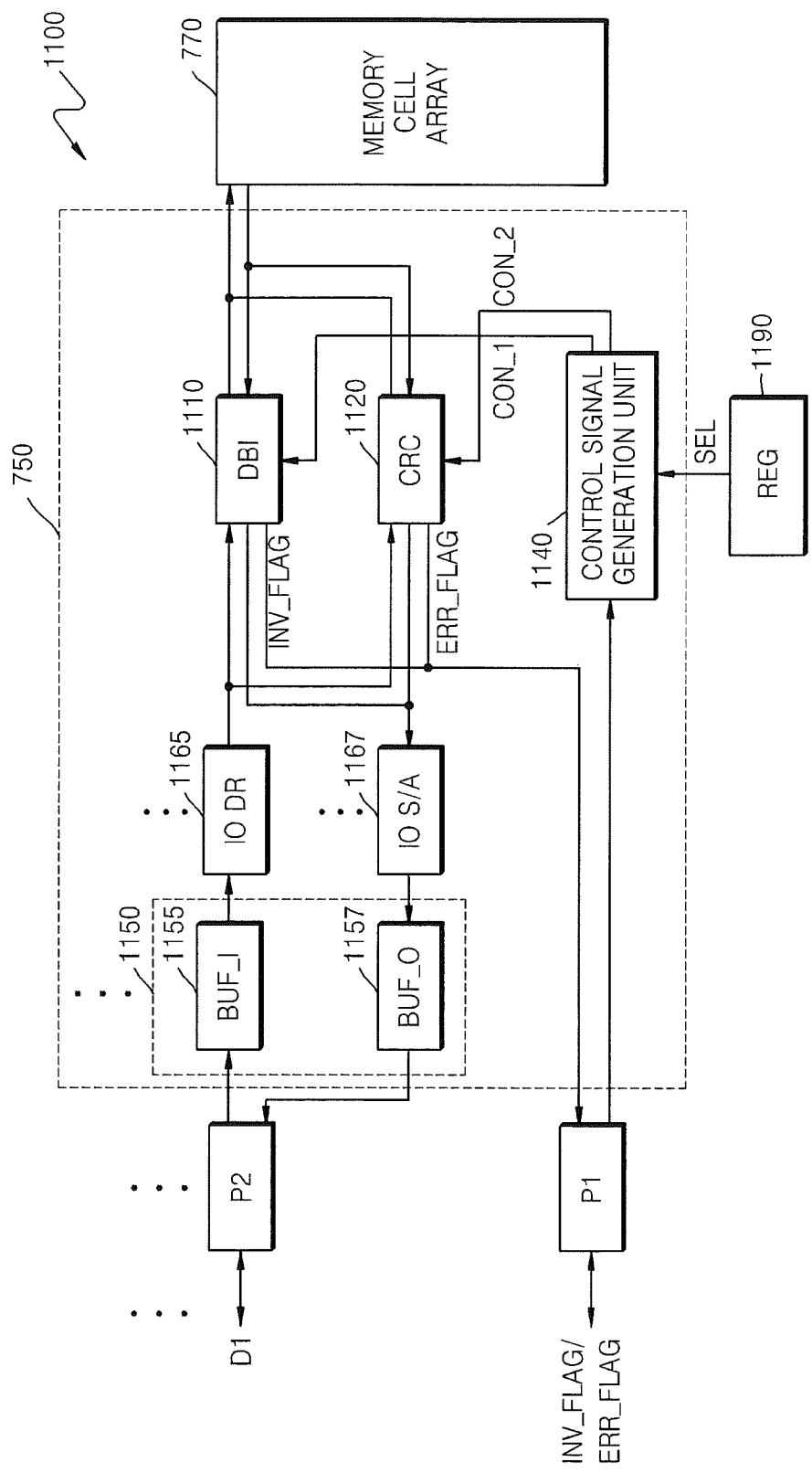
FIG. 11 is a block diagram of a semiconductor device that is another embodiment of the semiconductor device of FIG. 7 according to the inventive concepts.

FIG. 11 is a block diagram of a semiconductor device 1100 that is another embodiment of the semiconductor device 700 of FIG. 7 according to the inventive concepts.

In FIG. 11, a first pad P1, a plurality of second pads P2, and a memory cell array 770 have been described above with reference to FIG. 7.

Referring to FIGS. 7 to 11, the data control unit 750 may include a control signal generation unit 1140, a plurality of buffer units 1150, a plurality of driving units 1165, a plurality of sense amplification units 1167, a DBI unit 1110, and an error check unit 1120.

The control signal generation unit 1140 is similar to the control signal generation unit 1040 of FIG. 1, and may generate a first control signal CON_1 or a second control signal CON_2 according to selection information SEL and a signal output from the first pad P1, and output it to the DBI unit 1110 and the error check unit 1120.

The selection information SEL may be stored in a register 1190. For example, the selection information SEL may be defined according to an MRS command stored in the register 1190. That is, the control signal generation unit 1140 may generate the first control signal CON_1 or the second control signal CON_2 according to the MRS command stored in the register 1190.

The operations of the plurality of buffer units 1150, the plurality of driving units 1165, and the plurality of sense amplification units 1167 are similar to those of the plurality of buffer units 950, the plurality of driving units 965, and the plurality of sense amplification units 967 of FIG. 9, and thus a detailed description thereof is omitted here.

As described above with reference to FIG. 10, when the semiconductor device 1000 performs the read operation, the operations of a DBI unit 1110 and the error check unit 1120 of FIG. 11 are those of the DBI unit 1010 and the error check unit 1020 of FIG. 10, respectively. Thus, the operations of the DBI unit 1110 and the error check unit 1120 when the semiconductor device 1100 performs the read operation will not be described here.

The DBI unit 1110 may invert and output received data according to the first control signal CON_1. In detail, if the semiconductor device 1100 performs the write operation, the DBI unit 1110 may invert data received from the driving unit 1165 and write the inverting result to a corresponding memory cell of the memory cell array 770 according to the first control signal CON_1. The structure and operation of the DBI unit 1110 are similar to those of the DBI unit 1010 of FIG. 10.

The error check unit 1120 may perform error checking on received data and output the performing result according to the second control signal CON_2. In detail, if the semiconductor device 1100 performs the write operation, the error check unit 1120 may perform error checking on the data received from the driving unit 1165 according to the second control signal CON_2. The structure and operation of the error check unit 1120 are similar to those of the error check unit 1020 of FIG. 10.

The operation of the semiconductor device 1100 of FIG. 11 according to an embodiment of the inventive concepts will now be described in detail. The operations of the DBI unit 1110 and the error check unit 1120 are similar to those of the DBI unit 1010 and the error check unit 1020 of FIG. 10, respectively.

First, if the semiconductor device 1100 is in the data inversion mode, the control signal generation unit 1140 generates only the first control signal CON_1 according to a selection information SEL and the signal output from the first pad P1 and only the DBI unit 1110 is enabled according to the first control signal CON_1 as described above with reference to FIG. 10. If the semiconductor device 1100 performs the write operation, the DBI unit 1110 may invert the data received from the driving unit 1165 and write the inverting result to the corresponding memory cell of the memory cell array 770 according to the first control signal CON_1.

If the semiconductor device 1100 is in the error check mode, the control signal generation unit 1140 generates only the second control signal CON_2 according to the selection information SEL and the signal output from the first pad P1 and only the error check unit 1120 is enabled according to the second control signal CON_2 as described above with reference to FIG. 10. If the semiconductor device 1100 performs the write operation, the error check unit 1120 may perform error checking on the data received from the driving unit 1165 and write the performing result to the corresponding memory cell of the memory cell array 770 according to the second control signal CON_2.

Figure 12A:
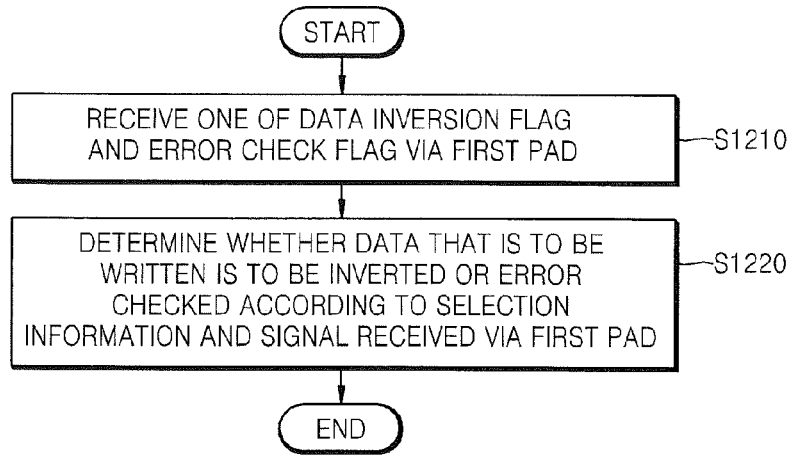
FIG. 12A is a flowchart illustrating a method of performing the write operation on one of the semiconductor devices of FIGS. 8 to 11, according to another embodiment of the inventive concepts.

FIG. 12A is a flowchart illustrating a method of performing the write operation on Cone of the semiconductor devices 800 to 1100 of FIGS. 8 to 11, according to another embodiment of the inventive concepts. Referring to FIGS. 8 to 12A, if each of the semiconductor devices 800 to 1100 performs the write operation, a data inversion flag INV_FLAG or an error check flag ERR_FLAG may be input to the first pad P1 of each of the semiconductor devices 800 to 1100 (operation S1210). Next, the data control unit 750 may determine whether data that is to be written is to be inverted or is to be error checked, according to a selection information SEL and either the data inversion flag INV_FLAG or the error check flag ERR_FLAG input to the first pad P1 (operation S1220). The operation of the data control unit 750 when each of the semiconductor devices 800 to 1100 performs the write operation has been described above with reference to FIGS. 8 to 11.

Figure 12B:
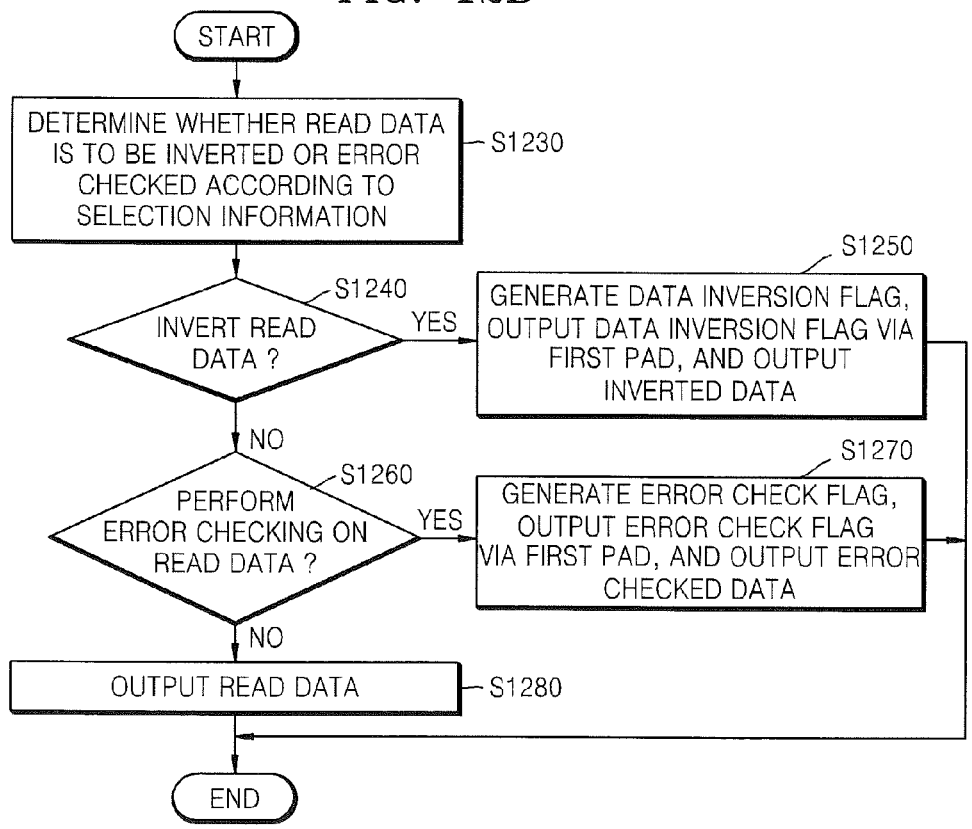
FIG. 12B is a flowchart illustrating a method of performing the read operation on one of the semiconductor devices of FIGS. 8 to 11, according to another embodiment of the inventive concepts.

FIG. 12B is a flowchart illustrating a method of performing the read operation on one of the semiconductor devices 800 to 1100 of FIGS. 8 to 11, according to another embodiment of the inventive concepts. Referring to FIGS. 11 to and 12B, if each of the semiconductor devices 800 to 1100 performs the read operation, the data control unit 750 may determine whether data that is read is to be inverted or to be error checked, according to a selection information SEL (operation S1230).

For example, the DMI unit may determine that the read data is to be inverted when the number of bits of the read data that are logic 'high' is greater than half the total number of bits of the read data, and may determine that the read data is not to be inverted when the number of the bits of the read data that are logic 'high' is less than the half the total number of bits of the read data. If it is determined in operation S1230 that the read data is not to be error checked and is to be inverted (operation S1240), then the data control unit 750 generates a data inversion flag INV_FLAG, outputs the data inversion flag INV_FLAG via the first pad P1, inverts the read data, and outputs the inverting result to a corresponding second pad P2 (operation S1250). If it is determined in operation S1230 that the read data is not to be inverted and is to be error checked (operation S1260), then the data control unit 150 generates an error check flag ERR_FLAG, outputs the error check flag ERR_FLAG via the first pad P1, performs error checking on the read data, and outputs the read data via a corresponding second pad P2 (operation S1270). If it is determined in operation S1230 that the read data is not to be error checked and is not to be inverted (operation S1260), then the data control unit 750 does not generate the data inversion flag INV_FLAG and the error check flag ERR_FLAG, and outputs the read data via a corresponding second pad P2 (operation. S1280). The operation of the data control unit 750 when each of the semiconductor devices 800 to 1100 performs the read operation has been described above with reference to FIGS. 8 to 11.

FIGS. 8 to 12B illustrate cases where the data inversion scheme, the error check scheme, or the data masking scheme is applied to the semiconductor devices 800 to 1100 but the inventive concepts is not limited thereto and one pad may also be used in the same way when other schemes are applied.

Figure 13:
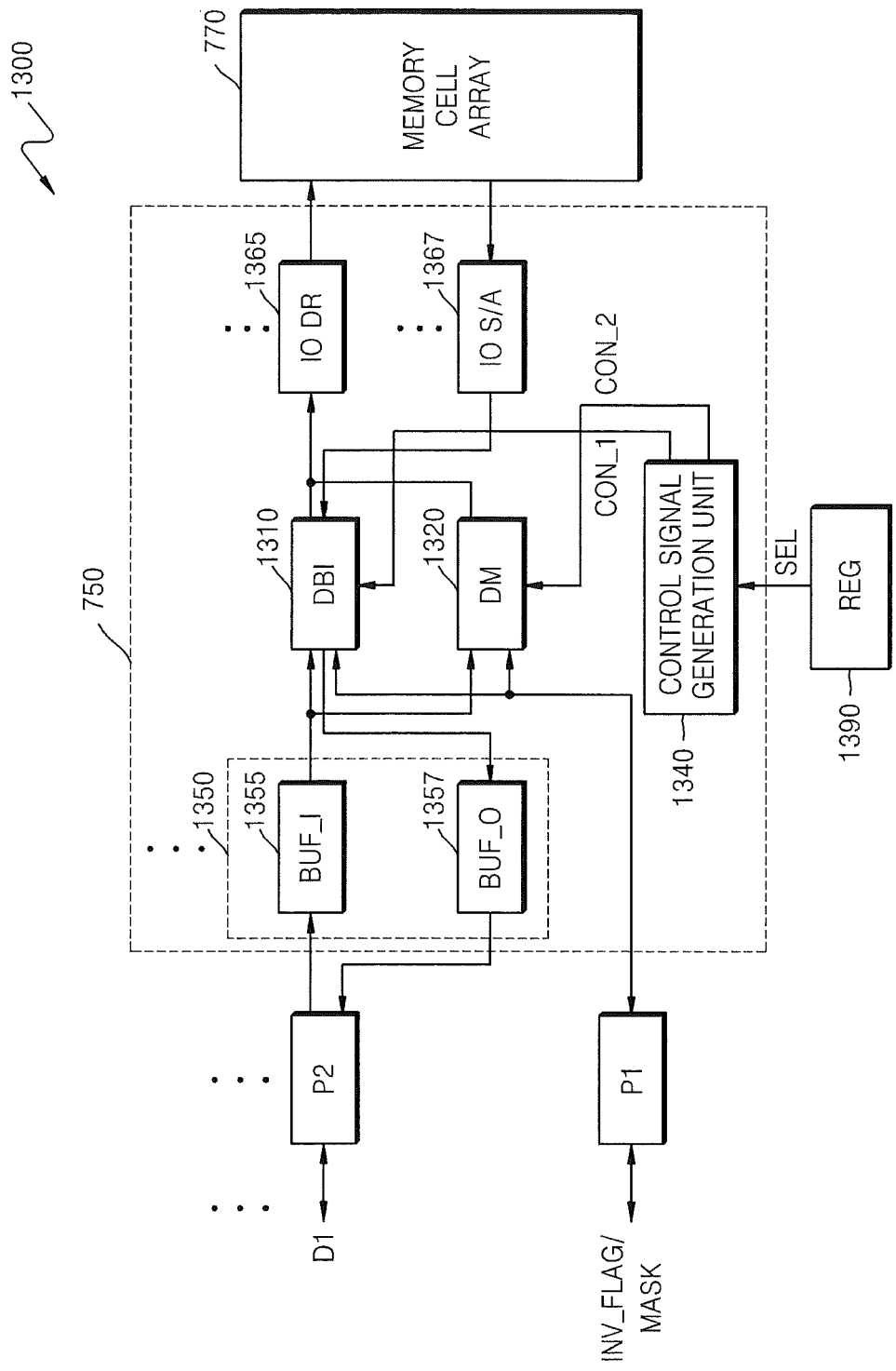
FIG. 13 is a block diagram of a semiconductor device that is another embodiment of the semiconductor device of FIG. 7 according the inventive concepts.

FIG. 13 is a block diagram of a semiconductor device 1300 that is another embodiment of the semiconductor device 700 of FIG. 7 according the inventive concepts.

In FIG. 13, a first pad P1, a plurality of second pads P2, and a memory cell array 770 have been described above with reference to FIG. 7.

Referring to FIGS. 7 and 13, the data control unit 750 may include a control signal generation unit 1340, a plurality of buffer units 1350, a plurality of driving units 1365, a plurality of sense amplification units 1367, a DBI unit 1310, and a DM unit 1320.

The control signal generation unit 1340 may generate a first control signal CON_1 or a second control signal CON_2 and then output it to the DBI unit 1310 or the DM unit 1320 according to a selection information SEL. Here, it is assumed that the first control signal CON_1 controls the DBI unit 1310 to be enabled or disabled and the second control signal CON_2 controls the DM unit 1320 to be enabled or disabled.

The selection information SEL may be stored in a register 1390. For example, the selection information SEL may be defined according to an MRS command stored in the register 1390. That is, the control signal generation unit 1340 may generate the first control signal CON_1 or the second control signal CON_2 according to the MRS command stored in the register 1390.

Each of the plurality of buffer units 1350 may be connected among the DBI unit 1310 and the DM unit 1320, and a corresponding second pad P2. Each of the plurality of buffer units 1350 may include an input buffer 1355 and an output buffer 1357. Each of the plurality of buffer units 1350 may buffer data received via the corresponding second pad P2, and may transmit the buffering result to the DBI unit 1310 and the DM unit 1320. The output buffer 1357 may buffer data output from one of the DBI unit 1310 and the DM unit 1320 and transmit the buffering result to the corresponding second pad P2.

The plurality of driving units 1365 and the plurality of sense amplification units 1367 may be connected between at least one from among the DBI unit 1310 and the DM unit 1320 and the memory cell array 770. Each of the plurality of driving units 1365 may write data received from one of the DBI unit 1310 and the DM unit 1320 to a corresponding memory cell of the memory cell array 770. Each of the plurality of sense amplification units 1367 may sense and amplify data received from a corresponding memory cell of the memory cell array 770 and transmit the amplified data to the DBI unit 1310, The DBI unit 1310 is used when the data inversion scheme is established. For example, a method of inverting and transmitting n-bit data when the number of bits that are logic 'high' is greater than the number of bits that are logic 'low' from among the n-bit data, is referred to as the data inversion scheme. The DBI unit 1310 may be constructed in various ways and the structure thereof will not be described here.

If the semiconductor device 1300 performs the write operation, the DBI unit 1310 may invert the data received from the input buffer 1355 and transmit the inverting result to the driving unit 1365 according to the first control signal CON_1 and a data inversion flag INV_FLAG. If the semiconductor device 1300 performs the read operation, then according to the first control signal CON_1, the DBI unit 1310 may invert data read from the memory cell array 770 and sense-amplified by the sense amplification unit 1367, transmit the inverting result to the output buffer 1357, generate the data inversion flag INV_FLAG, and transmit the data inversion flag INV_FLAG to the first pad P1. That is, the DBI unit 1310 may be enabled or disabled according to the first control signal CON_1.

The DM unit 1320 is used when the data masking scheme is established. According to the data masking scheme, if data that is in the same logic state as the data stored in the memory cell array 770 is to be written to the memory cell array 770, then a masking operation is performed to not transmit the data. The DM unit 1320 may be constructed in various ways and the structure thereof will not be described here.

If the semiconductor device 700 performs the write operation, the DM unit 1320 may not transmit the data received from the input buffer 1355 to the driving unit 1365 according to the second control signal CON_2 and a masking signal MASK. That is, the DM unit 1320 may be enabled or disabled according to the second control signal CON_2. Hereinafter it is assumed that the data control unit 750 does not mask the read data during a read operation. That is, when the semiconductor device 1300 performs the read operation, the DM unit 1320 does not operate. However, the inventive concepts is not limited thereto and the data control unit 750 may determine whether the read data is to be masked and whether the masking signal MASK is to be generated, during a read operation. The operation of the semiconductor device 1300 of FIG. 13 according to an embodiment of the inventive concepts will now be described in detail. For convenience of explanation, it is assumed that in the data inversion mode, the semiconductor device 1300 may invert received data and writes the inverting result to the memory cell array 770 or may invert the data read from the memory cell array 770 and outputs the inverting result. Also, it is assumed that in the data masking mode, the semiconductor device 1300 may not transmit data that is to be written to the memory cell array 770.

For convenience of explanation, it is assumed that in the current embodiment, the 1-bit data D1 from among the n-bit data D1, . . . , through to Dn is to be written or is to be read but the other data may also be written or read similar to the way the 1-bit data D1 is written or read.

First, a case where the semiconductor device 1300 performs the write operation in the data inversion mode will be described. In the data inversion mode, the control signal generation unit 1340 generates only the first control signal CON_1 according to the selection information SEL and does not generate a second control signal CON_2. Thus, the DBI unit 1310 is enabled according to the control signal CON_1 and the DM unit 1320 is disabled.

If the data D1 is input sequentially to the second pad P2, the input buffer 1355 and finally to the DBI unit 1310 and the data inversion flag INV_FLAG is input to the DBI unit 1310 via the first pad P1, then the DBI unit 1310 inverts the received data and transmits the inverting result to the driving unit 1365. If the data inversion flag INV_FLAG is not input to the first pad P1, the DBI unit 1310 does not invert the data and transmits the data directly to the driving unit 1365. Afterward, the driving unit 1365 writes the transmitted data to the memory cell array 770.

A case where the semiconductor device 1300 performs the read operation in the data inversion mode will be described. In the data inversion mode, the control signal generation unit 1340 generates only the first control signal CON_1 according to the selection information SEL and does not generate the second control signal CON_2. Thus, the DBI unit 1310 is enabled according to the control signal CON_1 and the DM unit 1320 is disabled.

The DBI unit 1310 may determine whether the data read from the memory cell array 770 and sense-amplified by the sense amplification unit 1367 is to be inverted, according to the first control signal CON_1. If the DBI unit 1310 inverts the sense-amplified data and outputs the inverting result to the output buffer 1357, then the DBI unit 1310 generates the data inversion flag INV_FLAG indicating that the read data has been inverted and then transmits the data inversion flag INV_FLAG to the first pad P1. If the DBI unit 1310 does not invert the sense-amplified data and transmits it directly to the output buffer 1357, then the DBI unit 1310 does not generate the data inversion flag INV_FLAG.

A case where the semiconductor device 1300 performs the write operation in the data masking mode will be described. In the data masking mode, the control signal generation unit 1310 generates only the second control signal CON_2 and does not generate the first control signal CON_1 according to the selection information SEL. Thus, the DM unit 1320 is enabled according to the second control signal CON_2 and the DBI unit 1310 is disabled.

If the data D1 is input sequentially to the second pad P2, the input buffer 1355 and finally to the DM unit 1320 and the masking signal MASK is input to the DM unit 1320 via the first pad P1, then the DM unit 1320 does not transmit the received data to the driving unit 1365. If the masking signal MASK is not input to the first pad P1, the DM unit 1320 transmits the received data to the driving unit 1365.

Figure 14:
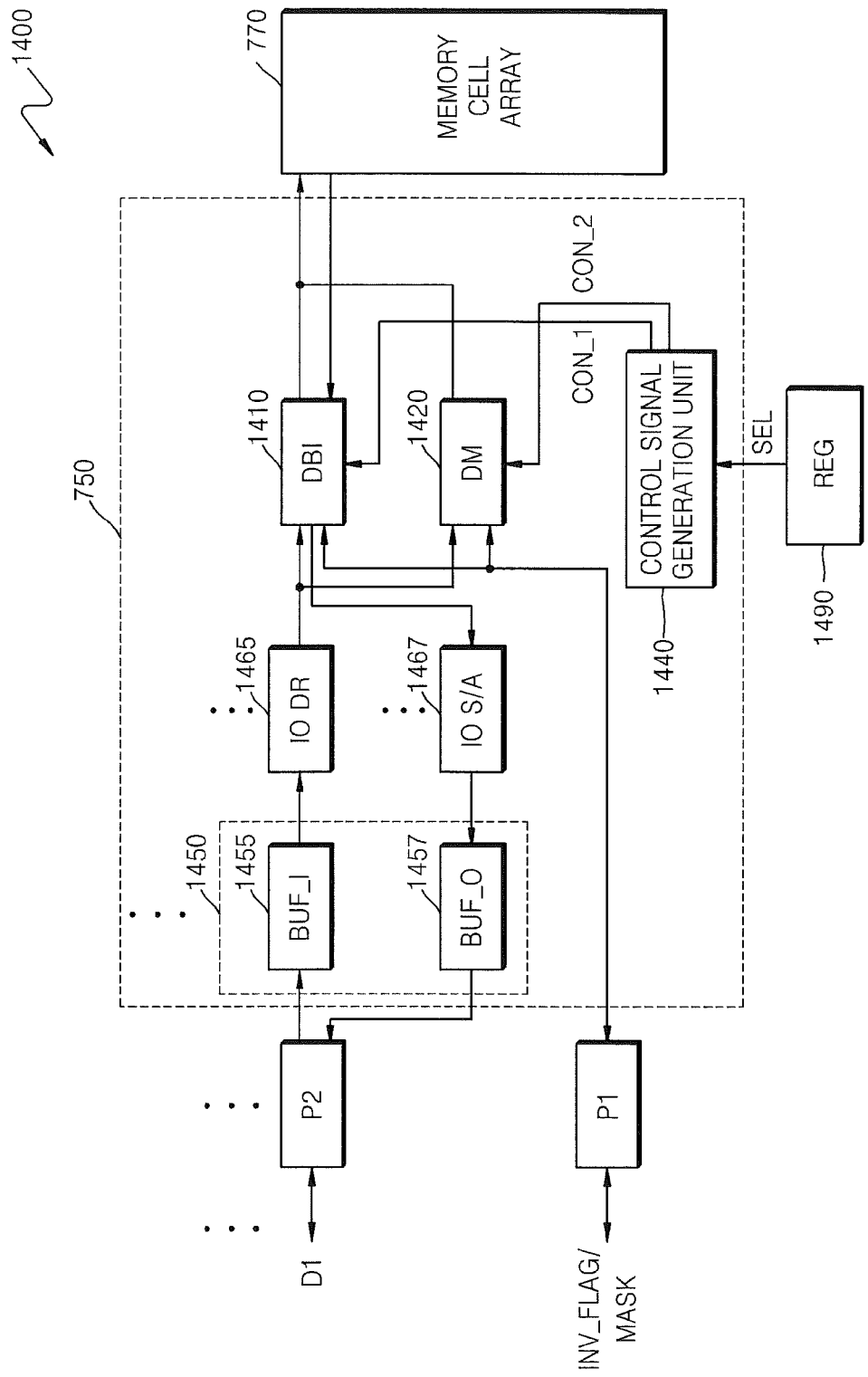
FIG. 14 is a block diagram of a semiconductor device that is another embodiment of the semiconductor device of FIG. 7 according to the inventive concepts.

FIG. 14 is a block diagram of a semiconductor device 1400 that is another embodiment of the semiconductor device 700 of FIG. 7 according to the inventive concepts.

In FIG. 14, a first pad P1, a plurality of second pads P2, and a memory cell array 770 have been described above with reference to FIG. 7, and thus a detailed description thereof is omitted here.

Referring to FIGS. 7, 13 and 14, the data control unit 750 may include a control signal generation unit 1440, a plurality of buffer units 1450, a plurality of driving units 1465, a plurality of sense amplification units 1467, a DBI unit 1410, and a DM unit 1420.

Similar to the control signal generation unit 1340 of FIG. 13, the control signal generation unit 1440 may generate a first control signal CON_1, or a second control signal CON_2 and then supply the generated signal to the DBI unit 1410, or the DM unit 1420, according to selection information SEL.

The selection information SEL may be stored in a register 1490. For example, the selection information SEL may be defined according to an MRS command stored in the register 1490. That is, the control signal generation unit 1440 may generate the first control signal CON_1, or the second control signal CON_2, according to the MRS command stored in the register 1490.

Each of the plurality of buffer units 1450 may be connected between a corresponding second pad P2 and a corresponding driving unit 1465. Each of the plurality of buffer units 1450 may include an input buffer 1455 and an output buffer 1457. The input buffer 1455 may buffer data received via the corresponding second pad P2 and transmit the buffering result to the corresponding driving unit 1465. The output buffer 1457 may buffer data received from one of the plurality of sense amplification units 1467 and transmit the buffering result to the corresponding second pad P2.

Each of the plurality of driving units 1465 and the plurality of sense amplification units 1467 may be connected between at least one of the DBI unit 1410 and the DM unit 1420, and a corresponding buffer unit 1450 from among the plurality of buffer units 1450. Each of the plurality of driving units 1465 may transmit data received from the input buffer 1455 to the DBI unit 1410 and the DM unit 1420. Each of the plurality of sense amplification units 1467 may sense and amplify data received from one of the DBI unit 1410 and the DM unit 1420, and transmit the output buffer 1457.

The DBI unit 1410 may invert and output received data according to a first control signal CON_1. In detail, if the semiconductor device 1400 performs the write operation, the DBI unit 1410 may invert data received from the driving unit 1465 and write the inverted data to a corresponding memory cell of the memory cell array 770 according to the first control signal CON_1 and a data inversion flag INV_FLAG. If the semiconductor device 1400 performs the read operation, then according to the first control signal CON_1, the DBI unit 1410 may invert data read by the corresponding memory cell of the memory cell array 770, transmit the inverting result to the second pad P2, generate the data inversion flag INV_FLAG, and transmit the data inversion flag INV_FLAG to the first pad P1. The structure and operation of the DBI unit 1410 of FIG. 13 are similar to those of the DBI unit 1310.

The DM unit 1420 may output received data or may mask it according to a second control signal CON_2. In detail, if the semiconductor device 1400 performs the write operation, the DM unit 1420 may mask data received from the driving unit 1465 according to the second control signal CON_2 and a masking signal MASK. As described above with reference to FIG. 13, it is assumed that the data control unit 750 does not mask read data while the semiconductor device 1400 performs a read operation, Thus, the DM unit 1420 does not operate while the semiconductor device 1400 performs the read operation. The structure and operation of the DM unit 1420 are similar to those of the DM unit 1320 of FIG. 13.

The operation of the semiconductor device 1400 of FIG. 18 will now be described in detail. The operations of the DBI unit 1410 and the DM unit 1420 are similar to those of the DBI unit 1310 and the DM unit 1320 of FIG. 13.

First, if the semiconductor device 1400 is in the data inversion mode, the control signal generation unit 1440 generates only the first control signal CON_1 according to the selection information SEL and only the DBI unit 1410 is enabled according to the first control signal CON_1 as described above with reference to FIG. 13 If the semiconductor device 1400 performs the write operation, the DBI unit 1410 may invert the data received from the driving unit 1465 and transmit the inverting result to a corresponding memory cell of the memory cell array 770 according to the data inversion flag INV_FLAG. If the semiconductor device 1400 performs the read operation, then according to the first control signal CON_1, the DBI unit 1410 may invert the data read by the corresponding memory cell of the memory cell array 770, transmit the inverting result to the sense amplification unit 1467, generate the data inversion flag INV_FLAG, and transmit the data inversion flag INV_FLAG to the first pad P1.

If the semiconductor device 1400 is in the data masking mode, the control signal generation unit 1440 generates only the second control signal CON_2 according to the selection information SEL and only the DM unit 1420 is thus enabled according to the second control signal CON_2 as described above with reference to FIG. 13. If the semiconductor device 1400 performs the write operation, the DM unit 1420 may not write the data output from the driving unit 1465 to the corresponding memory cell of the memory cell array 770 according to the mask signal MASK. As described above, it is assumed that the data control unit 750 does not mask read data while the semiconductor device 1400 performs a read operation, Thus, the DM unit 1420 does not operate while the semiconductor device 1400 performs the read operation.

Figure 15:
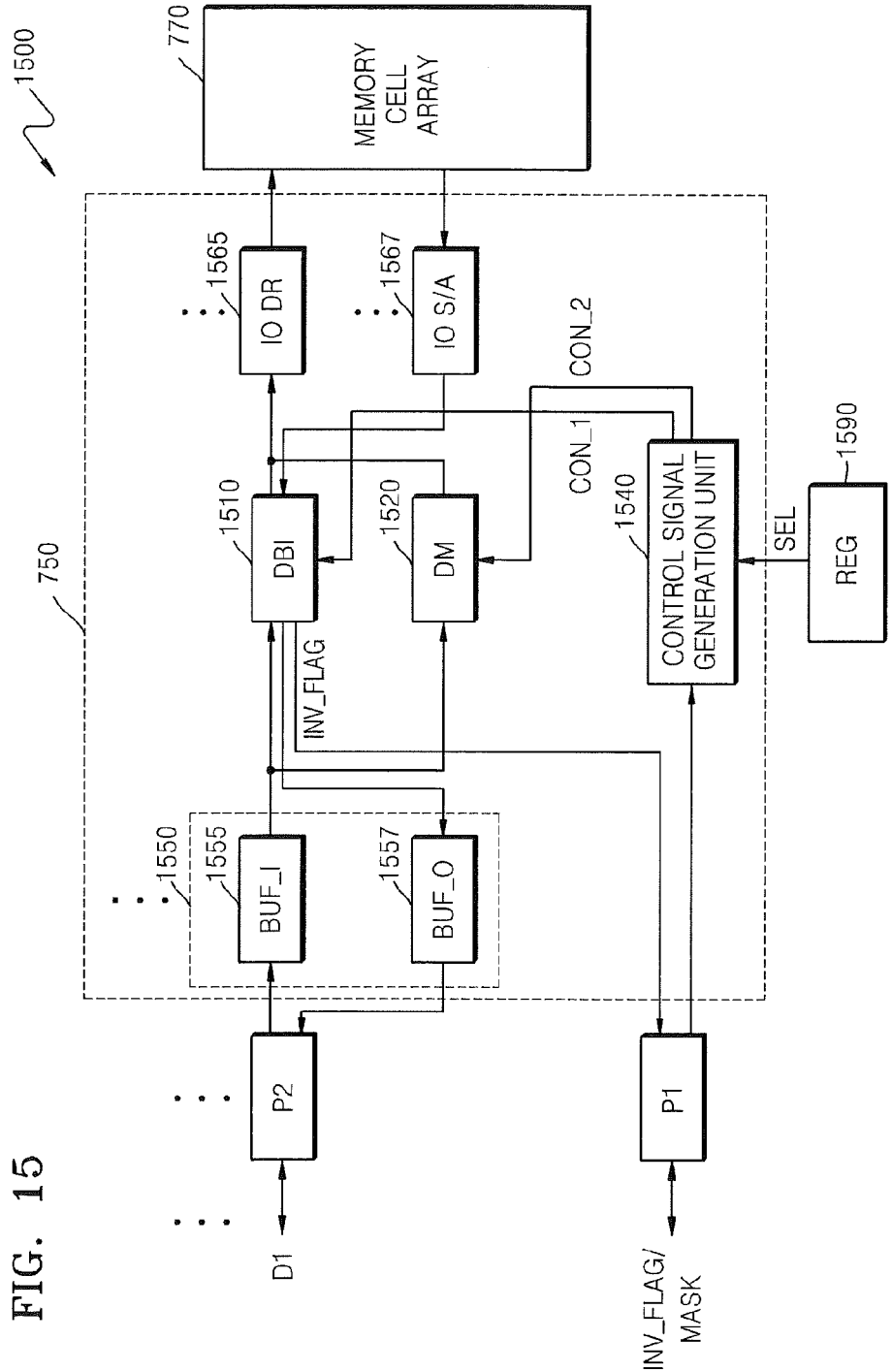
FIG. 15 is a block diagram of a semiconductor device that is another embodiment of the semiconductor device of FIG. 7 according to the inventive concepts.

FIG. 15 is a block diagram of a semiconductor device 1500 that is another embodiment of the semiconductor device 700 of FIG. 7 according to the inventive concepts.

In FIG. 15, a first pad P1, a plurality of second pads P2, and a memory cell array 770 have been described above with reference to FIG. 7.

Referring to FIGS. 7 and 15, the data control unit 750 may include a control signal generation unit 1540, a plurality of buffer units 1550, a plurality of driving units 1565, a plurality of sense amplification units 1567, a DBI unit 1510, and a DM unit 1520.

If the semiconductor device 1500 performs the write operation, the control signal generation unit 1540 may generate a first control signal CON_1 or a second control signal CON_2 according to selection information SEL and a signal output from the first pad P1. That is, if semiconductor device 1500 performs the write operation, the control signal generation unit 1540 may generate the first control signal CON_1 according to the selection information SEL and a data inversion flag INV_FLAG, and may generate the second control signal CON_2 according to the selection information SEL and a masking signal MASK. If the semiconductor device 1500 performs the read operation, the control signal generation unit 1540 may generate the first control signal CON_1 according to the selection information SEL, similar to the control signal generation units 1340 and 1440 of FIGS. 13 and 14. As described above, it is assumed that the data control unit 750 does not mask read data while the semiconductor device 1500 performs a read operation, Thus, the control signal generation unit 1540 does not generate a second control signal CON_2 while the semiconductor device 1500 performs the read operation.

The selection information SEL may be stored in a register 1590. For example, the selection information SEL may be defined according to an MRS command stored in the register 1590. That is, the control signal generation unit 1540 may generate the first control signal CON_1 or the second control signal CON_2 according to the MRS command stored in the register 1590.

The plurality of buffer units 1550, the plurality of driving units 1565, and the plurality of sense amplification units 1567 are similar to the plurality of buffer units 1350, the plurality of driving units 1365, and the plurality of sense amplification units 1367 of FIG. 13, respectively.

If the semiconductor device 1500 performs the read operation, the DBI unit 1510 and the DM unit 1520 operate similar to the DBI unit 1310 and the DM unit 1320 of FIG. 13, respectively. Accordingly, the operations of the DBI unit 1510 and the DM unit 1520 when the semiconductor device 1500 performs the read operation will not be described here.

The DBI unit 1510 is used when the data inversion scheme described above with reference to FIG. 13 is established. If the semiconductor device 1500 performs the write operation, then according to the first control signal CON_1, the DBI unit 1510 may invert data received from the input buffer 1555 and output the inverting result to the driving unit 1565. That is, the DBI unit 1510 may be enabled or disabled according to the first control signal CON_1.

The DM unit 1520 is used when the data masking scheme described above with reference to FIG. 13 is established. If the semiconductor device 1500 performs the write operation, the DM unit 1520 may not transmit the data received from the input buffer 1555 to the driving unit 1565. That is, the DM unit 1520 may be enabled or disabled according to the second control signal CON_2.

The operation of the semiconductor device 1500 of FIG. 15 according to an embodiment of the inventive concepts will now be described. For convenience of explanation, it is assumed the operation of the semiconductor device 1500 of FIG. 15 will be described with respect to the data inversion mode and the data masking mode assumed above with respect to FIG. 13.

First, a case where the semiconductor device 1500 performs the write operation in the data inversion mode will be described. In the data inversion mode, the control signal generation unit 1540 may generate the first control signal CON_1 according to the selection information SEL and the signal output from the first pad P1. That is, if in the data inversion mode, the data inversion flag INV_FLAG is input to the control signal generation unit 1540 via the first pad P1, then the control signal generation unit 1540 may generate the first control signal CON_1 for controlling the DBI unit 1510 to invert and output the received data. If in the data inversion mode, the data inversion flag INV_FLAG is not input to the control signal generation unit 1540 via the first pad. P1, then the control signal generation unit 1540 may generate the first control signal CON_1 for controlling the DBI unit 1510 to output the received data directly without inverting the data. Since the control signal generation unit 1540 does not generate the second control signal CON_2, the DM unit 1520 is disabled.

If 1-bit data D1 is input sequentially to the second pad P2 and the input buffer 1555 and finally to the DBI unit 1510 and the data inversion flag INV_FLAG is input to the control signal generation unit 1540 via the first pad P1, then the DBI unit 1510 inverts the received data and transmits the inverting result to the driving unit 1565 according to the first control signal CON_1. If the data inversion flag INV_FLAG is not input to the control signal generation unit 1540 via the first pad P1, the DBI unit 1510 does not invert the received data and transmits the received data directly to the driving unit 1565 according to the first control signal CON_1. The driving unit 1565 writes the transmitted data to a corresponding memory cell of the memory cell array 770.

A case where the semiconductor device 1500 performs the write operation in the data masking mode will be described. In the data masking mode, the control signal generation unit 1540 may generate the second control signal CON_2 according to the selection information SEL and the signal output from the first pad P1. That is, if in the data masking mode, the masking signal MASK is put to the control signal generation unit 1540 via the first pad P1, then the control signal generation unit 1540 may generate the second control signal CON_2 for controlling the DBI unit 1520 not to transmit the received data. If in the data masking mode, the masking signal MASK is not input to the control signal generation unit 1540 via the first pad P1, then the control signal generation unit 1540 may generate the second control signal CON_2 for controlling the DM unit 1520 to transmit the received data. Since the control signal generation unit 1540 does not generate the first control signal CON_1 and the second control signal CON_2, the DBI unit 1510 is disabled.

If the 1-bit data D1 is input sequentially to the second pad P2 and the input buffer 1555 and finally to the DM unit 1520 and the masking signal MASK is input to the control signal generation unit 1540 via the first pad P1, then the DM unit 1520 does not transmit the received data according to the second control signal CON_2. If the masking signal MASK is not input to the control signal generation unit 1540 via the first pad P1, then the DM unit 1520 transmits the received data to the driving unit 1565 according to the second control signal CON_2. The driving unit 1565 writes the transmitted data to the corresponding memory cell of the memory cell array 770.

Figure 16:
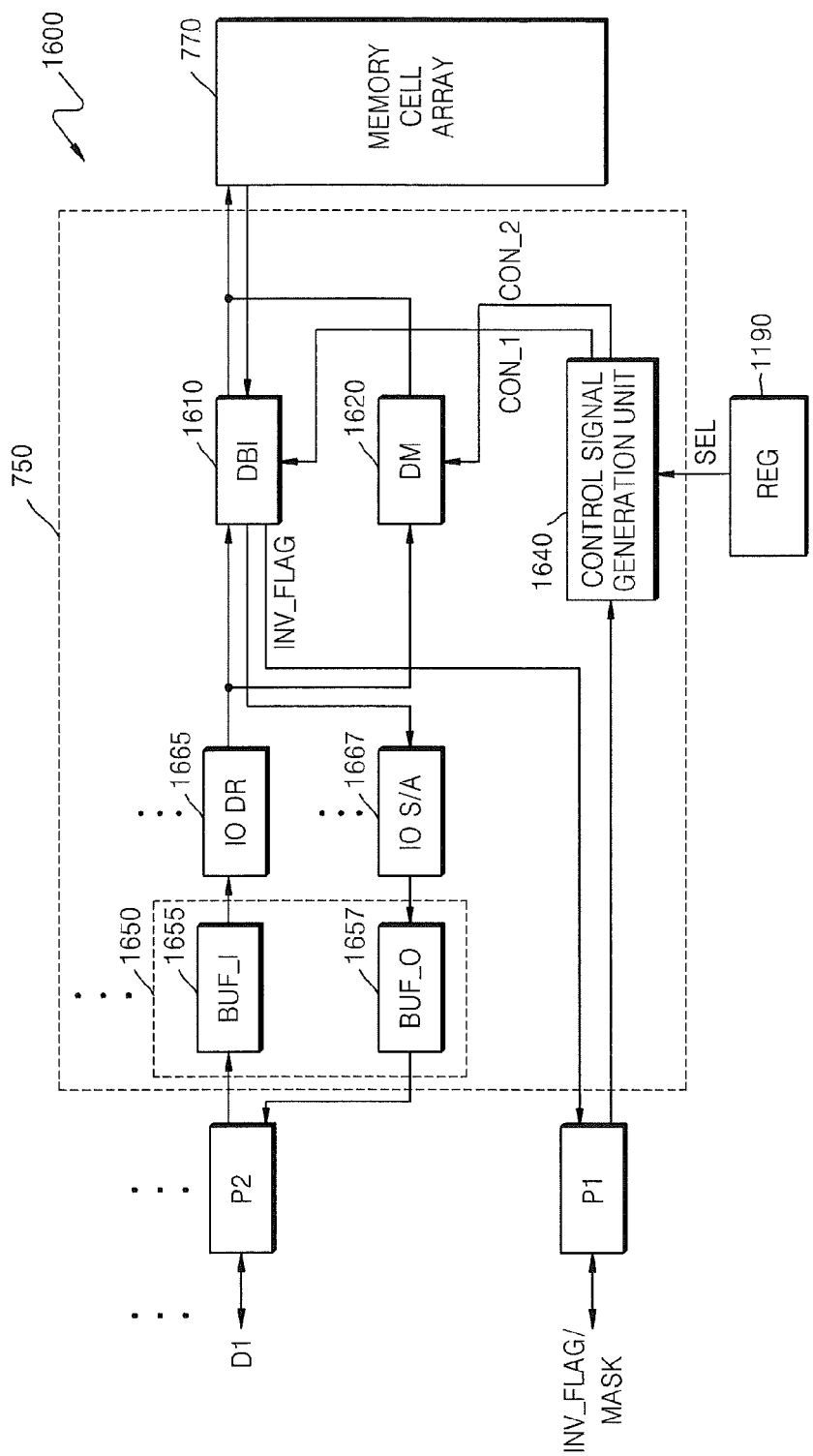
FIG. 16 is a block diagram of a semiconductor device that is another embodiment of the semiconductor device of FIG. 7 according to the inventive concepts.

FIG. 16 is a block diagram of a semiconductor device 1600 that is another embodiment of the semiconductor device 700 of FIG. 7 according to the inventive concepts.

In FIG. 16, a first pad P1, a plurality of second pads P2, and a memory cell array 770 have been described above with reference to FIG. 7.

Referring to FIGS. 7, and 13 to 16, the data control unit 750 may include a control signal generation unit 1640, a plurality of buffer units 1650, a plurality of driving units 1665, a plurality of sense amplification units 1667, a DBI unit 1610, and a DM unit 1620.

Similar to the control signal generation unit 1540 of FIG. 15, the control signal generation unit 1640 may generate a first control signal CON_1 or a second control signal CON_2 and transmit the generated signal to the DBI unit 1610 or the DM unit 1620, according to selection information SEL and a signal output via the first pad P1.

The selection information SEL may be stored in a register 1690. For example, the selection information SEL may be defined according to an MRS command stored in the register 1690. That is, the control signal generation unit 1640 may generate the first control signal CON_1 or the second control signal CON_2 according to the MRS command stored in the register 1690.

The plurality of buffer units 1650, the plurality of driving units 1665, and the plurality of sense amplification units 1667 are similar to the plurality of buffer units 1450, the plurality of driving units 1465, and the plurality of sense amplification units 1467 of FIG. 14, respectively.

As described above with reference to FIG. 15, if semiconductor device 1600 performs the read operation, then a DBI unit 1610 and a DM unit 1620 of FIG. 16 operate similar to the DBI unit 1410 and the DM unit 1430 of FIG. 14, respectively. Thus, the operations of the DBI unit 1610 and the DM unit 1620 when the semiconductor device 1600 performs the read operation will not be described here.

The DBI unit 1610 may invert and output received data according to a first control signal CON_1. In detail, if the semiconductor device 1600 performs the write operation, the DBI unit 1610 may invert data output from the driving unit 1665 and write the inverting result to the corresponding memory cell of the memory cell array 770 according to the first control signal CON_1. The structure and operation of the DBI unit 1610 are similar to those of the DBI unit 1510 of FIG. 15.

The DM unit 1620 may output received data or may mask the data according to a second control signal CON_2. In detail, if the semiconductor device 1600 performs the write operation, the DM unit 1620 may write or may not write the data output from the driving unit 1665 to the corresponding memory cell of the memory cell array 770 according to the second control signal CON_2. The structure and operation of the DM unit 1620 are similar to those of the DM unit 1520 of FIG. 15.

The operation of the semiconductor device 1600 of FIG. 16 according to an embodiment of the inventive concepts will now be described in detail. The operations of the DBI unit 1610 and the DM unit 1620 are similar to those of the DBI unit 1510 and the DM unit 1520 of FIG. 15 and will be described briefly here.

First, if semiconductor device 1600 is in the data inversion mode, the control signal generation unit 1640 generates only the first control signal CON_1 according to selection information SEL and a signal output from the first pad P1 and only the DBI unit 1610 is thus enabled according to the first control signal CON_1 as described above with reference to FIG. 16. If the semiconductor device 1600 performs the write operation, then according to the first control signal CON_1, the DBI unit 1610 may invert the data output from the driving unit 1665 and write the inverting result to the corresponding memory cell of the memory cell array 770.

If the semiconductor device 1600 is in the data masking mode, the control signal generation unit 1640 generates only the second control signal CON_2 according to the selection information SEL and the signal output from the first pad P1 and only the DM unit 1620 is thus enabled according to the second control signal CON_2 as described above with reference to FIG. 15. If the semiconductor device 1600 performs the write operation, the DM unit 1620 may not write the data output from the driving unit 1665 to the corresponding memory cell of the memory cell array 770 according to the second control signal CON_2.

Figure 17A:
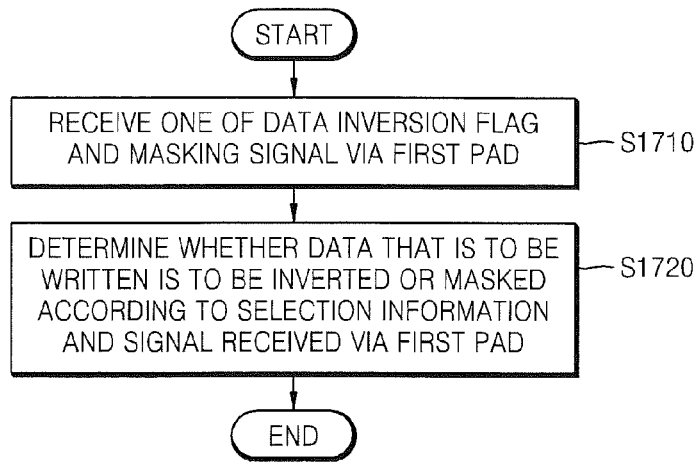
FIG. 17A is a flowchart illustrating a method of performing a write operation by using the semiconductor devices of FIGS. 13 to 16, according to an embodiment of the inventive concepts.

FIG. 17A is a flowchart illustrating a method of performing a write operation by using the semiconductor devices 1300 to 1600 of FIGS. 13 to 16, according to an embodiment of the inventive concepts.

Referring to FIGS. 13 to 17A, if each of the semiconductor devices 1300 to 1600 performs the write operation, a data inversion flag INV_FLAG or a masking signal MASK may be input to the first pad P1 of each of the semiconductor devices 1300 to 1600 (operation S1710). Next, the data control unit 750 may determine whether data that is to be written is to be inverted or to be masked, according to selection information SEL and the signal input to the first pad P1 (operation S1720).

The operation of the data control unit 750 when each of the semiconductor devices 1300 to 1600 performs the write operation has been described above in detail with reference to FIGS. 13 to 16.

Figure 17B:
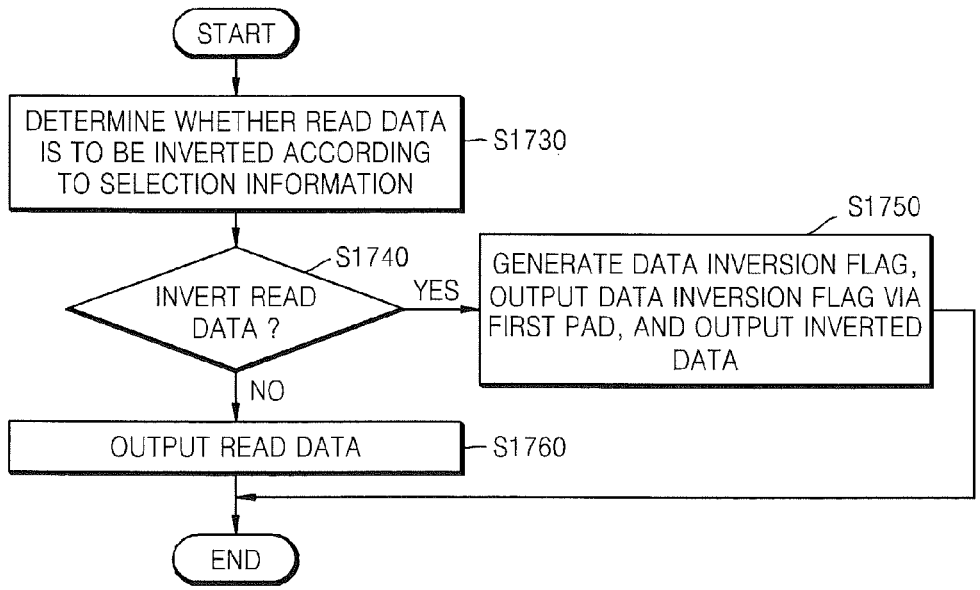
FIG. 17B is a flowchart illustrating a method of performing a read operation by using the semiconductor devices of FIGS. 13 to 16, according to an embodiment of the inventive concepts.

FIG. 17B is a flowchart illustrating a method of performing a read operation by using the semiconductor devices 1300 to 1600 of FIGS. 13 to 16, according to an embodiment of the inventive concepts.

Referring to FIGS. 13 to 16 and 17B, if each of the semiconductor devices 1300 to 1600 performs the read operation, the data control unit 750 may determine whether data that is read is to be inverted, according to selection information SEL (operation S1730). For example, the DMI unit may determine that the read data is to be inverted when the number of bits of the read data that are logic 'high' is greater than half the total number of bits of the read data, and may determine that the read data is not to be inverted when the number of the bits of the read data that are logic 'high' is less than the half the total number of bits of the read data. If it is determined in operation S1730 that the read data is to be inverted (operation S1740), then the data control unit 750 generates a data inversion flag INV_FLAG, outputs the data inversion flag INV_FLAG via the first pad P1, inverts the read data, and outputs the inverting result to a corresponding second pad P2 (operation S1750). If it is determined in operation S1730 that the read data is not to be inverted, then the data control unit 750 does not generate the data inversion flag INV_FLAG, and outputs the read data via a corresponding second pad P2 (operation S1760). The operation of the data control unit 750 when each of the semiconductor devices 1300 to 1600 performs the read operation has been described above in detail with reference to FIGS. 13 to 16.

FIGS. 13 through 17B illustrate cases where one of the data inversion scheme and the data masking scheme is applied to the semiconductor devices 1300 to 1600, but the inventive concepts is not limited thereto and the other various schemes may also be applied by using one pad.

Figure 18:
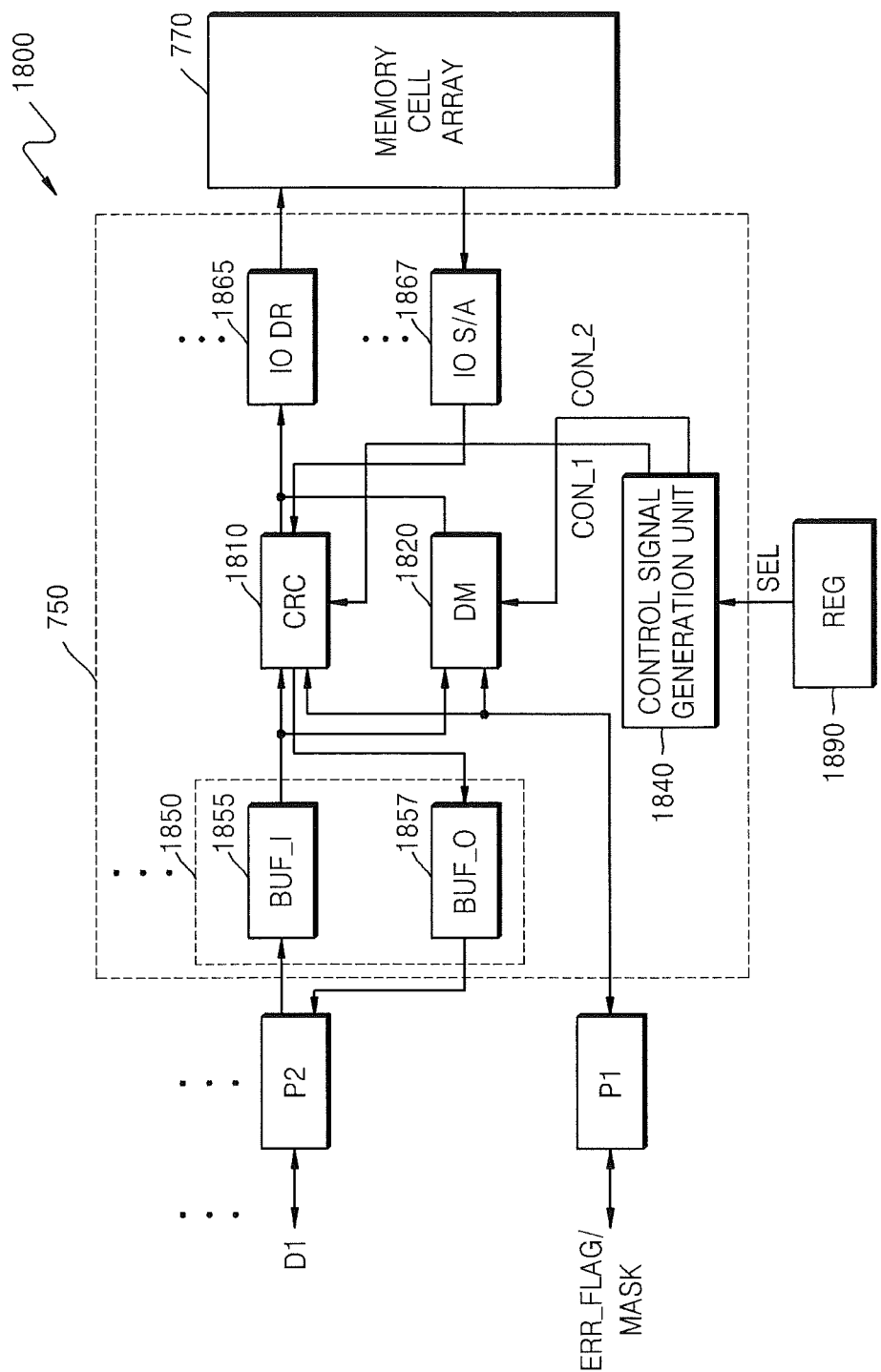
FIG. 18 is a block diagram of a semiconductor device of the semiconductor device of FIG. 7 according to the inventive concepts.

FIG. 18 is a block diagram of a semiconductor device 1800 of the semiconductor device 700 of FIG. 7 according to the inventive concepts.

In FIG. 18, a first pad P1, a plurality of second pad P2s, and a memory cell array 770 have been described above with reference to FIG.

Referring to FIGS. 7 and 18, the data control unit 750 may include a control signal generation unit 1840, a plurality of buffer units 1850, a plurality of driving units 1865, a plurality of sense amplification units 1867, an error check unit 1810, and a DM unit 1820.

The control signal generation unit 1840 may generate a first control signal CON_1 or a second control signal CON_2 according to selection information SEL and transmit the generated signal to the error check unit 1810 and the DM unit 1820. Here, it is assumed that the first control signal CON_1 controls the error check unit 1810 to be enabled or to disabled and the second control signal CON_2 controls the DM unit 1820 to be enabled or disabled.

The selection information SEL may be stored in a register 1890. For example, the selection information SEL may be defined according to an MRS command stored in the register 1890. That is, the control signal generation unit 1840 may generate the first control signal CON_1 or the second control signal CON_2 according to the MRS command stored in the register 1890.

Each of the plurality of buffer units 1850 may be connected among the error check unit 1810 and the DM unit 1820, and a corresponding second pad P2. Each of the plurality of buffer units 1850 may include an input buffer 1855 and an output buffer 1857. The input buffer 1855 may buffer data received via the corresponding second pad P2, and may transmit the buffering result to the error check unit 1810 and the DM unit 1820. The output buffer 1855 may buffer data output from the error check unit 1810 or the DM unit 1820, and may transmit the buffering result to the corresponding second pad P2.

The plurality of driving units 1865 and the plurality of sense amplification units 1867 may be connected between at least one of the error check unit 1810 and the DM unit 1820, and the memory cell array 770. Each of the plurality of driving units 1865 may write data received from one of the error check unit 1810 and the DM unit 1820 to a corresponding memory cell of the memory cell array 770. Each of the plurality of sense amplification units 1867 may sense and amplify data received from a corresponding memory cell of the memory cell array 770 and transmit the amplified data to the error check unit 1810.

The error check unit 1810 is used when the error check scheme is established. The error check scheme allows determination as to whether an error occurs during data transmission. For example, according to the error check scheme, n-bit data D1, . . . through to Dn of FIG. 7 may be transmitted together with a parity bit that is logic 'high' when the total number of bits that are logic 'high' is an odd number from among the n-bit data D1, . . . through to Dn of FIG. 7 and may be transmitted together with a parity bit that is logic 'low' when the total number of the bits that are logic 'high' is an even number, so that whether an error occurs during data transmission may be determined. The error check unit 1810 may be constructed in various ways and the structure thereof will not be described here.

If the semiconductor device 1800 performs the write operation, error check unit 1810 may perform error checking on the data received from the input buffer 1855 according to the first control signal CON_1 and an error check flag ERR_FLAG. If the semiconductor device 1800 performs the read operation, then according to the first control signal CON_1, the error check unit 1810 may perform error checking on data read from the memory cell array 970 and sense-amplified by the sense amplification unit 1867, transmit the sense-amplified data to the output buffer 1857, generate the error check flag ERR_FLAG, and transmit the error check flag ERR_FLAG to the first pad P1. That is, the error check unit 1810 may be enabled or disabled according to the first control signal CON_1.

The DM unit 1820 is used when the data masking scheme is established. According to the data masking scheme, if data that is in the same logic state as the data stored in the memory cell array 770 is to be written to the memory cell array 770, then a masking operation is performed to not transmit the data. The DM unit 1820 may be constructed in various ways and the structure thereof will not be described here.

If the semiconductor device 1800 performs the write operation, the DM unit 1820 may not transmit the data output from the input buffer 1855 to the driving unit 1865 according to the second control signal CON_2 and a masking signal MASK. That is, the DM unit 1820 may be enabled or disabled according to the second control signal CON_2. Hereinafter it is assumed that the data control unit 750 does not mask the read data during a read operation. That is, when the semiconductor device 1800 performs the read operation, the DM unit 1820 does not operate. However, the inventive concepts is not limited thereto and the data control unit 750 may determine whether the read data is to be masked and whether the masking signal MASK is to be generated, during a read operation.

The operation of the semiconductor device 1800 of FIG. 18 according to an embodiment of the inventive concepts will be described in detail. Here, for convenience of explanation, it is assumed that in the error check mode, the semiconductor device 1800 may perform error checking on data that is to be written or to be read, and in the data masking mode, the semiconductor device 900 may not transmit data that is to be written to the memory cell array 770. For convenience of explanation, it is assumed that in the current embodiment, 1-bit data D1 from among the n-bit data D1, . . . , through to Dn is to be written or is to be read but the other data may also be written or read similar to the way the 1-bit data D1 is written or read.

First, a case where the semiconductor device 1800 performs the write operation in the error check mode will be described. In the error check mode, the control signal generation unit 1840 generates only the first control signal CON_1 and does not generate a second control signal CON_2 according to the selection information SEL. Thus, the error check unit 1810 is enabled according to the control signal CON_1 and the DM unit 1820 is disabled.

If data D1 is input sequentially to the second pad P2 and the input buffer 1855 and finally to the error check unit 1810 and the error check flag ERR_FLAG is input to the error check unit 1810 via the first pad P1, then the error check unit 1810 performs error checking on the data DATA. If error check flag ERR_FLAG is not input to the first pad P1, the error check unit 1810 does not perform error checking on the data DATA and transmits the data DATA directly to the memory cell array 770.

A case where the semiconductor device 1800 performs the read operation in the error check mode will be described. In the error check mode, the control signal generation unit 1840 generates only the first control signal CON_1 and does not generate a third control signal CON_3 according to the selection information SEL. Thus, the error check unit 1810 is enabled according to the control signal CON_1 and the DM unit 1820 is disabled.

The error check unit 1810 may determine whether the data read from the memory cell array 770 is to be error checked, according to the first control signal CON_1. That is, if the error check unit 1810 performs error checking on the read data and transmits the read data to the driving unit 1865, then the error check unit 1810 generates the error check flag ERR_FLAG indicating that the read data has been error checked and transmits the error check flag ERR_FLAG to the first pad P1. If the error check unit 1810 does not perform error checking on the read data and transmits the read data directly to the output buffer 1857, then the error check unit 1810 does not generate the error check flag ERR_FLAG.

A case where the semiconductor device 1800 performs the write operation in the data masking mode will be described. In the data masking mode, the control signal generation unit 1840 generates only the second control signal CON_2 and does not generate the first control signal CON_1 according to the selection information SEL. Thus, the DM unit 1820 is enabled according to the second control signal CON_2 and the error check unit 1810 is disabled.

If the data D1 is input sequentially to the second pad P2, and the input buffer 1855 and finally to the DM unit 1820 and the masking signal MASK is input to the DM unit 1820 via the first pad P1, then the DM unit 1820 does not transmit the data DATA to the driving unit 1865. If the masking signal MASK is not input to the first pad P1, the DM unit 1820 transmits the data D1 to the driving unit 1865.

Figure 19:
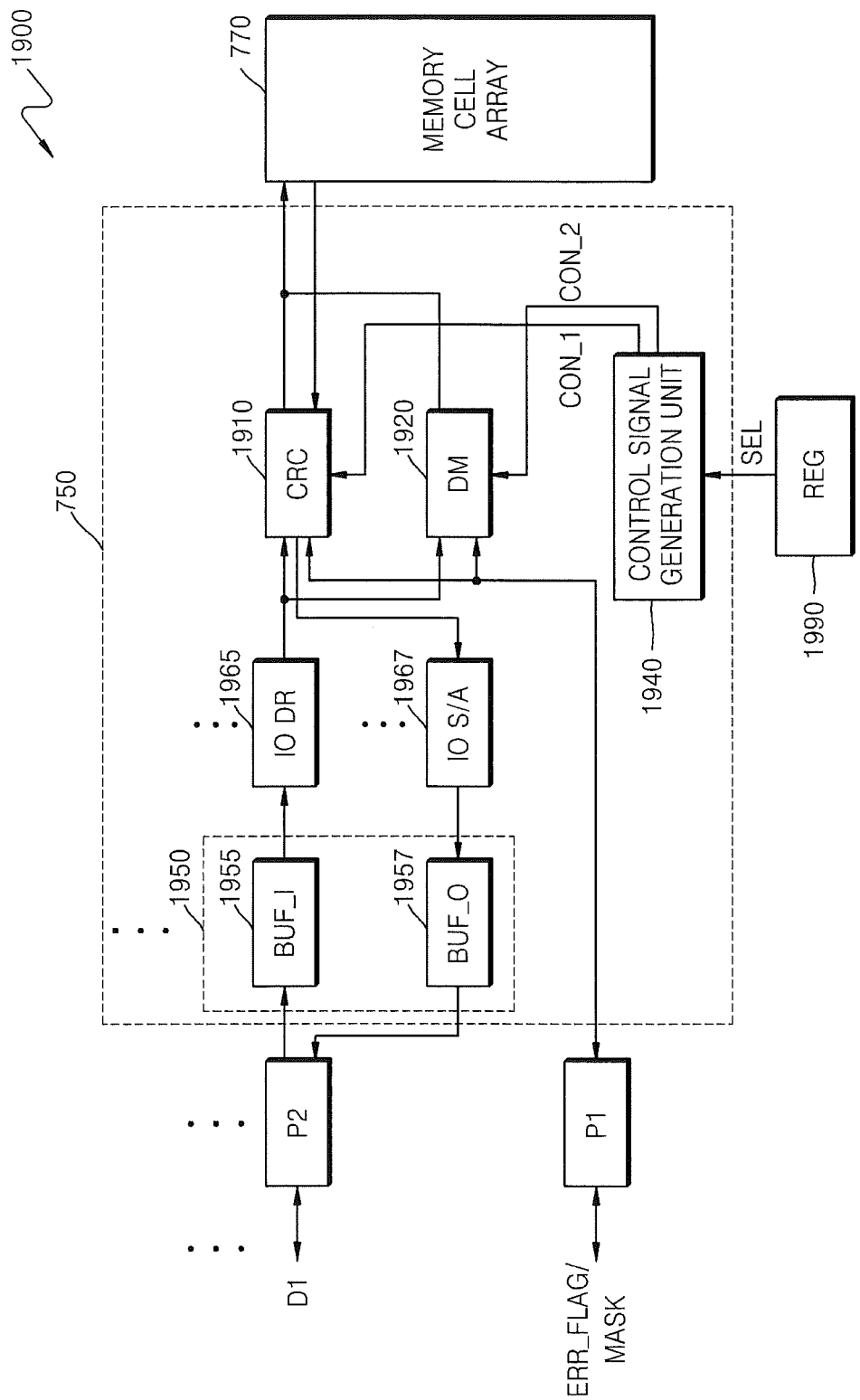
FIG. 19 is a block diagram of a semiconductor device that is another embodiment of the semiconductor device of FIG. 7, according to another embodiment of the inventive concepts.

FIG. 19 is a block diagram of a semiconductor device 1900 that is another embodiment of the semiconductor device 700 of FIG. 7, according to another embodiment of the inventive concepts.

In FIG. 19, a first pad P1, a plurality of second pads P2, and a memory cell array 770 have been described above with reference to FIG. 7.

Referring to FIGS. 7, 18, and 19, the data control unit 750 may include a control signal generation unit 1940, a plurality of buffer units 1950, a plurality of driving units 1965, a plurality of sense amplification units 1967, an error check unit 1910, and a DM unit 1920.

Similar to the control signal generation unit 1840 of FIG. 18, the control signal generation unit 1940 may generate a first control signal CON_1 or a second control signal CON_2 according to selection information SEL and may output it to the error check unit 1910 or the DM unit 1920.

The selection information SEL may be stored in a register 1990. For example, the selection information SEL may be defined according to an MRS command stored in the register 1990. That is, the control signal generation unit 1940 may generate the first control signal CON_1, or the second control signal CON_2 according to the MRS command stored in the register 1990.

Each of the plurality of buffer units 1950 may be connected to a corresponding driving unit of the driving units 1965, and a corresponding second pad P2. Each of the plurality of buffer units 850 may include an input buffer 1955 and an output buffer 1957. The input buffer 1955 may buffer data received via the corresponding second pad P2, and may transmit the buffering result to the corresponding driving unit. The output buffer 1957 may buffer data output from the sense amplification unit 1967, and may transmit the buffering result to the corresponding second pad P2.

The plurality of driving units 1965 and the plurality of sense amplification units 1967 may be connected between at least one of the error check unit 1910 and the DM unit 1920, and a corresponding buffer unit of the plurality of buffer units 1950. Each of the plurality of driving units 1965 may transmit data output from the input buffer 1955 to the error check unit 1910 and the DM unit 1920. Each of the plurality of sense amplification units 1967 may sense and amplify the data output from the error check unit 1910 and transmit the sense-amplified data to the output buffer 1957.

The error check unit 1910 may perform error checking on received data and then output the data according to a first control signal CON_1. In detail, if the semiconductor device 1900 performs the write operation, the error check unit 1910 may perform error checking on data output from the driving unit 1965 according to the first control signal CON_1 and an error check flag ERR_FLAG and may write the data to a corresponding memory cell of the memory cell array 770. If the semiconductor device 1900 performs the read operation, error check unit 1910 may perform error checking on data read by the corresponding memory cell of the memory cell array 770, transmit the data to the second pad P2, generate the error check flag ERR_FLAG, and then transmit the error check flag ERR_FLAG to the first pad P1. The structure and operation of the error check unit 1910 are similar to those of the error check unit 1810 of FIG. 18.

The DM unit 1920 may output received data or may mask the data according to a second control signal CON_2. In detail, if the semiconductor device 900 performs the write operation, the DM unit 1920 may mask the data received via the second pad P2 according to the second control signal CON_2 and a masking signal MASK. As described above with reference to FIG. 18, it is assumed that the data control unit 750 does not mask the read data while the semiconductor device 1900 performs a read operation. Thus, when the semiconductor device 1900 performs the read operation, the DM unit 1920 does not operate. The structure and operation of the DM unit 1920 are similar to those of the DM unit 1820 of FIG. 18.

The operation of the semiconductor device 1900 of FIG. 25 according to an embodiment of the inventive concepts will be described in detail. The operations of the error check unit 1910 and the DM unit 1920 are similar to those of the error check unit 1810 and the DM unit 1820 of FIG. 18, respectively.

First, if the semiconductor device 1900 is in the error check mode, the control signal generation unit 1940 generates only the first control signal CON_1 according to the selection information SEL and only the error check unit 1910 is enabled according to the first control signal CON_1 as described above with reference to FIG. 18. If semiconductor device 1900 performs the write operation, the error check unit 1910 may perform error checking on data output from the driving unit 1965 and write the data to a corresponding memory cell of the memory cell array 770 according to the error check flag ERR_FLAG. If semiconductor device 1900 performs the read operation, then according to the first control signal CON_1, error check unit 1910 may perform error checking on the data read by the corresponding memory cell of the memory cell array 770, transmit the data to the sense amplification unit 1967, generate the error check flag ERR_FLAG, and transmit the error check flag ERR_FLAG to the first pad P1.

If the semiconductor device 1900 is in the data masking mode, the control signal generation unit 1940 generates only the second control signal CON_2 according to the selection information SEL and only the DM unit 1920 is thus enabled according to the second control signal CON_2 as described above with reference to FIG. 18. If semiconductor device 1900 performs the write operation, the DM unit 1920 may not write the data output from the driving unit 1965 to the corresponding memory cell of the memory cell array 770 according to the mask signal MASK. As described above, it is assumed that the data control unit 750 does not mask the read data while the semiconductor device 1900 performs a read operation. Thus, when the semiconductor device 1900 performs the read operation, the DM unit 1920 does not operate.

Figure 20:
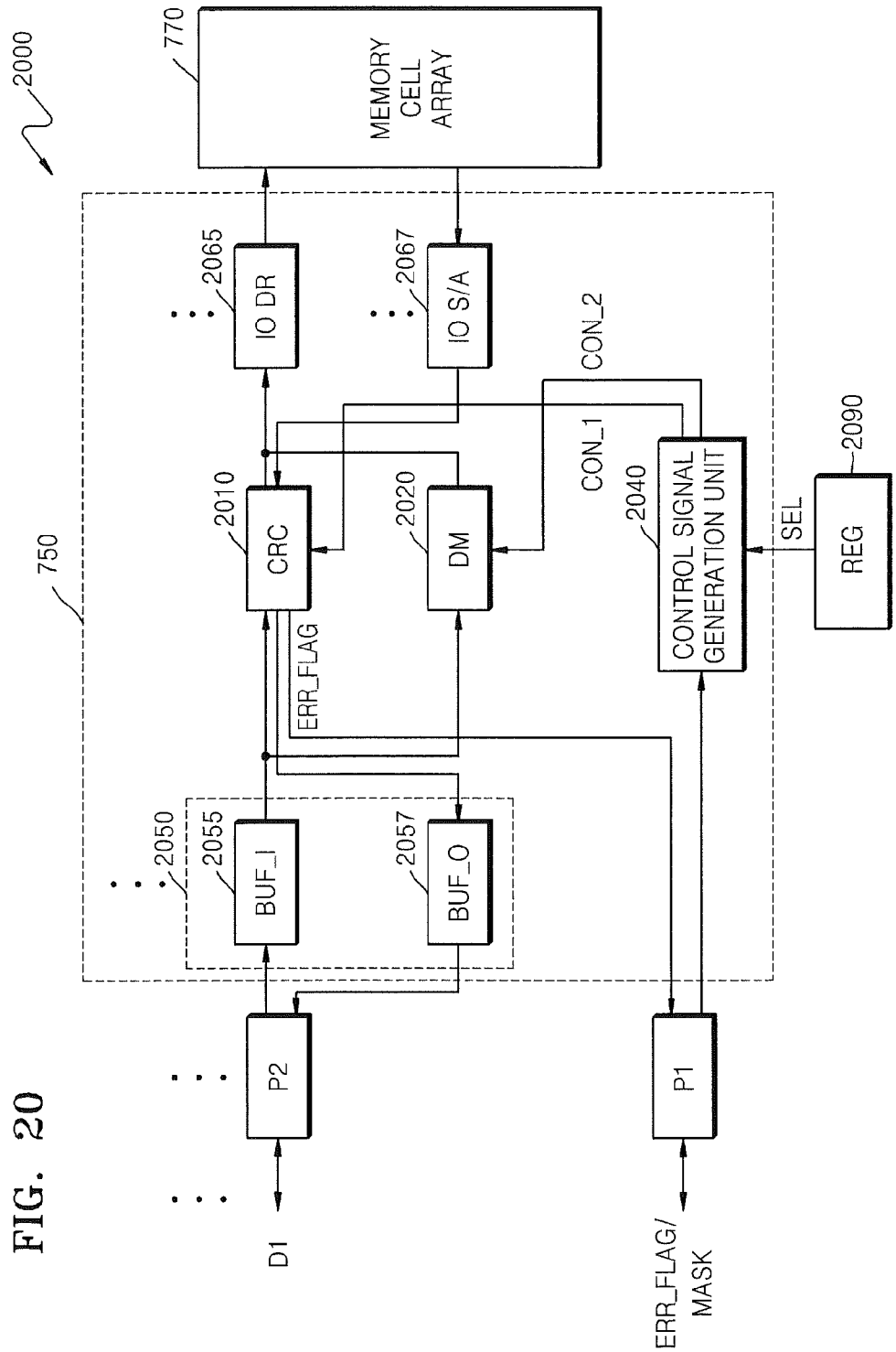
FIG. 20 is a block diagram of a semiconductor device that is another embodiment of the semiconductor device of FIG. 7 according to the inventive concepts.

FIG. 20 is a block diagram of a semiconductor device 2000 that is another embodiment of the semiconductor device 700 of FIG. 7 according to the inventive concepts.

Figure 27:
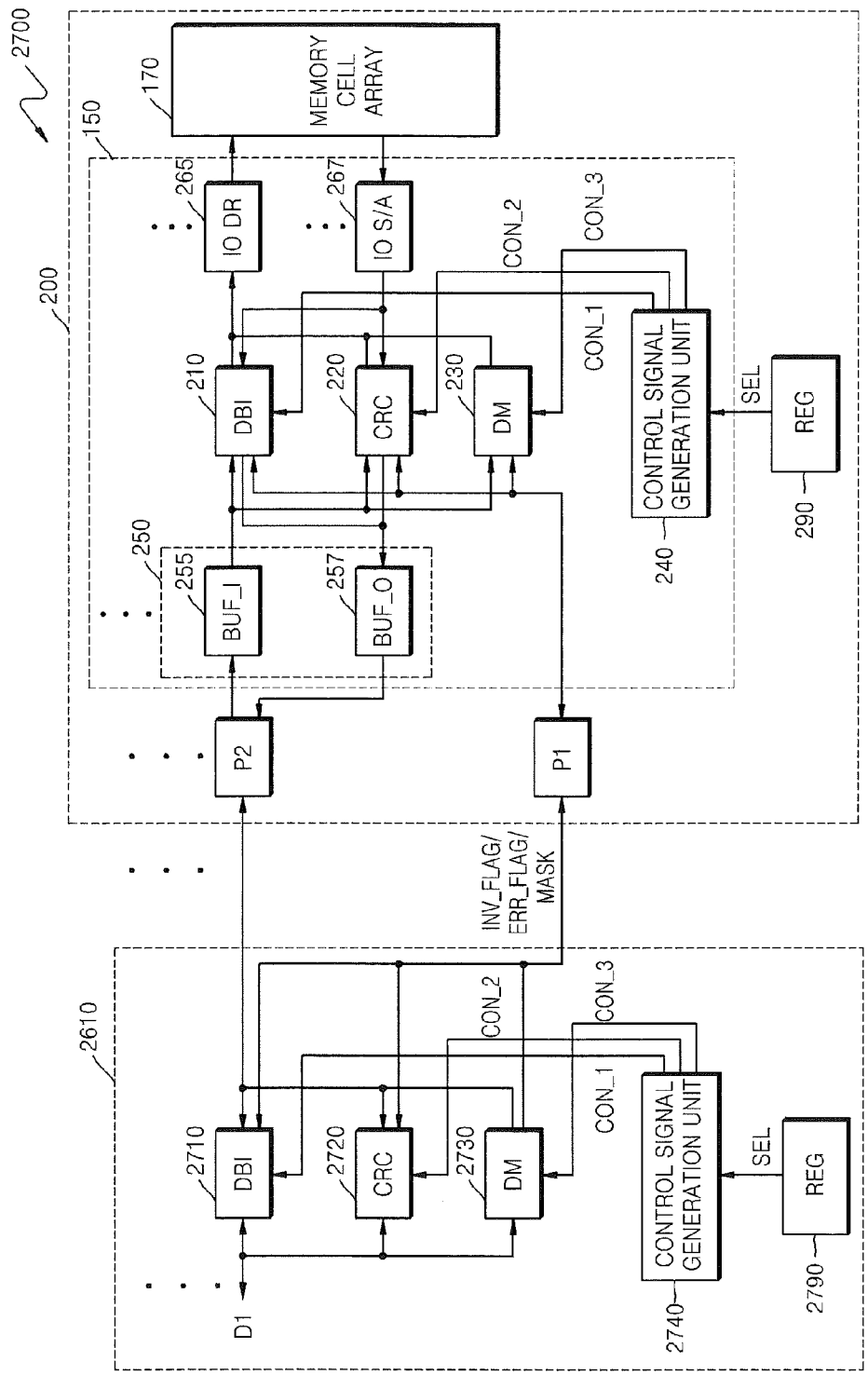
FIG. 27 is a block diagram of a memory system that is another embodiment of the memory system of FIG. 26 according to the inventive concepts.

In FIG. 27, a first pad P1, a plurality of second pads P2, and a memory cell array 770 have been described above with reference to FIG. 7.

Referring to FIGS. 7 and 20, the data control unit 750 may include a control signal generation unit 2040, a plurality of buffer units 2050, a plurality of driving units 2065, a plurality of sense amplification units 2067, an error check unit 2010, and a DM unit 2020.

If the semiconductor device 2000 performs the write operation, the control signal generation unit 2020 may generate a first control signal CON_1 or a second control signal CON_2 according to selection information SEL and a signal output from the first pad P1. That is, if semiconductor device 2000 performs the write operation, the control signal generation unit 2040 may generate a first control signal CON_1 according to the selection information SEL and an error check flag ERR_FLAG and may generate a second control signal CON_2 according to the selection information SEL and a masking signal MASK. If the semiconductor device 2000 performs the read operation, the control signal generation unit 2020 may generate the first control signal CON_1 or the second control signal CON_2 according to the selection information SEL, similar to the control signal generation units 1840 and 1940 illustrated in FIGS. 18 and 19. As described above, it is assumed that the data control unit 750 does not mask the read data while the semiconductor device 2000 performs a read operation. Thus, when the semiconductor device 2000 performs the read operation, the control signal generation unit 2040 does not generate a second control signal CON_2.

The selection information SEL may be stored in a register 2090. For example, the selection information SEL may be defined according to an MRS command stored in the register 2090. That is, the control signal generation unit 2040 may generate the first control signal CON_1, or the second control signal CON_2 according to the MRS command stored in the register 2090.

The operations of the plurality of buffer units 2050, the plurality of driving units 2065, and the plurality of sense amplification unit 2067 are similar to those of the plurality of buffer units 1850, the plurality of driving units 1865, and the plurality of sense amplification unit 1867 of FIG. 18, respectively.

If the semiconductor device 2000 performs the read operation, the error check unit 2010 and the DM unit 2020 of FIG. 20 operate to the error check unit 1810 and the DM unit 1820 of FIG. 18, respectively. Accordingly, the operations of the error check unit 2010 and the DM unit 2020 when the semiconductor device 2000 performs the read operation will not be described here.

The error check unit 2010 is used when the error check scheme described above with reference to FIG. 19 is established. If the semiconductor device 2000 performs the write operation, the error check unit 2010 may perform error checking on data received from the sense amplification unit 2060 according to the first control signal CON_1. That is, the error check unit 2710 may be enabled or disabled according to the first control signal CON_1.

The DM unit 2020 is used when the data masking scheme described above with reference to FIG. 18 is established. If the semiconductor device 2000 performs the write operation, the DM unit 2020 may not transmit the data output from the input buffer 2055 to the memory cell array 970 according to the second control signal CON_2. That is, the DM unit 2020 may be enabled or disabled according to the second control signal CON_2.

The operation of the semiconductor device 2000 of FIG. 20 according to an embodiment of the inventive concepts will be described in detail. For convenience of explanation, the operation of the semiconductor device 2000 of FIG. 20 will be described with respect to the error check mode and the data masking scheme described above with reference to FIG. 18.

First, a case where the semiconductor device 2000 performs the write operation in the error check mode will be described. In the error check mode, the control signal generation unit 2040 may generate the first control signal CON_1 according to the selection information SEL and the signal output from the first pad P1. That is, if in the error check mode, an error check flag ERR_FLAG is input to the control signal generation unit 2040 via the first pad P1, then the control signal generation unit 2040 may generate the first control signal CON_1 for controlling the error check unit 2010 to perform error checking on the received data. If in the error check mode, the error check flag ERR_FLAG is not input to the control signal generation unit 2040 via the first pad P1, then the control signal generation unit 2040 may generate the first control signal CON_1 for controlling the error check unit 2010 to not perform error checking on the received data and to directly transmit the received data. Since the control signal generation unit 2040 does not generate the second control signal CON_2, the DM unit 2020 is disabled.

If 1-bit data D1 is input sequentially to the second pad P2 and the input buffer 2055 and finally to the error check unit 2010 and the error check flag ERR_FLAG is input to the control signal generation unit 2040 via the first pad P1, then the error check unit 2010 performs error checking on the received data according to the first control signal CON_1 and transmits the received data to the driving unit 2065. If the error check flag ERR_FLAG is not input to the control signal generation unit 920 via the first pad P1, the error check unit 2710 does not perform error checking on the received data and transmits the data directly to the driving unit 2065 according to the first control signal CON_1. The driving unit 2065 writes the transmitted data to a corresponding memory cell of the memory cell array 770.

A case where the semiconductor device 2000 performs the write operation in the data masking mode will be described. In the data masking mode, the control signal generation unit 2040 may generate the second control signal CON_2 according to the selection information SEL and the signal output from the first pad P1. That is, if in the data masking mode, the masking signal MASK is input to the control signal generation unit 2040 via the first pad P1, then the control signal generation unit 2040 may generate the second control signal CON_2 for controlling the DM unit 2020 not to transmit the received data. If in the data masking mode the masking signal MASK is not input to the control signal generation unit 2040 via the first pad P1, then the control signal generation unit 2040 may generate the second control signal CON_2 for controlling the DM unit 2020 to transmit the received data. Since the control signal generation unit 2040 does not generate the first control signal CON_1, the error check unit 2010 is disabled.

If the 1-bit data D1 is input sequentially to the second pad P2 and the input buffer 2055 and finally to the DM unit 2020 and the masking signal MASK is input to the control signal generation unit 2040 via the first pad P1, then the DM unit 2020 does not transmit the received data according to the second control signal CON_2. If the masking signal MASK is not input to the control signal generation unit 2040 via the first pad P1, the DM unit 2020 transmits the received data to the driving unit 2065 according to the second control signal CON_2. The driving unit 2065 writes the transmitted data to the corresponding memory cell of the memory cell array 770.

Figure 21:
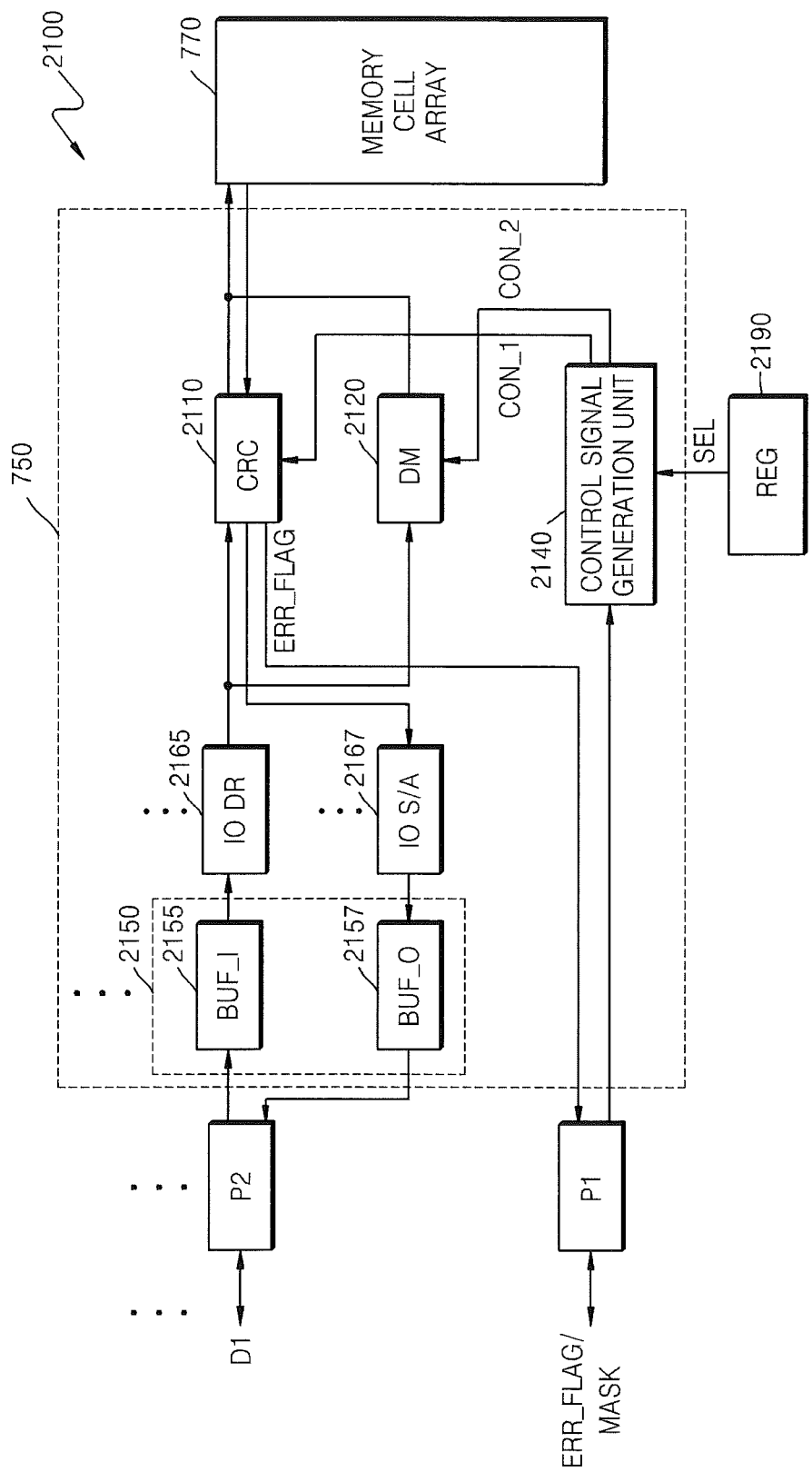
FIG. 21 is a block diagram of a semiconductor device that is another embodiment of the semiconductor device of FIG. 7 according to the inventive concepts.

FIG. 21 is a block diagram of a semiconductor device 2100 that is another embodiment of the semiconductor device 700 of FIG. 7 according to the inventive concepts. In FIG. 21, a first pad P1, a plurality of second pads P2, and a memory cell array 770 have been described above with reference to FIG. 7.

Referring to FIGS. 7, 18 to 21, the data control unit 750 may a control signal generation unit 2140, a plurality of buffer units 2150, a plurality of driving units 2165, a plurality of sense amplification units 2167, an error check unit 2110, and a DM unit 2120.

Similar to the control signal generation unit 2140 of FIG. 20, the control signal generation unit 2140 may generate a first control signal CON_1 or a second control signal CON_2 according to selection information SEL and may output it to the error check unit 2110 or the DM unit 2120.

The selection information SEL may be stored in a register 2190. For example, the selection information SEL may be defined according to an MRS command stored in the register 2190. That is, the control signal generation unit 2140 may generate the first control signal CON_1, or the second control signal CON_2 according to the MRS command stored in the register 2190.

The operations of the plurality of buffer units 2150, the plurality of driving units 2165, and the plurality of sense amplification unit 2167 are similar to those of the plurality of buffer units 1950, the plurality of driving units 1965, and the plurality of sense amplification unit 1967 of FIG. 19, respectively. As illustrated in FIG. 20, if the semiconductor device 2100 performs the read operation, an error check unit 2110 and a DM unit 2120 of FIG. 21 operate similar to the error check unit 1910 and the DM unit 1920 of FIG. 19, respectively. Thus, the operations of the error check unit 2110 and the DM unit 2120 when the semiconductor device 2100 performs the read operation will not be described.

The error check unit 2110 may perform error checking on received data and then output the data according to a first control signal CON_1. In detail, if the semiconductor device 2100 performs the write operation, the error check unit 2810 may write data output form the driving unit 2165 to a corresponding memory cell of the memory cell array 770 according to the first control signal CON_1. The structure and operation of the error check unit 2110 are similar to those of the error check unit 2010 of FIG. 20.

The DM unit 2120 may output received data or may mask the received data according to a second control signal CON_2. In detail, if the semiconductor device 2100 performs the write operation, the DM unit 2120 may write or may not write the data output form the driving unit 2165 to the corresponding memory cell of the memory cell array 770, according to the second control signal CON_2. The structure and operation of the DM unit 2120 are similar to those of the DM unit 2020 of FIG. 20, respectively.

The operation of the semiconductor device 2100 of FIG. 21 according to an embodiment of the inventive concepts will now be described in detail. The operations of the error check unit 2110 and the DM unit 2120 are similar to those of the error check unit 2010 and the DM unit 2020 of FIG. 20, respectively.

First, if the semiconductor device 2100 is in the error check mode, the control signal generation unit 2140 generates only the first control signal CON_1 according to the selection information SEL and a signal output from the first pad P1 and only the error check unit 2110 is enabled according to the first control signal CON_1 as described above with reference to FIG. 20. If the semiconductor device 2100 performs the write operation, the error check unit 2110 may invert data output form the driving unit 2165 and write the inverted data to the corresponding memory cell of the memory cell array 770 according to the first control signal CON_1.

If the semiconductor device 2100 is in the data masking mode, the control signal generation unit 2140 generates only the second control signal CON_2 according to the selection information SEL and the signal output from the first pad P1 and only the DM unit 2120 is thus enabled according to the second control signal CON_2 as described above with reference to FIG. 20. If the semiconductor device 2100 performs the write operation; the DM unit 2120 may not transmit the data received via the second pad P2 to the sense amplification unit 2160 according to the second control signal CON_2. The data output from the driving unit 2165 may be inverted and then may be or may not be written to the corresponding memory cell of the memory cell array 770.

The operation of the semiconductor device 2100 of FIG. 21 according to an embodiment of the inventive concepts will be described in detail. The operations of the error check unit 2110 and the DM unit 2120 are similar to those of the error check unit 2010 and the DM unit 2020 of FIG. 20.

First, if the semiconductor device 2100 is in the error check mode, the control signal generation unit 2140 generates only the first control signal CON_1 according to selection information SEL and a signal output from the first pad P1 and only the error check unit 2110 is enabled according to the first control signal CON_1 as described above with reference to FIG. 20. If the semiconductor device 2100 performs the write operation, the error check unit 2110 may invert the data output from the driving unit 2165 and write the data to the corresponding memory cell of the memory cell array 770 according to the first control signal CON_1.

If the semiconductor device 2100 is in the data masking mode, the control signal generation unit 2140 generates the second control signal CON_2 according to the selection information SEL and the signal output from the first pad P1 and only the DM unit 2120 is thus enabled according to the second control signal CON_2 as described above with reference to FIG. 20. If the semiconductor device 2100 performs the write operation, the DM unit 2120 may invert the data output from the driving unit 2165 and write or not write the data to the corresponding memory cell of the memory cell array 770 according to the second control signal CON_2.

Figure 22A:
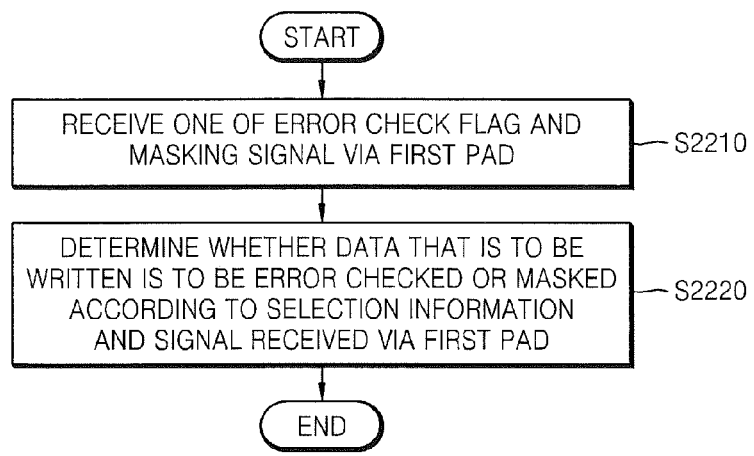
FIG. 22A is a flowchart illustrating a method of performing the read operation by using the semiconductor devices of FIGS. 19 to 21, according to another embodiment of the inventive concepts.

FIG. 22A is a flowchart illustrating a method of performing the write operation by using the semiconductor devices 1800 to 2100 of FIGS. 18 to 21, according to another embodiment of the inventive concepts. Referring to FIGS. 7 and 18 to 22A, if each of the semiconductor devices 1800 to 2100 performs the write operation, an error check flag ERR_FLAG or a masking signal MASK may be input to the first pad P1 of each of the semiconductor devices 1800 to 2100 (operation S2210). Next, the data control unit 750 may determine whether data that is to be written is to be error checked and to be masked, according to selection information SEL and the error check flag ERR_FLAG or the masking signal MASK supplied to the first pad P1 (operation S2220). The operation of the data control unit 750 when each of the semiconductor devices 1800 to 2100 performs the write operation has been described above with reference to FIGS. 7, and 18 to 21.

Figure 22B:
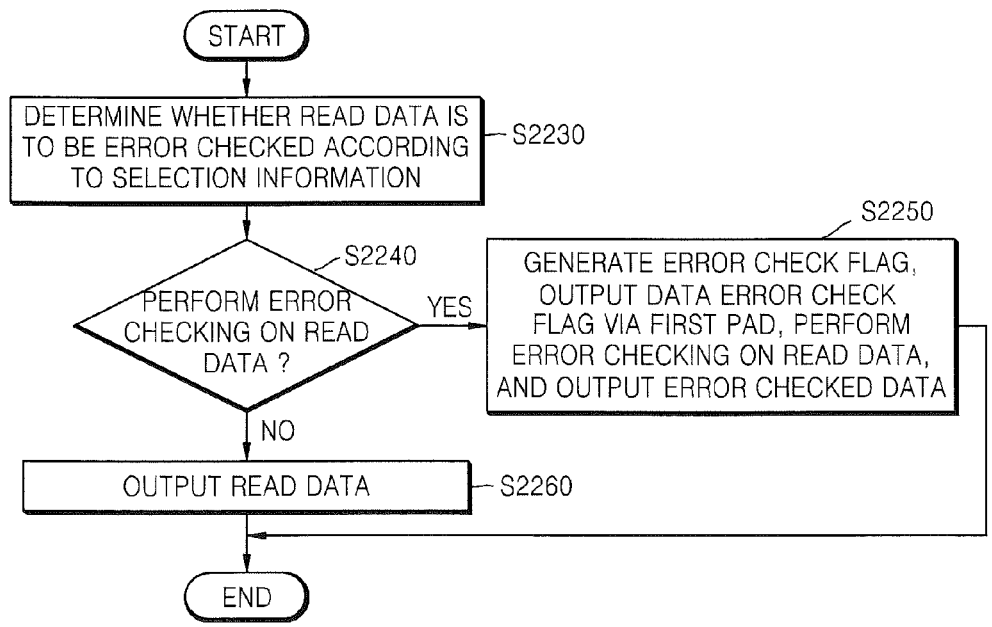
FIG. 22B is a flowchart illustrating a method of performing the read operation by using the semiconductor devices of FIGS. 18 to 21, according to another embodiment of the inventive concepts.

FIG. 22B is a flowchart illustrating a method of performing the read operation by using the semiconductor, devices 1800 to 2100 of FIGS. 18 to 21, according to another embodiment of the inventive concepts. Referring to FIGS. 7, 18 to 21, and 22B, if each of the semiconductor devices 1800 to 2100 performs the read operation, the data control unit 750 may determine whether data that is read is to be error checked, according to selection information SEL (operation S2230). If it is determined to perform error checking on the read data in operation S220 (operation S2230), the data control unit 750 generates an error check flag ERR_FLAG, outputs the error check flag ERR_FLAG via the first pad P1, performs error checking on the read data, and outputs the read data via the corresponding second pad P2 (operation S2250). If it is determined not to perform error checking on the read data in operation S220 (operation S2260), the data control unit 750, the data control unit 750 does not generate the error check flag ERR_FLAG and outputs the read data via the corresponding second pad P2 (operation S2260). The operation of the data control unit 750 when each of the semiconductor devices 1800 to 2100 performs the read operation has been described above with reference to FIGS. 18 to 21.

Figure 23A:
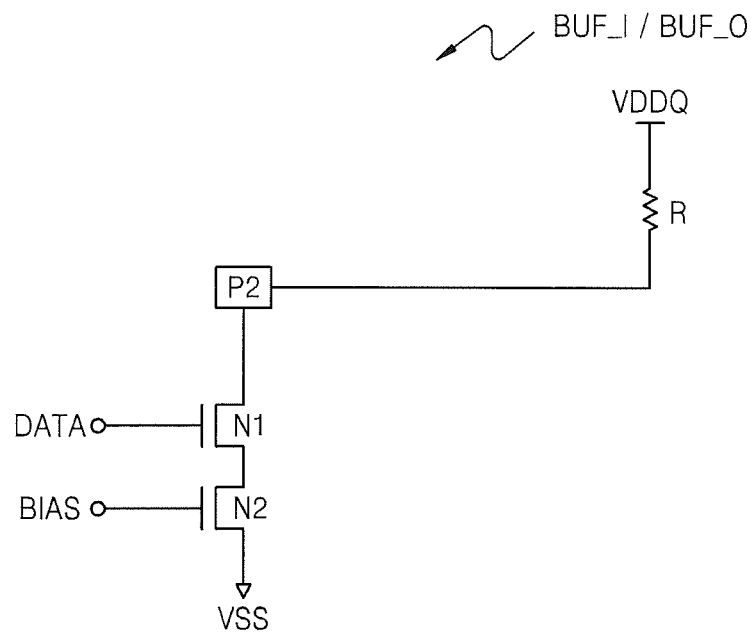
FIG. 23A is a circuit diagram of an input buffer or an output buffer included in a semiconductor device according to an embodiment of the inventive concepts.

FIG. 23A is a circuit diagram of an input buffer BUF_I or an output buffer BUF_O included in a semiconductor device according to an embodiment of the inventive concepts. That is, FIG. 23A is a circuit diagram of the input buffer BUF_I or the output buffer BUF_O illustrated in FIGS. 18 to 21, according to an embodiment of the inventive concepts. Referring to FIG. 23A, the input buffer BUF_I or the output buffer BUF_O may be an open drain type input/output buffer. That is, the input buffer BUF_I or the output buffer BUF_O may include first and second transistors N1 and N2. The first transistor N1 may an NMOS transistor, in which data DATA is supplied to a gate, a first terminal is connected to a second pad P2, and the second terminal is connected to a first terminal of the second transistor T2 but the inventive concepts is not limited thereto. The second transistor T2 may be an NMOS transistor, in which a bias voltage BIAS is applied to a gate, the first terminal is connected to the second terminal of the first transistor N1, and a second terminal is connected to a ground voltage VSS source but the inventive concepts is not limited thereto. For example, PMOS transistors may be used as the first and second transistors N1 and N2 through a simple circuit modification.

For example, if the bias voltage BIAS is a high voltage and the data DATA is logic high, then the first and second transistors N1 and N2 are turned on to form a current path from a power supply voltage VDDQ source to the ground voltage VSS source via a resistor R, thereby allowing current to flow along the current path. If the data DATA is logic low, then the transistor N1 is turned off, thereby preventing current from flowing along the current path from the power supply voltage VDDQ source to the ground voltage VSS source.

Figure 23B:
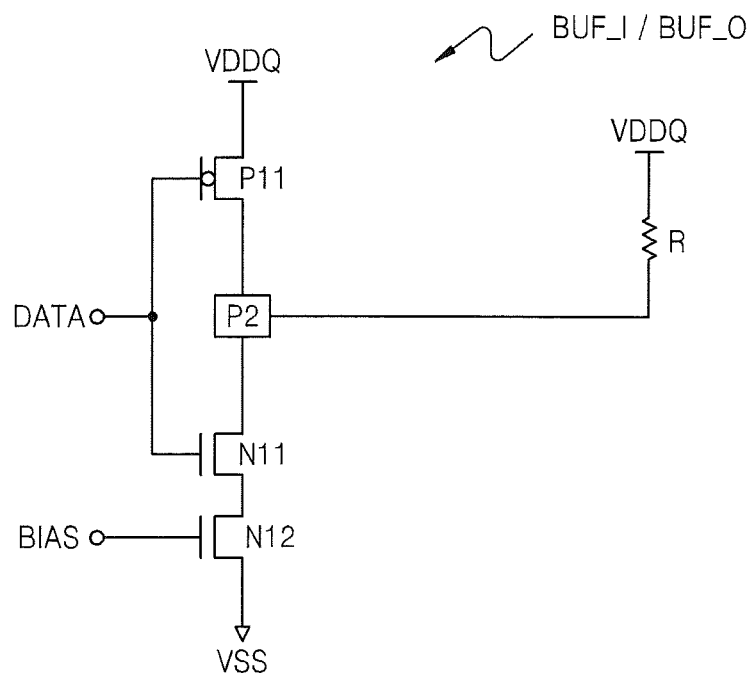
FIG. 23B is a circuit diagram of an input buffer or an output buffer included in a semiconductor device according to another embodiment of the inventive concepts.

FIG. 23B is a circuit diagram of an input buffer BUF_I or an output buffer BUF_O included in a semiconductor device according to another embodiment of the inventive concepts. That is, FIG. 23B is a circuit diagram of the input buffer BUF_I or the output buffer BUF_O illustrated in FIGS. 2 to 5, 8 to 11, 13 to 16, and 18 to 21, according to another embodiment of the inventive concepts. Referring to FIG. 23B, the buffer unit BUF may be an open drain type input/output buffer, the structure of which is different from that of the input buffer BUF_I or the output buffer BUF_O of FIG. 23A. That is, the input buffer BUF_I or the output buffer BUF_O of FIG. 23B may include a first transistor P11, a second transistor N11, and a third transistor N12. The first transistor P11 may be a PMOS transistor, in which data DATA is supplied to a gate, a first terminal is connected to a power supply voltage VDDQ source, and a second terminal is connected to a second pad P2, but the inventive concepts is not limited thereto and an NMOS transistor may be used as the first transistor P11 through a simple circuit modification. The second transistor N11 may be an NMOS transistor, in which the data DATA is supplied to a gate, a first terminal is connected to the second pad P2, and a second terminal is connected to a first terminal of the third transistor N12, but the inventive concepts is not limited thereto and a PMOS transistor may be used as the transistor N1 through a simple circuit modification. The third transistor N12 may be an NMOS transistor, in which a bias voltage BIAS is supplied to a gate, a first terminal is connected to the second terminal of the second transistor N11, and a second terminal is connected to the ground voltage VSS source, but the inventive concepts is not limited thereto and a PMOS transistor may be used as the transistor N1 through a simple circuit modification. For example, if the bias voltage BIAS is a high voltage and the data DATA is logic high, then the first transistor P11 is turned off and the second and third transistors N11 and N12 are turned on to form a current path from the power supply voltage VDDQ source to the ground voltage VSS source via the resistor R, thereby allowing current to flow along the current path. If the data DATA is logic low, then the first transistor P11 is turned on and the second transistor N11 is turned off, and thus, current does not flow from the power supply voltage VDDQ source to the ground voltage VSS source.

If the open drain type input/output buffer, such as shown in FIG. 23A or 23B, is used, the more bits that are logic 'high' of data to be written or that is read, the greater power consumption. Thus, if the input buffer BUF_I or the output buffer BUF_O is an open drain type input/output buffer, the data inversion scheme may be used in order to reduce power consumption.

Figure 24:
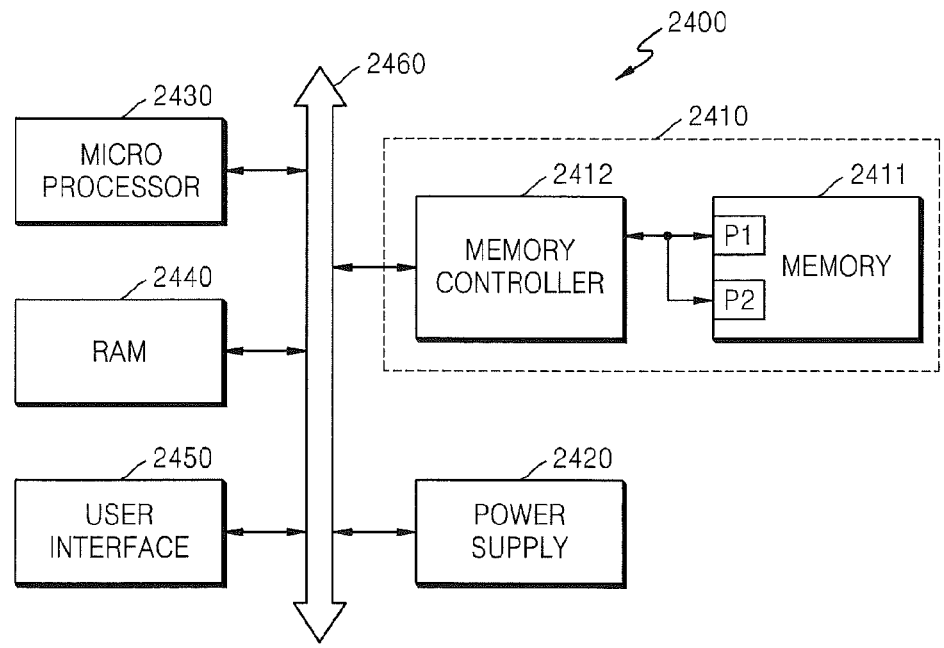
FIG. 24 is a block diagram of a computing system apparatus that includes a semiconductor device according to an embodiment of the inventive concepts.

FIG. 24 is a block diagram of a computing system apparatus 2400 that includes a semiconductor device according to an embodiment of the inventive concepts. Referring to FIG. 24, the computing system apparatus 2400 may include a microprocessor 2430, a user interface unit 2450, and a memory system device 2410 having a memory controller 2412 and a memory device 2411, which are electrically connected to one another via a bus 3260. The memory device 2411 may include one of the semiconductor devices 100 to 2100 illustrated in FIGS. 1 to 21. The memory controller 2412 may control the memory device 2411. That is, the memory controller 2412 may transmit the data inversion flag INV_FLAG, the error check flag ERR_FLAG, or the masking signal MASK which has been described above with reference to FIGS. 1 to 21, to the first pad P1, may receive the data inversion flag INV_FLAG, the error check flag ERR_FLAG, or the masking signal MASK from the first pad P1, may transmit the data D1, . . . through to Dn, which has been described above with reference to FIGS. 1 to 21, to a second pad P2, or my receive the data D1, . . . through to Dn from the second pad P2. In the current embodiment, the computing system apparatus 2400 may further include a random access memory (RAM) 2440 and a power supply device 2420.

If the computing system apparatus 2400 is a mobile device, it may further include a battery for supplying power thereto and a modem, such as a baseband chipset. Also, it would be apparent to those of ordinary skill in the art that the computing system apparatus 2400 may further include an application chipset, a camera image processor (CIS), a mobile dynamic RAM (DRAM), and so on.

The memory controller 2412 and the memory device 2411 may form, for example, a solid state drive/disk (SSD) that uses a non-volatile memory in order to store data.

Figure 25:
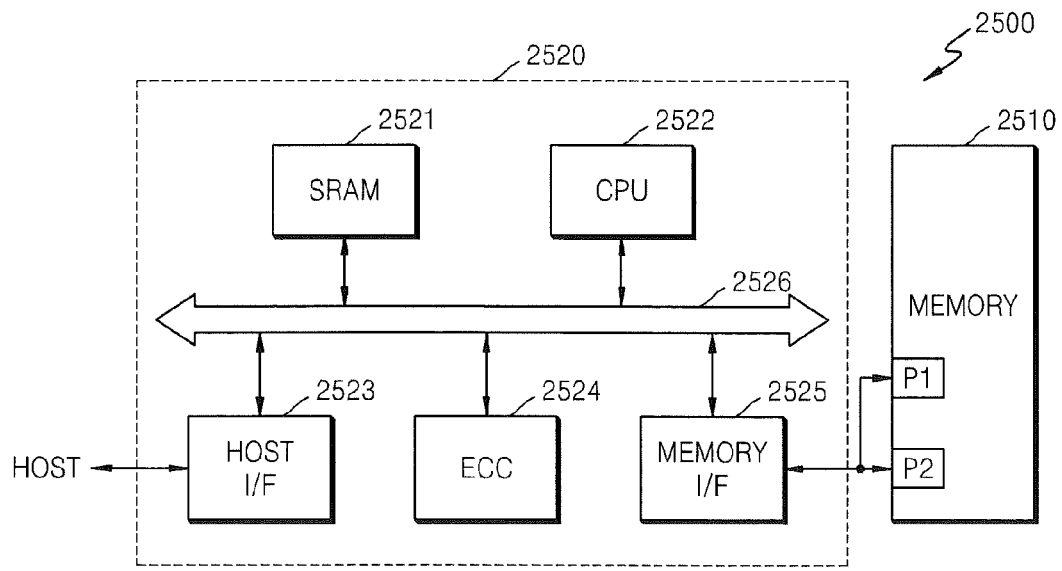
FIG. 25 is a block diagram of a memory card that includes a semiconductor device according to an embodiment of the inventive concepts.

FIG. 25 is a block diagram of a memory card 2500 that includes a semiconductor device according to an embodiment of the inventive concepts. Referring to FIG. 25, the memory card 2500 may include a memory device 2510 and a memory controller 2520. The memory device 2510 may include one of the semiconductor devices 100 to 2100 illustrated in FIGS. 1 to 21. The memory controller 3320 may control the memory device 2510. That is, the memory controller 2520 may transmit the data inversion flag INV_FLAG, the error check flag ERR_FLAG, or the masking signal MASK of FIGS. 1 to 21, to a first pad P1, may receive the data inversion flag INV_FLAG, the error check flag ERR_FLAG, or the masking signal MASK from the first pad P1, may transmit the data D1, . . . through to Dn of FIGS. 1 to 21 to a second pad P2, or may receive the data D1, . . . through to Dn from the second pad P2. The memory controller 2520 may be constructed to commutate with an external apparatus, e.g., a host, via one of various interface protocols; such as a Universal Serial Bus (USB), a MultiMedia Card (MMC), a Peripheral Component Interconnect Express (PCI-E), a Serial Advanced Technology Attachment (SATA), a Parallel. Advanced Technology Attachment (PATA), a Small Computer System Interface (SCSI), an Enhanced Small Device Interface (ESDI), and Integrated Device Electronics (IDE). In FIG. 25, the structures and operations of a central processing unit (CPU) 2522, a synchronous RAM (SRAM) 2521, a host interface (I/F) 2523, an error correcting code (ECC) device 2524, a memory I/F 2525, and a bus 2526 that are included in the memory controller 3320 would be obvious to those of ordinary skill in the art, and will thus not be described here.

The memory devices according to the above embodiments may be mounted via various type packages, such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a System In Package (SIP), a Multi Chip Package (MCP), a Wafer-level Fabricated Package (WFP), and a Wafer-Level Processed Stack Package (WSP).

Figure 26:
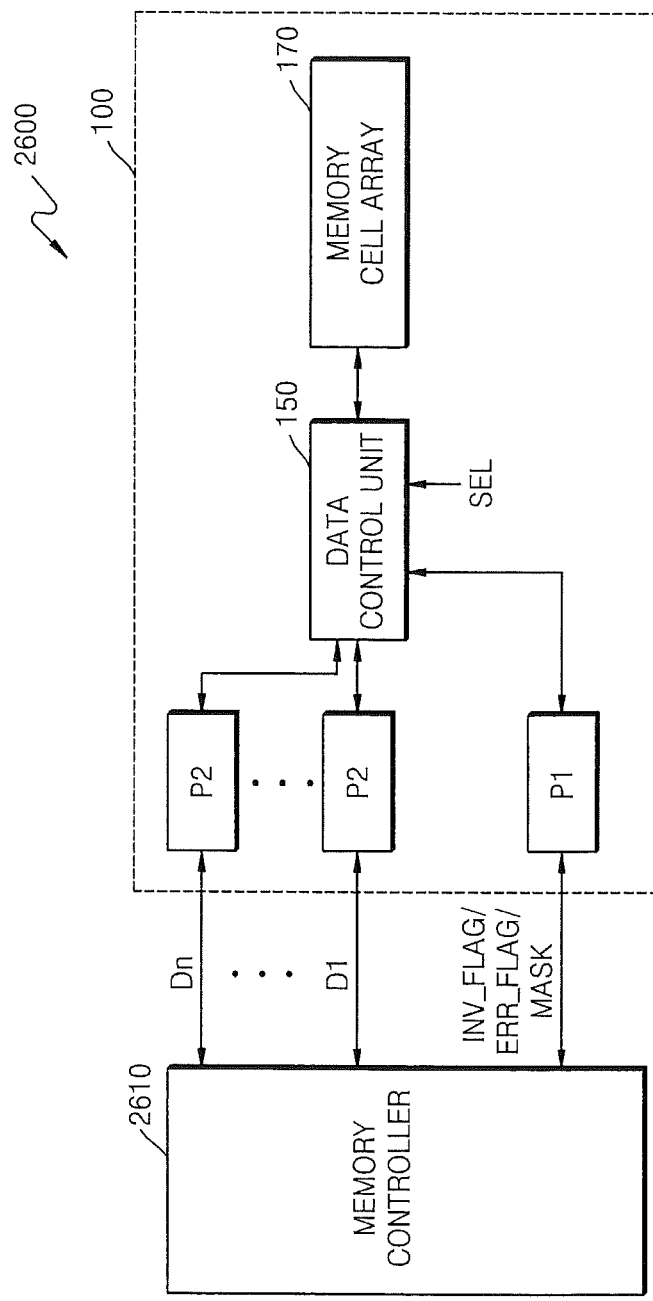
FIG. 26 is a block diagram of a memory system that includes a semiconductor device according to an embodiment of the inventive concepts.

FIG. 26 is a block diagram of a memory system 2600 that includes a semiconductor device according to an embodiment of the inventive concepts. That is, FIG. 26 illustrates in detail the memory controller 2412 and the memory device 2411 of FIG. 24 or the memory controller 2520 and the memory device 2510 of FIG. 25.

Referring to FIG. 26, the memory system 2600 may include a memory controller 2610 and a semiconductor device 100. The semiconductor device 100 is the same as the semiconductor device 100 of FIG. 1, and thus may correspond to one of the semiconductor devices 200 to 500 of FIGS. 2 to 5. The memory controller 2610 may transmit a data inversion flag INV_FLAG, an error check flag ERR_FLAG, or a masking signal MASK to a first pad P1 of the semiconductor device 100, and may receive the data inversion flag INV_FLAG, the error check flag ERR_FLAG, or the masking signal MASK via the first pad P1. That is, if the semiconductor device 100 performs the write operation, then the memory controller 2610 generates the data inversion flag INV_FLAG, the error check flag ERR_FLAG, or the masking signal MASK and outputs it to the first pad P1 according to a selection information SEL. If the semiconductor device 100 performs the read operation, then the memory controller 3410 may receive the data inversion flag INV_FLAG or the error check flag ERR_FLAG, which is generated by a data control unit 150, via the first pad P1. The memory controller 2610 may transmit data D1, . . . through to Dn, which are to be written, to a plurality of second pads P2 of the semiconductor device 100 or may receive the data D1, . . . , DN via the plurality of second pads P2, respectively.

The structure and operation of the semiconductor device 100 has been described above with reference to FIGS. 1 to 6.

FIG. 27 is a block diagram of a memory system 2700 that is another embodiment of the memory system 2600 of FIG. 26 according to the inventive concepts. Referring to FIGS. 26 and 27, a memory controller 2610 may include a DBI unit 2710, an error check unit 2720, a DM unit 2730, a control signal generation unit 2740, and a register 2790.

The control signal generation unit 2740 may generate a first control signal CON_1, a second control signal CON_2, or a third control signal CON_3 and then supply the generated signal to the DBI unit 2710, the error check unit 2720, or the DM unit 2730, according to selection information SEL. Here, it is assumed that the first control signal CON_1 controls the DBI unit 2710 to be enabled or disabled, the second control signal CON_2 controls the error check unit 2720 to be enabled or disabled, and the third control signal CON_3 controls the DM unit 2730 to be enabled or disabled.

The selection information SEL may be stored in the register 2790. For example, the selection information SEL may be defined according to an MRS command stored in the register 2790. That is, the control signal generation unit 2740 may generate the first control signal CON_1, the second control signal CON_2, or the third control signal CON_3 according to the MRS command stored in the register 2790.

The DBI unit 2710 is used when the data inversion scheme is employed, the error check unit 2720 is used when the error check scheme is employed, and the DM unit 2730 is used when the data masking scheme is employed. The structures and operations of the DBI unit 2710, the error check unit 2720, and the DM unit 2730 of the memory controller 2610 are similar to those of the DBI unit 210, the error check unit 220, and the DM unit 230 included in the semiconductor device 200 of FIG. 2, respectively.

FIG. 27 illustrates the memory system 2700, in which the memory controller 2610 controls the semiconductor device 200 illustrated in FIG. 2. The structure and operation of the semiconductor device 200 have been described above with reference to FIG. 2. However, the memory system 2600 of FIG. 26 is not limited by FIG. 27. The memory system 2700 may include one of the semiconductor devices 300 to 500 of FIGS. 3 to 5 instead of the semiconductor device 200.

Figure 28:
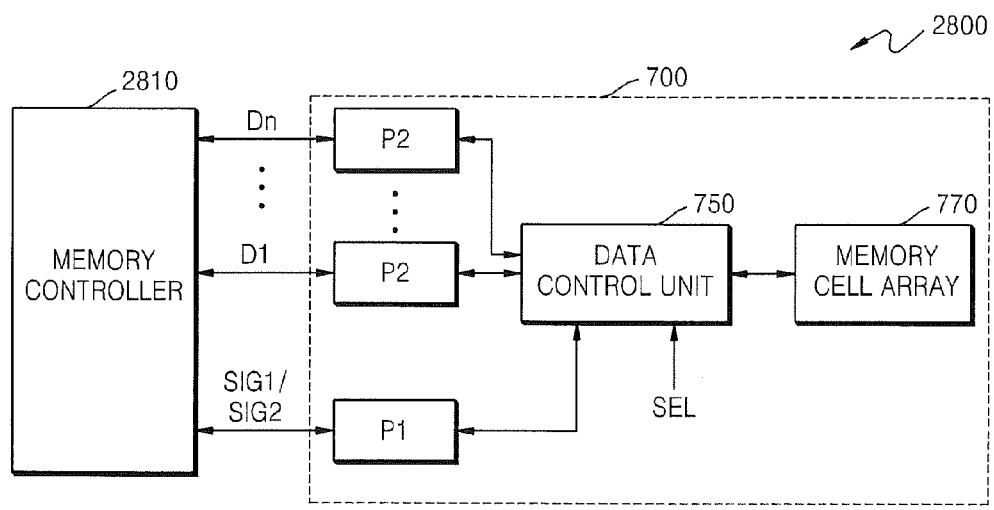
FIG. 28 is a block diagram of a memory system that includes a semiconductor device according to another embodiment of the inventive concepts.

FIG. 28 is a block diagram of a memory system 2800 that includes a semiconductor device 700 according to another embodiment of the inventive concepts. That is, FIG. 28 illustrates in detail the memory controller 2412 and the memory device 2411 of FIG. 24 or the memory controller 2520 and the memory device 2510 of FIG. 25.

Referring to FIG. 28, the memory system 2800 may include a memory controller 2810 and the semiconductor device 700. The semiconductor device 700 of FIG. 28 is the same as the semiconductor device 700 of FIG. 7. Thus, the semiconductor device 700 of FIG. 28 may correspond to one of the semiconductor devices 800 to 1100 of FIGS. 8 to 11, the semiconductor devices 1300 to 1600 of FIGS. 13 to 16, and the semiconductor devices 1800 to 2100 of FIGS. 18 to 21. The memory controller 2810 may transmit a first signal SIG_1 or a second signal SIG_2 to a first pad P1 of the semiconductor device 700 or receive it via the first pad P1. The first signal SIG_1 may be a data inversion flag INV_FLAG, an error check flag ERR_FLAG, or a masking signal MASK. The second signal SIG_2 is different from the first signal SIG_1 and may be the data inversion flag INV_FLAG, the error check flag ERR_FLAG or, the masking signal MASK. That is, if the semiconductor device 700 performs the write operation, the memory controller 3510 may generate the first signal SIG_1 or the second signal SIG_2 and outputs it to the first pad P1 according to selection information SEL. If the semiconductor device 700 performs the read operation, the memory controller 2810 may receive the first signal SIG_1 or the second signal SIG_2 which is generated by a data control unit 750 via the first pad P1. The memory controller 2810 may transmit data D1, . . . , Dn, which are to be written, to a plurality of second pads P2 of the semiconductor device 700 or may receive the data D1, . . . through to Dn via the plurality of second pads P2, respectively.

The structure and operation of the semiconductor device 700 have been described above with reference to FIGS. 8 to 22B.

Figure 29:
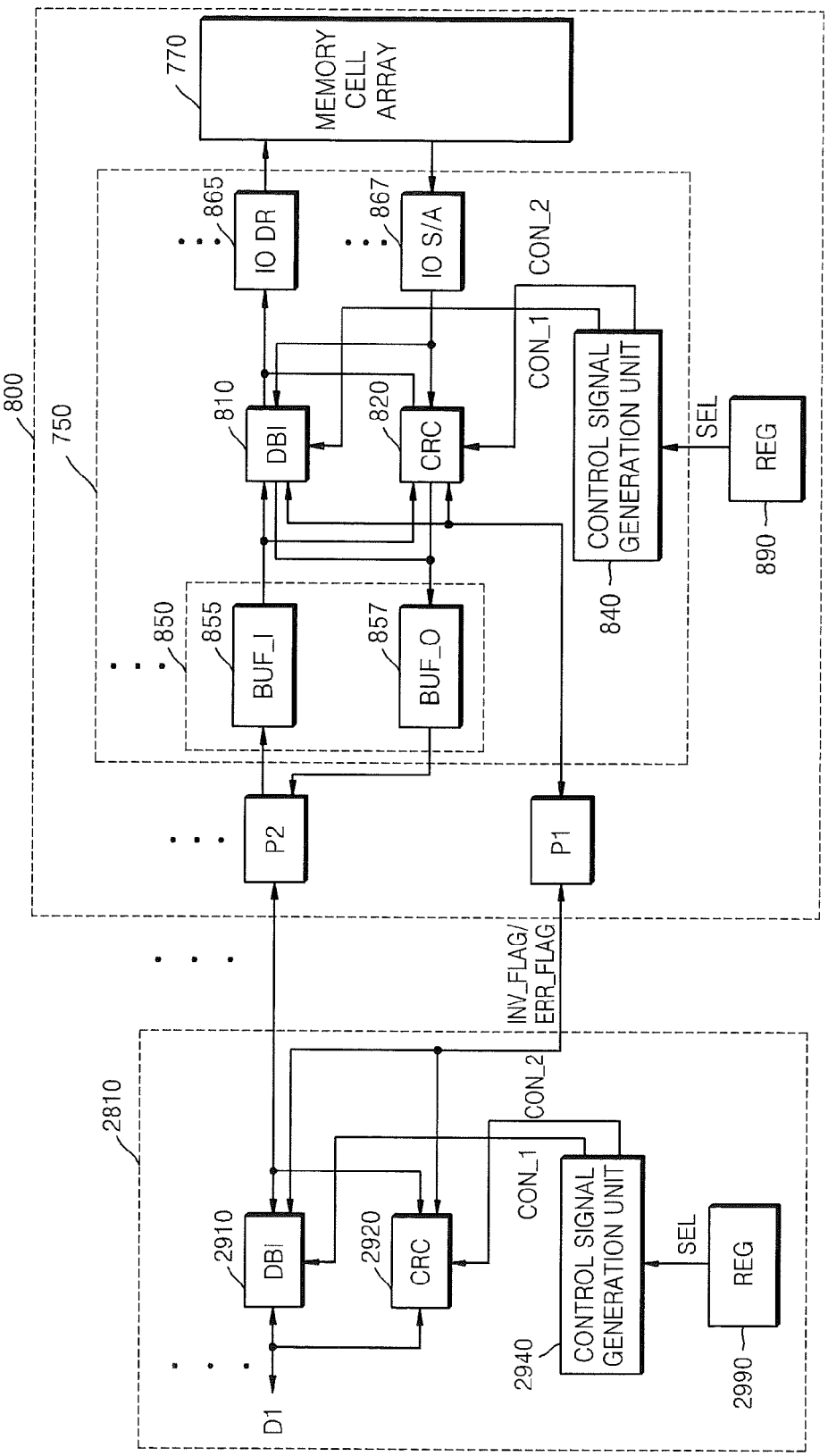
FIG. 29 is a block diagram of a memory system that is another embodiment of the memory system of FIG. 28 according to the inventive concepts.

FIG. 29 is a block diagram of a memory system 2900 that is another embodiment of the memory system 2800 of FIG. 28 according to the inventive concepts. Referring to FIGS. 28 and 29, a memory controller 2810 may include a DBI unit 2910, an error check unit 2920, a control signal generation unit 2940, and a register 2990.

The control signal generation unit 2940 may generate a first control signal CON_1 or a second control signal CON_2 and then supply the generated signal to the DBI unit 2910 and the error check unit 2920, according to selection information SEL. Here, it is assumed that the first control signal CON_1 controls the DBI unit 2910 to be enabled or disabled, and the second control signal CON_2 controls the error check unit 2920 to be enabled or disabled.

The selection information SEL may be stored in the register 2990. For example, the selection information SEL may be defined according to an MRS command stored in the register 2990. That is, the control signal generation unit 2940 may generate the first control signal CON_1 or the second control signal CON_2 according to the MRS command stored in the register 2990.

The DBI unit 2910 is used when the data inversion scheme is employed, and the error check unit 2920 is used when the error check scheme is employed. The structures and operations of the DBI unit 2910 and the error, check unit 2720 of the memory controller 2810 are similar to those of the DBI unit 810 and the error check unit 820 included in the semiconductor device 800 of FIG. 8, respectively.

FIG. 29 illustrates the memory system 2900, in which the memory controller 2810 controls the semiconductor device 800 illustrated in FIG. 8. The structure and operation of the semiconductor device 800 have been described above with reference to FIG. 8. However, the memory system 2800 of FIG. 28 is not limited by FIG. 29. The memory system 2900 may include one of the semiconductor devices 900 to 1100 of FIGS. 9 to 11 instead of the semiconductor device 800.

Figure 30:
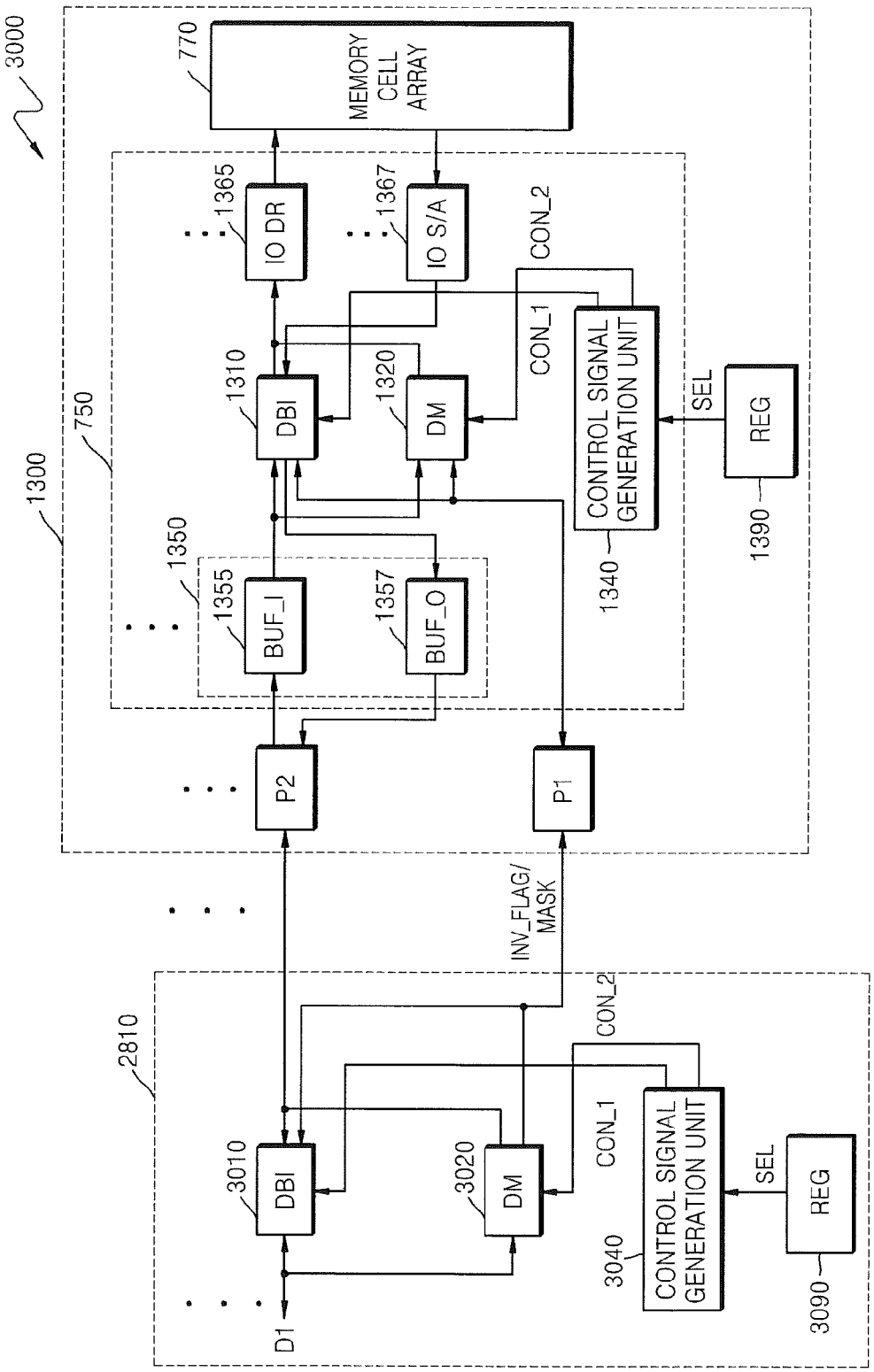
FIG. 30 is a block diagram of a memory system that is another embodiment of the memory system of FIG. 28 according to the inventive concepts.

FIG. 30 is a block diagram of a memory system 3000 that is another embodiment of the memory system 2800 of FIG. 28 according to the inventive concepts. Referring to FIGS. 28 and 30, a memory controller 2810 may include a DBI unit 3010, a DM unit 3020, a control signal generation unit 3040, and a register 3090.

The control signal generation unit 3040 may generate a first control signal CON_1 or a second control signal CON_2 and then supply the generated signal to the DBI unit 3010 and the DM unit 3020, according to selection information SEL. Here, it is assumed that the first control signal CON_1 controls the DBI unit 3010 to be enabled or disabled, and the second control signal CON_2 controls the DM unit 3020 to be enabled or disabled.

The selection information SEL may be stored in the register 3090. For example, the selection information SEL may be defined according to an MRS command stored in the register 3090. That is; the control signal generation unit 3040 may generate the first control signal CON_1 or the second control signal CON_2 according to the MRS command stored in the register 3090.

The DBI unit 3010 is used when the data inversion scheme is employed, and the DM unit 3020 is used when the data masking scheme is employed. The structures and operations of the DBI unit 3010 and the DM unit 3020 of the memory controller 2810 are similar to those of the DBI unit 1310 and the DM unit 1330 included in the semiconductor device 1300 of FIG. 13, respectively.

FIG. 30 illustrates the memory system 3000, in which the memory controller 2810 controls the semiconductor device 1300 illustrated in FIG. 13. The structure and operation of the semiconductor device 1300 have been described above with reference to FIG. 13. However, the memory system 2800 of FIG. 28 is not limited by FIG. 30. The memory system 3000 may include one of the semiconductor devices 1400 to 1600 of FIGS. 14 to 16 instead of the semiconductor device 1300, as described above with reference to FIG. 28.

Figure 31:
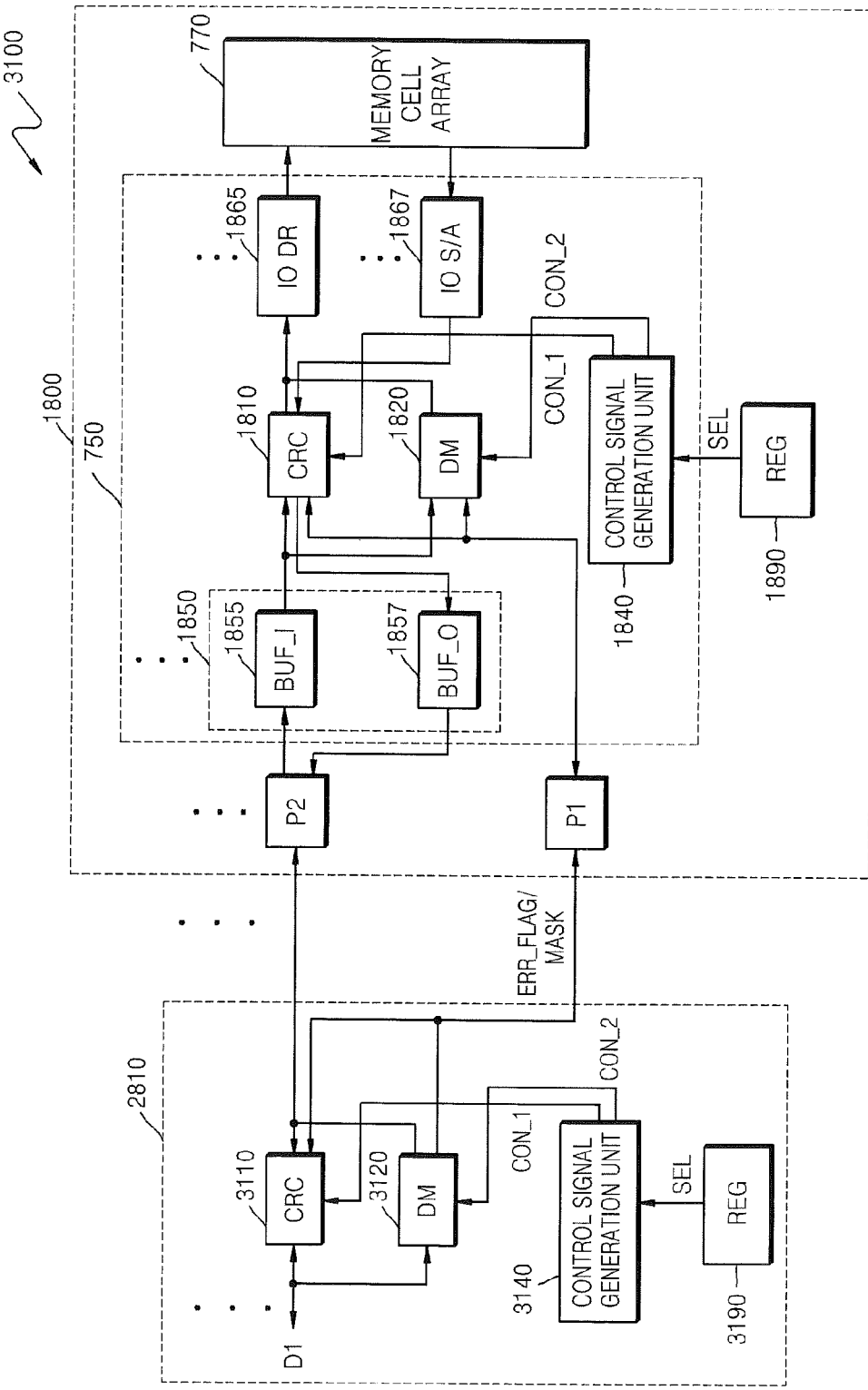
FIG. 31 is a block diagram of a memory system that is another embodiment of the memory system of FIG. 28 according to the inventive concepts.

FIG. 31 is a block diagram of a memory system 3100 that is another embodiment of the memory system 2800 of FIG. 28 according to another embodiment of the inventive concepts. Referring to FIGS. 28 and 31, a memory controller 2810 may include an error check unit 3110, a DM unit 3120, a control signal generation unit 3140, and a register 3190.

The control signal generation unit 3140 may generate a first control signal CON_1 or a second control signal CON_2 and then supply the generated signal to the error check unit 3110 and the DM unit 3120, according to selection information SEL. Here, it is assumed that the first control signal CON_1 controls the error check unit 3110 to be enabled or disabled, and the second control signal CON_2 controls the DM unit 3120 to be enabled or disabled.

The selection information SEL may be stored in the register 3190. For example, the selection information SEL may be defined according to an MRS command stored in the register 3190. That is, the control signal generation unit 3140 may generate the first control signal CON_1 or the second control signal CON_2 according to the MRS command stored in the register 3190.

The error check unit 3110 is used when the error check scheme is employed, and the DM unit 3120 is used when the data masking scheme is employed. The structures and operations of the error check unit 3110 and the DM unit 3120 of the memory controller 2810 are similar to those of the error check unit 1810 and the DM unit 1820 included in the semiconductor device 1800 of FIG. 18, respectively.

FIG. 31 illustrates the memory system 3100, in which the memory controller 2810 controls the semiconductor device 1800 illustrated in FIG. 18. The structure and operation of the semiconductor device 1800 have been described above with reference to FIG. 18. However, the memory system 2800 of FIG. 28 is not limited by FIG. 31. The memory system 3100 may include one of the semiconductor devices 1900 to 2100 of FIGS. 19 to 21 instead of the semiconductor device 1800, as described above with reference to FIG. 28.

Figure 32A:
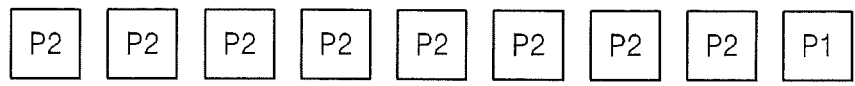
FIG. 32A illustrates a plurality of pads that may be included in a semiconductor device according to an embodiment of the inventive concepts.

FIG. 32A illustrates a plurality of pads P1 and P2 that may be included in a semiconductor device according to an embodiment of the inventive concepts. Referring to FIG. 32A, the semiconductor device may include one first pad P1 and a plurality of second pads P2. FIG. 32A illustrates a case where the semiconductor device includes a total of eight second pads P2 but the inventive concepts is not limited thereto and the semiconductor device may also operate as described in the above embodiments when the total number of second pads p2 included therein is less than or greater than eight.

Figure 32B:
FIGS. 32B-32E illustrate cases where the first pad and the plurality of second pads of FIG. 32A are used, according to an embodiment of the inventive concepts.

FIG. 32B illustrates a case where the first pad P1 and the plurality of second pads P2 of FIG. 32A are used, according to an embodiment of the inventive concepts. Referring to FIGS. 1 to 32B, the first pad P1 is used as a pad DBI for transmitting a data inversion flag INV_FLAG and the plurality of second pads P2 are used as pads DQ for transmitting data.

Figure 32C:

FIG. 32C illustrates a case where the first pad P1 and the plurality of second pads P2 of FIG. 32A are used, according to another embodiment of the inventive concepts. Referring to FIGS. 1 to 32A and 32C, the first pad P1 is used as a pad CRC for transmitting an error check flag ERR_FLAG and the plurality of second pads P2, are used as pads DQ for transmitting data.

Figure 32D:

FIG. 32D illustrates a case where the first pad P1 and the plurality of second pads P2 of FIG. 32A are used, according to another embodiment of the inventive concepts. Referring to FIGS. 1 to 32A and 32D, the first pad P1 is used as a pad DM for transmitting a masking signal MASK and the plurality of second pads P2 are used as pads DQ for transmitting data.

Figure 32E:

FIG. 32E illustrates a case where the first pad P1 and the plurality of second pads P2 of FIG. 32A are used, according to another embodiment of the inventive concepts. Referring to FIGS. 1 to 32A and 32E, the first pad P1 is not used and the plurality of second pads P2 are used as pads DQ for transmitting data.

Figure 33:
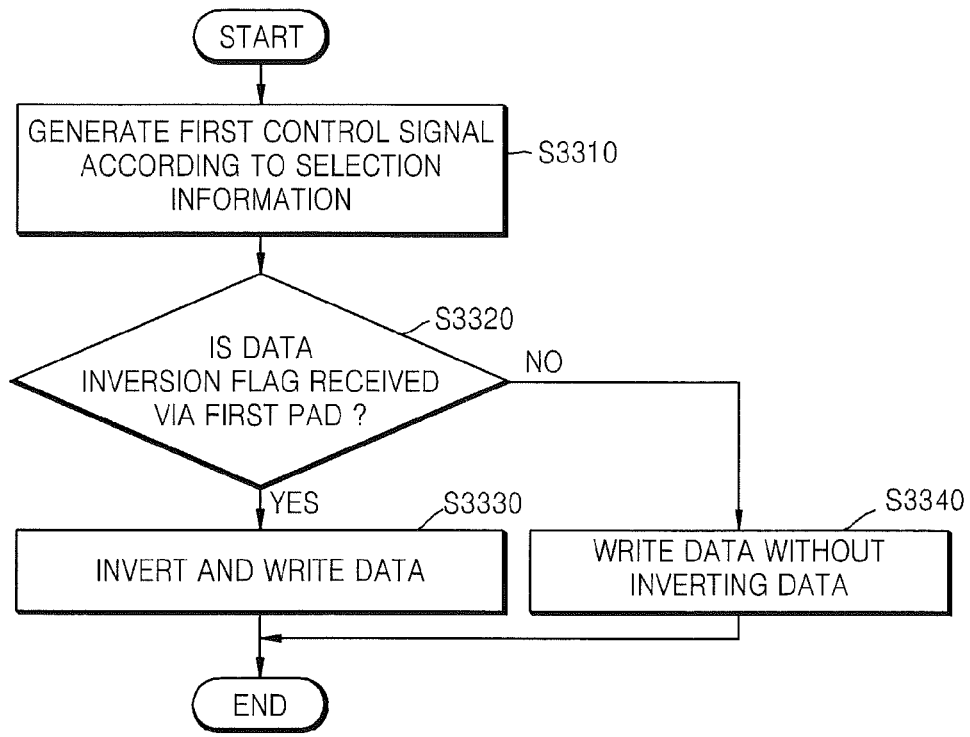
FIG. 33 is a flowchart illustrating a method of performing the write operation when pads of a semiconductor device are used as illustrated in FIG. 32B, according to an embodiment of the inventive concepts.

FIG. 33 is a flowchart illustrating a method of performing the write operation when pads of a semiconductor device are used as illustrated in FIG. 32B, according to an embodiment of the inventive concepts. Referring to FIGS. 1 to 3, 7 to 9, 13, 14, 18, 19, and 32A to 33, since the first pad P1 is used as a pad DBI for transmitting a data inversion flag INV_FLAG, the semiconductor device generates a first control signal CON_1 according to selection information SEL (operation S3310). It is determined whether the semiconductor device receives the data inversion flag INV_FLAG via the first pad P1 (operation S3320). If it is determined in operation S3320 that the semiconductor device receives the data inversion flag INV_FLAG via the first pad P1, then a DBI unit inverts data received from the plurality of second pads P2 and writes the data to memory cells of a memory cell array, respectively (operation S3330). If it is determined in operation S3320 that the semiconductor device does not receive the data inversion flag INV_FLAG via the first pad P1, then the DBI unit does not invert the data received from the plurality of second pads P2 and writes the data to the memory cells of the memory cell array, respectively (operation S3340). The operation of the semiconductor device has been described above in detail with reference to FIGS. 1 to 22B.

Figure 34:
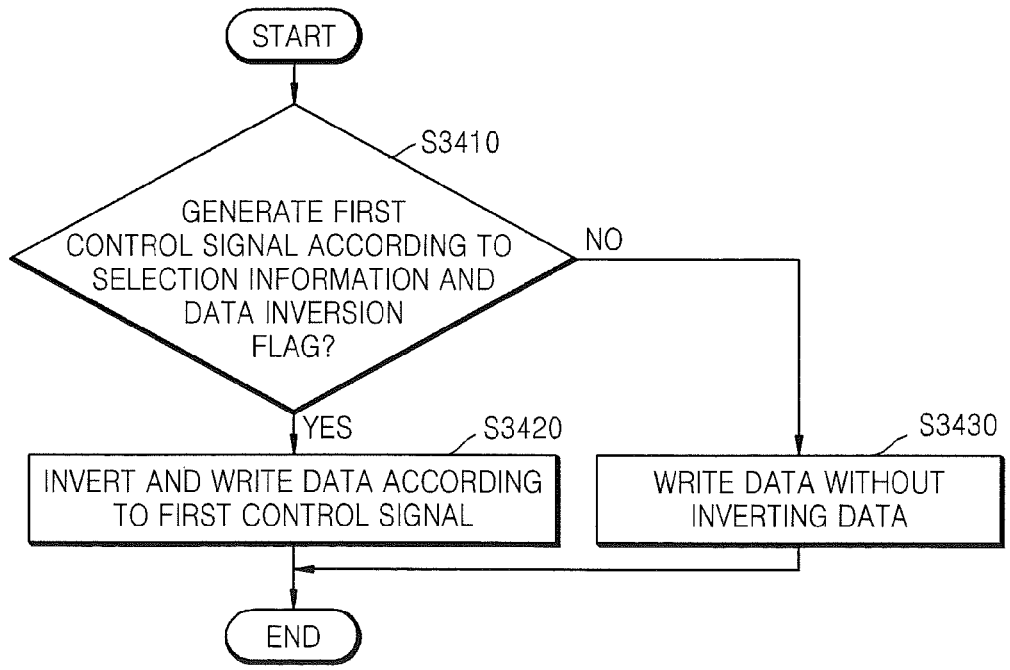
FIG. 34 is a flowchart illustrating a method of performing the write operation when pads of a semiconductor device are used as illustrated in FIG. 32B, according to another embodiment of the inventive concepts.

FIG. 34 is a flowchart illustrating a method of performing the write operation when pads of a semiconductor device are used as illustrated in FIG. 32B, according to another embodiment of the inventive concepts. Referring to FIGS. 1, 4, 5, 7, 10, 11, 15, 16, 20, 21, and 32A to 34, since the first pad P1 is used as a pad DBI for transmitting a data inversion flag INV_FLAG, the semiconductor device may generate a first control signal CON_1 according to selection information SEL and the data inversion flag INV_FLAG when the data inversion flag INV_FLAG is received via the first pad P1. If the data inversion flag INV_FLAG is not received via the first pad P1, then the semiconductor device does not generate the first control signal CON_1. It is determined whether the first control signal CON_1 is generated according to the selection information SEL and the data inversion flag INV_FLAG (operation S3410). If it is determined in operation S3410 that the first control signal CON_1 is generated according to the selection information SEL and the data inversion flag INV_FLAG, then a DBI unit inverts data received from the plurality of second pads P2 and writes the data to memory cells of a memory cell array; respectively (operation S3420). If it is determined in operation S3410 that the first control signal CON_1 is not generated according to the selection information SEL and the data inversion flag INV_FLAG, then the DBI unit does not invert the data received from the plurality of second pads P2 and writes the data to the memory cells of the memory cell array, respectively (operation S3430). The operation of the semiconductor device has been described above in detail with reference to FIGS. 1 to 22B.

Figure 35:
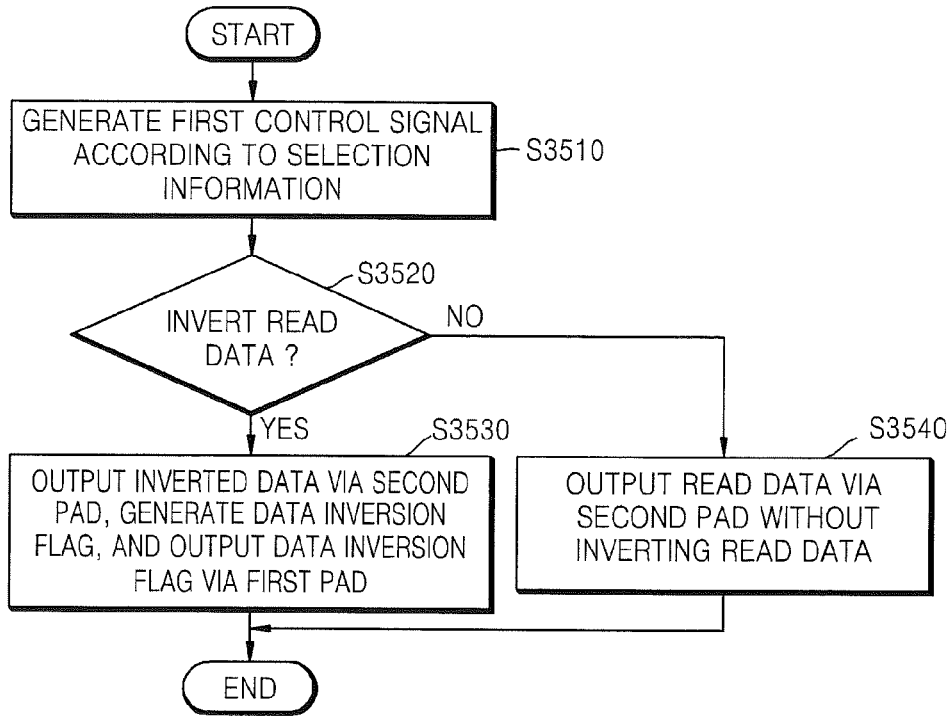
FIG. 35 is a flowchart illustrating a method of performing the read operation when pads of a semiconductor device are used as illustrated in FIG. 32B, according to an embodiment of the inventive concepts.

FIG. 35 is a flowchart illustrating a method of performing the read operation when pads of a semiconductor device are used as illustrated in FIG. 32B, according to an embodiment of the inventive concepts. Referring to FIGS. 1 through 35, since the first pad P1 is used as a pad DBI for transmitting a data inversion flag INV_FLAG, the semiconductor device generates a first control signal CON_1 according to selection information SEL (operation S3510). Next, a DBI unit of the semiconductor device determines whether data read from memory cells of a memory cell array is to be inverted (operation S3520). For example, if the number of bits of the read data that are logic high is greater than half the number of the total bits of the read data, the DBI unit may determine that the read data is to be inverted. If the number of bits of the read data that are logic high is less than half the number of the total bits of the read data, the DBI unit may determine that the read data is not to be inverted. If it is determined in operation S3520 that the read data is to be inverted, then the DBI unit inverts the read data, outputs the inverting result via the plurality of second pads, generates the data inversion flag INV_FLAG, and outputs the data inversion flag INV_FLAG via the first pad P1 (operation S3530): If it is determined in operation S3520 that the read data is not to be inverted, then the DBI unit does not invert the read data, outputs the read data via the plurality of second pads P2, and does not generate the data inversion flag INV_FLAG (operation S3540). The operation of the semiconductor device has been described above in detail with reference to FIGS. 1 to 22B.

Figure 36:
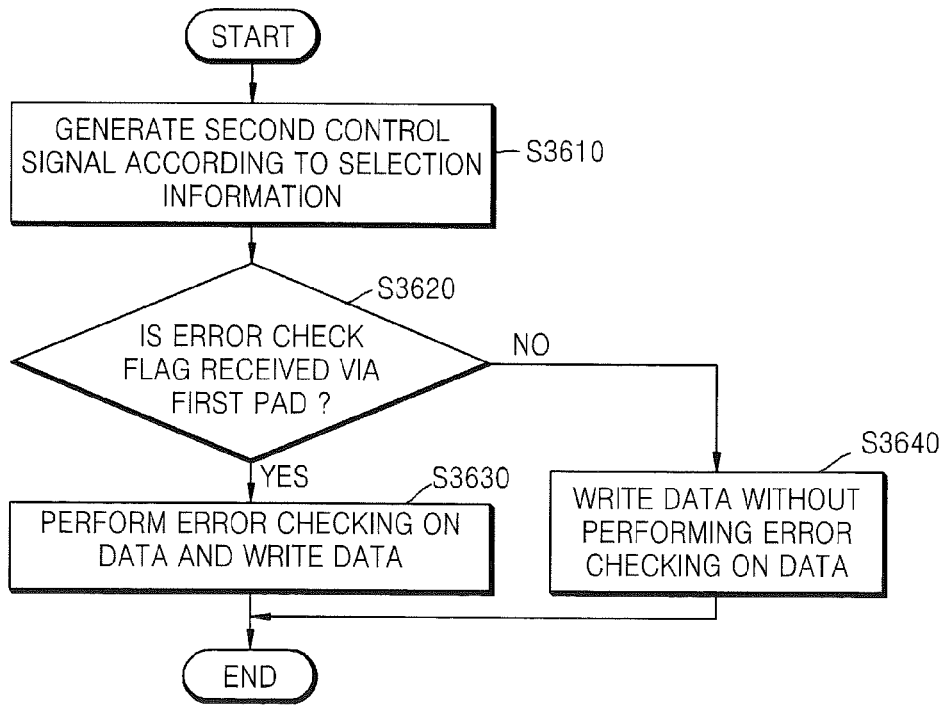
FIG. 36 is a flowchart illustrating a method of performing the write operation when pads of a semiconductor device are used as illustrated in FIG. 32C, according to another embodiment of the inventive concepts.

FIG. 36 is a flowchart illustrating a method of performing the write operation when pads of a semiconductor device are used as illustrated in FIG. 32C, according to another embodiment of the inventive concepts. Referring to FIGS. 1 to 3, 7 to 9, 13, 14, 18, 19, and 32A to 36, since the first pad P1 is used as a pad CRC for transmitting an error check flag ERR_FLAG, the semiconductor device generates a second control signal CON_2 according to selection information SEL (operation S3610). It is determined whether the semiconductor device receives the error check flag ERR_FLAG via the first pad P1 (operation S3620). If it is determined in operation S3620 that the semiconductor device receives the error check flag ERR_FLAG via the first pad P1, then an error check unit performs error checking on data received from the plurality of second pads P2 and writes the data to memory cells of a memory cell array, respectively (operation S3630). If it is determined in operation S3620 that the semiconductor device does not receive the error check flag ERR_FLAG via the first pad P1, then the error check unit does not perform error checking on the data received from the plurality of second pads P2 and writes the data to the memory cells of the memory cell array, respectively (operation S3640). The operation of the semiconductor device has been described above in detail with reference to FIGS. 1 to 22B.

Figure 37:
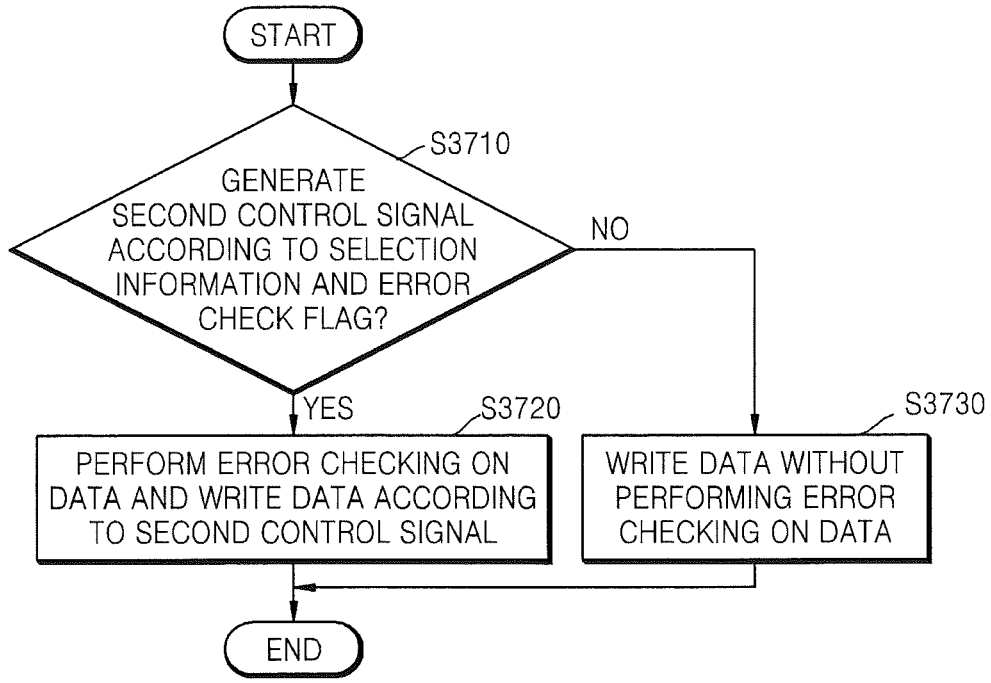
FIG. 37 is a flowchart illustrating a method of performing the write operation when pads of a semiconductor device are used as illustrated in FIG. 32C, according to another embodiment of the inventive concepts.

FIG. 37 is a flowchart illustrating a method of performing the write operation when pads of a semiconductor device are used as illustrated in FIG. 32C, according to another embodiment of the inventive concepts. Referring to FIGS. 1, 4, 5, 7, 10, 11, 15, 16, 20, 21, and 32A to 37, since the first pad P1 is used as a pad CRC for transmitting an error check flag ERR_FLAG, the semiconductor device may generate a second control signal CON_2 according to selection information SEL and the error check flag ERR_FLAG when the error check flag ERR_FLAG is received via the first pad P1. If the error check flag ERR_FLAG is not received via the first pad P1, the semiconductor device does not generate the second control signal CON_2. It is determined whether the second control signal CON_2 is generated according to the selection information SEL and the error check flag ERR_FLAG (operation S3710). If it is determined in operation S3710 that the second control signal CON_2 is generated according to the selection information SEL and the error check flag ERR_FLAG, then an error check unit performs error checking on data received from the plurality of second pads P2 and writes the data to memory cells of a memory cell array, respectively (operation S3720). If it is determined in operation S3710 that the second control signal CON_2 is not generated according to the selection information SEL and the error, check flag ERR_FLAG, then the error check unit does not perform error checking on the data received from the plurality of second pads P2 and writes the data to the memory cells of the memory cell array, respectively (operation S3730). The operation of the semiconductor device has been described above in detail with reference to FIGS. 1 to 22B.

Figure 38:
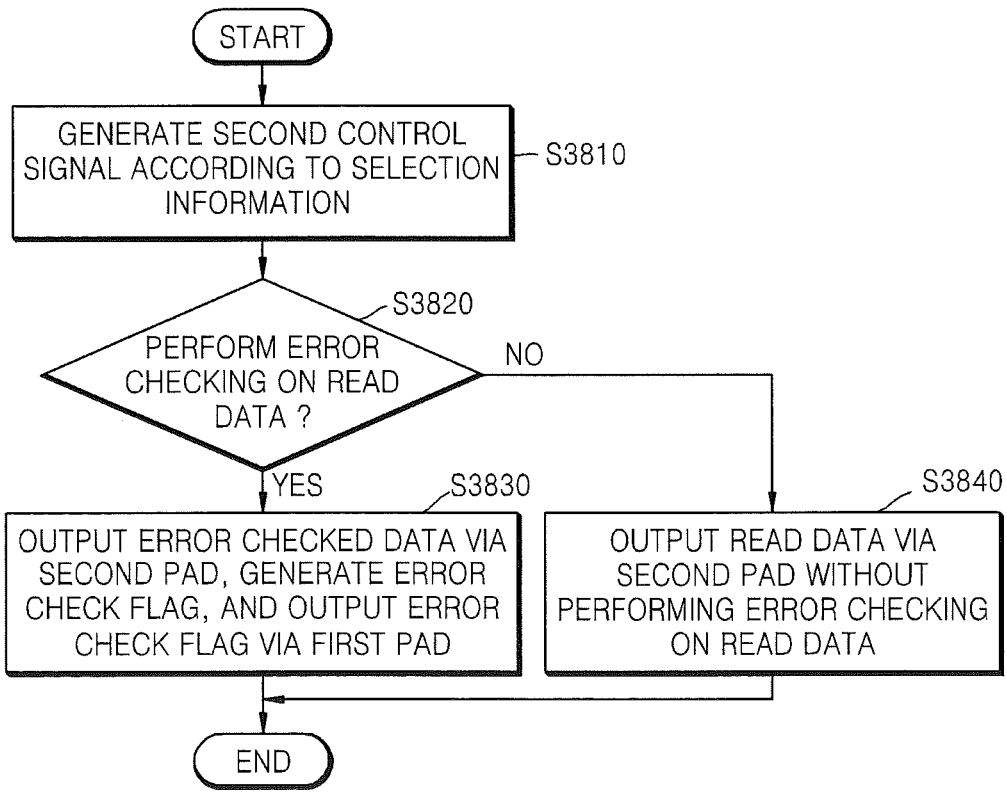
FIG. 38 is a flowchart illustrating a method of performing the read operation when pads of a semiconductor device are used as illustrated in FIG. 32C, according to another embodiment of the inventive concepts.

FIG. 38 is a flowchart illustrating a method of performing the read operation when pads of a semiconductor device are used as illustrated in FIG. 32C, according to another embodiment of the inventive concepts. Referring to FIGS. 1 through 38, since the first pad P1 is used as a pad CRC for transmitting an error check flag ERR_FLAG, the semiconductor device generates a second control signal CON_2 according to selection information SEL (operation S3810). Next, an error check unit of the semiconductor device determines whether data read from memory cells of a memory cell array is to be error checked (operation S3820). If it is determined in operation S3820 that the read data is to be error checked, then the error check unit performs error checking on the read data, outputs the read data via the plurality of second pads, generates the error check flag ERR_FLAG, and outputs the error check flag ERR_FLAG via the first pad P1 (operation S3830). If it is determined in operation S3820 that the read data is not to be error checked, then the error check does not perform error checking on the read data, outputs the read data via the plurality of second pads P2, and does not generate the error check flag ERR_FLAG (operation S3840). The operation of the semiconductor device has been described above in detail with reference to FIGS. 1 to 22B.

Figure 39:
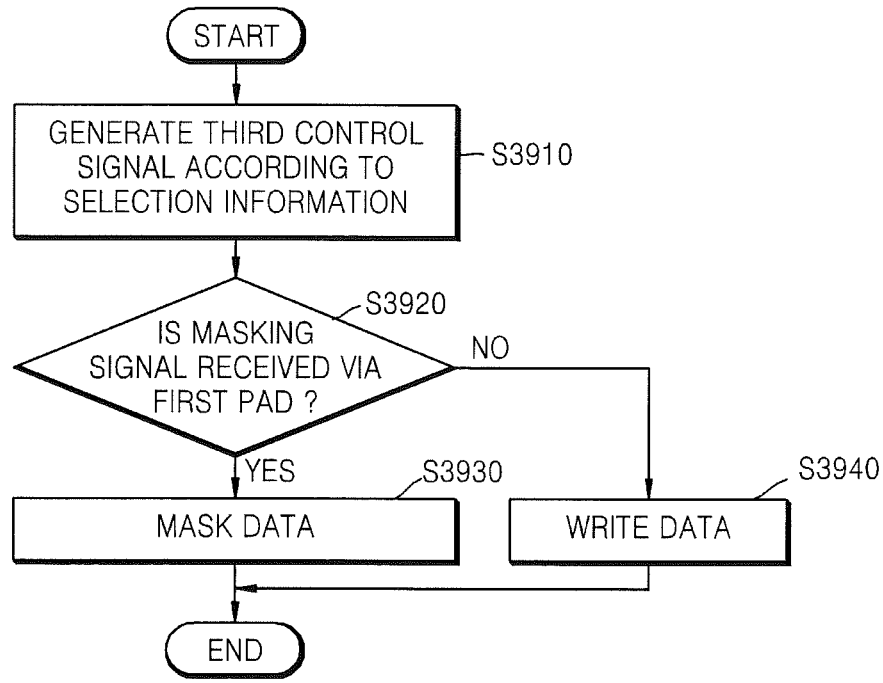
FIG. 39 is a flowchart illustrating a method of performing the write operation when pads of a semiconductor device are used as illustrated in FIG. 32D, according to another embodiment of the inventive concepts.

FIG. 39 is a flowchart illustrating a method of performing the write operation when pads of a semiconductor device are used as illustrated in FIG. 32D, according to another embodiment of the inventive concepts. Referring to FIGS. 1 to 3, 7 to 9, 13, 14, 18, 19, and 32A to 39, since the first pad P1 is used as a pad DM for transmitting a masking signal MASK, the semiconductor device generates a third control signal CON_3 according to selection information SEL (operation S3910). It is determined whether the semiconductor device receives the masking signal MASK via the first pad P1 (operation S3920). If it is determined in operation S3920 that the semiconductor device receives the masking signal MASK via the first pad P1, then a DM unit masks data received from the plurality of second pads P2 so that the data may not be written to memory cells of a memory cell array (operation S3930). If it is determined in operation S3920 that the semiconductor device does not receive the masking signal MASK via the first pad P1, then the DM unit does not masks the data received from the plurality of second pads P2 so that the data may be written to the memory cells of the memory cell array (operation S3940). The operation of the semiconductor device has been described above in detail with reference to FIGS. 1 to 22B.

Figure 40:
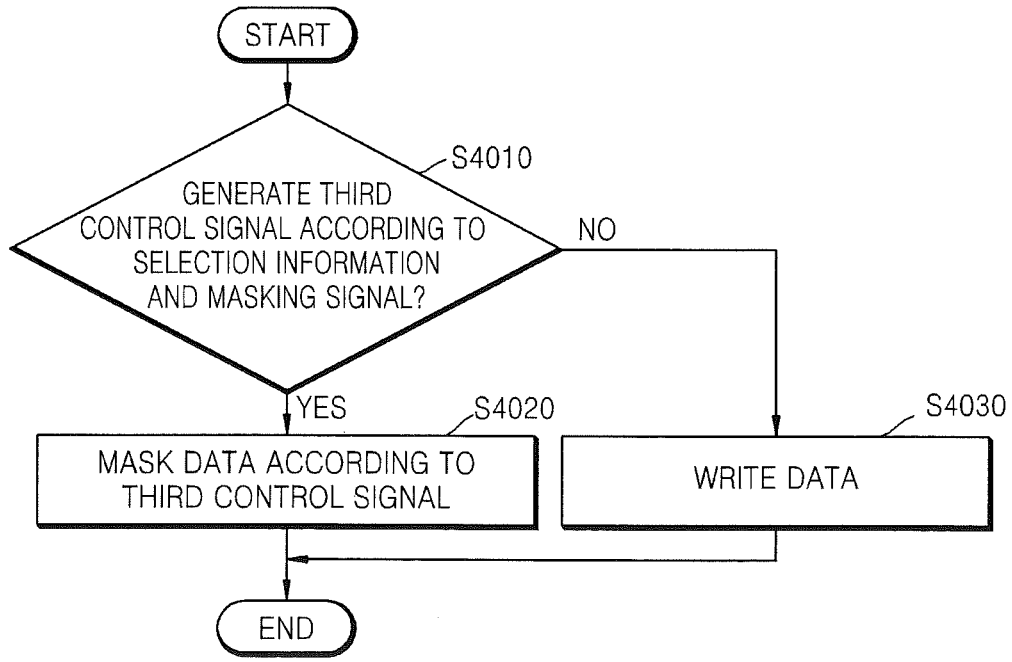
FIG. 40 is a flowchart illustrating a method of performing the write operation when pads of a semiconductor device are used as illustrated in FIG. 32D, according to another embodiment of the inventive concepts.
Figure 41:
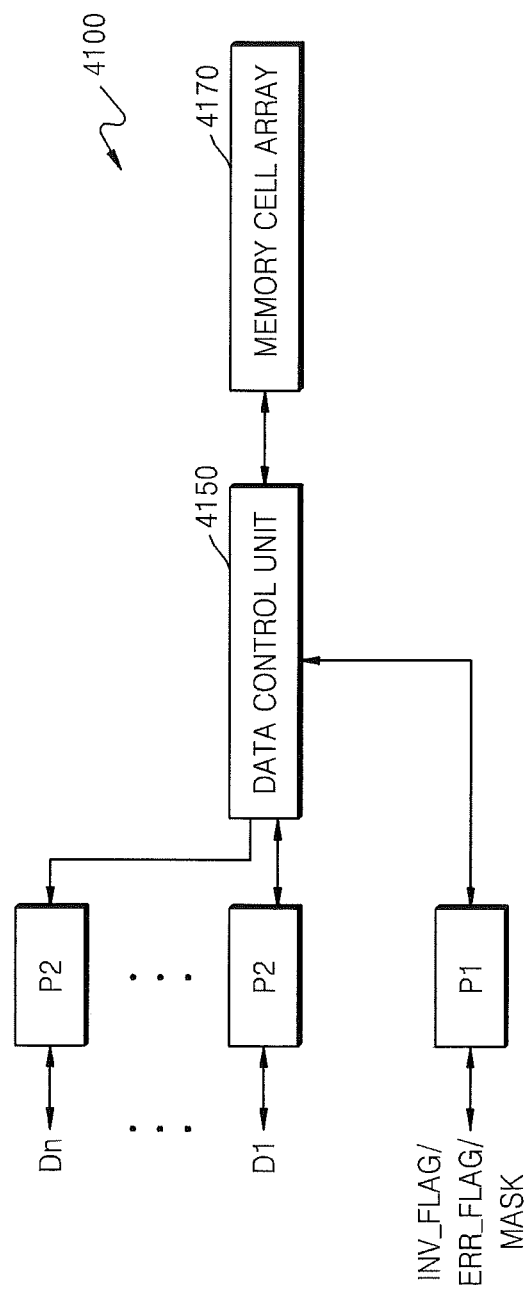
FIG. 41 is a block diagram of a memory device according to another embodiment of the inventive concepts.
Figure 46:
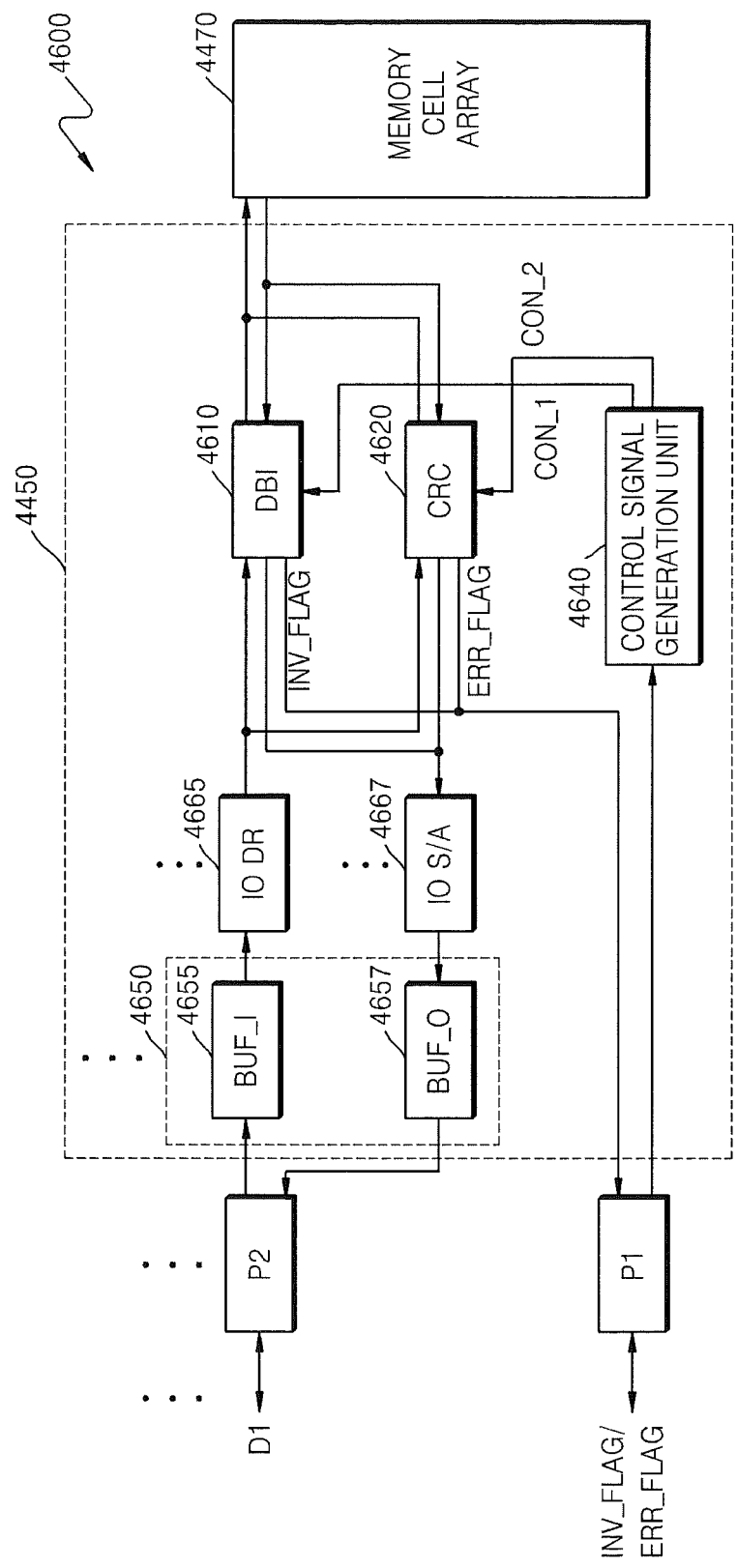
FIG. 46 is a block diagram of a semiconductor device that is another embodiment of the memory device of FIG. 44 according to the inventive concepts.

FIG. 40 is a flowchart illustrating a method of performing the write operation when pads of a semiconductor device are used as illustrated in FIG. 32D, according to another embodiment of the inventive concepts. Referring to FIGS. 1, 4, 5, 7, 10, 11, 15, 16, 20, 21, and 32A to 40, since the first pad P1 is used as a pad DM for transmitting a masking signal MASK, the semiconductor device may generate a third control signal CON_3 according to selection information SEL and the masking signal MASK when the masking signal MASK is received via the first pad P1. If the masking signal is not received via the first pad P1, then the semiconductor device does not generate the third control signal CON_3. It is determined whether the third control signal CON_3 is generated according to the selection information SEL and the masking signal (operation S4010). If it is determined in operation S4010 that the third control signal CON_3 is generated according to the selection information SEL and the masking signal MASK, then a DM unit masks data received from the plurality of second pads P2 so that the data may not be written to memory cells of a memory cell array (operation S4020). If it is determined in operation S4010 that the third control signal CON_3 is not generated according to the selection information SEL and the masking signal MASK, then the DM unit does not mask the data received from the plurality of second pads P2 so that the data may be written to the memory cells of the memory cell array (operation S4030). The operation of the semiconductor device has been described above in detail with reference to FIGS. 1 to 22B. FIG. 41 is a block diagram of a memory device 4100 according to another embodiment of the inventive concepts. Referring to FIG. 46, the memory device 4100 may include a first pad P1 and a data control unit 4150.

The first pad P1 may be connected to the data control unit 4150 and may transmit a data inversion flag INV_FLAG, an error check flag ERR_FLAG, or a masking signal MASK. The data inversion flag INV_FLAG may be a signal containing information regarding the data inversion flag INV_FLAG of FIG. 1 and selection information SEL, the error check flag ERR_FLAG may be a signal containing information regarding the data inversion flag INV_FLAG of FIG. 1 and the selection information SEL, and the masking signal MASK may be a signal containing information regarding the masking signal MASK of FIG. 1 and the selection information SEL. Each of the data inversion flag INV_FLAG, the error check flag ERR_FLAG, and the masking signal MASK may include a plurality of bits.

The data control unit 4150 may control data received according to a signal output from the first pad P1. That is, the data control unit 4150 may determine whether the data is to be inverted according to the data inversion flag INV_FLAG, may determine whether the data is to be error checked according to the error check flag ERR_FLAG, or may determine whether the data is to be masked according to the masking signal MASK. The embodiment of FIG. 41 is different from the embodiment of FIG. 1 in that the data control unit 4150 operates only according to the signal output from the first pad P1.

For example, if the memory device 4100 performs the write operation, then the data control unit 4650 may determine whether the data is to be inverted according to the data inversion flag INV_FLAG, may determine whether the data is to be error checked according to the error check flag ERR_FLAG, or may determine whether the data is to be masked according to the masking signal MASK. If the memory device 4100 performs the read operation, then the data control unit 4150 may determine whether the data is to be inverted according to the data inversion flag INV_FLAG and may determine whether the data is to be error checked according to the error check flag ERR_FLAG. Here, it is assumed that the data control unit 4150 does not mask read data while the memory device 4100 performs the read operation, but the inventive concepts is not limited thereto and the data control unit 4150 may determine whether the read data is to be masked and whether the masking signal MASK is to be generated, if needed, while the memory device 4100 performs the read operation.

In the embodiment of FIG. 41, the memory device 4100 may further include a plurality of second pads P2 and a memory cell array 4170. The plurality of second pads P2 and the memory cell array 4170 have been described above with reference to FIG. 1.

Figure 42:
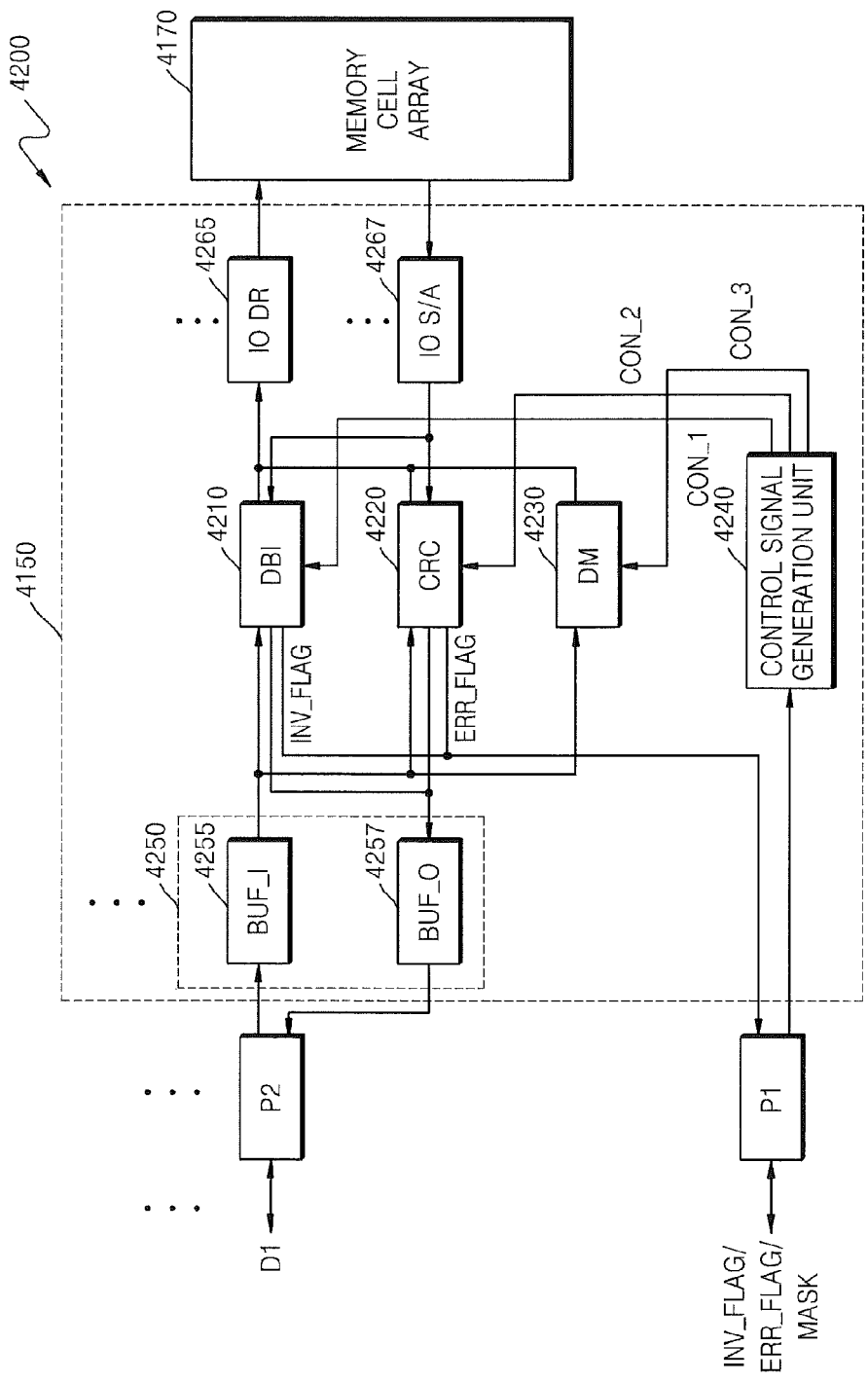
FIG. 42 is a block diagram of a semiconductor device that is another embodiment of the memory device of FIG. 41 according to the inventive concepts.

FIG. 42 is a block diagram of a semiconductor device 4200 that is another embodiment of the memory device 4100 of FIG. 41 according to the inventive concepts. In FIG. 42, a first pad P1, a plurality of second pads P2, and a memory cell array 4170 have been described above with reference to FIG. 41.

Referring to FIGS. 41 and 42, the data control unit 4150 may include a control signal generation unit 4240, a plurality of buffer units 4250, a plurality of driving units 4265, a plurality of sense amplification units 4267, a DBI unit 4210, an error check unit 4220, and a DM unit 4230. The operations of the plurality of buffer units 4250, the plurality of driving units 4265, the plurality of sense amplification units 4267, the DBI unit 4210, the error check unit 4220, and the DM unit 4230, are similar to those of the plurality of buffer units 450, the plurality of driving units 465, the plurality of sense amplification units 467, the DBI unit 410, the error check unit 420, and the DM unit 430, respectively.

The control signal generation unit 4240 may generate a first control signal CON_1, a second control signal CON_2, or a third control signal CON_3 and transmit the generated signal to the DBI unit 4210, the error check unit 4220, or the DM unit 4230, according to a signal output via the first pad P1. That is, the control signal generation unit 4240 may generate the first control signal CON_1, the second control signal CON_2, and the third control signal CON_3 without selection information, by using a data inversion flag INV_FLAG, an error check flag ERR_FLAG, and a masking signal MASK received via the first pad P1, respectively. Here, it is assumed that the first control signal CON_1 controls the DBI unit 4210 to be enabled or disabled, the second control signal CON_2 controls the error check unit 4220 to be enabled or disabled, and the third control signal CON_3 controls the DM unit 4230 to be enabled or disabled.

For example, it is assumed that the control signal generation unit 4240 generates the first control signal CON_1 for enabling the DBI unit 4210 when the signal received via the first pad P1 is '01', and generates the second control signal CON_2 for enabling the error check unit 4220 when the signal received via the first pad P1 is '10'. Also, it is assumed that the control signal generation unit 4240 generates the third control signal CON_3 for enabling the DM unit 4230 when the signal received via the first pad P1 is '11', and does not generate any of the first to third control signals CON_1 to CON_3 when the signal received via the first pad P1 is '00'. In this case, the signal received via the first pad P1 may be considered as the data inversion flag INV_FLAG when this signal is '01', may be considered as the error check flag ERR_FLAG when this signal is '10', and may be considered as the masking signal MASK when this signal is '11'. If the signal received via the first pad P1 is '00', then it may mean that any of the data inversion flag INV_FLAG, the error check flag ERR_FLAG, and the masking signal MASK is not received.

The operation of the memory device 4200 of FIG. 42 according to an embodiment of the inventive concepts will now be described in detail. For convenience of explanation, the operation of the memory device 4700 of FIG. 47 will be described with respect to the data inversion mode, the error check mode, and the data masking mode that have been assumed above with reference to FIG. 4.

First, a case where the memory device 4200 performs the write operation in the data inversion mode will be described. If the control signal generation unit 4240 receives the data inversion flag INV_FLAG via the first pad P1, then the control signal generation unit 4240 may generate the first control signal CON_1. If 1-bit data D1 is supplied to the DBI unit 4210 via a corresponding second pad P2 and an input buffer 4255 of a corresponding buffer unit 4250, then the DBI unit 4210 inverts the data D1 and transmits the inverting result to a corresponding driving unit 4265, according to the first control signal CON_1. If the data inversion flag INV_FLAG is not input via the first pad P1, then the DBI unit 4210 does not invert the data D1 and transmits the data D1 directly to the corresponding driving unit 4265.

A case where the memory device 4200 performs the read operation in the data inversion mode will be described. If the control signal generation unit 4240 receives the data inversion flag INV_FLAG via the first pad P1, the control signal generation unit 4240 may generate the first control signal CON_1. If data read from a corresponding memory cell of the memory cell array 4170 is sensed and amplified by a corresponding sense amplification unit 4267, then the DBI unit 4210 is enabled according to the first control signal CON_1, and thus, the amplified data may be inverted or may not be inverted. For example, if the number of bits of the amplified data that are logic high is greater than half the number of the total bits of the amplified data, then the DBI unit 4210 may invert the amplified data, transmit the inverting result to an output buffer 4257 of the corresponding buffer unit 4250, generate the data inversion flag INV_FLAG, and output the data inversion flag INV_FLAG via the first pad P1. If the number of bits of the amplified data that are logic high is less than half the number of the total bits of the amplified data, then the DBI unit 4210 may not invert the amplified data, may transmit the amplified data to the output buffer 4257, and may not generate the data inversion flag INV_FLAG. If the data inversion flag INV_FLAG is not transmitted to the first pad P1, then the control signal generation unit 4240 does not generate the first control signal CON_1 and the DBI unit 4210 is thus disabled. Accordingly, the amplified data is not inverted and is directly transmitted to the output buffer 4257, and the data inversion flag INV_FLAG is not generated.

A case where the memory device 4200 performs the write operation in the error check mode will be described. If the control signal generation unit 4240 receives the error check flag ERR_FLAG via the first pad P1, the control signal generation unit 4240 may generate the second control signal CON_2. If 1-bit data D1 is input to the error check unit 4220 via the corresponding second pad P2 and the corresponding input buffer 4250, then the error check unit 4220 performs error checking on the data D1. If the error check flag ERR_FLAG is not input to the first pad P1, then the control signal generation unit 4240 does not generate the second control signal CON_2, and thus, the error check unit 4220 does not perform error checking on the data D1 and transmits the data D1 directly to the corresponding driving unit 4265.

A case where the memory device 4200 performs the write operation in the error check mode will be described. If the control signal generation unit 4240 receives the error check flag ERR_FLAG via the first pad P1, the control signal generation unit 4240 may generate the second control signal CON_2. If data read from a corresponding memory cell of the memory cell array 4170 is sensed and amplified by the corresponding sense amplification unit 4267, then the error check unit 4220 is enabled according to the second control signal CON_2 and thus may perform error checking on the read data or may not perform error checking on the read data. For example, the error check unit 4220 may perform error checking on the read data, output the read data to the corresponding output buffer 4257, generate the error check flag ERR_FLAG, and output the error check flag ERR_FLAG to the first pad P1. Otherwise, the error check unit 4220 may not perform error checking on the read data, may output the read data to the corresponding output buffer 4257, and may not generate the error check flag ERR_FLAG. If the error check flag ERR_FLAG is not input to the first pad P1, then the control signal generation unit 4240 does not generate the second control signal CON_2, and thus, the error check unit 4220 is disabled. Accordingly, the error check unit 4220 does not perform error checking on the read data, transmits the read data directly to the corresponding output buffer 4257, and does not generate the error check flag ERR_FLAG.

A case where the memory device 4200 performs the write operation in the data masking mode will be described. If the control signal generation unit 4240 receives the masking signal MASK via the first pad P1, the control signal generation unit 4240 may generate the third control signal CON_3. If 1-bit data D1 is input to the DM unit 4230 via the corresponding second pad P2 and the corresponding input buffer 4250, then the DM unit 4230 does not transmit the data D1 to the corresponding driving unit 4265. If the masking signal MASK is not input to the first pad P1, then the control signal generation unit 4240 does not generate the third control signal CON_3, and thus, the DM unit 4230 transmits the data D1 directly to the corresponding driving unit 4265. As described above, it is assumed in the current embodiment, the data control unit 4150 does not mask read data while the memory device 4200 performs the read operation. Thus, the DM unit 423Q does not operate while the memory device 4200 performs the read operation.

Figure 43:
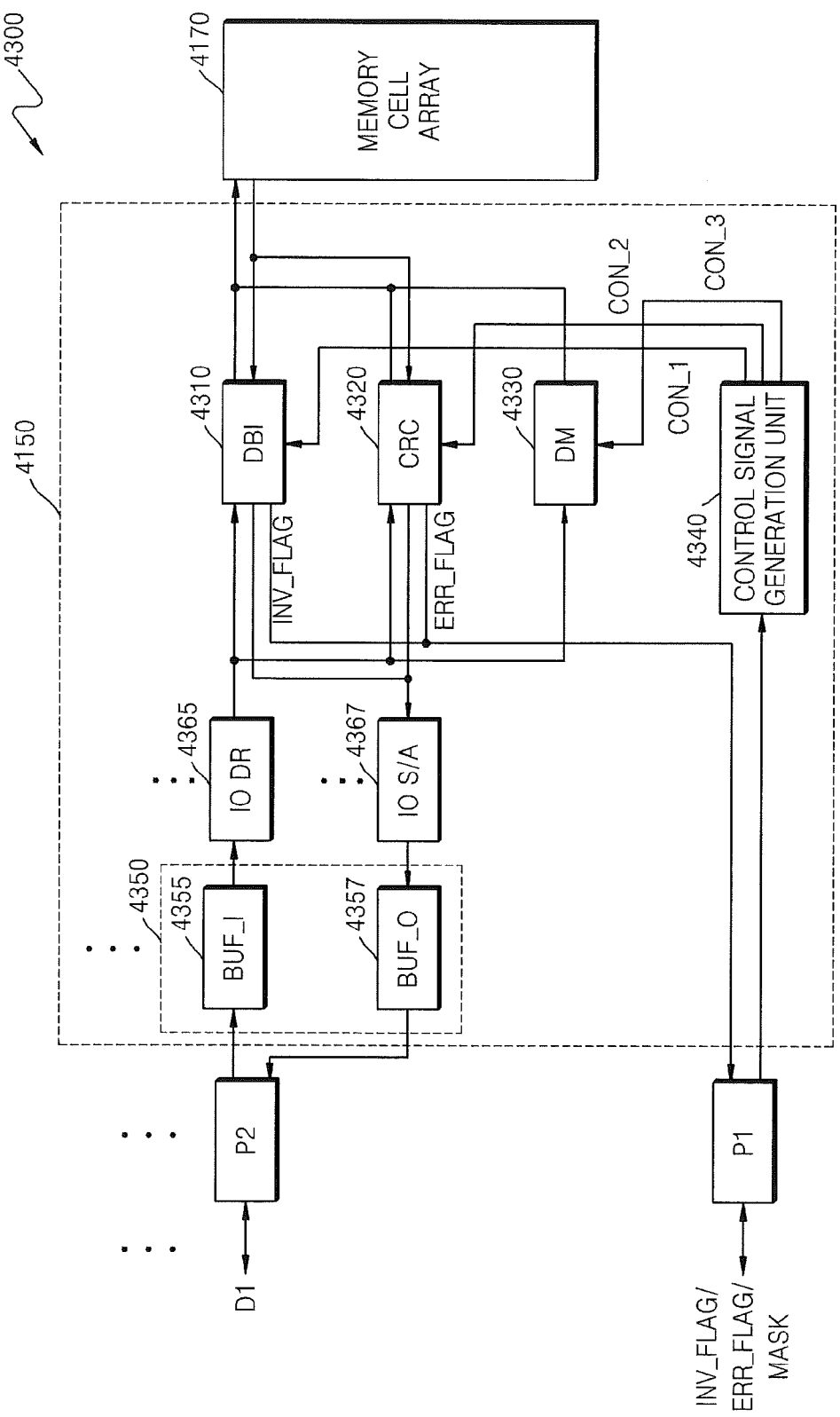
FIG. 43 is a block diagram of a semiconductor device that is another embodiment of the memory device of FIG. 41 according to the inventive concepts.

FIG. 43 is a block diagram of a semiconductor device 4300 that is another embodiment of the memory device 4100 of FIG. 41 according to the inventive concepts. In FIG. 43, a first pad P1, a plurality of second pads P2, and a memory cell array 4170 have been described above with reference to FIG. 41.

Referring to FIGS. 41 to 43, the data control unit 4150 may include a control signal generation unit 4340, a plurality of buffer units 4350, a plurality of driving units 4365, a plurality of sense amplification units 4367, a DBI unit 4310, an error check unit 4320, and a DM unit 4330. The plurality of buffer units 4350, the plurality of driving units 4365, the plurality of sense amplification units 4367, the DBI unit 4310, the error check unit 4320, and the DM unit 4330, are the same as the plurality of buffer units 4250, the plurality of driving units 4265, the plurality of sense amplification units 4267, the DBI unit 4210, the error check unit 4220, and the DM unit 4230, respectively, except for a manner in which the plurality of buffer units 4350, the plurality of driving units 4365, the plurality of sense amplification units 4367, the DBI unit 4310, the error check unit 4320, and the DM unit 4330 are connected to one another. More specifically, the DBI unit 4210, the error check unit 4220, and the DM unit 4230 of FIG. 42 are located between the plurality of buffer units 4250 and the plurality of driving units 4265 and between the plurality of buffer units 4250 and the plurality of sense amplification units 4267, whereas the DBI unit 4310, the error check unit 4320, and the DM unit 4330 of FIG. 43 are located between the plurality of driving units 4365 and the memory cell array 4170 and between the plurality, of sense amplification units 4367 and the memory cell array 4170.

Similar to the control signal generation unit 4240, the control signal generation unit 4230 may generate a first control signal CON_1, a second control signal CON_2, or a third control signal CON_3 and transmit the generated signal to the DBI unit 4310, the error check unit 4320, or the DM unit 4330, according to a signal output via the first pad P1. That is, the control signal generation unit 4340 may generate the first control signal CON_1, the second control signal CON_2, and the third control signal CON_3 without selection information, by using a data inversion flag INV_FLAG, an error check flag ERR_FLAG, and a masking signal MASK received via the first pad P1, respectively. Here, it is assumed that the first control signal CON_1 controls the DBI unit 4310 to be enabled or disabled, the second control signal CON_2 controls the error check unit 4320 to be enabled or disabled, and the third control signal CON_3 controls the DM unit 4330 to be enabled or disabled. The operation of the control signal generation unit 4340 is similar to that of the control signal generation unit 4240 of FIG. 42.

Figure 44:
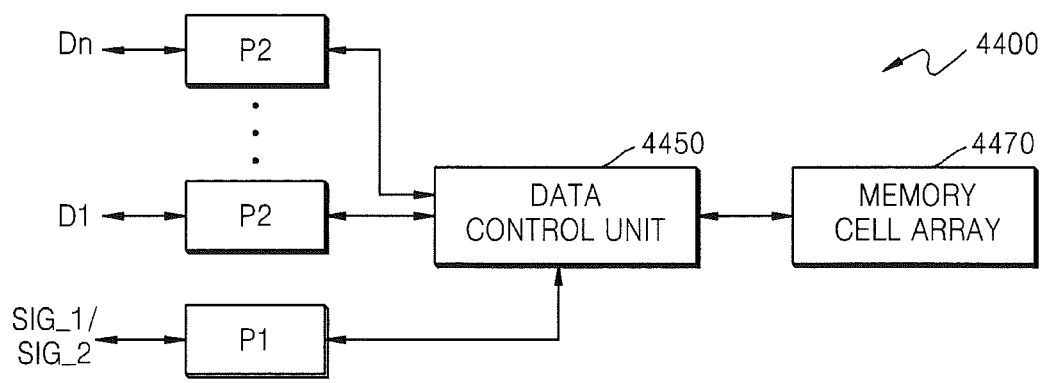
FIG. 44 is a block diagram of a memory device according to another embodiment of the inventive concepts.

FIG. 44 is a block diagram of a memory device 4400 according to another embodiment of the inventive concepts. Referring to FIG. 44, the memory device 4400 may include a first pad P1 and a data control unit 4450.

The first pad P1 may be connected to the data control unit 4450 and a first signal SIG_1 or a second signal SIG_2 may be received or transmitted via the first pad P1. The data inversion may be a signal containing information regarding the data inversion flag INV_FLAG of FIG. 1 and selection information SEL, the error check flag may be a signal containing information regarding the data inversion flag INV_FLAG of FIG. 1 and the selection information SEL, and the masking signal may be a signal containing information regarding the masking signal MASK of FIG. 1 and the selection information SEL. Each of the data inversion flag, the error check flag, and the masking signal may include a plurality of bits.

The data control unit 4450 may control data received according to a signal output via the first pad P1. The operation of the data control unit 4450 will be described later in detail with reference to FIGS. 45 to 50.

In the embodiment of FIG. 44, the memory device 4400 may further include a plurality of second pads P2 and a memory cell array 4470. In FIG. 44, the plurality of second pads P2 and the memory cell array 4470 have been described above with reference to FIG. 7.

Figure 45:
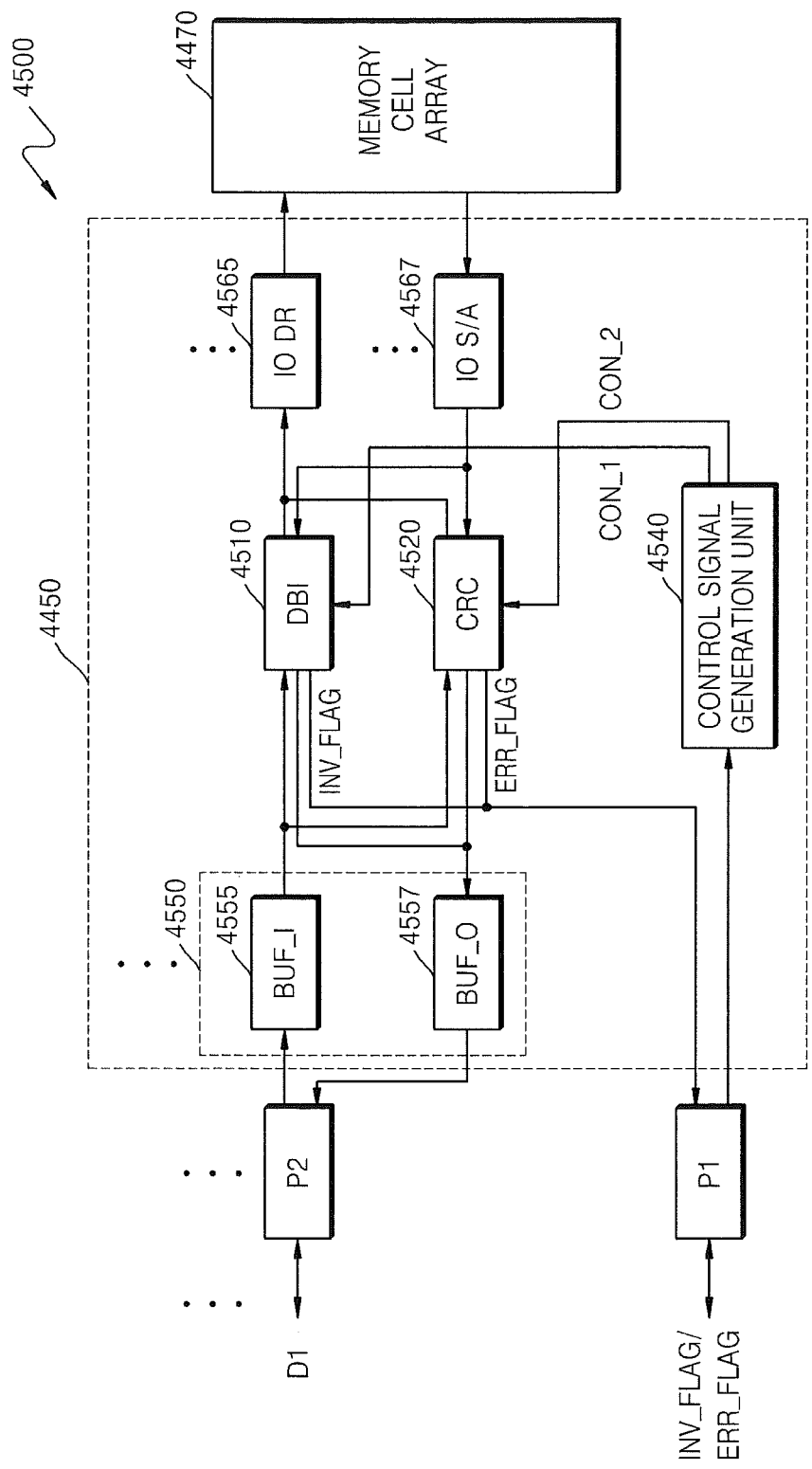
FIG. 45 is a block diagram of a semiconductor device that is another embodiment of the memory device of FIG. 44 according to the inventive concepts.
Figure 47:
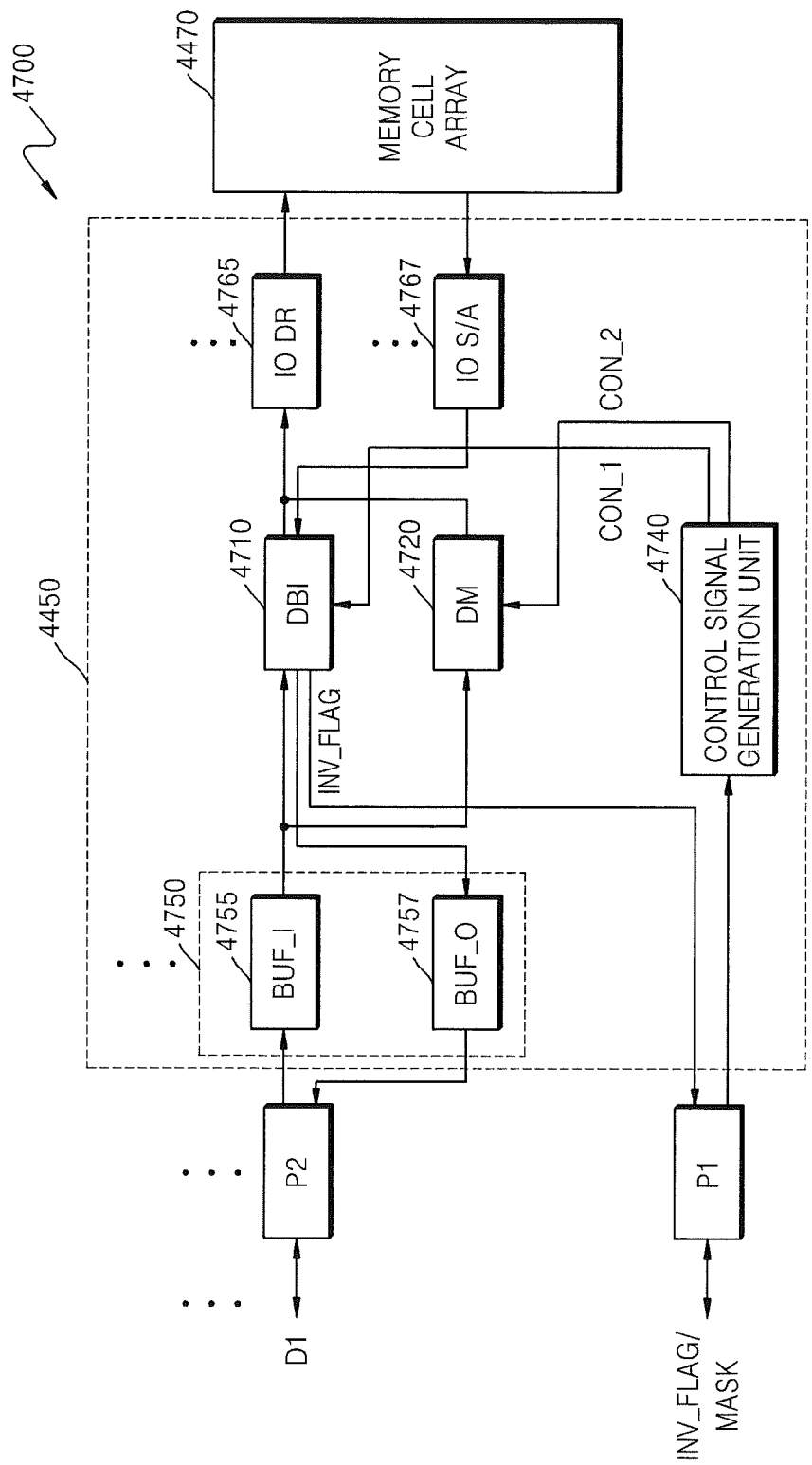
FIG. 47 is a block diagram of a semiconductor device that is another embodiment of the memory device of FIG. 44 according to the inventive concepts.
Figure 48:
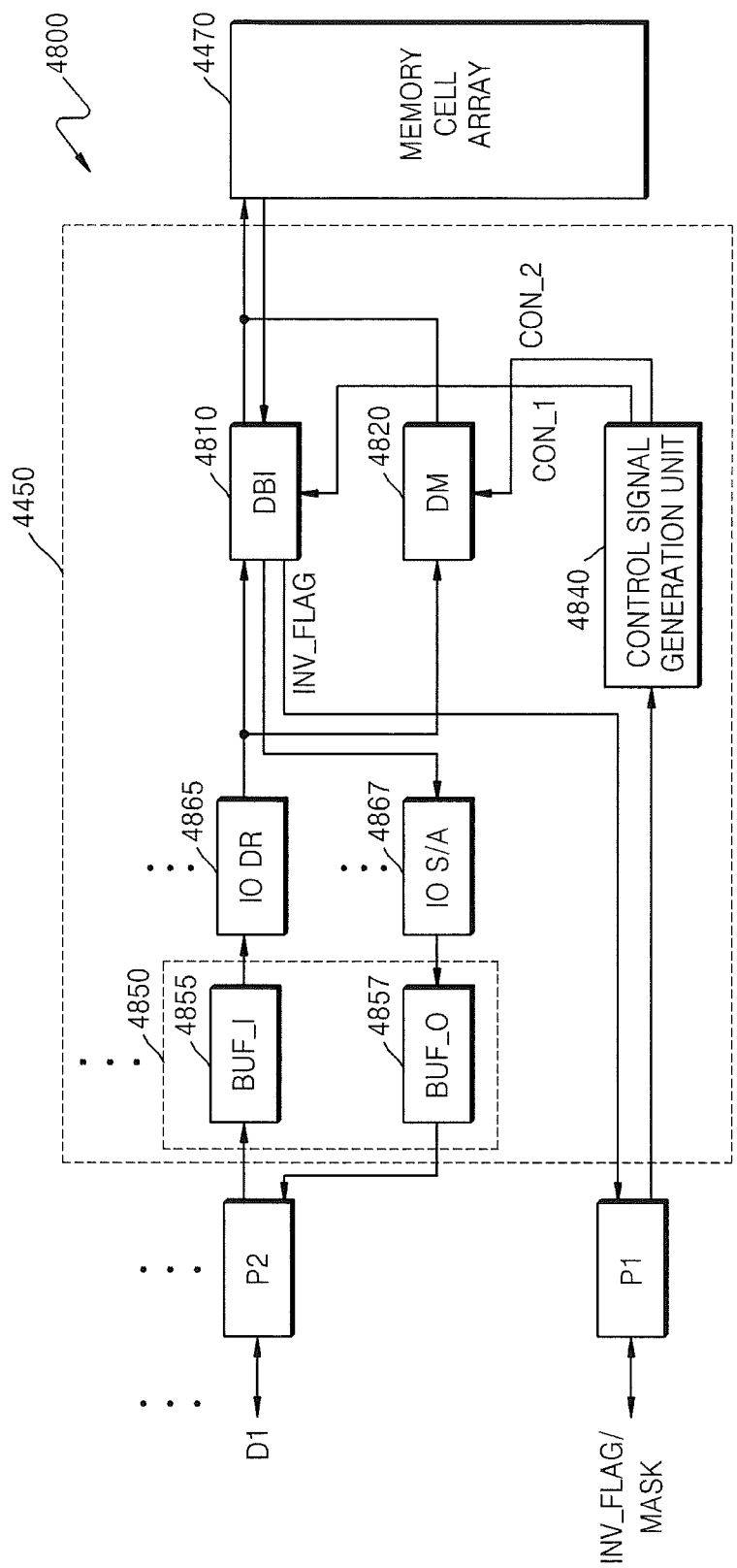
FIG. 48 is a block diagram of a semiconductor device that is another embodiment of the memory device of FIG. 44 according to the inventive concepts.
Figure 49:
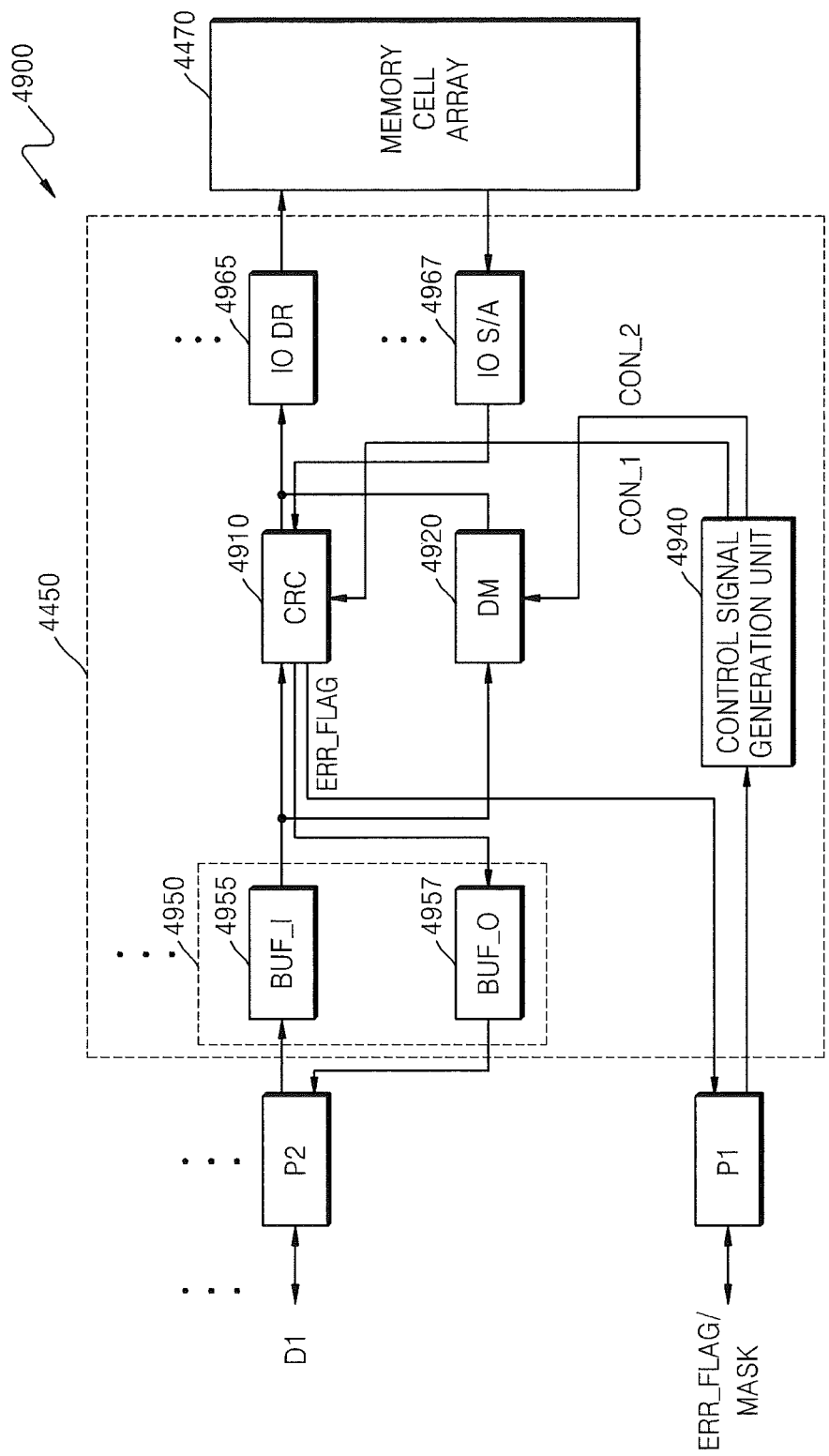
FIG. 49 is a block diagram of a semiconductor device that is another embodiment of the memory device of FIG. 44 according to the inventive concepts.
Figure 50:
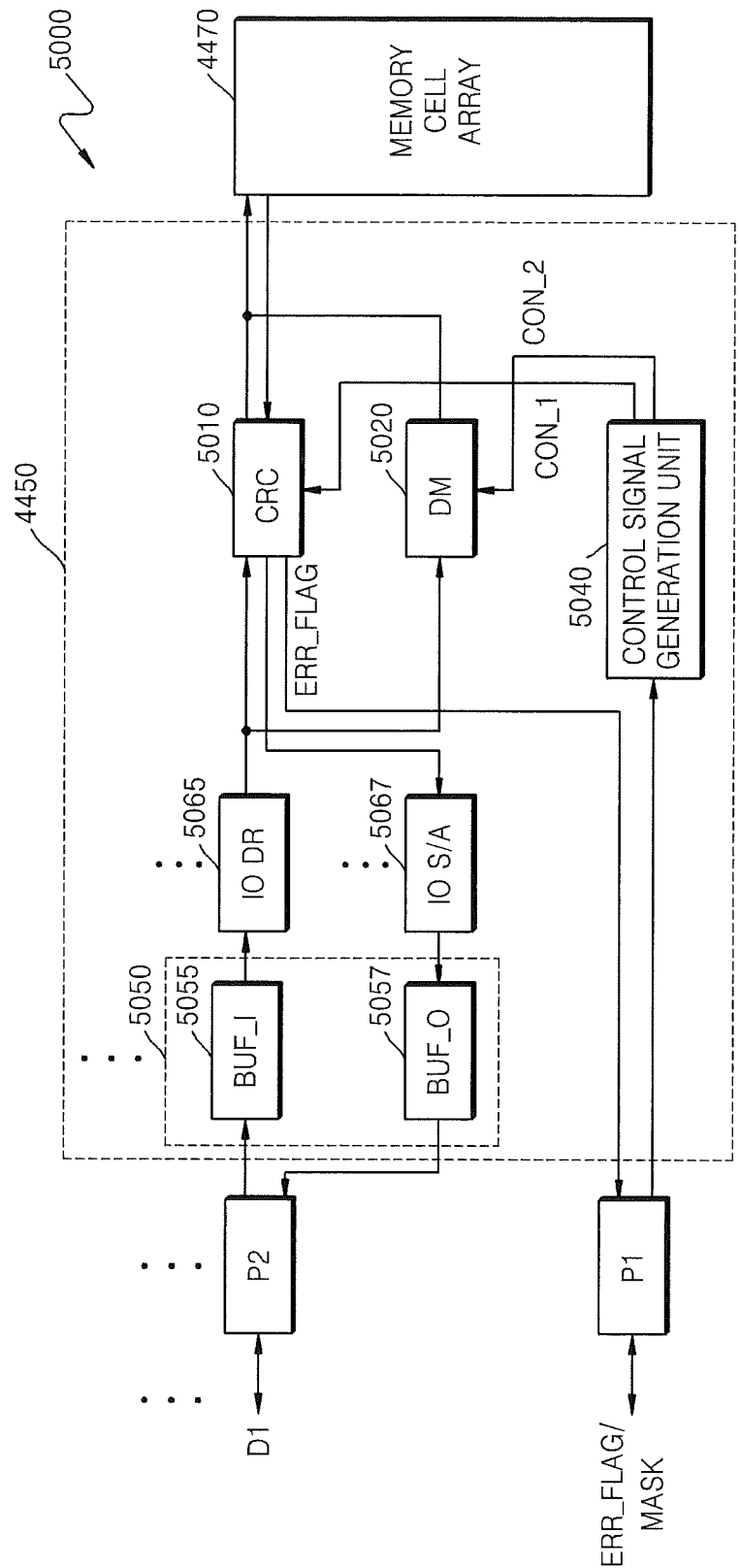
FIG. 50 is a block diagram of a semiconductor device that is another embodiment of the memory device of FIG. 44 according to the inventive concepts.

The structure and operation of the memory device 4400 according to various embodiments of the inventive concepts will now be described in detail with reference to FIGS. 45 to 50. In the embodiments of FIGS. 45 and 46, a first signal SIG_1 is a data inversion flag INV_FLAG and a second signal SIG_2 is an error check flag ERR_FLAG. In the embodiments of FIGS. 47 and 48, a first signal SIG_1 is a data inversion flag INV_FLAG and a second signal SIG_2 is a masking signal MASK. In the embodiments of FIGS. 49 and 50, a first signal SIG_1 is an error check flag ERR_FLAG and a second signal SIG_2 is a masking signal MASK.

FIG. 45 is a block diagram of a semiconductor device 4500 that is another embodiment of the memory device 4400 of FIG. 44 according to the inventive concepts. In FIG. 45, a first pad P1, a plurality of second pads P2, and a memory cell array 4470 have been described above with reference to FIG. 44.

Referring to FIGS. 44 and 45, the data control unit 4450 may include a control signal generation unit 4540, a plurality of buffer units 4550, a plurality of driving units 4565, a plurality of sense amplification units 4567, a DBI unit 4510, and an error check unit 4520. The operations of the plurality of buffer units 4550, the plurality of driving units 4565, the plurality of sense amplification units 4567, the DBI unit 4510, and the error check unit 4520 of FIG. 45, are similar to those of the plurality of buffer units 1050, the plurality of driving units 1065, the plurality of sense amplification units 1067, the DBI unit 1010, and the error check unit 1020 of FIG. 10, respectively.

The control signal generation unit 4540 may generate a first control signal CON_1 or a second control signal CON_2 and transmit the generated signal to the DBI unit 4510 or the error check unit 4520, according to a signal output via the first pad P1. That is, the control signal generation unit 4540 may generate the first control signal CON_1 and the second control signal CON_2 without selection information, by using a data inversion flag INV_FLAG and an error check flag ERR_FLAG received via the first pad P1, respectively. Here, it is assumed that the first control signal CON_1 controls the DBI unit 4510 to be enabled or disabled, and the second control signal CON_2 controls the error check unit 4520 to be enabled or disabled.

For example, it is assumed that the control signal generation unit 4540 generates the first control signal CON_1 for enabling the DBI unit 4510 when the signal received via the first pad P1 is '01', generates the second control signal CON_2 for enabling the error check unit 4520 when the signal received via the first pad P1 is '10', and does not generate any of the first and second control signals CON_1 and CON_2 when the signal received via the first pad P1 is '00'. In this case, the signal received via the first pad P1 may be considered as the data inversion flag INV_FLAG when this signal is '01' and may be considered as the error check flag ERR_FLAG when this signal is '10'. If the signal received via the first pad P1 is '00', then it may mean that any of the data inversion flag INV_FLAG and the error check flag ERR_FLAG is not received.

When the memory device 4500 performs the write operation in the error check mode, the error check unit 4520 may perform error checking on data received from an input buffer 4555 of one of the plurality of buffer units 4500 and transmit the data to a corresponding driving unit 4565, according to the second control signal CON_2. When the memory device 4500 performs the read operation in the error check mode, the error check unit 4520 may perform error checking on data, which is read from a memory cell of the memory cell array 4470 and is sensed and amplified by the corresponding sense amplification unit 4567, transmit the read data to a corresponding output buffer 4557, generate the error check flag ERR_FLAG, and output the error check flag ERR_FLAG via the first pad P1, according to the second control signal CON_2.

The operations of the DBI unit 4510 and the error check unit 4520 are similar to those of the DBI unit 2410 and the error check unit 4220, respectively.

FIG. 46 is a block diagram of a semiconductor device 4600 that is another embodiment of the memory device 4400 of FIG. 44 according to the inventive concepts. In FIG. 46, a first pad P1, a plurality of second pads P2, and a memory cell array 4470 have been described above with reference to FIG. 44.

Referring to FIGS. 44 and 46, the data control unit 4450 may include a control signal generation unit 4640, a plurality of buffer units 4650, a plurality of driving units 4665, a plurality of sense amplification units 4667, a DBI unit 4610, and an error check unit 4620. The operations of the plurality of buffer units 4650, the plurality of driving units 4665, the plurality of sense amplification units 4667, the DBI unit 4610, and the error check unit 4620 of FIG. 46, are similar to those of the plurality of buffer units 1150, the plurality of driving units 1165, the plurality of sense amplification units 1167, the DBI unit 1110, and the error check unit 1120 of FIG. 11, respectively.

The control signal generation unit 4640 may generate a first control signal CON_1 or a second control signal. CON_2 and transmit the generated signal to the DBI unit 4610 or the error check unit 4620, according to a signal output via the first pad P1. That is, the control signal generation unit 4540 may generate the first control signal CON_1 and the second control signal CON_2 without selection information, by using a data inversion flag INV_FLAG and an error check flag ERR_FLAG received via the first pad P1, respectively. Here, it is assumed that the first control signal CON_1 controls the DBI unit 4610 to be enabled or disabled, and the second control signal CON_2 controls the error check unit 4620 to be enabled or disabled. The operation of the control signal generation unit 4640 is similar to that of the control signal generation unit 4540 of FIG. 45.

While the memory device 4600 performs the write operation in the data inversion mode, the DBI unit 4610 may invert data received from one of the plurality of driving units 4665 and writes the inverting result to a corresponding memory cell of the memory cell array 4470, according to the first control signal CON_1. While the memory device 4600 performs the read operation in the data inversion mode, the DBI unit 4610 may invert data read from a corresponding memory cell of the memory cell array 4470, transmit the inverting result to a corresponding sense amplification unit 4667, generate the data inversion flag INV_FLAG, and output the data inversion flag INV_FLAG via the first pad P1, according to the first control signal CON_1.

While the memory device 4600 performs the write operation in the error check mode, the error check unit 4620 may perform error checking on data received from one of the plurality of driving units 4665 and write the data to a corresponding memory cell of the memory cell array 4470, according to the second control signal CON_2. While the memory device 4600 performs the read operation in the error check mode, the error check unit 4620 may perform error checking on data read from a corresponding memory cell of the memory cell array 4470, generate the error check flag ERR_FLAG, and output the error check flag ERR_FLAG via the first pad P1, according to the second control signal CON_2.

The operations of the DBI unit 4610 and the error check unit 4620 are similar to those of the DBI unit 4210 and the error check unit 4220 of FIG. 42.

FIG. 47 is a block diagram of a semiconductor device 4700 that is another embodiment of the memory device 4400 of FIG. 44 according to the inventive concepts. In FIG. 47, a first pad P1, a plurality of second pads P2, and a memory cell array 4470 have been described above with reference to FIG. 44.

Referring to FIGS. 44 and 47, the data control unit 4450 may include a control signal generation unit 4740, a plurality of buffer units 4750, a plurality of driving units 4765, a plurality of sense amplification units 4767, a DBI unit 4710, and a DM unit 4720. The operations of the plurality of buffer units 4750, the plurality of driving units 4765, the plurality of sense amplification units 4767, the DBI unit 4710, and the DM unit 4720 of FIG. 47, are similar to those of the plurality of buffer units 1550, the plurality of driving units 1565, the plurality of sense amplification units 1567, the DBI unit 1510, and the DM unit 1520 of FIG. 15, respectively.

The control signal generation unit 4740 may generate a first control signal CON_1 or a second control signal CON_2 and transmit the generated signal to the DBI unit 4710 or the DM unit 4720, according to a signal output via the first pad P1. That is, the control signal generation unit 4740 may generate the first control signal CON_1 and the second control signal CON_2 without selection information, by using a data inversion flag INV_FLAG and a data masking signal MASK received via the first pad P1, respectively. Here, it is assumed that the first control signal CON_1 controls the DBI unit 4710 to be enabled or disabled, and the second control signal CON_2 controls the DM unit 4720 to be enabled or disabled. The operation of the control signal generation unit 4740 is similar to that of the control signal generation unit 4540 of FIG. 45.

While the memory device 4700 performs the write operation in the data inversion mode, the DBI unit 4710 may invert data received from an input buffer 4755 of one of the plurality of buffer units 4750 and transmit the inverting result to a corresponding driving unit 4765, according to the first control signal CON_1. While the memory device 4700 performs the read operation in the data inversion mode, the DBI unit 4710 may invert data, which is read from a corresponding memory cell of the memory cell array 4470 and is sensed and amplified by a corresponding sense amplification unit 4767, transmit the inverting result to a corresponding output buffer 4757, generate the data inversion flag INV_FLAG, and output the data inversion flag INV_FLAG via the first pad P1, according to the first control signal CON_1.

While the memory device 4700 performs the write operation in the data masking mode, the DM unit 4720 may mask data received from the input buffer 4755 so that the data may not be delivered to a corresponding driving unit 4765, according to the second control signal CON_2. Here, it is assumed that the data control unit 4450 does not mask read data while the memory device 4700 performs the read operation. That is, the DM unit 4720 does not operate while the memory device 4700 performs the read operation, but the inventive concepts is not limited thereto and the data control unit 4450 may determine whether the read data is to be masked and whether the masking signal MASK is to be generated, if needed, while the memory device 4700 performs the read operation.

FIG. 48 is a block diagram of a semiconductor device 4800 that is another embodiment of the memory device 4400 of FIG. 44 according to the inventive concepts. In FIG. 48, a first pad P1, a plurality of second pads P2, and a memory cell array 4470 have been described above with reference to FIG. 44.

Referring to FIGS. 44 and 48, the data control unit 4450 may include a control signal generation unit 4840, a plurality of buffer units 4850, a plurality of driving units 4865, a plurality of sense amplification units 4867, a DBI unit 4810, and a DM unit 4820. The operations of the plurality of buffer units 4850, the plurality of driving units 4865, the plurality of sense amplification units 4867, the DBI unit 4810, and the DM unit 4820 of FIG. 48, are similar to those of the plurality of buffer units 1650, the plurality of driving units 1665, the plurality of sense amplification units 1667, the DBI unit 1610, and the DM unit 1620 of FIG. 16, respectively.

The control signal generation unit 4840 may generate a first control signal CON_1 or a second control signal CON_2 and transmit the generated signal to the DBI unit 4810 or the DM unit 4820, according to a signal output via the first pad P1. That is, the control signal generation unit 4840 may generate the first control signal CON_1 and the second control signal CON_2 without selection information, by using a data inversion flag INV_FLAG and a data masking signal MASK received via the first pad P1, respectively. Here, it is assumed that the first control signal CON_1 controls the DBI unit 4810 to be enabled or disabled, and the second control signal CON_2 controls the DM unit 4820 to be enabled or disabled. The operation of the control signal generation unit 4840 is similar to that of the control signal generation unit 4540 of FIG. 45.

While the memory device 4800 performs the write operation in the data inversion mode, the DBI unit 4810 may invert data received from one of the plurality of driving units 4865 and write the inverting result to a corresponding memory cell of the memory cell array 4470, according to the first control signal CON_1. While the memory device 4800 performs the read operation in the data inversion mode, the DBI unit 4810 may invert data read from a corresponding memory cell of the memory cell array 4470, transmit the inverting result to a corresponding sense amplification unit 4867, generate the data inversion flag INV_FLAG, and output the data inversion flag INV_FLAG via the first pad P1, according to the first control signal CON_1.

While the memory device 4800 performs the write operation in the data masking mode, the DM unit 4820 may mask data received from one of the plurality of driving units 4865 so that the data may not be written to a corresponding memory cell of the memory cell array 4470, according to the second control signal CON_2. Here, it is assumed that the data control unit 4450 does not mask read data while the memory device 4800 performs the read operation, as described above with reference to FIG. 47. That is, the DM unit 4820 does not operate while the memory device 4800 performs the read operation.

FIG. 49 is a block diagram of a semiconductor device 4900 that is another embodiment of the memory device 4400 of FIG. 44 according to the inventive concepts. In FIG. 49, a first pad P1, a plurality of second pads P2, and a memory cell array 4470 have been described above with reference to FIG. 44.

Referring to FIGS. 44 and 49, the data control unit 4450 may include a control signal generation unit 4940, a plurality of buffer units 4950, a plurality of driving units 4965, a plurality of sense amplification units 4967, an error check unit 4910, and a DM unit 4920. The operations of the plurality of buffer units 4950, the plurality of driving units 4965, the plurality of sense amplification units 4967, the error check unit 4910, and the DM unit 4920 of FIG. 49, are similar to those of the plurality of buffer units 2050, the plurality of driving units 2065, the plurality of sense amplification units 2067, the error check unit 2010, and the DM unit 2020 of FIG. 20, respectively.

The control signal generation unit 4940 may generate a first control signal CON_1 or a second control signal CON_2 and transmit the generated signal to the error check unit 4910 or the DM unit 4920, according to a signal output via the first pad P1. That is, the control signal generation unit 4940 may generate the first control signal CON_1 and the second control signal CON_2 without selection information, by using a an error check flag ERR_FLAG and a masking signal MASK received via the first pad P1, respectively. Here, it is assumed that the first control signal CON_1 controls the error check unit 4910 to be enabled or disabled, and the second control signal CON_2 controls the DM unit 4920 to be enabled or disabled. The operation of the control signal generation unit 4940 is similar to that of the control signal generation unit 4540 of FIG. 45.

While the memory device 4900 performs the write operation in the error check mode, the error check unit 4910 may perform error checking on data received from an input buffer 4955 of one of the plurality of buffer units 4950 and transmit the data to a driving unit 4965, according to the first control signal CON_1. While the memory device 4900 performs the read operation in the error check mode, the error check unit 4910 may perform error checking on data, which is read from a corresponding memory cell of the memory cell array 4470 and is sensed and amplified by a corresponding sense amplification unit 4940, transmit the read data to a corresponding output buffer 4957, generate the error check flag ERR_FLAG, and output the error check flag ERR_FLAG via the first pad P1, according to the first control signal CON_1.

While the memory device 4900 performs the write operation in the data masking mode, the DM unit 4920 may not mask data received from the input buffer 4955 so that the data may not be delivered to the corresponding driving unit 4965, according to the second control signal CON_2. Here, it is assumed that the data control unit 4450 does not mask read data while the memory device 4900 performs the read operation, as described above with reference to FIG. 47. That is, the DM unit 4920 does not operate while the memory device 4900 performs the read operation.

FIG. 50 is a block diagram of a semiconductor device 5000 that is another embodiment of the memory device 4400 of FIG. 44 according to the inventive concepts. In FIG. 50, a first pad P1, a plurality of second pads P2, and a memory cell array 4470 have been described above with reference to FIG. 44.

Referring to FIGS. 44 and 50, the data control unit 4450 may include a control signal generation unit 5040, a plurality of buffer units 5050, a plurality of driving units 5065, a plurality of sense amplification units 5067, an error check unit 5010, and a DM unit 5020. The operations of the plurality of buffer units 5050, the plurality of driving units 5065, the plurality of sense amplification units 5067, the error check unit 5010, and the DM unit 5020 of FIG. 50, are similar to those of the plurality of buffer units 2150; the plurality of driving units 2165, the plurality of sense amplification units 2167, the error check unit 2110, and the DM unit 2120 of FIG. 21, respectively.

The control signal generation unit 5040 may generate a first control signal CON_1 or a second control signal CON_2 and transmit the generated signal to the error check unit 5010 or the DM unit 5020, according to a signal output via the first pad P1. That is, the control signal generation unit 5040 may generate the first control signal CON_1 and the second control signal CON_2 without selection information, by using an error check flag ERR_FLAG and a masking signal MASK received via the first pad P1, respectively. Here, it is assumed that the first control signal CON_1 controls the error check unit 5010 to be enabled or disabled, and the second control signal CON_2 controls the DM unit 5020 to be enabled or disabled. The operation of the control signal generation unit 5040 is similar to that of the control signal generation unit 4540 of FIG. 45.

While the memory device 5000 performs the write operation in the error check mode, the error check unit 5010 may perform error checking on data received from one of the plurality of driving units 5065 and write the data to a corresponding memory cell of the memory cell array 4470, according to the first control signal CON_1. While the memory device 5000 performs the read operation in the error check mode, the error check unit 5010 may perform error checking on data read from a corresponding memory cell of the memory cell array 4470, transmit the read data to a corresponding sense amplification unit 5067, generate the error check flag ERR_FLAG, and output the error check flag ERR_FLAG via the first pad P1, according to the first control signal CON_1.

While the memory device 5000 performs the write operation in the data masking mode, the DM unit 5020 may mask data received from one of the plurality of driving units 5065 so that the data may not be written to a corresponding memory cell of the memory cell array 4470, according to the second control signal CON_2. Here, it is assumed that the data control unit 4450 does not mask read data while the memory device 5000 performs the read operation, as described above with reference to FIG. 47. That is, the DM unit 5020 does not operate while the memory device 5000 performs the read operation.

Figure 51:
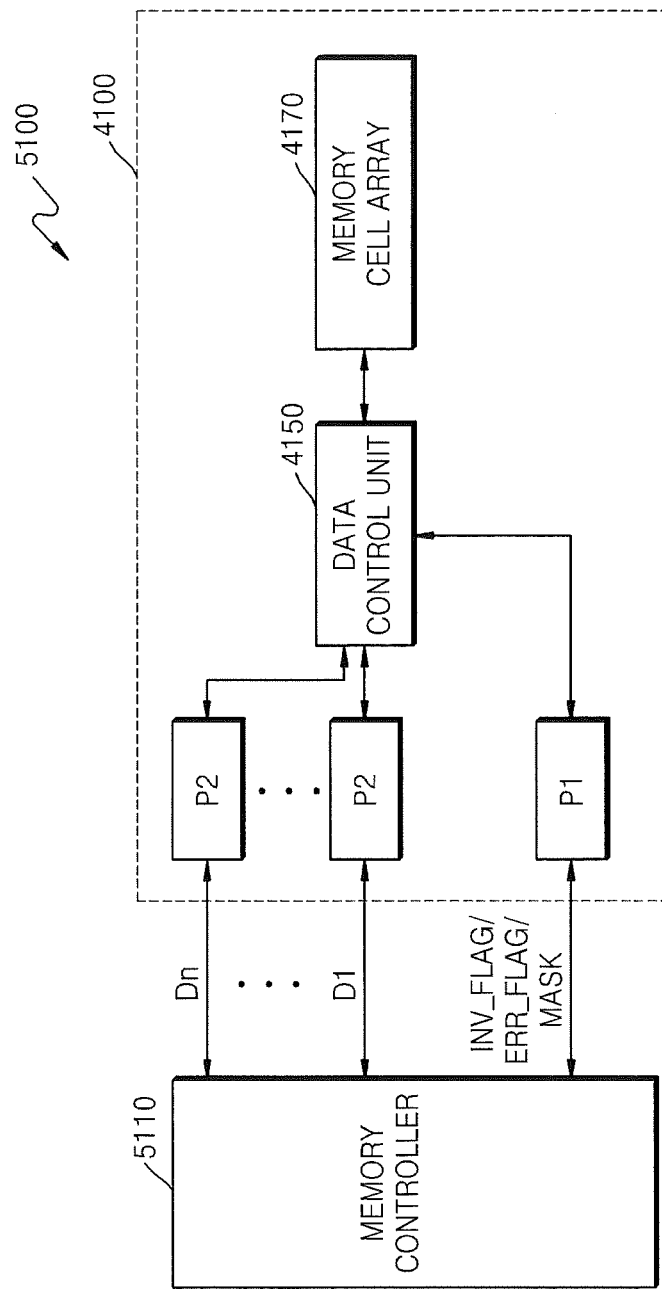
FIG. 51 is a block diagram of a memory system that includes a memory device according to an embodiment of the inventive concepts.

FIG. 51 is a block diagram of a memory system 5100 that includes a memory device according to an embodiment of the inventive concepts. In other words, FIG. 51 illustrates in detail the memory controller 2412 and the memory device 2411 of FIG. 24 or the memory controller 2520 and the memory device 2510 of FIG. 25.

Referring to FIG. 51, a memory system 5100 may include a memory controller 5110 and the memory device 4100. The memory device 4100 is the same as the memory device 4100 of FIG. 41. Thus, the memory device 4100 of FIG. 51 may correspond to one of the memory devices 4200 and 4300 of FIGS. 42 and 43. If the memory device 4100 performs the write operation, the memory controller 5010 may generate a data inversion flag INV_FLAG, an error check flag ERR_FLAG, or a masking signal MASK and transmit the generated signal to a first pad P1 of the memory device 4100 according to a selection information SEL. The data inversion flag INV_FLAG, the error check flag ERR_FLAG, and the masking signal MASK have been described above with reference to FIG. 42. If the memory device 4100 performs the read operation, the memory controller 5110 may receive one of the data inversion flag INV_FLAG, the error check flag ERR_FLAG, and the masking signal MASK via the first pad P1. The memory controller 5110 may transmit or receive data D1, . . . , Dn, which are to be written, via a plurality of second pads P2, respectively.

The structure and operation of the memory device 4100 have been described above with reference to FIGS. 42 and 43.

Figure 52:
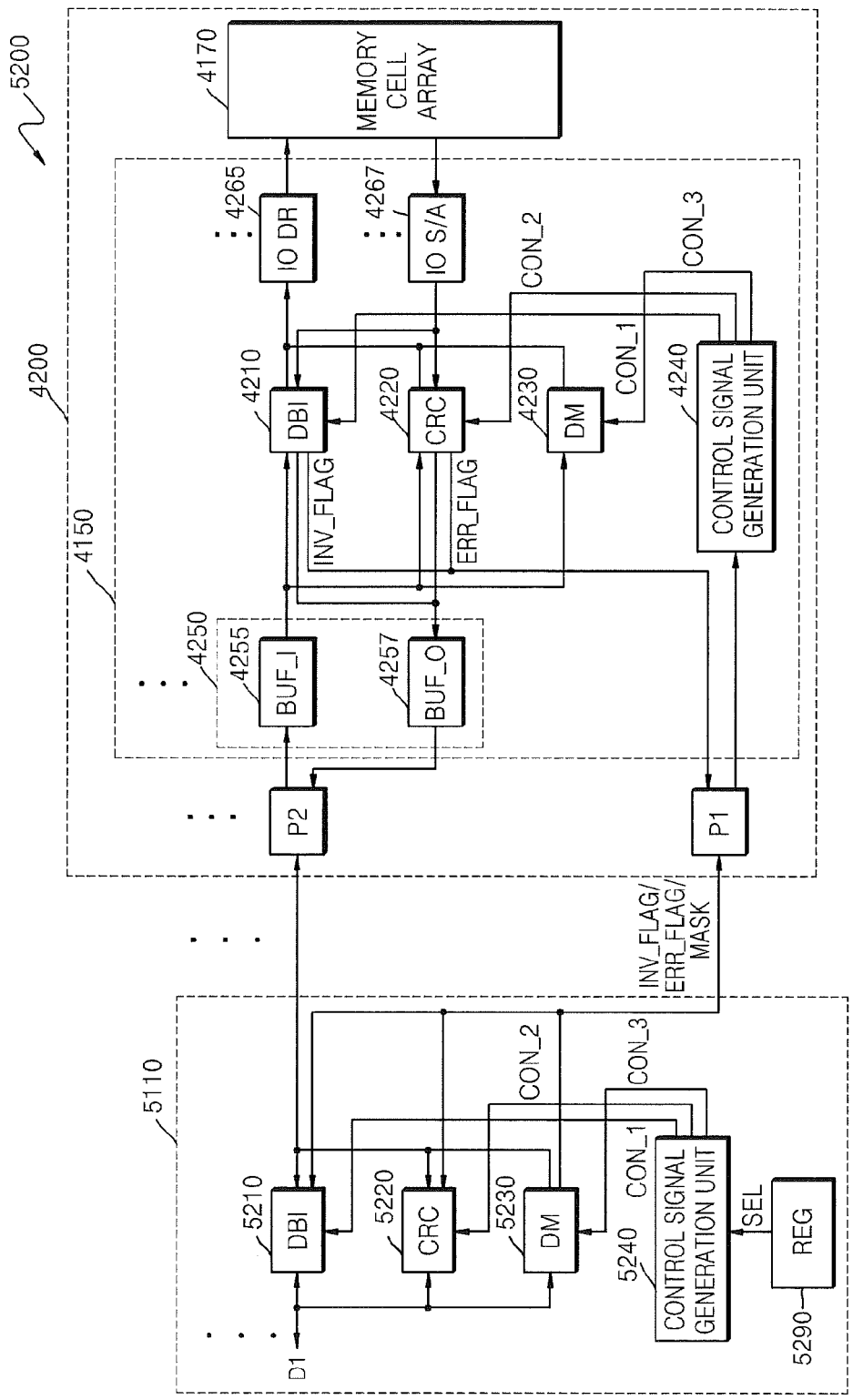
FIG. 52 is a block diagram of a memory system that is another embodiment of the memory system FIG. 51 according to the inventive concepts.

FIG. 52 is a block diagram of a memory system 5200 that is another embodiment of the memory system 5100 FIG. 51 according to the inventive concepts. Referring to FIGS. 51 and 52, a memory system 5110 may include a DBI unit 5210, an error check unit 5220, a DM unit 5230, a control signal generation unit 5240, and a register 5290.

The control signal generation unit 5240 may generate a first control signal CON_1, a second control signal CON_2, or a third control signal CON_3 and transmit the generated signal to the DBI unit 5210, the error check unit 5220, and the DM unit 5230, according to selection information SEL. Here, it is assumed that the first control signal CON_1 controls the DBI unit 5210 to be enabled or disable, the second control signal CON_2 controls the error check unit 5220 to be enabled or disabled, and the third control signal CON_3 controls the DM unit 5230 to be enabled or disabled.

The selection information SEL may be stored in the register 5290. For example, the selection information SEL may be defined according to an MRS command stored in the register 5290. That is, the control signal generation unit 5240 may generate the first control signal CON_1, the second control signal CON_2, or the third control signal CON_3 according to the MRS command stored in the register 5290.

The DBI unit 5210 is used when the data inversion scheme is employed, the error check unit 5220 is used when the error check scheme is employed, and the DM unit 5230 is used when the data masking scheme is employed. The structures and operations of the DBI unit 5210, the error check unit 5220, and the DM unit 5230 of the memory controller 5110 are similar to those of the DBI unit 4210, the error check unit 4220, and the DM unit 4230 included in the semiconductor device 4200 of FIG. 2, respectively. Also, a data inversion flag INV_FLAG, an error check flag ERR_FLAG, and a masking signal MASK that are transmitted by the DBI unit 5210, the error check unit 5220, and the DM unit 5230 of the memory controller 5110 via a first pad P1, respectively, have been described above in detail with reference to FIG. 42. FIG. 52 illustrates the memory system 5200, in which the memory controller 5110 controls the memory device 4200 illustrated in FIG. 42. The structure and operation of the memory device 4200 have been described above with reference to FIG. 42. However, the memory system 5100 of FIG. 51 is not limited by FIG. 52. The memory system 5200 may include the memory device 4300 of FIG. 43 instead of the memory device 4200, as described above with reference to FIG. 51.

Figure 53:
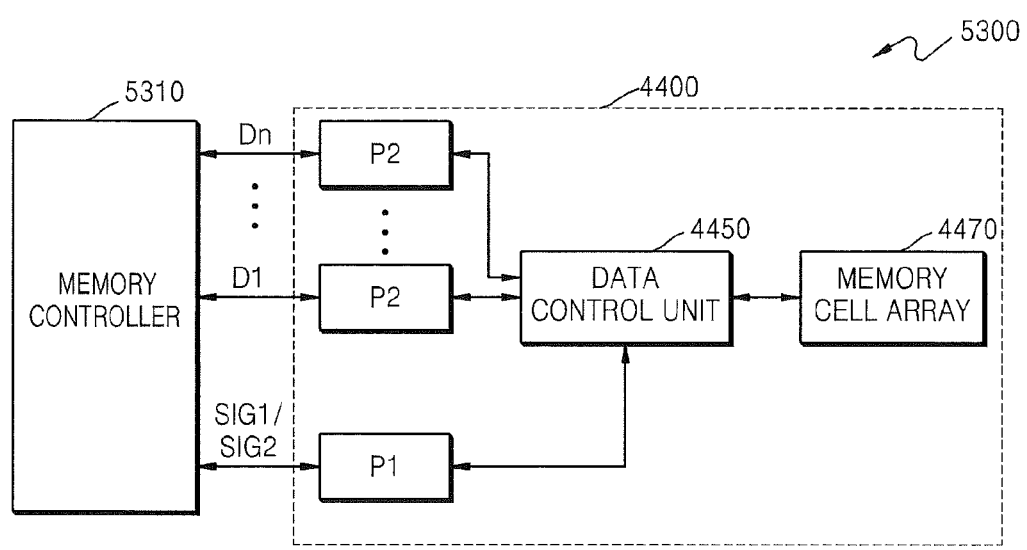
FIG. 53 is a block diagram of a memory system that includes a memory device according to another embodiment of the inventive concepts.

FIG. 53 is a block diagram of a memory system 5300 that includes a memory device 4400, according to another embodiment of the inventive concepts. That is, FIG. 53 illustrates in detail the memory controller 2412 and the memory device 2411 of FIG. 24 or the memory controller 2520 and the memory device 2510 of FIG. 25.

Referring to FIG. 53, the memory system 5300 may include a memory controller 5310 and the memory device 4400. The memory device 4400 of FIG. 53 is the same as the memory device 4400 of FIG. 44. Thus, the memory device 4400 of FIG. 53 may correspond to one of the memory devices 4500 to 5000 of FIGS. 45 to 50. The memory controller 5310 may generate a first signal SIG_1 or a second signal SIG_2 and transmit the generated signal to a first pad P1 of the memory device 4400. The first signal SIG_1 may be a data inversion flag INV_FLAG, an error check flag ERR_FLAG, or a masking signal MASK. The second signal SIG_2 is different from, the first signal SIG_1 and may be the data inversion flag INV_FLAG, the error check flag ERR_FLAG, or the masking signal MASK. That is, if the memory device 44000 performs the write operation, then the memory controller 5310 may generate the first signal SIG_1 or the second signal SIG_2 and output the generated signal via, a first pad P1, according to selection information. If the memory device 4400 performs the read operation then the memory controller 5510 may receive the first signal SIG_1 or the second signal SIG_2 generated by a data controller 4450 via the first pad P1. The memory controller 5310 may transmit or receive data D1, . . . , Dn, which are to be written, via a plurality of second pads P2, respectively.

The structure and operation of the memory device 4400 have been described above with reference to FIGS. 44 to 50.

Figure 54:
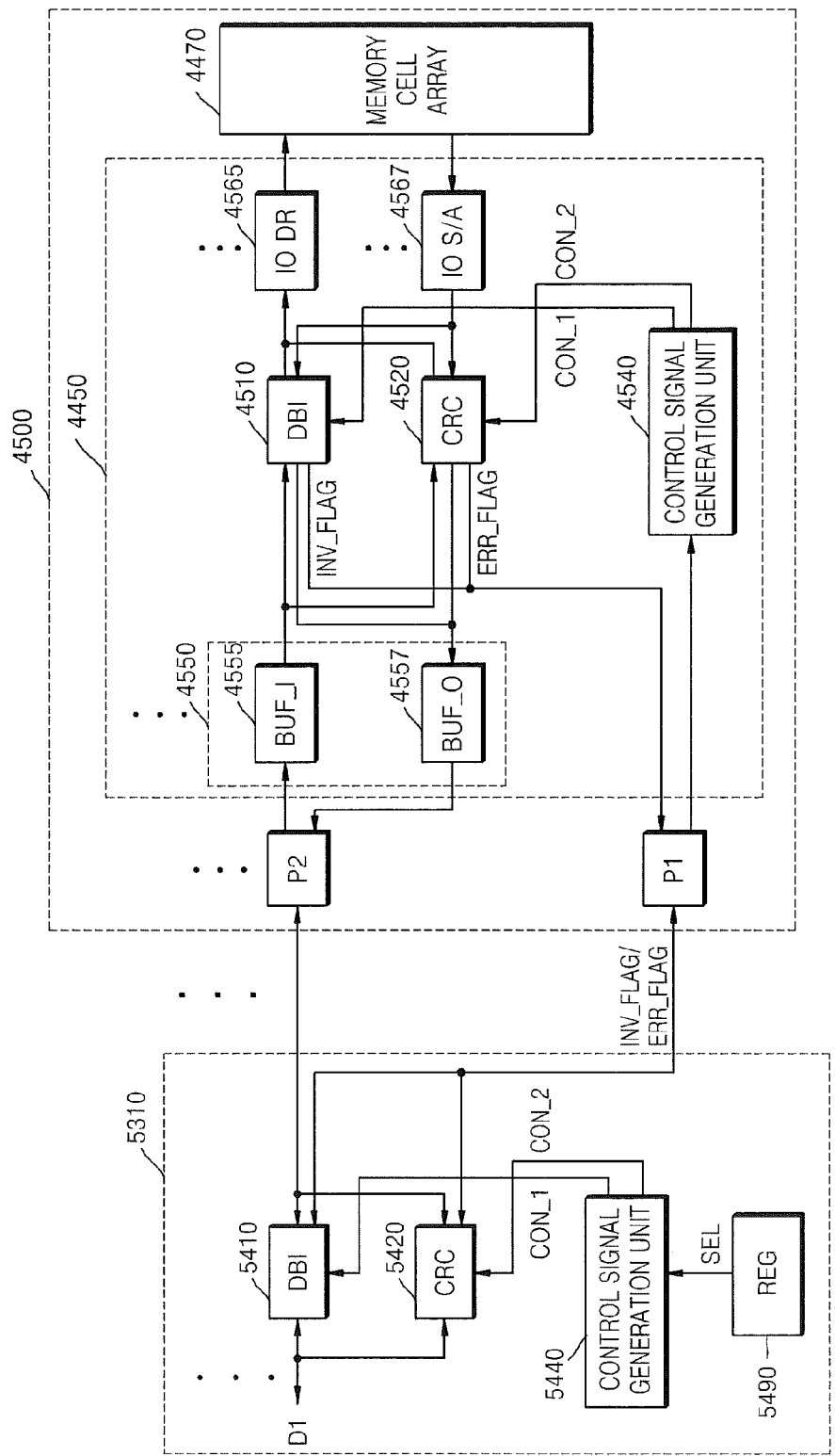
FIG. 54 is a block diagram of a memory system that is another embodiment of the memory system FIG. 53 according to the inventive concepts.

FIG. 54 is a block diagram of a memory system 5400 that is another embodiment of the memory system 5300 FIG. 53 according to the inventive concepts. Referring to FIGS. 53 and 54, a memory system 5310 may include a DBI unit 5410, an error check unit 5420, a control signal generation unit 5440, and a register 5490.

The control signal generation unit 5440 may generate a first control signal CON_1 or a second control signal CON_2 and transmit the generated signal to the DBI unit 5410 and the error check unit 5420, according to selection information SEL. Here, it is assumed that the first control signal CON_1 controls the DBI unit 5410 to be enabled or disable, and the second control signal CON_2 controls the error check unit 5420 to be enabled or disabled.

The selection information SEL may be stored in the register 5490. For example, the selection information SEL may be defined according to an MRS command stored in the register 5490. That is, the control signal generation unit 5440 may generate the first control signal CON_1 or the second control signal CON_2 according to the MRS command stored in the register 5490.

The DBI unit 5410 is used when the data inversion scheme is employed, and the error check unit 5420 is used when the error check scheme is employed. The structures and operations of the DBI unit 5410 and the error check unit 5420 of the memory controller 5310 are similar to those of the DBI unit 4510 and the error check unit 4520 included in the memory device 4400 of FIG. 44, respectively. Also, a data inversion flag INV_FLAG and an error check flag ERR_FLAG that are transmitted by the DBI unit 5410 and the error check unit 5420 of the memory controller 5310 via a first pad P1, respectively, have been described above in detail with reference to FIG. 45.

FIG. 54 illustrates the memory system 5400, in which the memory controller 5310 controls the memory device 4400 illustrated in FIG. 44. The structure and operation of the memory device 4500 have been described above with reference to FIG. 45. However, the memory system 5300 of FIG. 53 is not limited by FIG. 54. The memory system 5400 may include the memory device 4600 of FIG. 46 instead of the memory device 4500, as described above with reference to FIG. 53.

Figure 55:
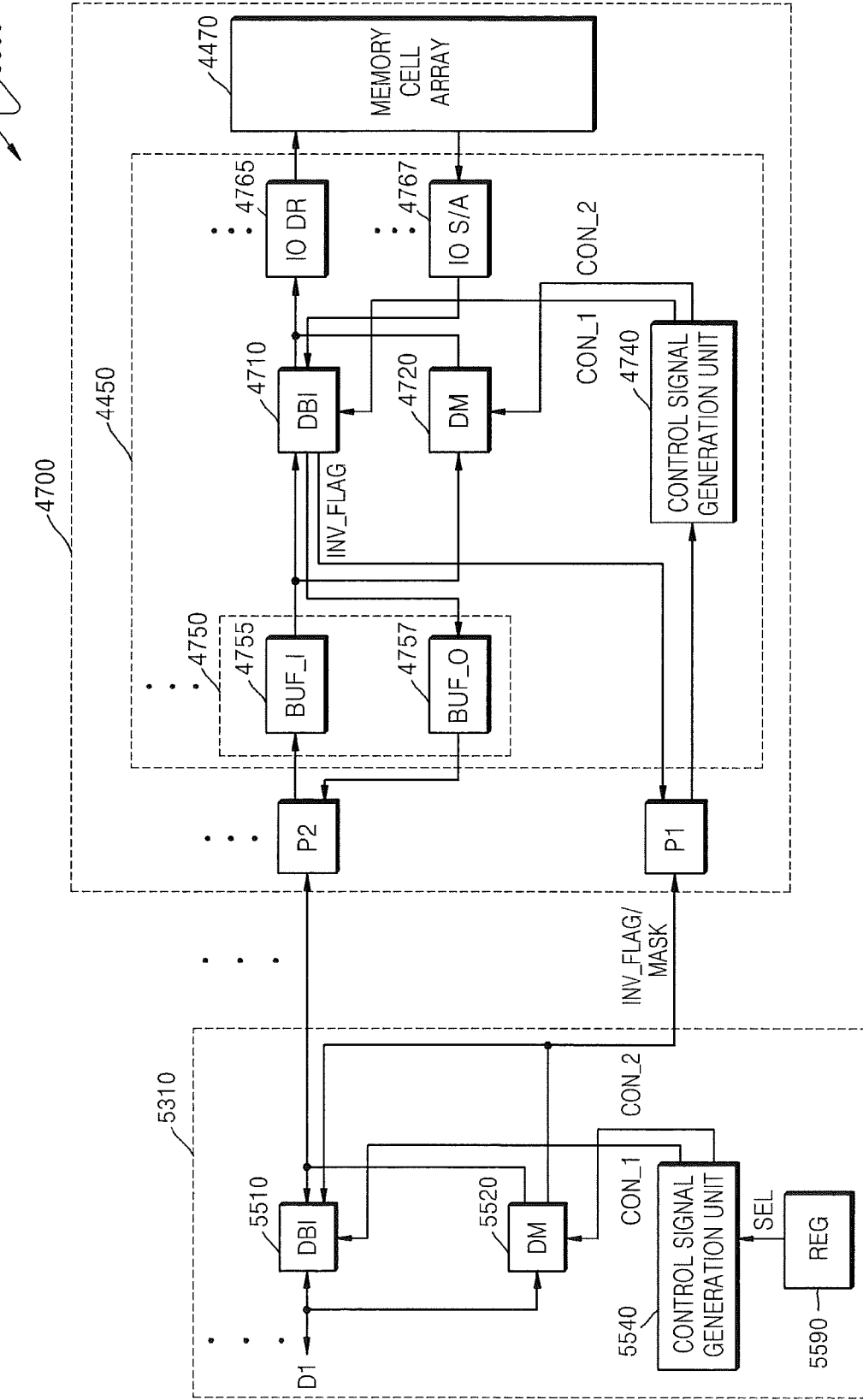
FIG. 55 is a block diagram of a memory system that is another embodiment of the memory system FIG. 53 according to the inventive concepts.

FIG. 55 is a block diagram of a memory system 5500 that is another embodiment of the memory system 5300 FIG. 53 according to the inventive concepts. Referring to FIGS. 53 and 55, a memory system 5310 may include a DBI unit 5510, a DM unit 5520, a control signal generation unit 5540, and a register 5590.

The control signal generation unit 5540 may generate a first control signal CON_1 or a second control signal CON_2 and transmit the generated signal to the DBI unit 5510 and the DM unit 5520, according to selection information SEL. Here, it is assumed that the first control signal CON_1 controls the DBI unit 5510 to be enabled or disable, and the second control signal CON_2 controls the DM unit 5520 to be enabled or disabled.

The selection information SEL may be stored in the register 5590. For example, the selection information SEL may be defined according to an MRS command stored in the register 5590. That is, the control signal generation unit 5540 may generate the first control signal CON_1 or the second control signal CON_2 according to the MRS command stored in the register 5590.

The DBI unit 5510 is used when the data inversion scheme is employed, and the DM unit 5520 is used when the data masking scheme is employed. The structures and operations of the DBI unit 5410 and the DM unit 5520 of the memory controller 5310 are similar to those of the DBI unit 4710 and the error check unit 4720 included in the memory device 4700 of FIG. 47, respectively. Also, a data inversion flag INV_FLAG and a masking signal MASK that are transmitted by the DBI unit 5410 and the DM unit 5520 of the memory controller 5310 via a first pad P1, respectively, have been described above in detail with reference to FIG. 45.

FIG. 55 illustrates the memory system 5500, in which the memory controller 5310 controls the memory device 4700 illustrated in FIG. 47. The structure and operation of the memory device 4700 have been described above with reference to FIG. 47. However, the memory system 5300 of FIG. 53 is not limited by FIG. 55. The memory system 5500 may include the memory device 4800 of FIG. 48 instead of the memory device 4700, as described above with reference to FIG. 53.

Figure 56:
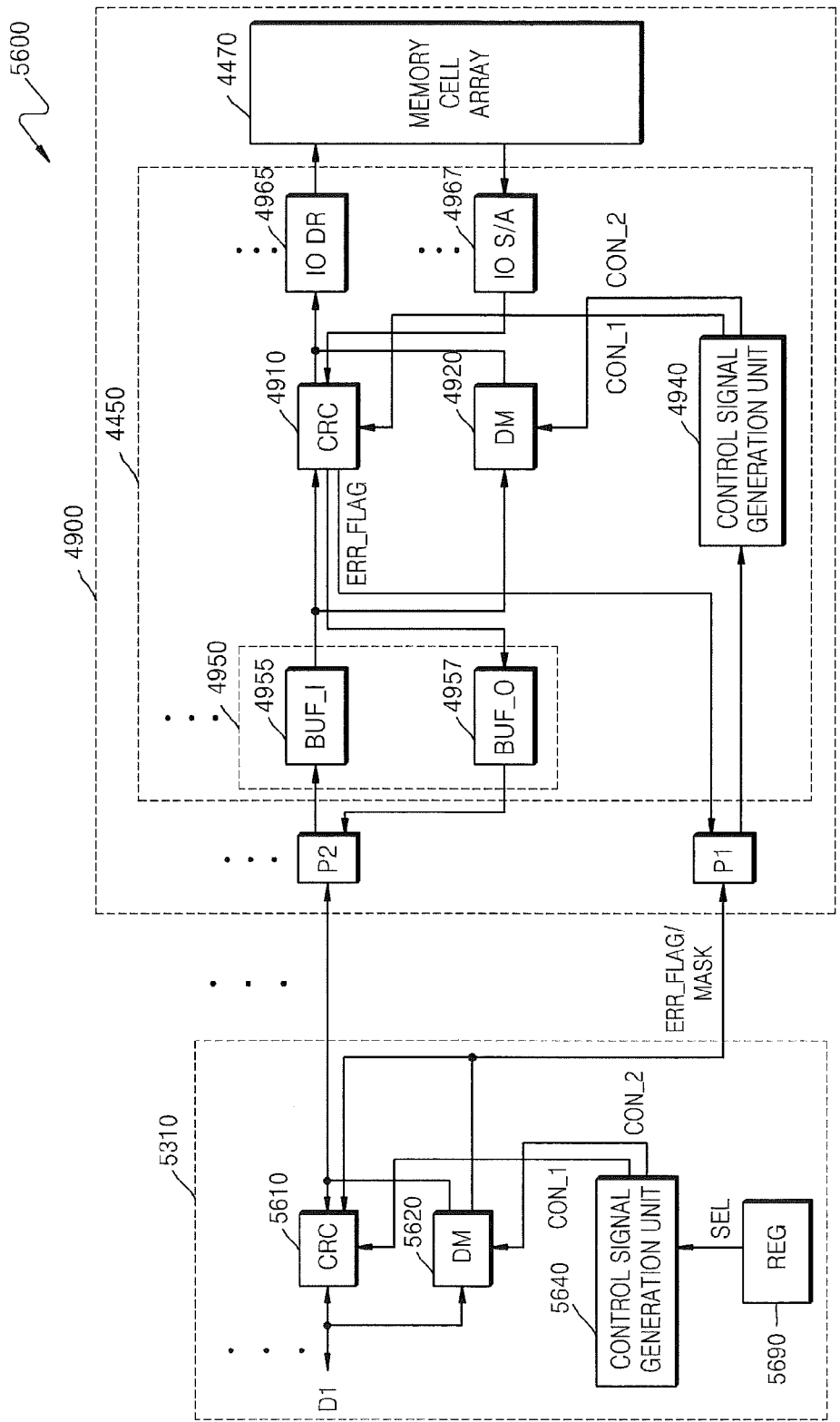
FIG. 56 is a block diagram of a memory system that is another embodiment of the memory system FIG. 53 according to the inventive concepts.

FIG. 56 is a block diagram of a memory system 5600 that is another embodiment of the memory system 5300 FIG. 53 according to the inventive concepts. Referring to FIGS. 53 and 56, a memory system 5310 may include an error check unit 5610, a DM unit 5620, a control signal generation unit 5640, and a register 5690.

The control signal generation unit 5640 may generate a first control signal CON_1 or a second control signal CON_2 and transmit the generated signal to the error check unit 5610 and the DM unit 5620, according to selection information SEL. Here, it is assumed that the first control signal CON_1 controls the error check unit 5610 to be enabled or disable, and the second control signal CON_2 controls the DM unit 5620 to be enabled or disabled.

The selection information SEL may be stored in the register 5690. For example, the selection information SEL may be defined according to an MRS command stored in the register 5690. That is, the control signal generation unit 5640 may generate the first control signal CON_1 or the second control signal CON_2 according to the MRS command stored in the register 5690.

The error check unit 5610 is used when the error check scheme is employed, and the DM unit 5620 is used when the data masking scheme is employed. The structures and operations of the error check unit 5610 and the DM unit 5620 of the memory controller 5310 are similar to those of the error check unit 4910 and the error check unit 4920 included in the memory device 4900 of FIG. 49, respectively. Also, an error check flag ERR_FLAG and a masking signal MASK that are transmitted by the error check unit 5610 and the DM unit 5620 of the memory controller 5310 via a first pad P1, respectively, have been described above in detail with reference to FIG. 45.

FIG. 56 illustrates the memory system 5600, in which the memory controller 5310 controls the memory device 4900 illustrated in FIG. 49. The structure and operation of the memory device 4900 have been described above with reference to FIG. 49. However, the memory system 5300 of FIG. 53 is not limited by FIG. 56. The memory system 5600 may include the memory device 5000 of FIG. 50 instead of the memory device 4900, as described above with reference to FIG. 53.

Figure 57:
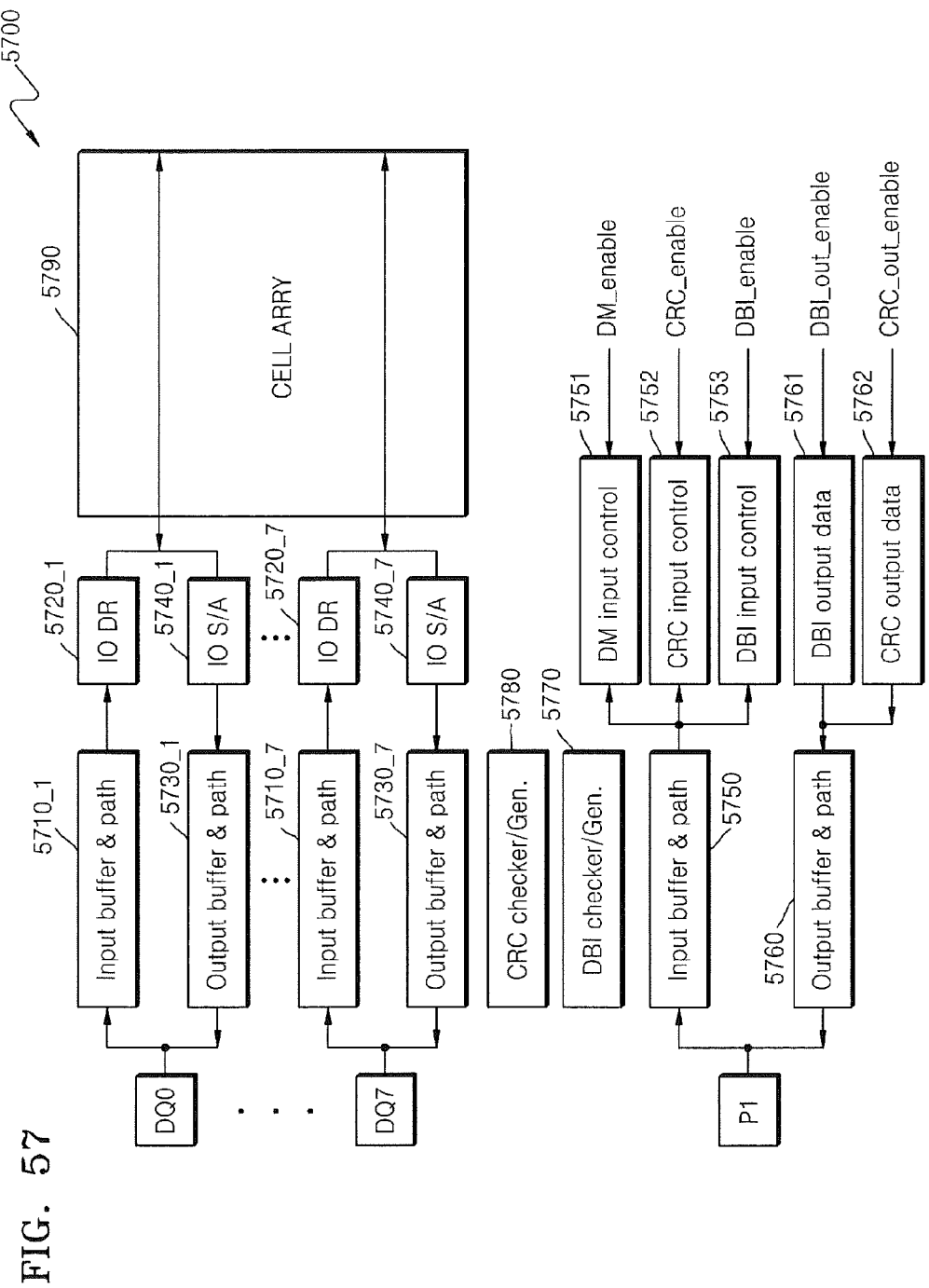
FIG. 57 is a block diagram of a semiconductor device according to another embodiment of the inventive concepts.

FIG. 57 is a block diagram of a semiconductor device 5700 according to another embodiment of the inventive concepts. Referring to FIG. 57, the semiconductor device 5700 may include a first pad P1, a plurality of second pads DQ0, . . . , DQ7, a plurality of input buffers 5710_1, . . . , 5710_7, and 5750, a plurality of output buffers 5730_1, . . . , 5730_7, and 5760, a plurality of driving units 5720_1, . . . , and 5720_7, a plurality of sense amplification units 5740_1, . . . , through to 5740_7, a memory cell array 5790, a first check unit 5770, a second check unit 5780, a first input control unit 5751, a second input control unit 5752, a third input control unit 5753, a first output control unit 5761, and a second output control unit 5762, One of a data inversion flag INV_FLAG, an error check flag ERR_FLAG, and a masking signal MASK may be received via the first pad P1, and 1-bit data may be received via each of the plurality of second pads DQ0, . . . , through to DQ7.

If the data inversion flag INV_FLAG is received via one of the plurality of second pads DQ0, . . . , through to DQ7, then the first check unit 5770 transmits the data inversion flag INV_FLAG to the third input control unit 5753. The third input control unit 5753 may be enabled according to a first enable signal DBI_enable, or may invert data received from the plurality of input buffers 5710_1, . . . through to 5710_7 or data received from the plurality of driving units 5720_1, . . . , through to 5720_7 according to the data inversion flag INV_FLAG. When data is read from the memory cell array 5790, the third input control unit 5753 is enabled according to the first enable signal DBI_enable. The first check unit 5770 may determine whether the read data is to be inverted. If the first check unit 5770 determines that the read data is to be inverted, then the first check unit 5770 transmits the data inversion flag INV_FLAG to the first output control unit 5761. The first output control unit 5761 may control signals, which are input to the plurality of output buffers 5730_1, . . . , 5730_7, and 5760 or are output from the plurality of sense amplifications 5740_1, . . . , through 5740_7, to be inverted. Also, the first output control unit 5761 may transmit the data inversion flag INV_FLAG to the first pad P1.

If the error check flag ERR_FLAG is received via one of the plurality of second pads P2, then the second check unit 5780 transmits the error check flag ERR_FLAG to the second input control unit 5752. The second input control unit 5752 may be enabled according to a second enable signal CRC_enable, or may perform error checking on data, which is output from the plurality of input buffers 5710_1, . . . , through to 5710_7 or is input to the plurality of driving units 5720_1, ..., 5720_7 according to the error check flag ERR_FLAG. If data is read from the memory cell array 5790, the second input control unit 5752 is enabled according to the second enable signal CRC_enable. The second check unit 5780 may determine whether the read data is to be error checked. If the second check unit 5780 determines that the read data is to be error checked, then second check unit 5780 transmits the error check flag ERR_FLAG to the second output control unit 5762. The second output control unit 5762 may control signals, which are input to the plurality of output buffers 5730_1, ..., 5730_7, and 5760 or are output from the plurality of sense amplifications 5740_1, ..., through to 5740_7, to be error checked. The second output control unit 5762 may transmit the error check flag ERR_FLAG to the first pad P1.

If the masking signal MASK is received via one of the plurality of second pads P2, the first input control unit 5751 may be enabled according to a third enable signal MC_enable, or may control any data not to be output from the plurality of input buffers 5710_1, ..., through to 5710_7 or the plurality of driving units 5720_1, ..., through to 5720_7 according to the masking signal MASK. Similar to the previous embodiments, according to the current embodiment, the semiconductor device 5700 does not mask read data while the read operation is performed.

Figure 58:
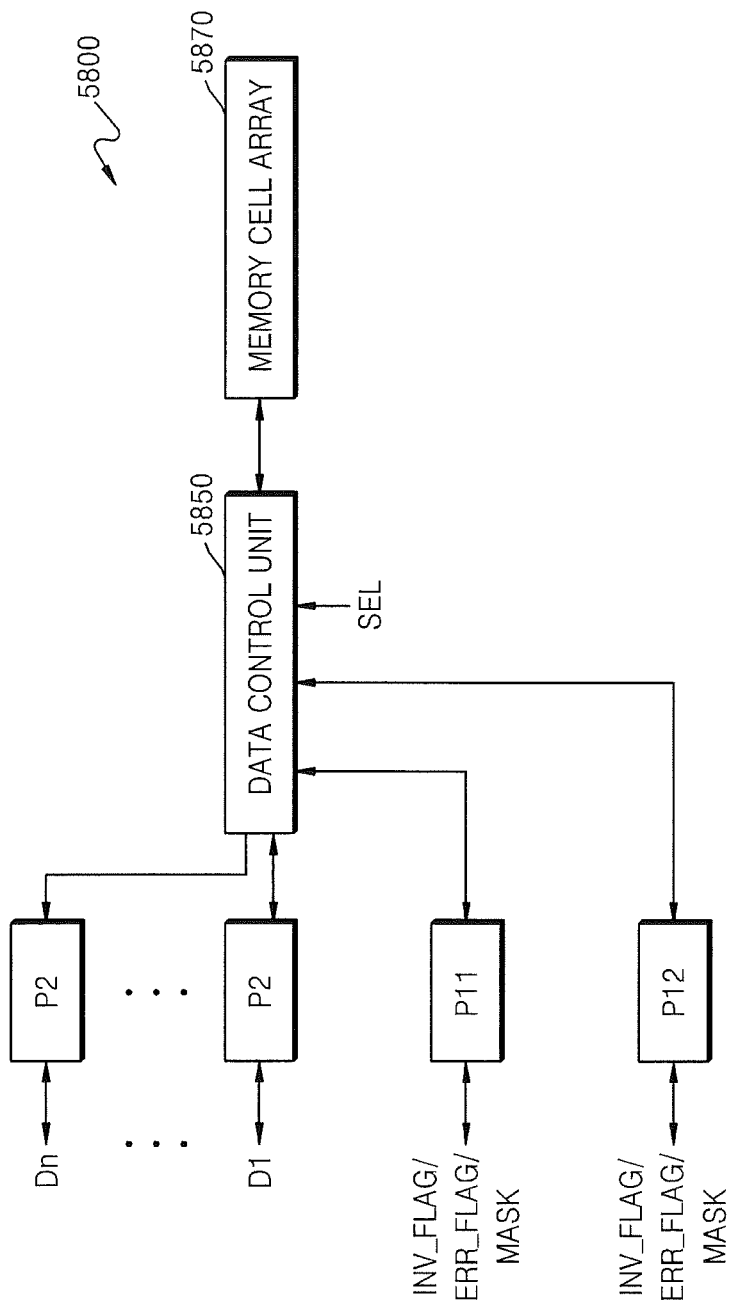
FIG. 58 is a block diagram of a semiconductor device according to another embodiment of the inventive concepts.

FIG. 58 is a block diagram of a semiconductor device 5800 according to another embodiment of the inventive concepts. Referring to FIG. 58, the semiconductor device 5800 may include a plurality of first pads P11 and P12, a plurality of second pads P2, a data control unit 5850, and a memory cell array 5870.

The plurality of first pads P11 and P12 are connected to the data control unit 5850, and one of a data inversion flag INV_FLAG, an error check flag ERR_FLAG, and a masking signal MASK may be transmitted via each of the plurality of first pads P11 and P12. The data inversion flag INV_FLAG may be a signal indicating whether the data control unit 5850 has inverted data input thereto, and the error check flag ERR_FLAG may be a signal indicating whether the data control unit 5850 has performed error checking data input thereto. The masking signal MASK may be a signal indicating whether the data control unit 5850 has masked data input thereto.

The plurality of second pads P2, the data control unit 5850, and the memory cell array 5870 are as described above with reference to FIG. 1.

Figure 59:
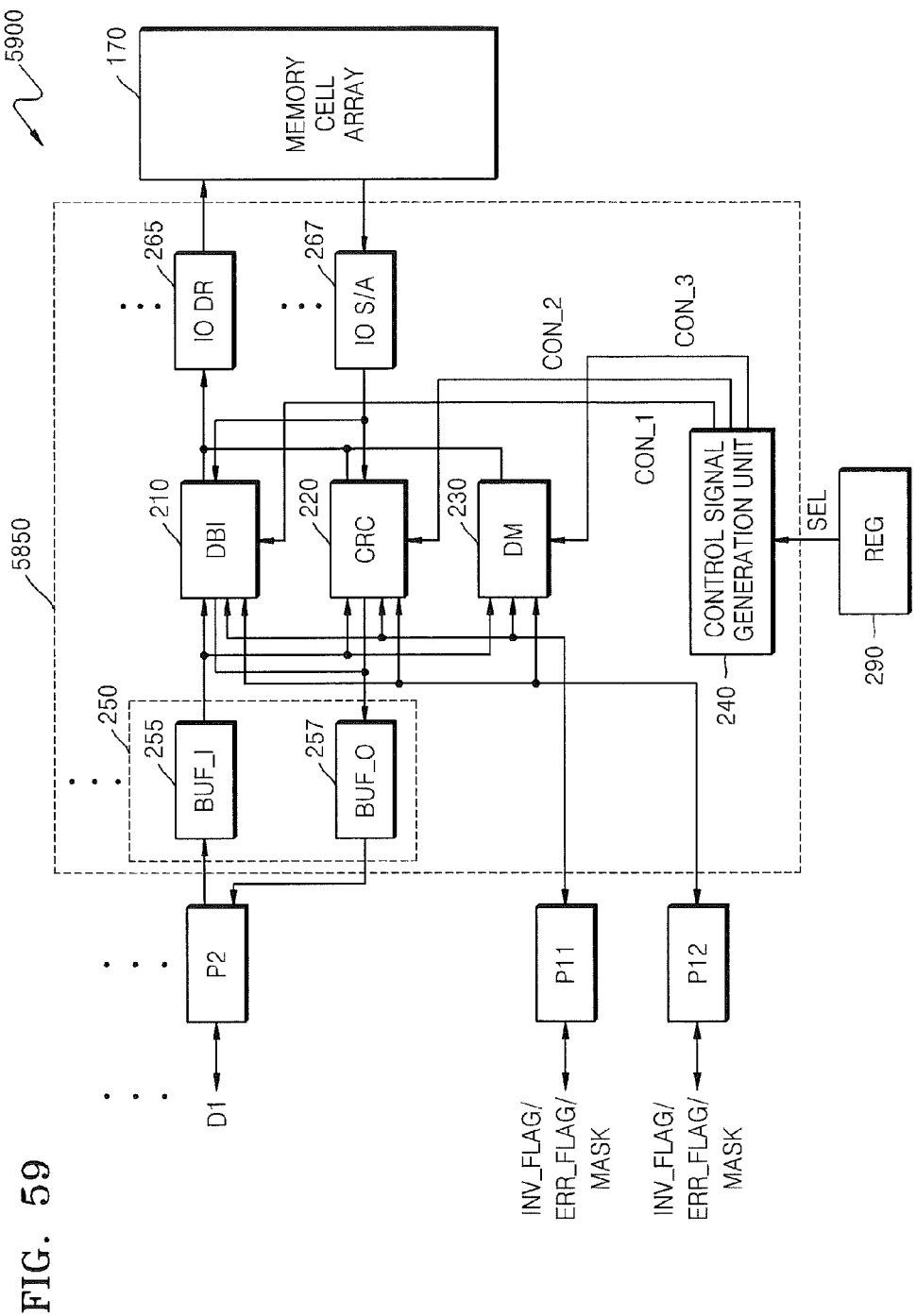
FIG. 59 is a block diagram of a semiconductor device that is another embodiment of the semiconductor device of FIG. 58 according to the inventive concepts.

FIG. 59 is a block diagram of a semiconductor device 5900 that is another embodiment of the semiconductor device 5800 of FIG. 58 according to the inventive concepts. Referring to FIGS. 58 and 59, in the semiconductor device 5900, a data control unit 5850 corresponds to the data control unit 150 of FIG. 2. The data control unit 5850 may control received data according to at least one signal selected from among selection information SEL and signals output from a plurality of first pads P11 and P12. The selection information SEL may be defined according to a MRS command. That is, the data control unit 5850 may simultaneously perform both an operation corresponding to a signal received via the first pad P11 and an operation corresponding to a signal received via the first pad P12. For example, if during a write operation, a data inversion flag INV_FLAG and an error check flag ERR_FLAG are received via the first pad P11 and the first pad P12, respectively, then a DBI unit 210 inverts data D1, ..., through to Dn received from a plurality of input buffers 255, transmits the inverting result to a plurality of driving units 265, and at the same time, an error check unit 220 performs error checking on the data D1, ..., through to Dn received from the plurality of input buffers 255.

The operation of the data control unit 5850 has been described above with reference to FIG. 2. FIG. 59 illustrates a case where the data control unit 5850 of FIG. 59 is the same as the data control unit 150 of FIG. 2 but the inventive concepts is not limited thereto and the data control unit 5850 of FIG. 59 may correspond to one of the data control units 150 of FIGS. 3 to 5.

Still further, instead of simultaneously performing the enabled processing functions (e.g., DBI and error checking), one skilled in the art will appreciate that the DBI unit 210, CRC unit 220 and the DM unit 230 may be connected to permit performing enabled processing functions in serial. For example, the CRC unit 220 may first perform the error checking function and then the DBI unit 210 may perform the data bus inversion function.

FIG. 60 is a table showing the relationship between selection information SEL and a first pad P1 according to an embodiment of the inventive concepts. The selection information SEL may be stored in a register of a semiconductor device according to one of the above embodiments and may be defined according to an MRS command stored in the register, as described above. Referring to FIG. 60, a use of the first pad P1 may be defined according to the MRS command. For example, if an MRS command MRS_W0 is received, the use of the first pad P1 is defined to be data bus inversion when the semiconductor device performs the write operation. Thus, a DBI unit DBI is enabled according to selection information SEL corresponding to the MRS command MRS_W0, and the semiconductor device operates in the data inversion mode. If an MRS command MRS_W1 is received, the use of the first pad P1 is defined to be error checking when the semiconductor device performs the write operation. Thus, an error check unit CRC is enabled according to selection information SEL corresponding to the MRS command MRS_W1, and the semiconductor device operates in the error check mode. If an MRS command MRS_W2 is received, the use of the first pad P1 is defined to be data masking when the semiconductor device performs the write operation. Thus, a DM unit DM is enabled according to selection information SEL corresponding to the MRS command MRS_W2, and the semiconductor device operates in the data masking mode. If an MRS command MRS_W3 is received, the use of the first pad P1 is not defined when the semiconductor device performs the write operation. Thus, all the DBI units DBI, the error check units CRC, and the DM units DM are disabled.

FIG. 61 is a table showing the relationship between selection information SEL and a first pad P1 according to another embodiment of the inventive concepts. The selection information SEL may be stored in a register of a semiconductor device according to one of the above embodiments and may be defined according to an MRS command stored in the register, as described above. Referring to FIG. 61, a use of the first pad P1 may be defined according to the MRS command. For example, if an MRS command MRS_R0 is received, the use of the first pad P1 is defined to be data bus inversion when the semiconductor device performs the read operation. Thus, a DBI unit DBI is enabled according to selection information SEL corresponding to the MRS command MRS_R0, and the semiconductor device operates in the data inversion mode. If an MRS command MRS_R1 is received, the use of the first pad P1 is defined to be error checking when the semiconductor device performs the read operation. Thus, an error check unit CRC is enabled according to selection information SEL corresponding to the MRS command MRS_R1, and the semiconductor device operates in the error check mode. If an MRS command MRS_R2 is received, the use of the first pad P1 is not defined when the semiconductor device performs the read operation. Thus, all the DBI units DBI, the error check units CRC, and the DM units DM are disabled.

FIG. 62 is a table showing the relationship between selection information SEL and a first pad P1 according to another embodiment of the inventive concepts. The selection information SEL may be stored in a register of a semiconductor device according to one of the above embodiments and may be defined according to an MRS command stored in the register, as described above. Referring to FIGS. 60 and 61, a use of a first pad P1 when the write operation is performed is defined according to one MRS command, and a use of the first pad P1 when the read operation is performed is defined according to another MRS command. In other words, referring to FIGS. 60 and 61, whether the data inversion mode, the error check mode, or the data masking mode is to be applied when the write operation is performed, may be defined according to one MRS command, and whether the data inversion mode, the error check mode, or the data masking mode is to be applied when the read operation is performed, may be defined according to another MRS command. However, referring to FIG. 62, uses of the first pad P1 when the write operation and the read operation are performed, respectively, are defined according to one MRS command. In other words, referring to FIG. 62, both whether the data inversion mode, the error check mode, or the data masking mode is to be applied when the write operation is performed and whether the data inversion mode, the error check mode, or the data masking mode is to be applied when the read operation is performed, may be defined according to one MRS command.

For example, if an MRS command MRS_0 is received, the use of the first pad P1 is defined to be data bus inversion both when the semiconductor device performs the write operation and when the semiconductor device performs the read operation. Thus, a DBI unit DBI is enabled according to selection information SEL corresponding to the MRS command MRS_0, and the semiconductor device operates in the data inversion mode both during the read operation and during the write operation. If an MRS command MRS_1 is received, the use of the first pad P1 is defined to be data bus inversion when the semiconductor device performs the write operation, and is defined to error checking when the semiconductor device performs the read operation. In this case, if the semiconductor device performs the write operation, the DBI unit DBI is enabled according to selection information SEL corresponding to the MRS command MRS_1 and the semiconductor device operates in the data inversion mode. If the semiconductor device performs the read operation, an error check unit CRC is enabled according to the selection information SEL, corresponding to the MRS command MRS_1, and the semiconductor device operates in the error check mode.

In the table of FIG. 62, "DBI" denotes that the use of the first pad P1 is defined to be data bus inversion, "CRC" denotes that the use of the first pad P1 is defined to be error checking, "DM" denotes that the use of the first pad P1 is defined to be data masking, and "X" denotes that the use of the first pad P1 is not defined.

FIG. 63 is a table showing the relationship between selection information SEL and a first pad P1 according to another embodiment of the inventive concepts. The selection information SEL may be stored in a register of a semiconductor device according to one of the above embodiments and may be defined according to an MRS command stored in the register, as described above. Referring to FIG. 63, uses of the plurality of first pads P11 and P12 of FIG. 58 or 59 may be defined to be different from each other according to the MRS command. For example, if an MRS command MRS_W0 is received, the use of the first pad P11 is defined to be data bus inversion and the use of the first pad P12 is defined to be error checking when the semiconductor device performs the write operation. Thus, both a DBI unit DBI and an error check unit CRC are enabled according to selection information corresponding to the MRS command MRS_W0, and the semiconductor device operates both in the data inversion mode and the error check mode. If an MRS command MRS_W1 is received, the use of the first pad P11 is defined to be data bus inversion and the use of the first pad P12 is defined to be data masking when the semiconductor device performs the write operation. Thus, both the DBI unit DBI and a data masking unit DM are enabled according to selection information SEL corresponding of the MRS command MRS_W1, and the semiconductor device operates both in the data bus inversion mode and data masking mode.

FIG. 63 illustrates a case where the semiconductor devices 5800 and 5900 perform the write operation. In the table of FIG. 63, "DBI" denotes that the use of the first pad P11 or P12 is defined to be data bus inversion, "CRC" denotes that the use of the first pad P11 or P12 is defined to be error checking, "DM" denotes that the use of the first pad P11 or P12 is defined to be data masking, and "X" denotes that the use of the first pad P11 or P12 is not defined.

FIG. 64 is a table showing the relationship between selection information SEL and a first pad P1 according to another embodiment of the inventive concepts. The selection information SEL may be stored in a register of a semiconductor device according to one of the above embodiments and may be defined according to an MRS command stored in the register, as described above. Referring to FIG. 64, uses of the plurality of first pads P11 and P12 of FIG. 58 or 59 may be defined to be different from each other according to the MRS command. For example, if an MRS command MRS_R0 is received, the use of the first pad P11 is defined to be data bus inversion and the use of the first pad P12 is defined to be error checking when the semiconductor device performs the read operation. Thus, both a DBI unit DBI and an error check unit CRC are enabled according to selection information corresponding to the MRS command MRS_R0, and the semiconductor device operates both in the data inversion mode and the error check mode. If an MRS command MRS_R1 is received, the use of the first pad P11 is defined to be data bus inversion and the use of the first pad P12 is not defined when the semiconductor device performs the read operation. Thus, the DBI unit DBI is enabled according to selection information SEL corresponding of the MRS command MRS_R1, and the semiconductor device operates in the data bus inversion mode.

FIG. 64 illustrates a case where the semiconductor devices 5800 and 5900 perform the read operation. In the table of FIG. 64, "DBI" denotes that the use of the first pad P11 or P12 is defined to be data bus inversion, "CRC" denotes that the use of the first pad P11 or P12 is defined to be error checking, and "X" denotes that the use of the first pad P11 or P12 is not defined.

FIG. 65 is a table showing the relationship between selection information SEL and a first pad P1 according to another embodiment of the inventive concepts. The selection information SEL may be stored in a register of a semiconductor device according to one of the above embodiments and may be defined according to an MRS command stored in the register, as described above. Referring to FIGS. 63 and 64, uses of first pads P11 and P12 when the write operation is performed and when the read operation is performed are defined separately according to one MRS command. In other words, referring to FIGS. 63 and 64, whether the data inversion mode, the error check mode, or the data masking mode is to be applied when the write operation is performed, may be defined according to one MRS command, and whether the data inversion mode, the error check mode, or the data masking mode is to be applied when the read operation is performed, may be defined according to another MRS command. However, referring to FIG. 65, uses of the first pads P11 and P12 when the write operation and the read operation are performed, respectively, are defined according to one MRS command. In other words, referring to FIG. 65, both whether the data inversion mode, the error check mode, or the data masking mode is to be applied when the write operation is performed and whether the data inversion mode, the error check mode, or the data masking mode is to be applied when the read operation is performed, may be defined according to one MRS command.

For example, if an MRS command MRS_0 is received, the use of the first pad P11 is defined to be data bus inversion and the use of the first pad P12 may be defined to be error checking both when the semiconductor device performs the write operation and when the semiconductor device performs the read operation. Thus, both a DBI unit DBI and an error check unit CRC are enabled according to selection information SEL corresponding to the MRS command MRS_0, and the semiconductor device operates both in the data inversion mode and in the error check mode both during the read operation and during the write operation. If an MRS command MRS_1 is received, the use of the first pad P11 is defined to be data bus inversion and the use of the first pad P12 is defined to be error checking when the semiconductor device performs the write operation, and the use of the first pad P11 is defined to be data bus inversion and the use of the first pad P12 is not defined when the semiconductor device performs the read operation. In this case, if the semiconductor device performs the write operation, both the DBI unit DBI and the error check unit CRC are enabled according to selection information SEL corresponding to the MRS command MRS_1 and the semiconductor device operates both in the data inversion mode and the error check mode. If the semiconductor device performs the read operation, only the DBI unit DBI is enabled according to the selection information SEL corresponding to the MRS command MRS_1, and the semiconductor device operates only in the data bus inversion mode.

In the table of FIG. 65, "DBI" denotes that the use of the first pad P11 or P12 is defined to be data bus inversion, "CRC" denotes that the use of the first pad P11 or P12 is defined to be error checking, "DM" denotes that the use of the first pad P11 or P12 is defined to be data masking, and "X" denotes that the use of the first pad P11 or P12 is not defined.

Figure 66:
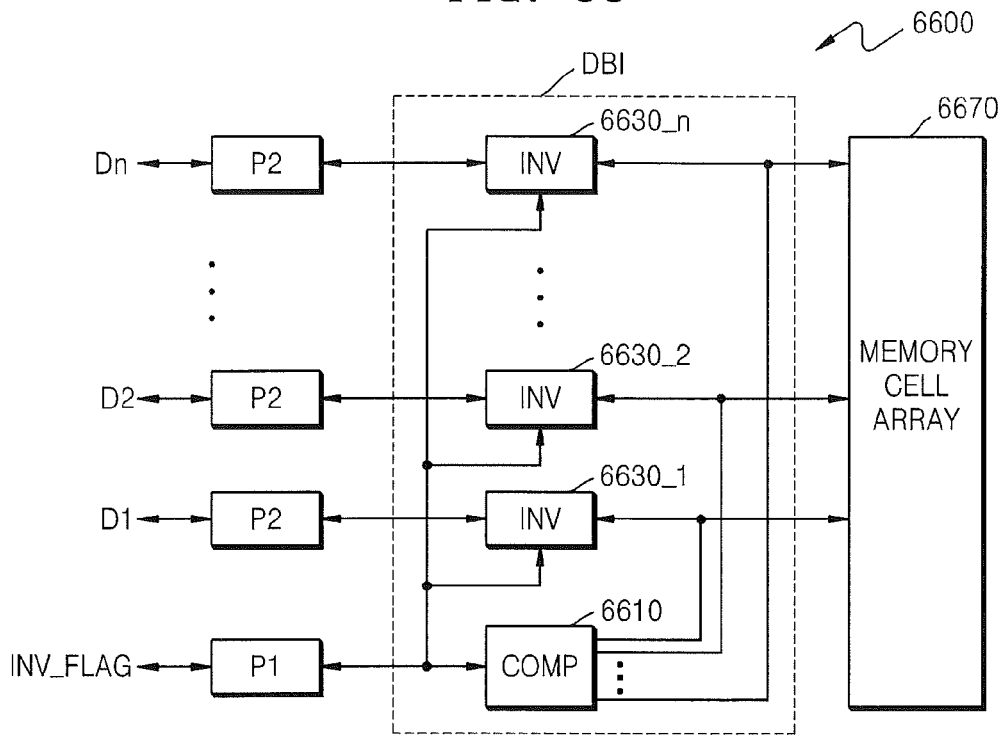
FIG. 66 is a block diagram of a DBI unit DBI included in a semiconductor device according to an embodiment of the inventive concepts.

FIG. 66 is a block diagram of a DBI unit DBI included in a semiconductor device 6600 according to an embodiment of the inventive concepts. For convenience of explanation, FIG. 66 illustrates that the semiconductor device 6600 includes a first pad P1, a plurality of second pads P2, a DBI unit DBI, and a memory cell array 6670 but a semiconductor device according to the inventive concepts is not limited thereto. Here, the semiconductor device 6600 will be described focusing on the structure of the DBI unit DBI.

The DBI unit DBI may include a plurality of inversion units 6630_1, 6630_2, ..., 6630_n, and a comparator 6610. The plurality of inversion units 6630_1, 6630_2, ..., 6630_n may invert data D1, D2, ..., Dn or may not invert the data D1, D2, ..., Dn according to a data inversion flag INV_FLAG, respectively. The comparator 6610 may compare a plurality of pieces of data read from the memory cell array 6670 with one another, and may or may not generate a data inversion flag INV_FLAG when the semiconductor device 6600 performs the read operation. If the comparator 6610 generates the data inversion flag INV_FLAG, the comparator 6610 may output it to the first pad P1 and the plurality of inversion units 6630_1, 6630_2, ..., 6630_n.

For example, if the data D1, D2, ..., through to Dn are to be written, the plurality of inversion units 6630_1, 6630_2, ..., through to 6630_n invert and output the data D1, D2, ..., through to Dn according to the data inversion flag INV_FLAG, respectively, when the data inversion flag INV_FLAG is received. In this case, if the data inversion flag INV_FLAG is not received, the plurality of inversion units 6630_1, 6630_2, ..., through to 6630_n do not invert the data D1, D2, ..., through to Dn and directly output the data D1, D2, ..., through to Dn, respectively.

For example, if the data D1, D2, ..., through to Dn are read from the memory cell array 6670, the comparator 6610 may compare the number of bits of the read data D1, D2, ..., Dn that are logic high with the number of bits of the read data D1, D2, ..., Dn that are logic low and may or may not generate the data inversion flag INV_FLAG. According to an embodiment of the inventive concepts, the comparator 6610 may generate the data inversion flag INV_FLAG when the number of bits of the read data D1, D2, ..., Dn that are logic high is greater than the number of bits of the read data D1, D2, ..., Dn that are logic low, and may not generate the data inversion flag INV_FLAG when the number of bits of the read data D1, D2, ..., Dn that are logic high is less than or equal to the number of bits of the read data D1, D2, ..., Dn that are logic low. If the plurality of inversion units 6630_1, 6630_2, ..., 6630_n receive the data inversion flag INV_FLAG, the plurality of inversion units 6630_1, 6630_2, ..., 6630_n may invert and output the data D1, D2, ..., Dn. If the plurality of inversion units 6630_1, 6630_2, ..., 6630_n do not receive the data inversion flag INV_FLAG, the plurality of inversion units 6630_1, 6630_2, ..., 6630_n may not invert the data D1, D2, ..., Dn and directly output the data D1, D2, ..., Dn.

Figure 67:
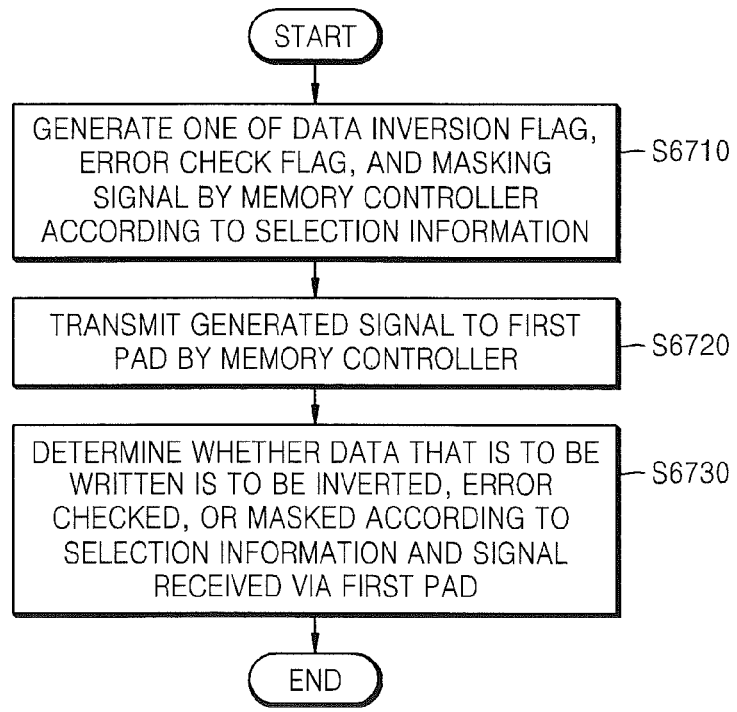
FIG. 67 is a flowchart illustrating a method of performing the write operation by using the memory system of FIG. 26, according to another embodiment of inventive concepts.

FIG. 67 is a flowchart illustrating a method of performing the write operation by using the memory system 2600 of FIG. 26, according to another embodiment of inventive concepts. Referring to FIGS. 26, 27, and 67, if the memory system 2600 performs the write operation, the memory controller 2610 may generate a data inversion flag INV_FLAG, an error check flag ERR_FLAG, or a masking signal MASK according to selection information SEL (operation S6710). A method of generating the data inversion flag INV_FLAG, the error check flag ERR_FLAG, or the masking signal MASK according to the selection information SEL by using memory controller 2610, is as described above with reference to FIG. 27. Next, the memory controller 2610 may transmit the generated signal to the first pad P1 (operation S6720). Next, the memory device 100 may determine whether data that is to be written is to be inverted, is to be error checked, or is to be masked, according to the selection information SEL and the signal received via the first pad P1 (operation S6730). The operation of the data control unit 150 when the semiconductor device 100 performs the write operation has been described above in detail with reference to FIGS. 1 to 5.

Figure 68:
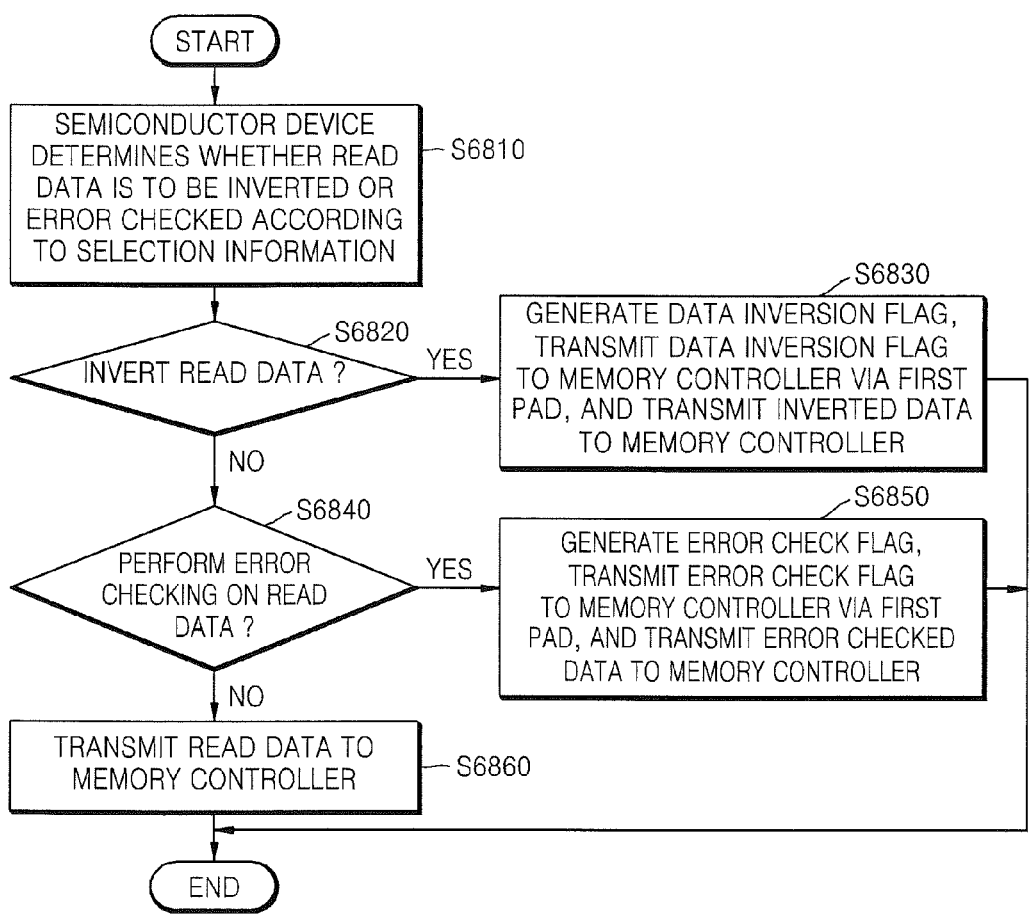
FIG. 68 is a flowchart illustrating a method of performing the read operation by using the memory system of FIG. 26, according to another embodiment of the inventive concepts.

FIG. 68 is a flowchart illustrating a method of performing the read operation by using the memory system 2600 of FIG. 26, according to another embodiment of the inventive concepts. Referring to FIGS. 26, 27, and 68, if the memory device 100 performs the read operation, the data control unit 150 may determine whether read data is to be inverted or is to be error checked, according to selection information SEL (operation S6810). For example, the DBI unit DBI may determine that the read data is to be inverted when the number of bits that are logic 'high' is greater than half the number of the total bits of the read data, and may determine that the read data is not to be inverted when the number of bits that are logic 'high' is less than or equal to half the number of the total bits of the read data. If it is determined in operation S6810 that the read data is not to be error checked Sand is to be inverted (operation S6820), then the data control unit 150 may generate a data inversion flag INV_FLAG, transmit the data inversion flag INV_FLAG to the memory controller 2610 via the first pad P1, invert the read data, and transmit the inverting result to the memory controller 2610 via a corresponding second pad P2 (operation S6830). If it is determined in operation S6810 that the read data is not to be inverted and is to be error checked (operation S6840), then the data control unit 150 may generate an error check flag ERR_FLAG, transmit the error check flag ERR_FLAG to the memory controller 2610 via the first pad P1, perform error checking on the read data, and transmit the read data to the memory controller 2610 via the corresponding second pad P2 (operation S6850). If it is determined in operation S6810 that the read data is neither to be inverted nor to be error checked, then the data control unit 150 does not generate any of the data inversion flag INV_FLAG and the error check flag ERR_FLAG and transmits the read data to the memory controller 2610 via the corresponding second pad P2 (operation S6860). The operation of the data control unit 150 when the memory device 100 performs the read operation has been described above in detail with reference to FIGS. 1 to 5.

FIGS. 26, 27, 67, and 68 illustrate cases where the data inversion scheme, the error check scheme, or the masking scheme is applied to the memory system 2600 or 2700 but the inventive concepts is not limited thereto and one of the other various scheme may also be applied by using one pad.

Figure 69:
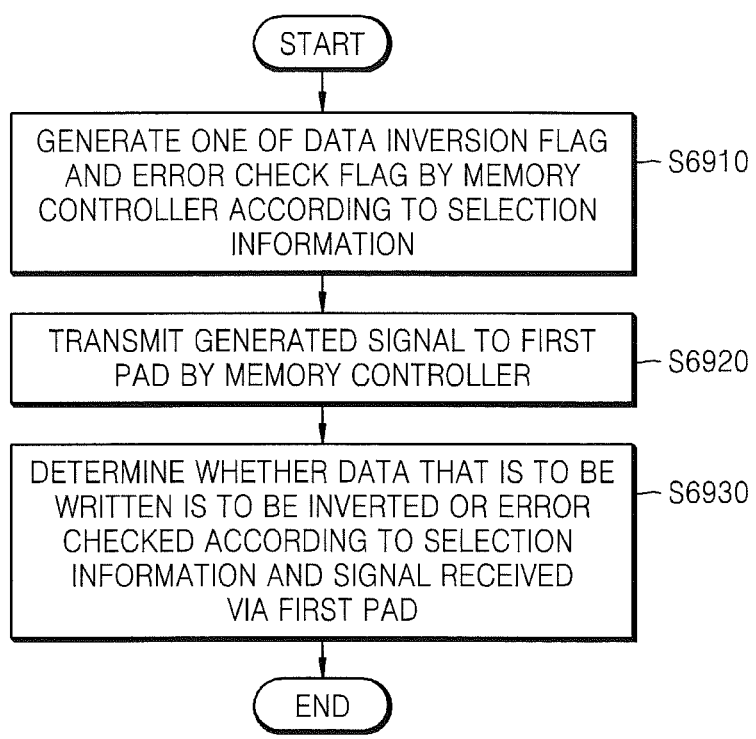
FIG. 69 is a flowchart illustrating a method of performing the write operation by using the memory system of FIG. 29, according to another embodiment of inventive concepts.

FIG. 69 is a flowchart illustrating a method of performing the write operation by using the memory system 2900 of FIG. 29, according to another embodiment of inventive concepts. Referring to FIGS. 28, 29, and 69, if the memory system 2900 performs the write operation, the memory controller 2810 may generate a data inversion flag INV_FLAG or an error check flag ERR_FLAG according to selection information SEL (operation S6910). A method of generating the data inversion flag INV_FLAG or the error check flag ERR_FLAG according to the selection information SEL by using memory controller 2810 is as described above with reference to FIG. 29. Next, the memory controller 2810 may transmit the generated signal to the first pad P1 (operation S6920). Next, the memory device 800 may determine whether data that is to be written is to be inverted or is to be error checked, according to the selection information SEL and the signal received via the first pad P1 (operation S6930). The operation of the data control unit 750 when the semiconductor device 800 performs the write operation has been described above in detail with reference to FIGS. 8 to 12B.

Figure 70:
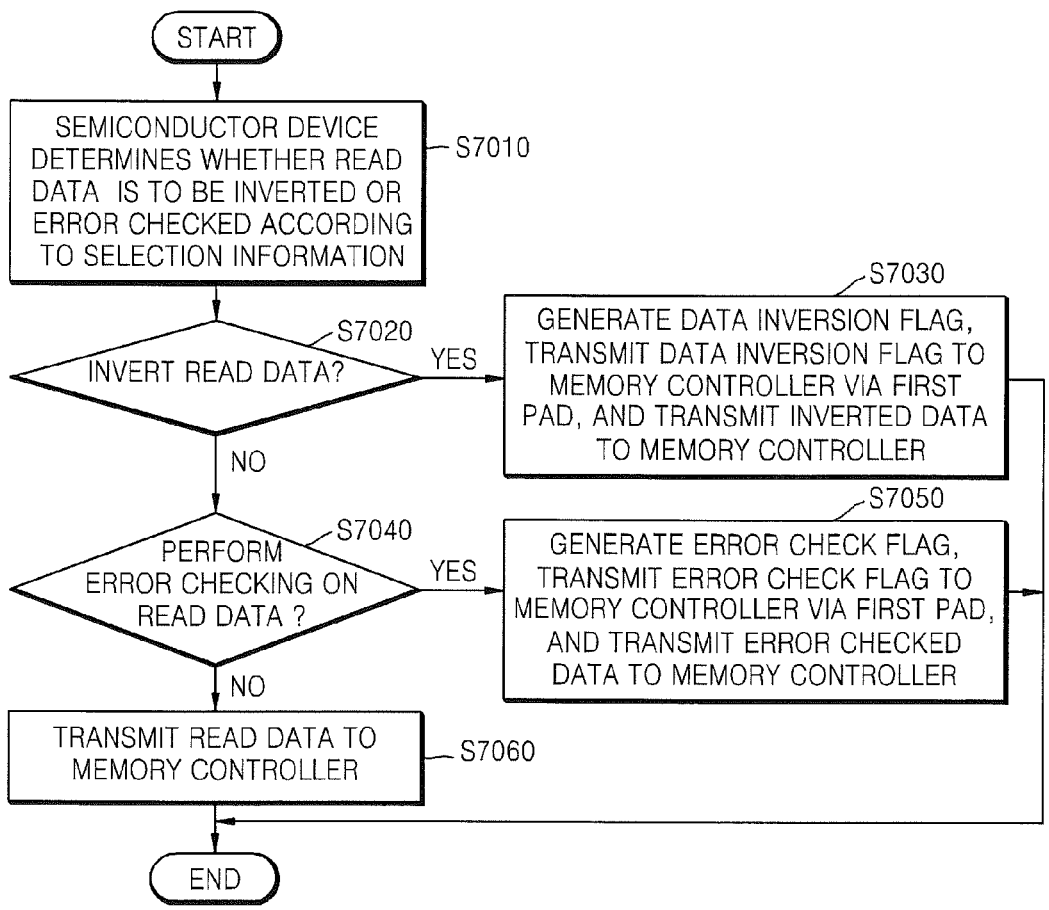
FIG. 70 is a flowchart illustrating a method of performing the read operation by using the memory system of FIG. 29, according to another embodiment of the inventive concepts.

FIG. 70 is a flowchart illustrating a method of performing the read operation by using the memory system 2900 of FIG. 29, according to another embodiment of the inventive concepts. Referring to FIGS. 28, 29, and 70, if the memory device 800 performs the read operation, the data control unit 750 may determine whether read data is to be inverted or is to be error checked, according to selection information SEL (operation S7010). For example, the DBI unit DBI may determine that the read data is to be inverted when the number of bits that are logic 'high' is greater than half the number of the total bits of the read data, and may determine that the read data is not to be inverted when the number of bits that are logic 'high' is less than or equal to half the number of the total bits of the read data. If it is determined in operation S7010 that the read data is not to be error checked and is to be inverted (operation S7020), then the data control unit 750 may generate a data inversion flag INV_FLAG, transmit the data inversion flag INV_FLAG to the memory controller 2810 via the first pad P1, invert the read data, and transmit the inverting result to the memory controller 2810 via a corresponding second pad P2 (operation S7030). If it is determined in operation S7010 that the read data is not to be inverted and is to be error checked (operation S7040), then the data control unit 750 may generate an error check flag ERR_FLAG, transmit the error check flag ERR_FLAG to the memory controller 2810 via the first pad P1, perform error checking on the read data, and transmit the read data to the memory controller 2810 via the corresponding second pad P2 (operation S7050). If it is determined in operation S7010 that the read data is neither to be inverted nor to be error checked, then the data control unit 750 does not generate any of the data inversion flag INV_FLAG and the error check flag ERR_FLAG and transmits the read data to the memory controller 2810 via the corresponding second pad P2 (operation S7060). The operation of the data control unit 750 when the memory device 800 performs the read operation has been described above in detail with reference to FIGS. 8 to 12B.

FIGS. 28, 29, 69, and 70 illustrate cases where the data inversion scheme or the error check scheme is applied to the memory system 2800 or 2900 but the inventive concepts is not limited thereto and one of the other various scheme may also be applied by using one pad.

Figure 71:
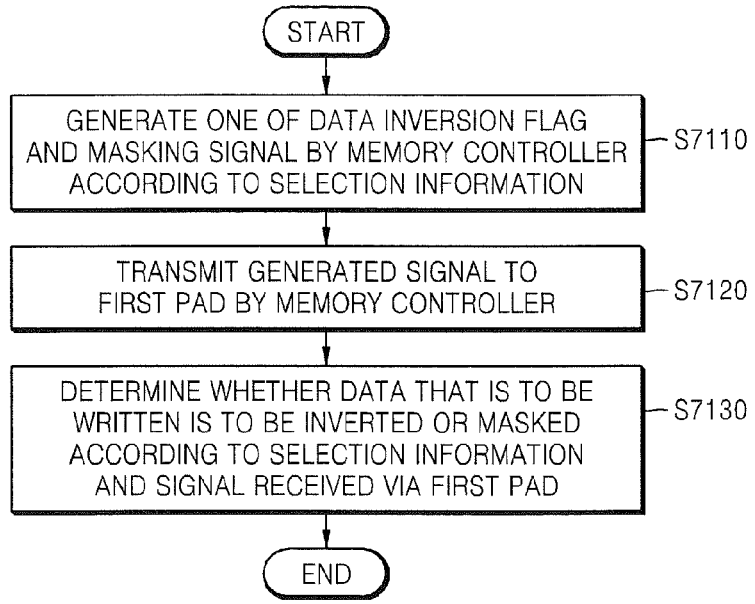
FIG. 71 is a flowchart illustrating a method of performing the write operation by using the memory system 3000 of FIG. 30, according to another embodiment of inventive concepts.

FIG. 71 is a flowchart illustrating a method of performing the write operation by using the memory system 3000 of FIG. 30, according to another embodiment of inventive concepts. Referring to FIGS. 28, 30, and 71, if the memory system 3000 performs the write operation, the memory controller 2810 may generate a data inversion flag INV_FLAG or a masking signal MASK according to selection information SEL (operation S7110). A method of generating the data inversion flag INV_FLAG or the masking signal MASK according to the selection information SEL by using memory controller 2810, is as described above with reference to FIG. 30. Next, the memory controller 2810 may transmit the generated signal to the first pad P1 (operation S7120). Next, the memory device 1300 may determine whether data that is to be written is to be inverted or is to be masked, according to the selection information SEL and the signal received via the first pad P1 (operation S7130). The operation of the data control unit 750 when the semiconductor device 1300 performs the write operation has been described above in detail with reference to FIGS. 13 to 17B.

Figure 72:
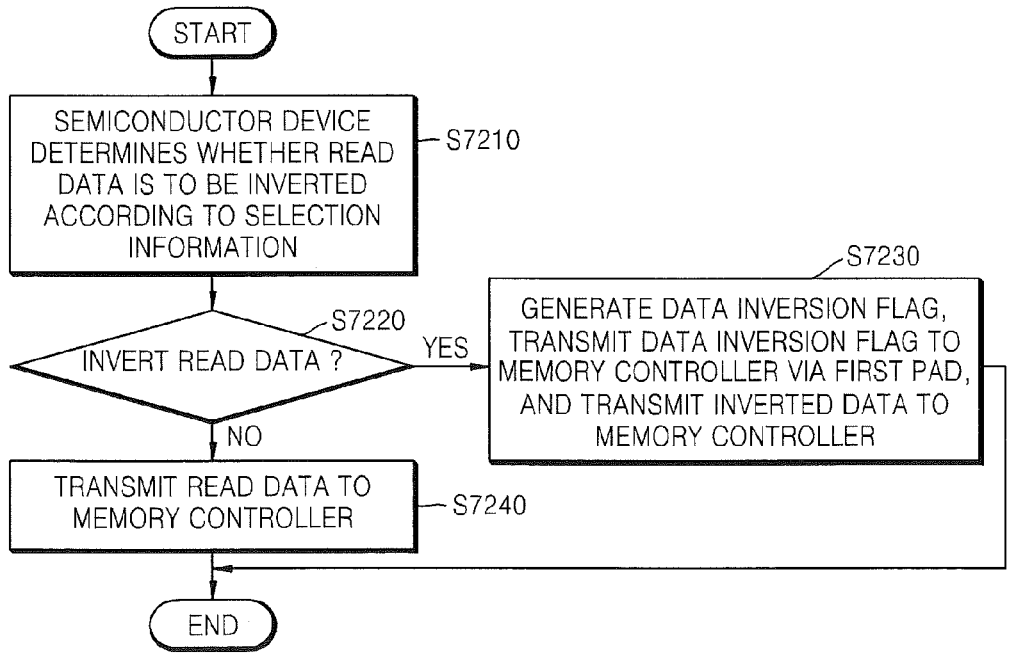
FIG. 72 is a flowchart illustrating a method of performing the read operation by using the memory system of FIG. 39, according to another embodiment of the inventive concepts.

FIG. 72 is a flowchart illustrating a method of performing the read operation by using the memory system 3000 of FIG. 39, according to another embodiment of the inventive concepts. Referring to FIGS. 28, 30, and 72, if the memory device 1300 performs the read operation, the data control unit 750 may determine whether read data is to be inverted, according to selection information SEL (operation S7210). For example, the DBI unit DBI may determine that the read data is to be inverted when the number of bits that are logic 'high' is greater than half the number of the total bits of the read data, and may determine that the read data is not to be inverted when the number of bits that are logic 'high' is less than or equal to half the number of the total bits of the read data. If it is determined in operation S7210 that the read data is to be inverted (operation S7220), then the data control unit 750 may generate a data inversion flag INV_FLAG, transmit the data inversion flag INV_FLAG to the memory controller 2810 via the first pad P1, invert the read data, and transmit the inverting result to the memory controller 2810 via a corresponding second pad P2 (operation S7230). If it is determined in operation S7220 that the read data is not to be inverted, then the data control unit 750 does not generate the data inversion flag INV_FLAG, and transmit the read data to the memory controller 2810 via the corresponding second pad P2 (operation S7240). The operation of the data control unit 750 when the memory device 1300 performs the read operation has been described above in detail with reference to FIGS. 13 to 17B.

FIGS. 28, 30, 71, and 72 illustrate cases where the data inversion scheme or the masking scheme is applied to the memory system 2800 or 3000 but the inventive concepts is not limited thereto and one of the other various scheme may also be applied by using one pad.

Figure 73:
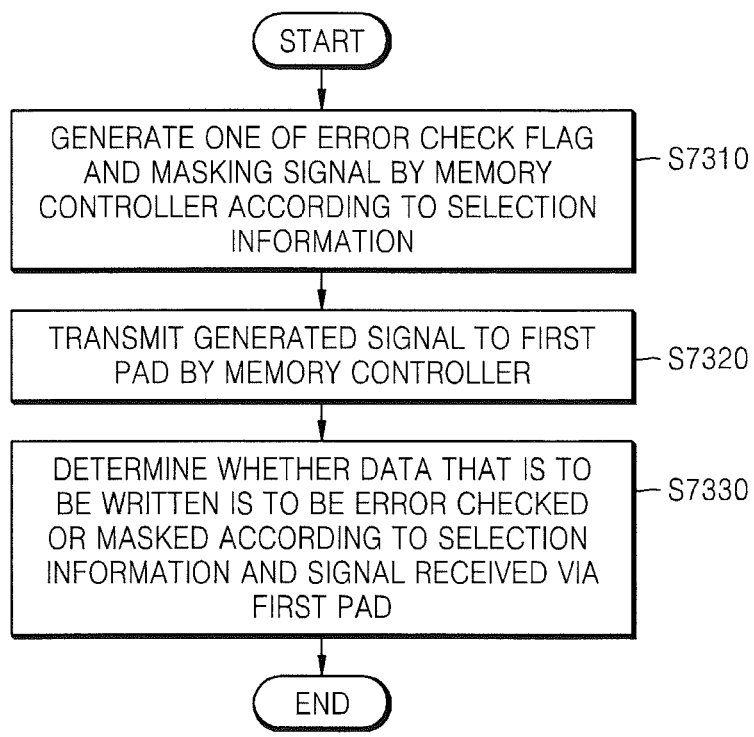
FIG. 73 is a flowchart illustrating a method of performing the write operation by using the memory system of FIG. 31, according to another embodiment of the inventive concepts.

FIG. 73 is a flowchart illustrating a method of performing the write operation by using the memory system 3100 of FIG. 31, according to another embodiment of the inventive concepts. Referring to FIGS. 28, 31, and 73, if the memory system 3100 performs the write operation, the memory controller 2810 may generate an error check flag ERR_FLAG or a masking signal MASK according to selection information SEL (operation S7310). A method of generating the error check flag ERR_FLAG or the masking signal MASK according to the selection information SEL by using memory controller 2810, is as described above with reference to FIG. 31. Next, the memory controller 2810 may transmit the generated signal to the first pad P1 (operation S7320). Next, the memory device 1800 may determine whether data that is to be written is to be error checked or is to be masked, according to the selection information SEL and the signal received via the first pad P1 (operation S7330). The operation of the data control unit 750 when the semiconductor device 1800 performs the write operation has been described above in detail with reference to FIGS. 18 to 22B.

Figure 74:
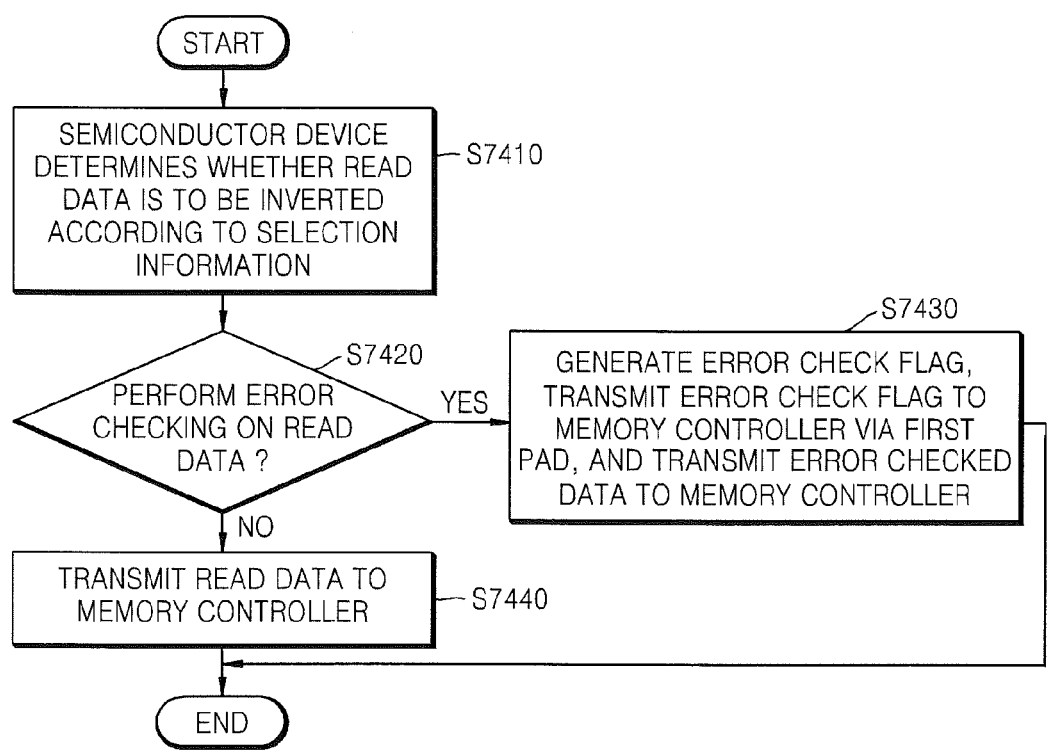
FIG. 74 is a flowchart illustrating a method of performing the read operation by using the memory system of FIG. 31, according to another embodiment of the inventive concepts.

FIG. 74 is a flowchart illustrating a method of performing the read operation by using the memory system 3100 of FIG. 31, according to another embodiment of the inventive concepts. Referring to FIGS. 28, 31, and 74, if the memory device 1800 performs the read operation, the data control unit 750 may determine whether read data is to be error checked, according to selection information SEL (operation S7410). If it is determined in operation S7410 that the read data is to be error checked (operation S7420), then the data control unit 750 generates an error check flag ERR_FLAG, transmits the error check flag ERR_FLAG to the memory controller 2810 via the first pad P1, performs error checking on the read data, and then transmits the read data to the memory controller 2810 via a corresponding second pad P2 (operation S7430). If it is determined in operation S7410 that the read data is not to be error checked (operation S7420), then the data control unit 750 does not generate the error check flag ERR_FLAG and transmits the read data to the memory controller 2810 via the corresponding second pad P2 (operation S7460). The operation of the data control unit 750 when the memory device 1800 performs the read operation has been described above in detail with reference to FIGS. 18 to 22B.

FIGS. 28, 31, 73, and 74 illustrate cases where the error check scheme or the masking scheme is applied to the memory system 2800 and 3100 but the inventive concepts is not limited thereto and one of the other various scheme may also be applied by using one pad.

The inventive concepts has been particularly shown and described with reference to exemplary embodiments thereof. The specific terms used in the present disclosure are not intended to restrict the scope of the inventive concepts and are only used for a better understanding of the inventive concepts. It would be obvious to those of ordinary skill in the art that the above exemplary embodiments are to cover all modifications, equivalents, and alternatives falling within the scope of the inventive concepts.

For example, while the data control units in the above described embodiments were configured to perform processing functions such as data bus inversion, error correction, and/or data masking, the present invention is not limited to these processing functions. For instance, embodiments of the data control unit may include or be directed to other processing function circuitry. As one example, a TDQS processing circuit may be included in the data control unit. As is well-known, TDQS stands for termination data strobe, and the TDQS function helps simplify memory controller design for systems that use both x4 and x8 based DIMMs. DIMMs that are x8-based usually only require one DQ strobe pair (DQS/DQS#) for each 8 bit byte, while x4-based DIMMs require a DQS pair for each 4 bit nibble (a total of four strobe lines). When these two different DIMM configurations are mixed within the same system, the loading of the DQS lines differs. These loading differences can cause signal integrity issues. As is known, the TDQS function reduces signal integrity issues in such systems. As with the other processing functions, the TDQS circuit may be enabled and disabled by the MRS command, and any further input or output during read and write operations may be provided on the pin associated with the processing functions. Accordingly, it will be understood that various changes in form and details may be made therein without departing from the spirit and scope of the following claims.

We claim:

1. A semiconductor device, comprising:
 a data control unit configured to selectively process data for writing to a memory, the data control unit configured to enable a processing function from a group of processing functions based on a mode register command during a write operation, the group of processing functions including at least three processing functions;
 a pin associated with the group of functions; and wherein
 the data control unit is configured to selectively perform the enabled processing function based on a signal received on the pin;
 the group of processing functions includes a first function, a bus inversion function, and a data masking function;
 the data control unit includes,
  a first circuit configured to receive the data for writing and configured to selectively perform the first function on the data for writing based on a signal received by the pin if enabled by a first control signal;
  a data bus inversion circuit configured to receive the data for writing and configured to selectively invert the data for writing based on a signal received by the pin if enabled by a second control signal;
  a data masking circuit configured to receive the data for writing and configured to selectively mask the data for writing based on the signal received by the pin if enabled by a third control signal; and
  a control signal generation circuit configured to generate the first, second and third control signals based on the mode register command.

2. The device of claim 1, wherein the first function is an error checking function.

3. The device of claim 1, wherein the data control unit further comprises:
 a buffer configured to buffer the data for writing and configured to supply the buffered data to the first circuit, the data bus inversion circuit and the data masking circuit; and at least one driver, the driver configured to write the data for writing received from one of the first circuit, the data bus inversion circuit and the data mask circuit into the memory.

4. The device of claim 1, wherein the data control unit further comprises:
a buffer configured to buffer the data for writing; and
at least one driver, the driver configured to receive the data for writing received from the buffer and configured to supply the data for writing to one of the first circuit, the data bus inversion circuit and the data mask circuit.

5. The device of claim 1, wherein the data control unit is configured to disable all data processing functions from the group based on the mode register command.

6. The device of claim 1, further comprising:
first and second pins associated with the group of functions; and wherein
the data control unit is configured to selectively enable one or more of the processing functions and to selectively perform one or more of the enabled processing functions based on signals received on the first and second pins.

7. The device of claim 6, wherein the data control unit is configured to perform two enabled processing functions in parallel based on signals received on the first and second pins.

8. The device of claim 6, wherein the data control unit is configured to perform two enable processing functions in sequence based on signals received on the first and second pins.

9. The device of claim 1, further comprising:
the memory, the memory including an array of memory cells.

10. A semiconductor device, comprising:
a data control unit configured to process data read from a memory, the data control unit configured to enable a processing function from a group of processing functions based on a mode register command during a read operation, the group of processing functions including at least two processing functions;
a pin associated with the group of functions; and wherein
the data control unit is configured to selectively output a signal on the pin based on performance of the enabled processing function;
the group of processing functions includes a first function and a bus inversion function;
the data control unit includes,
a first circuit configured to selectively perform the first function on the read data if enabled by a first control signal, and configured to output a first signal on the pin if enabled;
a data bus inversion circuit configured to selectively invert the read data if enabled by a second control signal, and configured to output a second signal on the pin if enabled; and
a control signal generation circuit configured to generate the first and second control signals based on the mode register command.

11. The device of claim 10, wherein the first function is an error checking function.

12. The device of claim 10, wherein the data control unit further comprises:
at least one sense amplifier, the sense amplifier configured to sense the read data and supply the read data to the first circuit and the data bus inversion circuit; and
a buffer configured to buffer output from the first circuit and the data bus inversion circuit.

13. The device of claim 10, wherein the data control unit further comprises:
at least one sense amplifier, the sense amplifier configured to sense output from the first circuit and the data bus inversion circuit; and
a buffer configured to buffer output from the sense amplifier.

14. The device of claim 10, wherein the data control unit is configured to disable all data processing functions from the group based on the mode register command.

15. The device of claim 10, further comprising:
first and second pins associated with the group of functions; and wherein
the data control unit is configured to selectively enable one or more of the processing functions and to selectively output signals on the first and second pins based on performance of the enabled processing functions.

16. The device of claim 15, wherein the data control unit is configured to perform two of the enabled processing functions in parallel and output signals on the first and second pins, respectively.

17. The device of claim 15, wherein the data control unit is configured to perform two of the enabled processing functions in sequence and output signals on the first and second pins, respectively.

18. The device of claim 10, further comprising:
the memory, the memory including an array of memory cells.

* * * * *